(12) United States Patent
Wu et al.

(10) Patent No.: US 12,283,463 B2
(45) Date of Patent: Apr. 22, 2025

(54) SYSTEMS AND METHODS FOR MULTI-LEVEL PULSING IN RF PLASMA TOOLS

(71) Applicant: Lam Research Corporation, Fremont, CA (US)

(72) Inventors: Ying Wu, Livermore, CA (US); Maolin Long, Santa Clara, CA (US); John Drewery, San Jose, CA (US); Vikram Singh, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 698 days.

(21) Appl. No.: 17/605,982

(22) PCT Filed: Apr. 24, 2020

(86) PCT No.: PCT/US2020/029900
§ 371 (c)(1),
(2) Date: Oct. 22, 2021

(87) PCT Pub. No.: WO2020/233129
PCT Pub. Date: Nov. 5, 2020

(65) Prior Publication Data
US 2022/0216038 A1     Jul. 7, 2022

Related U.S. Application Data

(60) Provisional application No. 62/840,335, filed on Apr. 29, 2019.

(51) Int. Cl.
*H01J 37/32*     (2006.01)
*H03K 3/017*     (2006.01)

(52) U.S. Cl.
CPC .. *H01J 37/32183* (2013.01); *H01J 37/32146* (2013.01); *H01J 37/32174* (2013.01); *H03K 3/017* (2013.01)

(58) Field of Classification Search
None
See application file for complete search history.

(56) References Cited

U.S. PATENT DOCUMENTS

| 7,115,185 B1 | 10/2006 | Gonzalez et al. |
| 7,839,223 B2 | 11/2010 | Van Zyl et al. |

(Continued)

FOREIGN PATENT DOCUMENTS

| KR | 2014-0035860 A | 3/2014 |
| KR | 2016-0143539 A | 12/2016 |

(Continued)

OTHER PUBLICATIONS

ISR & Written Opinion PCT/US2020/029900, dated Aug. 14, 2020, 12 pages.

*Primary Examiner* — Srinivas Sathiraju
(74) *Attorney, Agent, or Firm* — PENILLA IP, APC

(57) ABSTRACT

Systems and methods for multi-level pulsing are described. The systems and methods include generating four or more states. During each of the four or more states, a radio frequency (RF) generator generates an RF signal. The RF signal has four or more power levels, and each of the four or more power levels corresponds to the four or more states. The multi-level pulsing facilitates a finer control in processing a substrate.

20 Claims, 49 Drawing Sheets

(56) References Cited

U.S. PATENT DOCUMENTS

| | | |
|---|---|---|
| 7,999,526 B2 | 8/2011 | Ilic et al. |
| 8,044,594 B2 | 10/2011 | Morgan et al. |
| 9,088,267 B2 | 7/2015 | Blackburn et al. |
| 9,123,509 B2 | 9/2015 | Papasouliotis et al. |
| 9,368,329 B2 | 6/2016 | Valcore, Jr. et al. |
| 9,378,931 B2 * | 6/2016 | Kwon ................ H01J 37/32146 |
| 9,536,713 B2 | 1/2017 | Van Zyl et al. |
| 9,536,749 B2 | 1/2017 | Marakhtanov et al. |
| 9,544,987 B2 | 1/2017 | Mueller et al. |
| 9,685,297 B2 | 6/2017 | Carter et al. |
| 9,767,988 B2 | 9/2017 | Brouk et al. |
| 9,788,405 B2 | 10/2017 | Kawasaki et al. |
| 9,947,513 B2 | 4/2018 | Valcore, Jr. et al. |
| 10,515,781 B1 * | 12/2019 | Long ................. H01J 37/32165 |
| 10,811,227 B2 * | 10/2020 | Van Zyl ............ H01J 37/32357 |
| 10,811,228 B2 * | 10/2020 | Van Zyl ............ H01J 37/32697 |
| 10,811,229 B2 * | 10/2020 | Van Zyl ............ H01J 37/32146 |
| 10,861,708 B2 * | 12/2020 | Yanagawa .......... H01J 37/32174 |
| 10,879,044 B2 * | 12/2020 | Wang ..................... H01Q 5/335 |
| 11,011,349 B2 * | 5/2021 | Brouk ............... H01J 37/32091 |
| 11,189,454 B2 * | 11/2021 | Carter ..................... H01J 37/08 |
| 11,942,309 B2 * | 3/2024 | Singh ................ H01J 37/32174 |
| 2011/0309049 A1 * | 12/2011 | Papasouliotis .... H01J 37/32412 |
| | | 427/523 |
| 2013/0006555 A1 | 1/2013 | Roberg et al. |
| 2014/0009073 A1 * | 1/2014 | Valcore, Jr. ....... H01J 37/32082 |
| | | 315/183 |
| 2014/0062495 A1 | 3/2014 | Carter et al. |
| 2016/0126069 A1 * | 5/2016 | Kwon .................... H05B 31/26 |
| | | 315/111.21 |
| 2016/0336152 A1 * | 11/2016 | Valcore, Jr. ....... H01J 37/32174 |
| 2017/0099722 A1 * | 4/2017 | Kawasaki ................ H05H 1/46 |
| 2017/0178864 A1 | 6/2017 | Valcore, Jr. et al. |
| 2018/0005802 A1 * | 1/2018 | Chen .................. H01J 37/32174 |
| 2018/0005857 A1 * | 1/2018 | Zhang ................... H01J 37/321 |
| 2018/0025891 A1 * | 1/2018 | Marakhtanov .... H01J 37/32568 |
| | | 438/714 |
| 2018/0130640 A1 * | 5/2018 | Gregor .............. H01L 21/67253 |
| 2018/0240647 A1 * | 8/2018 | McChesney ...... H01J 37/32183 |
| 2018/0330921 A1 * | 11/2018 | Radomski ......... H01J 37/32174 |
| 2018/0342903 A1 * | 11/2018 | Luu .................... H01J 37/32091 |
| 2019/0013182 A1 | 1/2019 | Van Zyl |
| 2019/0066979 A1 * | 2/2019 | Shoeb ............... H01J 37/32568 |
| 2019/0068407 A1 | 2/2019 | Haga et al. |
| 2019/0096633 A1 | 3/2019 | Pankratz et al. |
| 2019/0116656 A1 * | 4/2019 | Long ........................ H05H 1/46 |
| 2019/0157040 A1 | 5/2019 | Fairbairn et al. |
| 2019/0172685 A1 | 6/2019 | Van Zyl et al. |
| 2019/0180982 A1 | 6/2019 | Brouk et al. |
| 2019/0215942 A1 * | 7/2019 | Long ........................ H05H 1/46 |
| 2019/0371571 A1 * | 12/2019 | McChesney ...... H01J 37/32183 |
| 2020/0243304 A1 * | 7/2020 | Valcore, Jr. ............. H05H 1/46 |
| 2022/0216038 A1 * | 7/2022 | Wu .................... H01J 37/32183 |
| 2022/0277934 A1 * | 9/2022 | Valcore, Jr. ....... H01J 37/32183 |
| 2024/0006151 A1 * | 1/2024 | Samuels ........... H01J 37/32137 |
| 2024/0006169 A1 * | 1/2024 | Samuels ........... H01J 37/32174 |
| 2024/0012370 A1 * | 1/2024 | Samuels ............. G05B 13/0275 |
| 2024/0258071 A1 * | 8/2024 | Luu .................... H01J 37/32183 |

FOREIGN PATENT DOCUMENTS

| | | | | |
|---|---|---|---|---|
| KR | 2017-0117312 A | | 10/2017 | |
| WO | WO-2019079325 A1 * | 4/2019 | ........ | H01J 37/32174 |
| WO | WO-2020223129 A1 * | 11/2020 | ........ | H01J 37/32082 |

* cited by examiner (System)

(RFG)

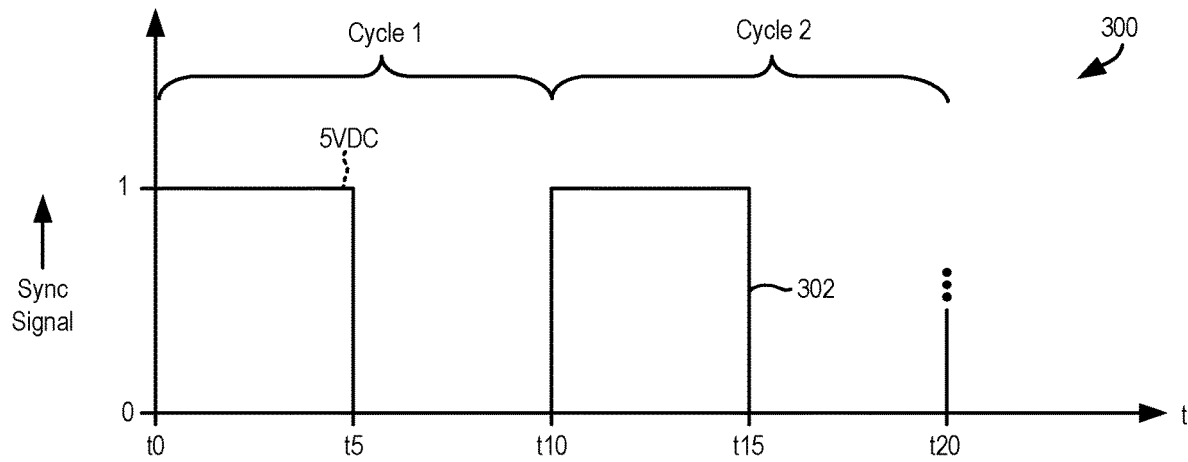
FIG. 3A - (DC 50%)
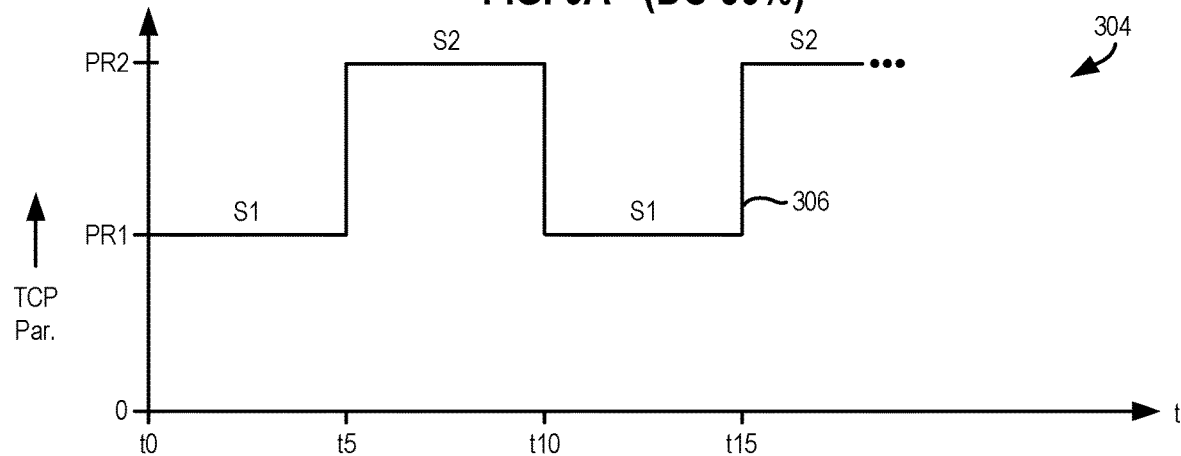
FIG. 3B
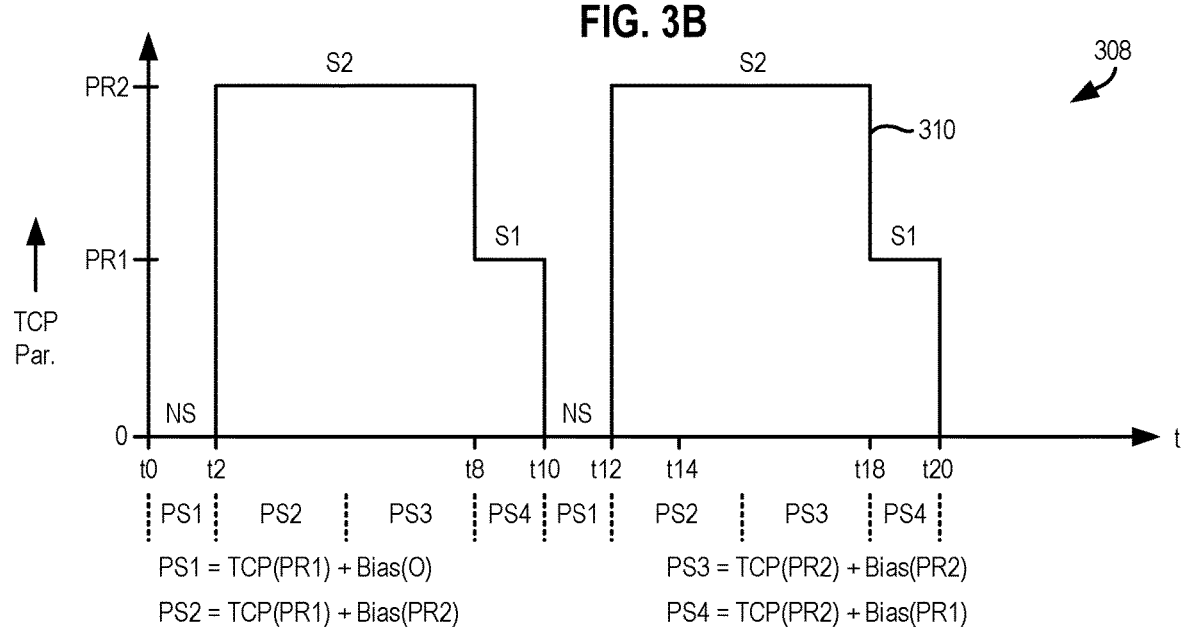
FIG. 3C - (4 States)

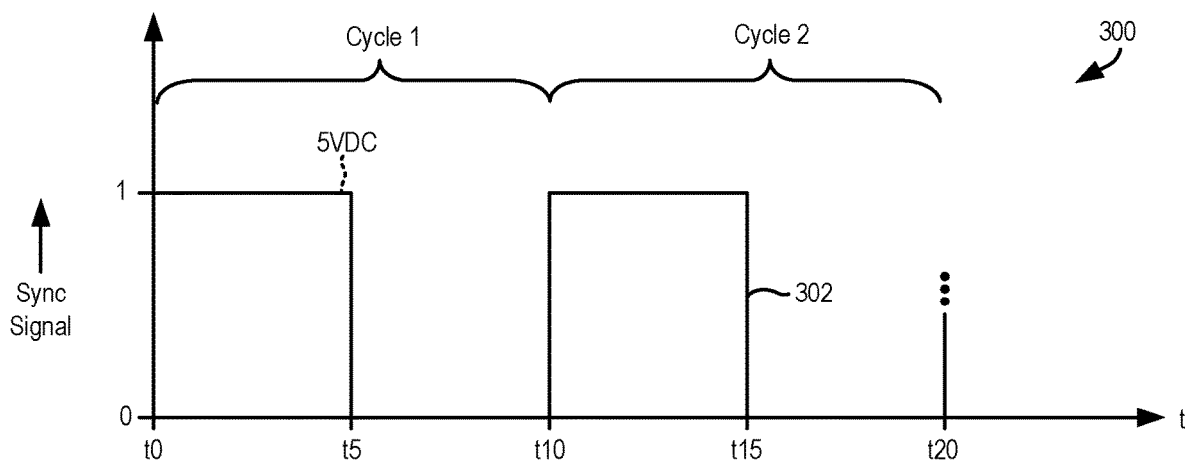
FIG. 4A - (DC 50%)
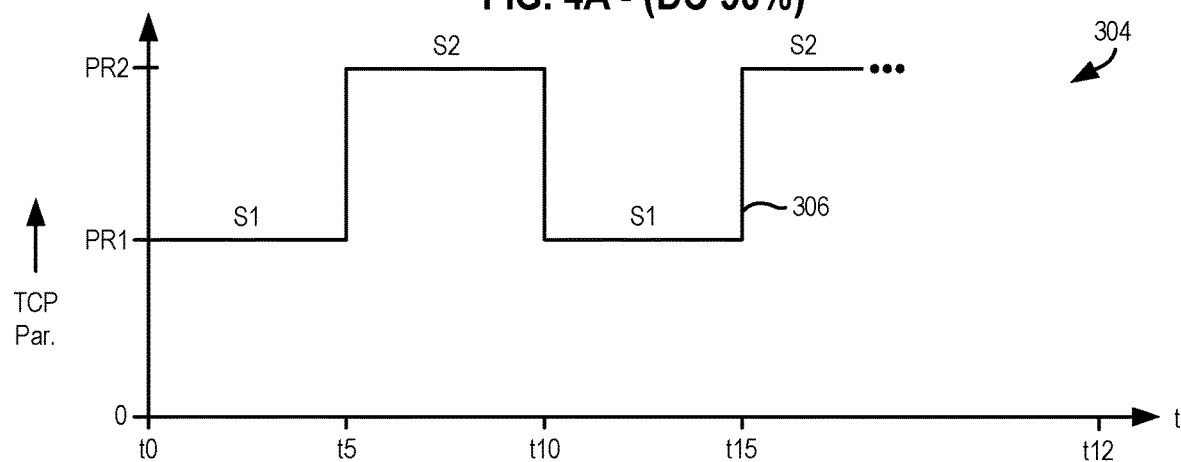
FIG. 4B
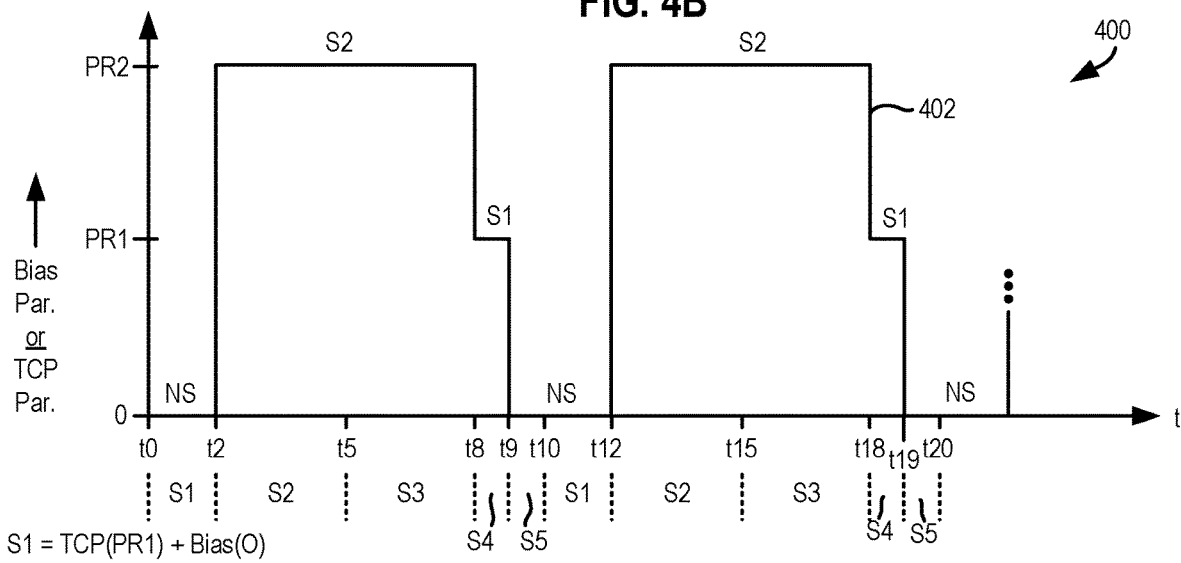
S1 = TCP(PR1) + Bias(O)
S2 = TCP(PR1) + Bias(PR2)
S3 = TCP(PR2) + Bias(PR2)
S4 = TCP(PR2) + Bias(PR1)
S5 = TCP(PR2) + Bias(O)
FIG. 4C - (5 States)

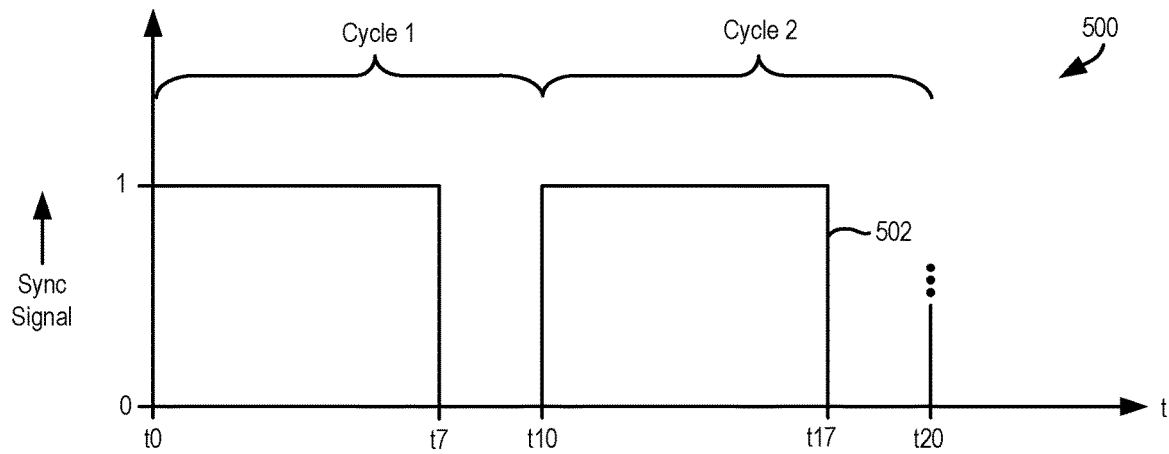
FIG. 5A - (DC 70%)
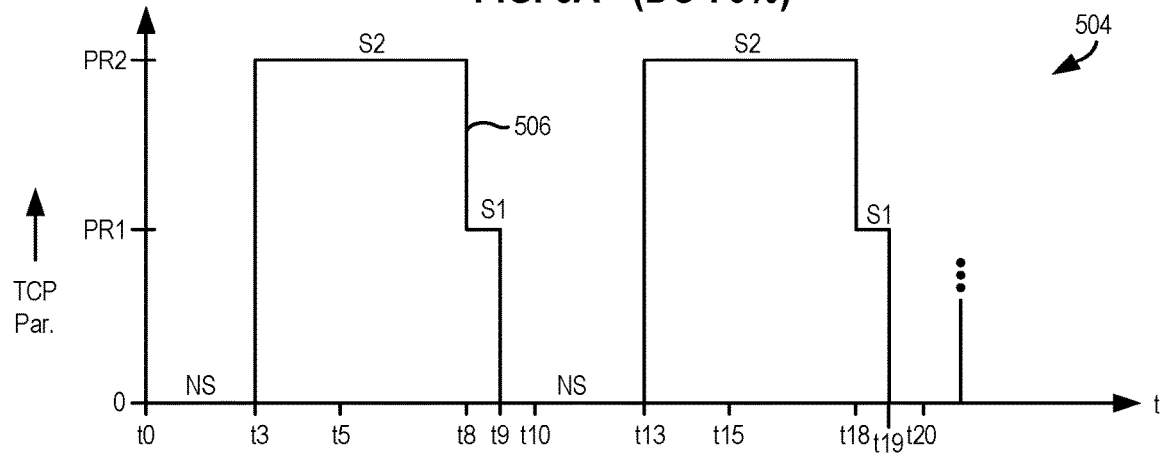
FIG. 5B
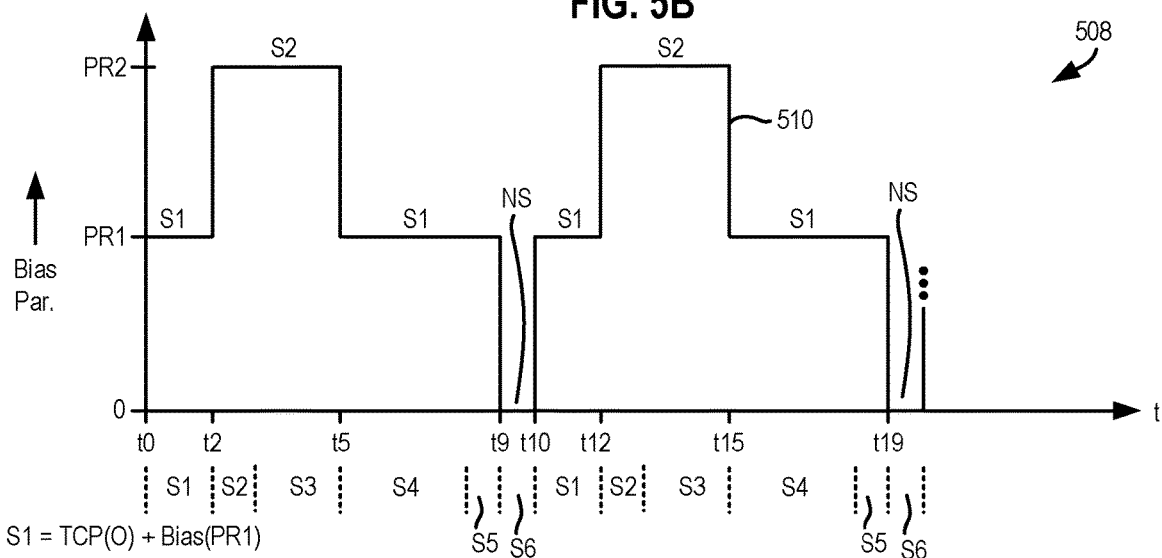
S1 = TCP(O) + Bias(PR1)
S2 = TCP(O) + Bias(PR2)
S3 = TCP(PR2) + Bias(PR2)
S4 = TCP(PR2) + Bias(PR1)
S5 = TCP(PR2) + Bias(PR1)
S6 = TCP(O) + Bias(O)
FIG. 5C - (6 States)

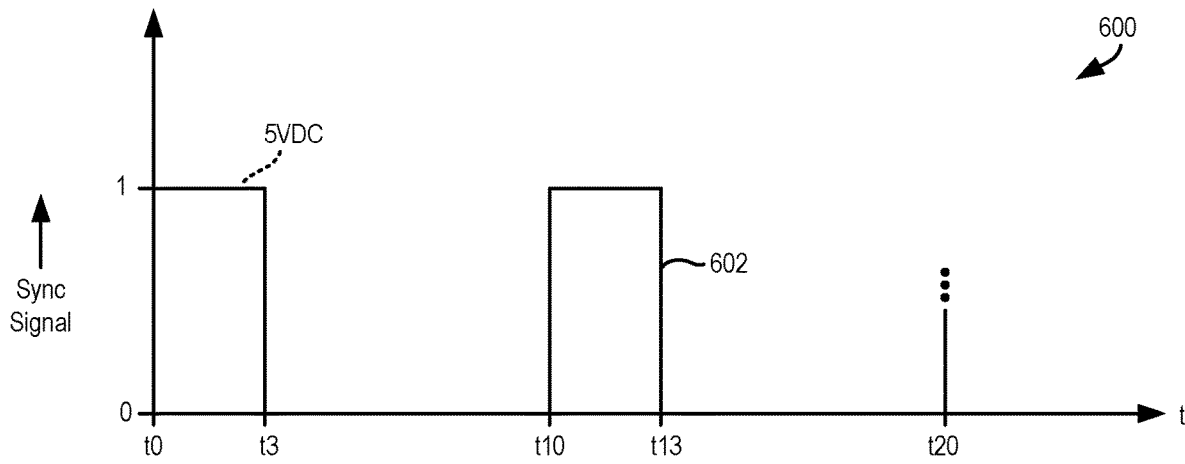
FIG. 6A - (DC 25%)
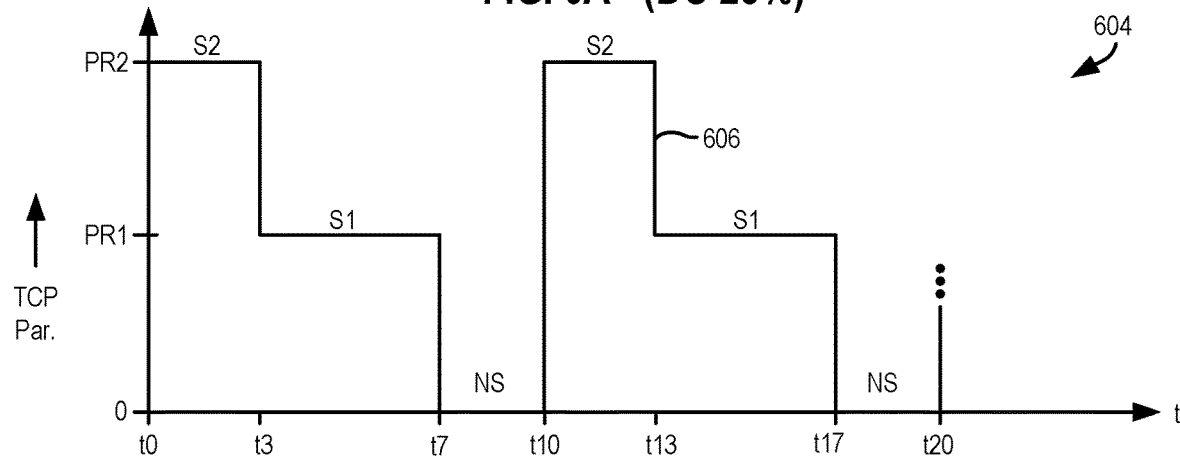
FIG. 6B
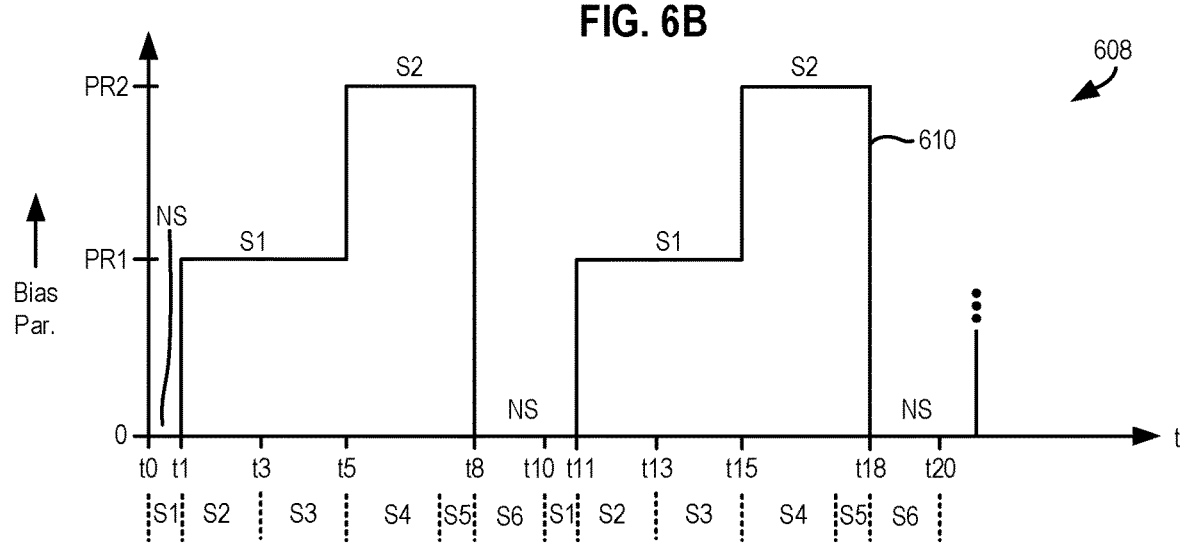
S1 = TCP(PR2) + Bias(O)
S2 = TCP(PR2) + Bias(PR1)
S3 = TCP(PR1) + Bias(PR1)
S4 = TCP(PR1) + Bias(PR2)
S5 = TCP(O) + Bias(PR2)
S6 = TCP(O) + Bias(O)
FIG. 6C - (6 States)

(Multi-State Power)

(Multi-State Frequency)

(Multi-State Powered, Multi-State Frequency)

FIG. 10A - (Sync Signal)

(Frequency Tuning for Each State)

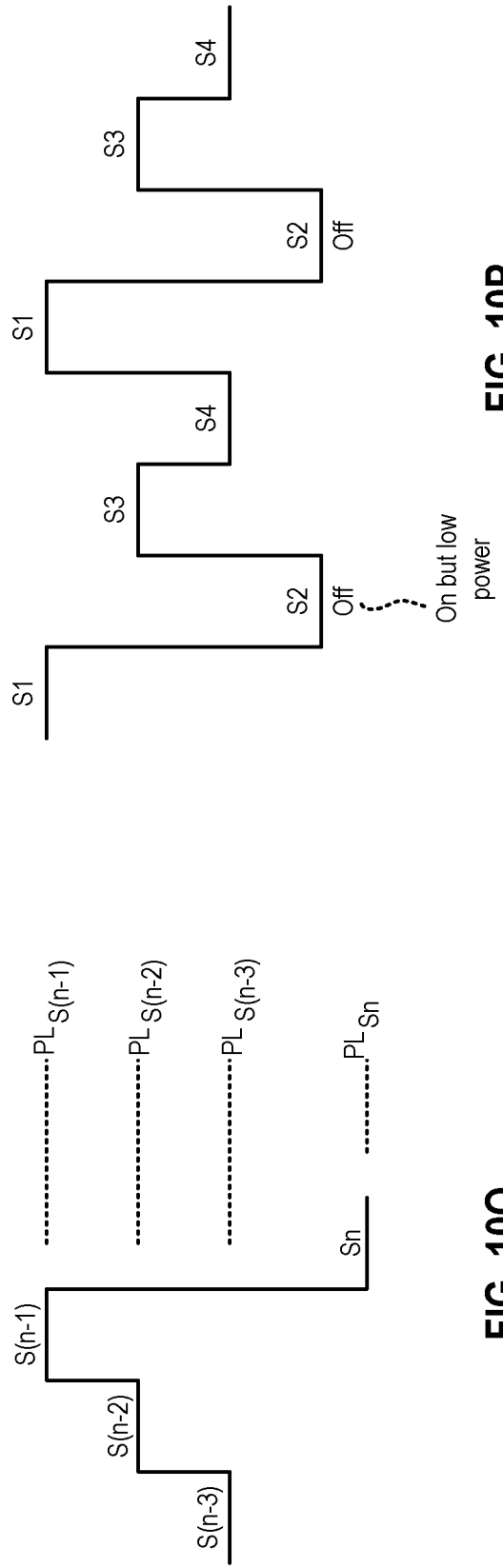

(Transition Control)

(Transition Control)

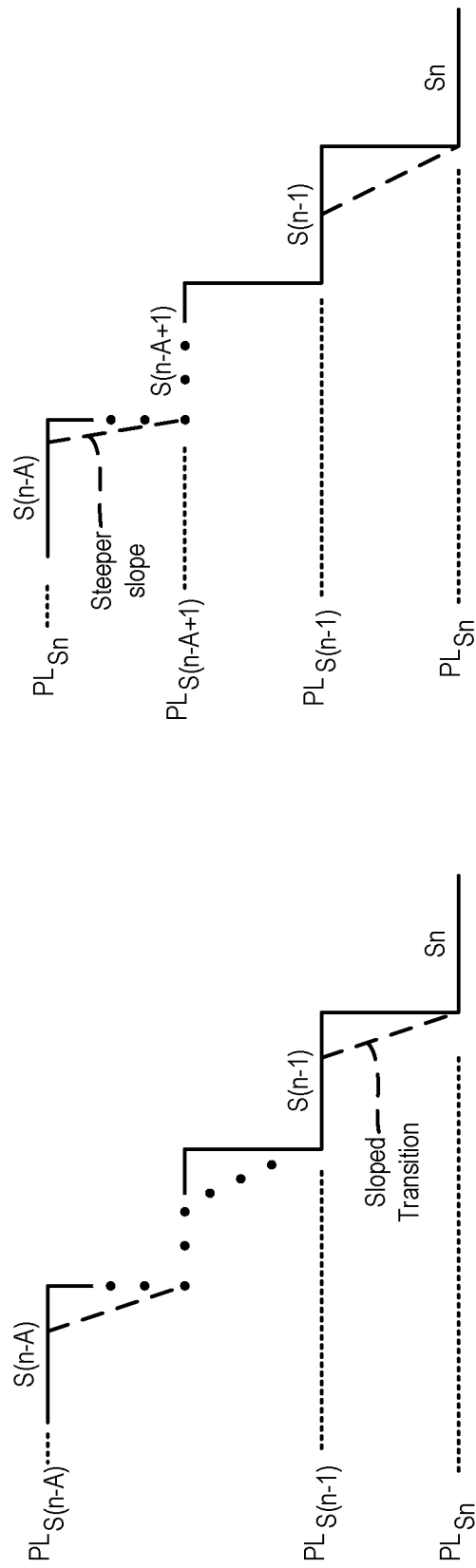

(EtherCAT Cable)

(EtherCAT frame)

(EtherCAT frame)

(Frequency Tuning for each state to reduce reflected power)

SYSTEMS AND METHODS FOR MULTI-LEVEL PULSING IN RF PLASMA TOOLS

CLAIM OF PRIORITY

This application is a national stage filing of and claims priority, under 35 U.S.C. § 371, to PCT/US2020/029900, filed on Apr. 24, 2020, and titled "SYSTEMS AND METHODS FOR MULTI-LEVEL PULSING IN RF PLASMA TOOLS", which claims the benefit of and priority, under 35 U.S.C. § 119 (e), to U.S. Provisional Patent Application No. 62/840,335, filed on Apr. 29, 2019, and titled "SYSTEMS AND METHODS FOR MULTI-LEVEL PULSING IN RF PLASMA TOOLS", both of which are incorporated by reference herein in their entirety.

FIELD

The present embodiments relate to systems and methods for multi-level pulsing in radio frequency (RF) plasma tools.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching circuit. The impedance matching circuit is coupled to a plasma chamber. RF signals are supplied from the RF generators to the impedance matching circuit. The impedance matching circuit outputs an RF signal upon receiving the RF signals. The RF signal is supplied from the impedance matching circuit to the plasma chamber for processing a wafer in the plasma chamber. However, the wafer is not processed to a level of detail that is desired.

It is in this context that embodiments described in the present disclosure arise.

SUMMARY

Embodiments of the disclosure provide apparatus, methods and computer programs for multi-level pulsing in radio frequency (RF) plasma tools. It should be appreciated that the present embodiments can be implemented in numerous ways, e.g., a process, an apparatus, a system, a piece of hardware, or a method on a computer-readable medium. Several embodiments are described below.

In a description that follows, a number of embodiments of the multi-level pulsing are provided. Also, several benefits associated with the multi-level pulsing are provided. Two or more of the embodiments described herein can be combined to operate with each other or each of the embodiments described herein can operate independently from each other to provide a specific embodiment associated with the multi-level pulsing.

An RF generator that facilitates multi-level pulsing is described. The RF generator generates an RF signal having four or more power levels and provides the RF signal to an impedance matching circuit that is coupled to an electrode of the plasma chamber. The RF signal achieves the multi-level pulsing during a clock cycle. For example, the RF signal transitions from a first power level to a second power level, further transitions from the second power level to a third power level, and transitions from the third power level to a fourth power level during one clock cycle. The RF signal transitions back to the first power level from the fourth power level at an end of the clock cycle. The multi-state pulsing repeats periodically for multiple clock cycles.

Each of the first, second, third, and fourth power level is a distinct power level. For example, one or more power values of the first power level are exclusive or different from one or more power values of the second power level, from one or more power values of the third power level, and from one or more power values of the fourth power level. Also, the one or more power values of the second power level are different from the one or more power values of the third power level and from the one or more power values of the fourth power level. The one or more power values of the third power level are different from the one or more power values of the fourth power level.

The multi-state pulsing is not limited to four power levels. For example, a number of power levels less than four is generated. To illustrate, two or three power levels are generated by the RF generator. As another example, a number of power levels greater than four, such as five, or six, or seven, power levels is generated by the RF generator.

The multi-state pulsing is performed to achieve a balance between different phases of a processing operation, such as a balance between a deposition phase during an etching operation and an etching phase during the etching operation. For example, two power levels of the multi-state pulsing are applied to perform the deposition phase and two higher power levels of the multi-state pulsing are applied to perform the etching phase. The two lower power levels have lower power than the higher power levels. As an example, the etching operation is a conductor etch that is performed in an inductively coupled plasma (ICP) chamber. The RF generator is coupled via an impedance matching circuit to an electrode, such as a transformer coupled plasma (TCP) electrode or a bias electrode, of the ICP plasma chamber.

In one embodiment, a pulse train calibration method for reducing line power losses is described. The pulse train calibration method includes simulating a multi-state power pulse train to be produced, applying the train to a known 50 ohm load, and measuring voltage or power for the multi-state power pulse train. For example, the voltage or power is measured for each state of the multi-state power pulse train. Power of each state of the power pulse train can be changed to account for line losses based on the measured voltage or power or measured complex voltage and current. An example of the line includes a radio frequency (RF) cable that couples an output of an RF generator to an input of a match or a combination of the RF cable and an RF transmission line, which couples an output of the match to an electrode of a plasma chamber.

In an embodiment, a voltage pulse leveling method for reducing line power losses is described. The voltage pulse leveling method includes measuring or determining a pulse shape at a known load and compensating for power to obtain a square-shaped RF pulse response. The pulse shape is measured by using a voltage or power or a complex voltage and current probe. This is voltage control within a pulse. The pulse is divided into multiple sub-pulses. For each sub-pulse, voltage or power control is performed. For example, for portions of the pulse where voltage or power is too low, power is changed to achieve a flat pulse that is square-shaped. The voltage pulse leveling method is executed to account for power losses in a line.

In one embodiment, a duty cycle calibration method to reduce line power losses is described. The duty cycle calibration method includes measuring a duty cycle and adjusting a time duration of the duty cycle for each state in multi-state pulsing to account for line power losses.

With multi-level pulsing (e.g., four or higher number of power levels), it is sometimes difficult for a match to reduce reflected power.

In an embodiment, a transformer coupled capacitive tuning (TCCT) match is provided to reduce the reflected power during the multi-state pulsing. The TCCT match is used with a source RF generator and is modified for use with multi-level pulsing, such as four and higher level pulsing. The TCCT match is provided timing information regarding the multi-level pulsing so it can be tuned to the multi-level pulsing.

In one embodiment, a state match tuning method is described. The state tuning method includes tuning the TCCT match during one state and frequency tuning (e.g., tune RF generator) during the other 3 or 4 or 5 remaining states to reduce the reflected power.

In an embodiment, instead of the source TCCT match or a bias match, a solid state matching device is used so that it can tune faster to the multi-state pulsing to reduce the reflected power. The solid state matching device is fabricated from transistors, or semiconductor diodes, or a combination thereof.

With multi-level pulsing, it is difficult for a match to keep up with the multi-level pulsing to minimize reflected power.

In one embodiment, a match tuning method with fixed frequency is described. In a four state scenario, a match is tuned in the first state and a fixed frequency of RF generator is maintained in the other three states. The frequency is determined to minimize a sum of product of weights and reflected powers for the four states. For example, the frequency is such that C1P1+C2P2+C3P3+C4P4 is minimum for states 1 through 4, where C1 through C4 are weights, and P1 through P4 are reflected powers during each state. The weights C1 through C4 could be percentages of duty cycles for each state. Instead of reflected power, a power reflection coefficient can be minimized.

When a transformer coupled plasma (TCP) electrode, such as one or more TCP coils, and a bias electrode are pulsed to have multiple states (e.g., four or more power levels), it is desirable to achieve uniformity in a processing rate, such as an etch rate or a deposition rate.

In one embodiment, a clock synchronization method between the TCP and bias electrodes is provided. In the clock synchronization method, a fine resolution clock for multiple states is provided. The fine resolution clock supplies a digital pulse signal having multiple states, such as four or more states, to RF generators that provide power to the TCP electrode and the bias electrode. The synchronization facilitates achievement of the uniformity.

In an embodiment, an Ethernet for Control Automation Technology (EtherCAT) synchronization method and system is provided to achieve the uniformity. An EtherCAT cable is used to synchronize different devices, such as a TCP RF generator, a bias RF generator, and a match. The EtherCAT cable is used to transfer a communication pulse train to communicate with the different devices. As an example, the communication pulse train has a start time and a stop time. The start time is a start of a series of pulses and the stop time is a time at which the series stops. The start and stop times repeat. The pulse train can be embedded with information regarding multiple states for the different devices. The information will include start and stop times for each state for each device. Also, using the EtherCAT cable for synchronization will eliminate the need to provide TTL signals to the different devices via multiple synchronization cables to synchronize the different devices. Each synchronization cable carries a TTL signal. The synchronization cables are no longer needed. An example of the EtherCAT cable is an Ethernet cable.

Also, it is desirable to control process uniformity and to achieve processing rates or etch depths in multi-state pulsing (e.g., four or more states).

In one embodiment, a synchronization master, such as a pulse master, is provided to control process uniformity and achieve the processing rates. As an example, the pulse master includes an analog-to-digital voltage control interface (ADVCI) to synchronize TCP and bias RF generators. For example, the ADVCI can generate a digital pulse signal or a TTL signal having two states to provide to the TCP RF generator and can generate another digital pulse signal or another TTL signal having four states to provide to the bias RF generator. The two states and the four states are generated during a clock cycle of a clock signal. As another example, the ADVCI can generate a digital pulse signal or a TTL signal having four states to provide to the TCP RF generator and can generate another digital pulse signal or another TTL signal having four states to provide to the bias RF generator. The four states are generated during a clock cycle of a clock signal.

In an embodiment, the pulse master is used with endpoint detection to control process uniformity and achieve the processing rates. The pulse master is used to synchronize optical emission spectroscopy (OES) and Lam spectral reflectometry with multi-state, such as multi-level, pulsing. End point or process point detection is done with OES and Lam spectral reflectometry. A Lam spectral reflectometer (LSR) or the OES measures intensity of light reflected from a wafer.

In one embodiment, an on-off time modification method with selective synchronization between a source RF generator and a bias RF generator is provided. The on-off time modification method includes changing, such as delaying or moving forward, an on time and an off time of RF power in each state to change 2 plasma impedance states to 4 plasma impedance states or to change four plasma impedance states to eight plasma impedance states. On and off times can be adjusted or changed within each state to achieve 4 plasma impedance states from 2 plasma impedance states. For example, the on time for applying RF power is slightly delayed in state S1 and/or the off time is achieved slightly early in the state S1. In case on and off times of RF power for both TCP and bias RF generators are changed, both the TCP and bias RF generators are synchronized with each other. As an example, when multi-state power having the four states or the eight states is generated by a source RF generator, a bias RF generator is operated in a continuous wave (CW) mode. As another example, when multi-state power having the four states or the eight states is generated by the bias RF generator, the source RF generator is operated in a continuous wave (CW) mode. Also, as an example, different processes are performed in each state. For example, deposition on a wafer can occur in one state and etching of the wafer can occur in another state.

A process is controlled to minimize defects in wafers due to spikes at transition edges and to protect an RF generator when the RF generator operates in four or more states.

In an embodiment, a pulse shaping method is provided to achieve the process control. As an example, the pulse shaping method includes shaping a power rise edge and/or shaping a power fall edge of an RF signal that is generated by an RF generator. Also, as another example, the pulse shaping method includes shaping a frequency rise edge and/or a frequency falling edge of the RF signal. As yet another example, the pulse shaping method includes shaping a rising edge and/or a falling edge of power and shaping a rising edge and/or a falling edge of frequency of the RF signal.

It is further desirable to control a process for achieving uniformity in processing a substrate.

In one embodiment, to achieve the uniformity, a system having multiple power controllers and multiple auto frequency tuners (AFTs) is provided.

In an embodiment, a method for frequency tuning trajectories at a microsecond level to achieve the uniformity is described. In the method, each RF signal is frequency tuned at a microsecond level to reduce reflected power for each recipe to generate a trajectory of the RF signal, and the trajectory is applied during application of the recipe to process a wafer. The trajectory is generated to learn the trajectory, which is then applied during processing of the wafer.

In one embodiment, an off state placement method is described. In the off state placement method, an off state is provided anywhere in a multi-level pulse sequence. The off state can be anywhere in the pulse sequence. There is no need to achieve the off state before repeating the first state in the pulse sequence.

Some advantages of the herein described systems and methods include using two-state RF generators to generate a multi-state plasma impedance, such as, for example, of four or more plasma impedance states. By generating various combinations of parameter levels of source and bias RF generators, the multi-state plasma impedance is created. The multi-state plasma impedance is used to achieve uniformity in processing a substrate and is also used for finer control during processing of the substrate.

Also, some advantages of the herein described systems and methods for multi-state pulsing include increasing a level of control of processing a substrate. By implementing four or more states of variable levels during processing of the substrate, a finer control in processing of the substrate is achieved. In addition, by controlling a state transition for transitioning between two of the variable levels, additional finer control in processing the substrate is achieved to achieve pre-determined process results.

Advantages of the herein described systems and methods for using an EtherCAT cable include achieving a quick transfer of information between various components of a plasma tool or a plasma system. Data, such as measured parameter levels during the four or more states, is quickly transferred from a processor to an EtherCAT frame. Also, data, such as parameter levels to generate the four or more states, is transferred quickly from the EtherCAT frame to the processor. The fast transfers allows for quicker data transfer when multi-state pulsing is used, thereby allowing control during processing the substrate.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 3A is an embodiment of a graph to illustrate a synchronization signal.

FIG. 3B is an embodiment of a graph to illustrate a parameter of a source RF signal versus time.

FIG. 3C is an embodiment of a graph to illustrate the parameter of a bias RF signal versus the time.

FIG. 4A is an embodiment of the graph of FIG. 3A to illustrate the synchronization signal of FIG. 3A.

FIG. 4B is an embodiment of the graph of FIG. 3B.

FIG. 4C is an embodiment of a graph to illustrate the parameter of another bias RF signal versus the time.

FIG. 5A is an embodiment of a graph to illustrate a synchronization signal.

FIG. 5B is an embodiment of a graph to illustrate a parameter of a source RF signal versus the time.

FIG. 5C is an embodiment of a graph to illustrate the parameter of a bias RF signal versus the time.

FIG. 6A is an embodiment of a graph to illustrate a synchronization signal.

FIG. 6B is an embodiment of a graph to illustrate a parameter of a source RF signal versus the time.

FIG. 6C is an embodiment of a graph to illustrate the parameter of a bias RF signal versus the time.

FIG. 10A is an embodiment of the graph of FIG. 3A to illustrate the synchronization signal of FIG. 3A.

FIG. 10O is a diagram of an embodiment to illustrate still another RF signal having four states S(n−3), S(n−2), S(n−1), and Sn to illustrate power levels of the RF signal.

FIG. 10P is a diagram of an embodiment of a method to illustrate that a power level of zero is achieved during one or more of states S(n−A) through Sn, where (n−A) is an integer less than n.

FIG. 12F is a diagram of an embodiment of a pulse shaping method.

FIG. 12G is a diagram of an embodiment of another pulse shaping method.

DETAILED DESCRIPTION

Figure 1:
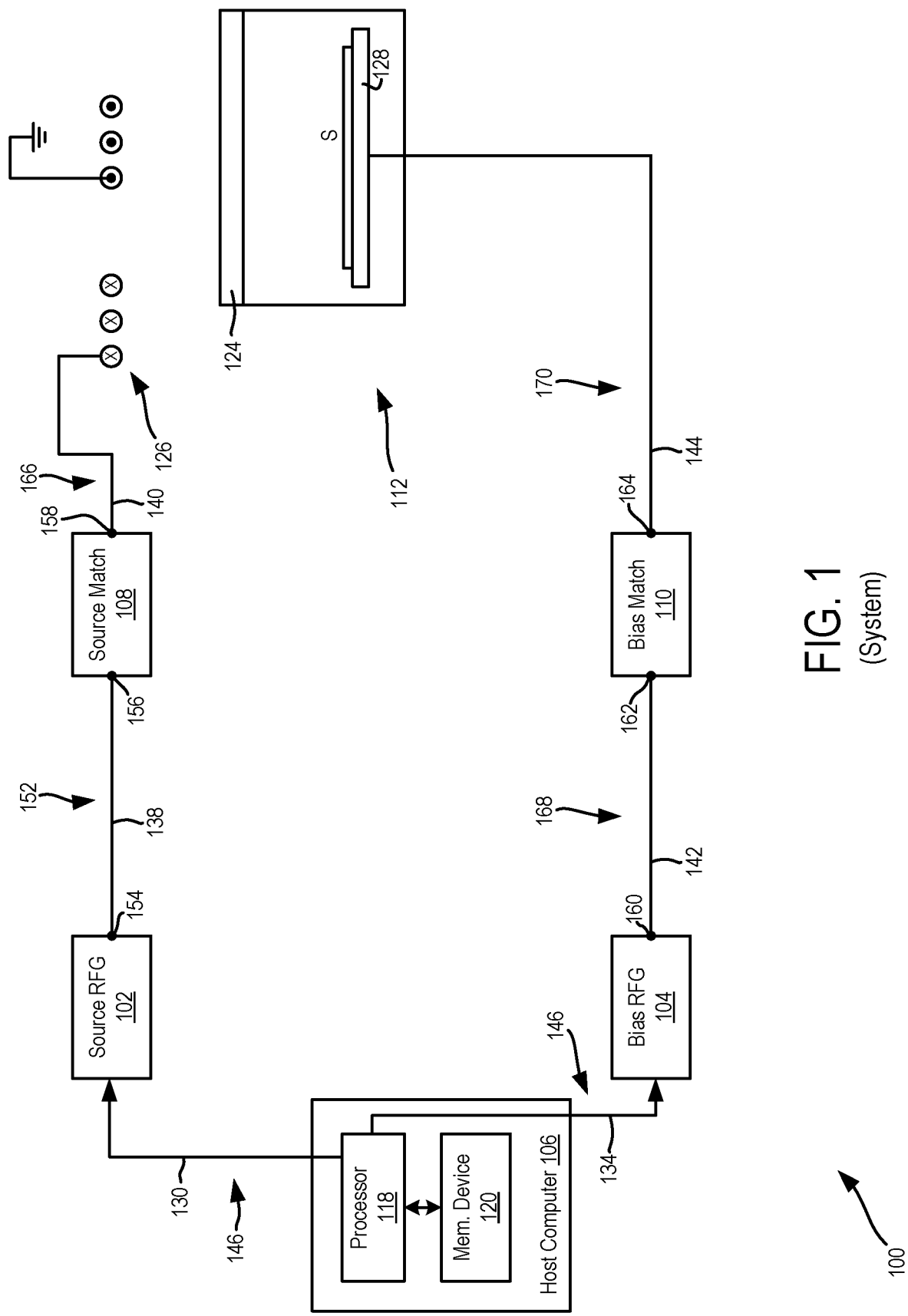
FIG. 1 is a diagram of an embodiment of a plasma system to illustrate use of a two-state radio frequency (RF) generator to generate a multi-state plasma impedance.

The following embodiments describe systems and methods for multi-level pulsing in radio frequency (RF) plasma tools. It will be apparent that the present embodiments may be practiced without some or all of these specific details. In other instances, well known process operations have not been described in detail in order not to unnecessarily obscure the present embodiments.

In a description that follows, a number of embodiments of the multi-level pulsing are provided. Two or more of the embodiments described herein can be combined to operate with each other or each of the embodiments described herein can operate independently from each other to provide a specific embodiment associated with the multi-level pulsing.

An RF generator that facilitates multi-level pulsing is described. The RF generator generates an RF signal having four or more power levels and provides the RF signal to an impedance matching circuit that is coupled to an electrode of the plasma chamber. The RF signal achieves the multi-level pulsing during a clock cycle. For example, the RF signal transitions from a first power level to a second power level, further transitions from the second power level to a third power level, and transitions from the third power level to a fourth power level during a single clock cycle. The multi-state pulsing repeats periodically for multiple clock cycles.

Each of the first, second, third, and fourth power level is a distinct power level. For example, one or more power values of the first power level are exclusive or different from one or more power values of the second power level, from one or more power values of the third power level, and from one or more power values of the fourth power level. Also, the one or more power values of the second power level are different from the one or more power values of the third power level and from the one or more power values of the fourth power level. The one or more power values of the third power level are different from the one or more power values of the fourth power level. To illustrate, a difference between the highest power value of a power level of the RF signal and the lowest power value of the power level of the RF signal is less than a pre-determined percentage. For example, a highest power value of the first power level is at most 20% greater than a lowest power value of the first power level. Similarly, a highest power value of the second power level is at most 20% greater than a lowest power value of the second power level.

In one embodiment, the same power level is applied during two or more states. For example, during a first state and a second state, one power level is applied, during a third state, a different power level is applied, and during a fourth state, yet another different power level is applied.

The multi-state pulsing is performed to achieve a balance between different phases during a processing operation, such as a deposition operation, an etching operation, a cleaning operation, and a sputtering operation. For example, the first power level and the second power level of the RF signal is used to perform a deposition phase during an etch operation and the third power level and the fourth power level of the RF signal is used to perform an etching phase during the etch operation. As another example, during each state of the multi-state pulsing, a different phase is performed. As yet another example, during one or more states of the multi-state pulsing, one phase is performed and during one or more of the remaining states of the multi-state pulsing, another phase is performed. As an example, the etching operation is a conductor etch that is performed in an inductively coupled plasma (ICP) chamber. The RF generator is coupled via an impedance matching circuit to an electrode, such as a transformer coupled plasma (TCP) electrode or a bias electrode, of the ICP plasma chamber.

The RF generator receives a digital pulse signal indicating a duty cycle, such as a duration, of each of the power levels of the RF signal to be generated by the RF generator. The distal pulse signal indicates a time period for which each of the power levels is to be supplied from the RF generator. The digital pulse signal has multiple states, such as four or more states. For example, the digital pulse signal has a first logic level during the first state, a second logic level during the second state, a third logic level during the third state, and a fourth logic level during the fourth state. Each logic level is defined by a voltage level of a voltage signal that is generated by a digital pulse source. The digital pulse source is coupled to the RF generator to provide the digital pulse signal to the RF generator. Moreover, the RF generator receives a clock signal having the multiple clock cycles to facilitate repetition of the multi-level pulsing. The clock signal is generated by the digital pulse source or a clock source that is coupled to the RF generator to provide a clock signal to the RF generator.

It should be noted that the above description of four power levels is an example. In one embodiment, the RF generator generates additional number of power levels, such as five, or six, or seven, or eight power levels during the clock cycle, and the power levels repeat for multiple clock cycles. With an increase in the number of power levels, a finer control during processing of a substrate within the plasma chamber is achieved. For example, with an increase in the number of power levels during a clock cycle, optimal etching of the substrate or optimal deposition of materials on the substrate or a combination thereof is achieved. In an embodiment, less than four power levels, such as three power levels or two power levels, are generated.

Also, the plasma chamber may be an ICP chamber. For example, the RF generator is coupled via an impedance matching circuit to an electrode, such as a TCP electrode or a bias electrode of the plasma chamber. To illustrate a multi-state, such as a multi-level, RF signal is supplied to the TCP electrode via a match while a continuous wave (CW) RF signal or a dual-state RF signal is supplied to the bias electrode via another match. As another illustration, a multi-level RF signal is supplied to the bias electrode via a match while a CW RF signal or a dual-state RF signal is supplied to the TCP electrode via another match. As yet another illustration, a multi-level RF signal is supplied to the bias electrode via a match and a multi-level RF signal is supplied to the TCP electrode via another match. The bias electrode is a lower electrode that is located within a chuck or a substrate support of the plasma chamber.

Two-State RF Generators for Generating Four or More Plasma Impedance States.

FIG. 1 is a diagram of an embodiment of a plasma system 100 to illustrate use of a two-state RF generator, such as a source radio frequency (RF) generator 102 or a bias RF generator 104, to generate plasma impedance having four or more states. The system 100 includes a host computer 106, the source RF generator 102, the bias RF generator 104, a source match 108, a bias match 110, and a plasma chamber 112.

Examples of the host computer, as used herein, include a desktop computer, a tablet, a smart phone, and a laptop computer. Examples of an RF generator, as used herein, include an RF generator that has an operating frequency of 400 kilohertz (kHz), or an operating frequency of 2 megahertz (MHz), or an operating frequency of 27 MHz, an operating frequency of 60 MHz. To illustrate, the bias RF generator 104 has an operating frequency of 2 MHz and the source RF generator 102 has an operating frequency of 60 MHz or vice versa. As another illustration, the bias RF generator 104 has an operating frequency of 400 kHz and the source RF generator 102 has an operating frequency of 60 MHz or vice versa.

Examples of a match, as used herein, include a network of components, such as inductors, capacitors, and resistors, that are coupled to each other. For example, the match includes multiple series circuits and multiple shunt circuits, and each of the series circuits includes a capacitor or an inductor or a series combination thereof, and each of the shunt circuits includes a capacitor or an inductor or a series combination thereof. It should be noted that in one embodiment, the terms match, an impedance matching circuit, and an impedance matching network are used herein interchangeably.

Examples of the plasma chamber 112 include a transformer coupled plasma (TCP) plasma chamber and an inductively coupled plasma (ICP) plasma chamber.

The host computer 106 includes a processor 118 and a memory device 120, and the processor 118 is coupled to the memory device 120. Examples of the processor, as used herein, include a central processing unit (CPU), a microcontroller, a controller, a microprocessor, an application specific integrated circuit (ASIC), and a programmable logic device (PLD). Examples of a memory device, as used herein, include a read-only memory, a random access memory, or a combination thereof. To illustrate, the memory device is a flash memory or a redundant array of independent disks.

The plasma chamber 112 includes a dielectric window 124, above which is a TCP coil 126. For example, the dielectric window 124 forms a top surface of the plasma chamber 112. The TCP coil 126 is an example of an electrode of the plasma chamber 112. The plasma chamber 112 further includes a substrate support 128, such as a chuck, on which a substrate S is placed for processing. The substrate support 128 is an example of an electrode of the plasma chamber 112. The substrate S is placed on a top surface of the substrate support 128. The substrate support 128 has embedded therein a lower electrode. As an example, the lower electrode is fabricated from a metal, such as aluminum or an alloy of aluminum.

The processor 118 is coupled to the source RF generator 102 via a transfer cable system 130. Similarly, the processor 118 is coupled to the bias RF generator 104 via a transfer cable system 134. A transfer cable system, as used herein, includes one or more transfer cables. As an example, a transfer cable, as used herein, includes a serial transfer cable for a serial transfer of data between the processor 118 and an RFG that is coupled to the processor 118. In the serial transfer of data, one bit is transferred at a time. Another example of the transfer cable includes a parallel transfer cable for a parallel transfer of data the between the processor 118 and the RFG coupled to the processor 118. In the parallel transfer of data, multiple bits are transferred simultaneously. Yet another example of the transfer cable includes a Universal Serial Bus (USB) cable.

An output 154 of the source RF generator 102 is coupled to an input 156 of the source match 108 via an RF cable 138 and an output 158 of the source match 108 is coupled to the TCP coil 126 via an RF transmission line 140. Similarly, an output 160 of the bias RF generator 104 is coupled to an input 162 of the bias match via an RF cable 142 and an output 164 of the bias match 110 is coupled to the substrate support 128 via an RF transmission line 144. An example of an RF transmission line includes an RF rod. The RF rod is surrounded by an insulator material, which is further surrounded by an RF sheath of the RF transmission line. The insulator material of the RF transmission line is between the RF rod and the RF sheath. Another example of the RF transmission line includes the RF sheath surrounding the insulator material and the RF rod and one or more RF straps that are coupled to the RF rod. Yet another example of the RF transmission line includes the RF sheath surrounding the insulator material and the RF rod, the one or more RF straps, and an RF cylinder that is coupled to the RF sheath via at least one of the one or more RF straps.

The processor 118 includes a clock source that generates and sends a synchronization signal 146, such as a digital clock signal or a digital pulsed signal, to the source RF generator 102 via the transfer cable system 130. An example of the clock source includes a phase-locked loop circuit that generates a synchronization signal having a duty cycle of 50%. Another example of the clock source includes the phase-locked loop circuit that is coupled at its output with a duty cycle control circuit to change a duty cycle of a synchronization signal from 50% to greater or less than 50%, such as 80% or 10%, to output a synchronization signal having the changed duty cycle. The clock source of the processor 118 also sends the synchronization signal 146 via the transfer cable system 134 to the bias RF generator 104.

In addition, the processor 118 sends source variables, such as a frequency of an RF signal 152 to be generated or a parameter of the RF signal 152, to the source RF generator 102 via the transfer cable system 130. Examples of a variable, as used herein, include frequency and parameter. To illustrate, the variable is frequency or power. Examples of a parameter, as used herein, include voltage and power. To illustrate, the parameter is voltage or power. Also, the processor 118 sends bias variables, such as a frequency of an RF signal 168 and a parameter of the RF signal 168, to the bias RF generator 104 via the transfer cable system 134.

The source RF generator 102, upon receiving the synchronization signal 146 and the source variables via the transfer cable system 130 generates the RF signal 152. The RF signal 152 has the source variables, such as the frequency and power or voltage, that are received from the processor 118 by the source RF generator 102. The RF signal 152 is sent from the output 154 of the source RF generator 102 via the RF cable 138 to the input 156 of the source match 108. The source match 108 receives the RF signal 152 and modifies an impedance of the RF signal 152 to match an impedance of a load that is coupled to the output 158 of the source match 108 with an impedance of a source that is coupled to the input 156 of the source match 108. The source match 108 modifies the impedance of the RF signal 152 to output a modified RF signal 166 at the output 158 of the source match 108. The modified RF signal 166 is sent from the output 158 via the RF transmission line 140 to the TCP coil 126.

Similarly, upon receiving the synchronization signal 146 and the bias variables via the transfer cable 134, the bias RF generator 104 generates the RF signal 168. The RF signal 168 has the bias variables, such as frequency and power or voltage, that are received from the processor 118 by the bias RF generator 104. The RF signal 168 is sent from the output 160 of the bias RF generator 104 via the RF cable 142 to the input 162 of the bias match 110. The bias match 110 receives the RF signal 168 and modifies an impedance of the RF signal 168 to match an impedance of a load that is coupled to the output 164 of the bias match 110 with an impedance of a source that is coupled to the input 162 of the bias match 110. The bias match 110 modifies the impedance of the RF signal 168 to output a modified RF signal 170 at the output 164 of the bias match 110. The modified RF signal 170 is sent from the output 164 via the RF rod of the RF transmission line 144 to the lower electrode embedded within the substrate support 128.

It should be noted that in one embodiment, the modified RF signal 166 has the same number of parameter levels as the RF signal 152 from which the modified RF signal 166 is generated. For example, each of the RF signals 152 and 166 has two parameter levels during a cycle of the synchronization signal 146. Also, in an embodiment, each of the RF signal 152 and the modified RF signal 166 transition at the same time from one parameter level to another. For example, when the RF signal 152 transitions from one parameter level to another, the modified RF signal 166 transitions from one parameter level to another. In one embodiment, the modified RF signal 166 has the same parameter level as that of the RF signal 152. For example, when the RF signal 152 has a first parameter level, the modified RF signal has the same first parameter level.

It should be noted that in one embodiment, the modified RF signal 170 has the same number of parameter levels as the RF signal 168 from which the modified RF signal 170 is generated. For example, each of the RF signals 168 and 170 has three parameter levels during a cycle of the synchronization signal 146. Also, in an embodiment, each of the RF signal 168 and the modified RF signal 170 transition at the same time from one parameter level to another. For example, when the RF signal 168 transitions from one parameter level to another, the modified RF signal 170 transitions from one parameter level to another. In one embodiment, the modified RF signal 170 has the same parameter level as that of the RF signal 168. For example, when the RF signal 168 has a first parameter level, the modified RF signal has the same first parameter level.

When one or more process gases, such as an oxygen containing gas, or a fluorine containing gas, or a combination thereof, is supplied to an enclosure or housing of the plasma chamber 112 in addition to the modified RF signals 166 and 170, plasma is generated or maintained within the enclosure or housing of the plasma chamber 112. The plasma is used to process the substrate S and has an impedance. For example, the plasma is used to deposit materials on the substrate S, or etch the substrate S, or sputter the substrate S, or clean the substrate S, or a combination thereof.

In one embodiment, instead of the TCP coil 126, multiple TCP coils are placed above the dielectric window 124. In an embodiment, in addition to the TCP coil 126, one or more TCP coils are placed to a side of the plasma chamber 112.

Figure 2:
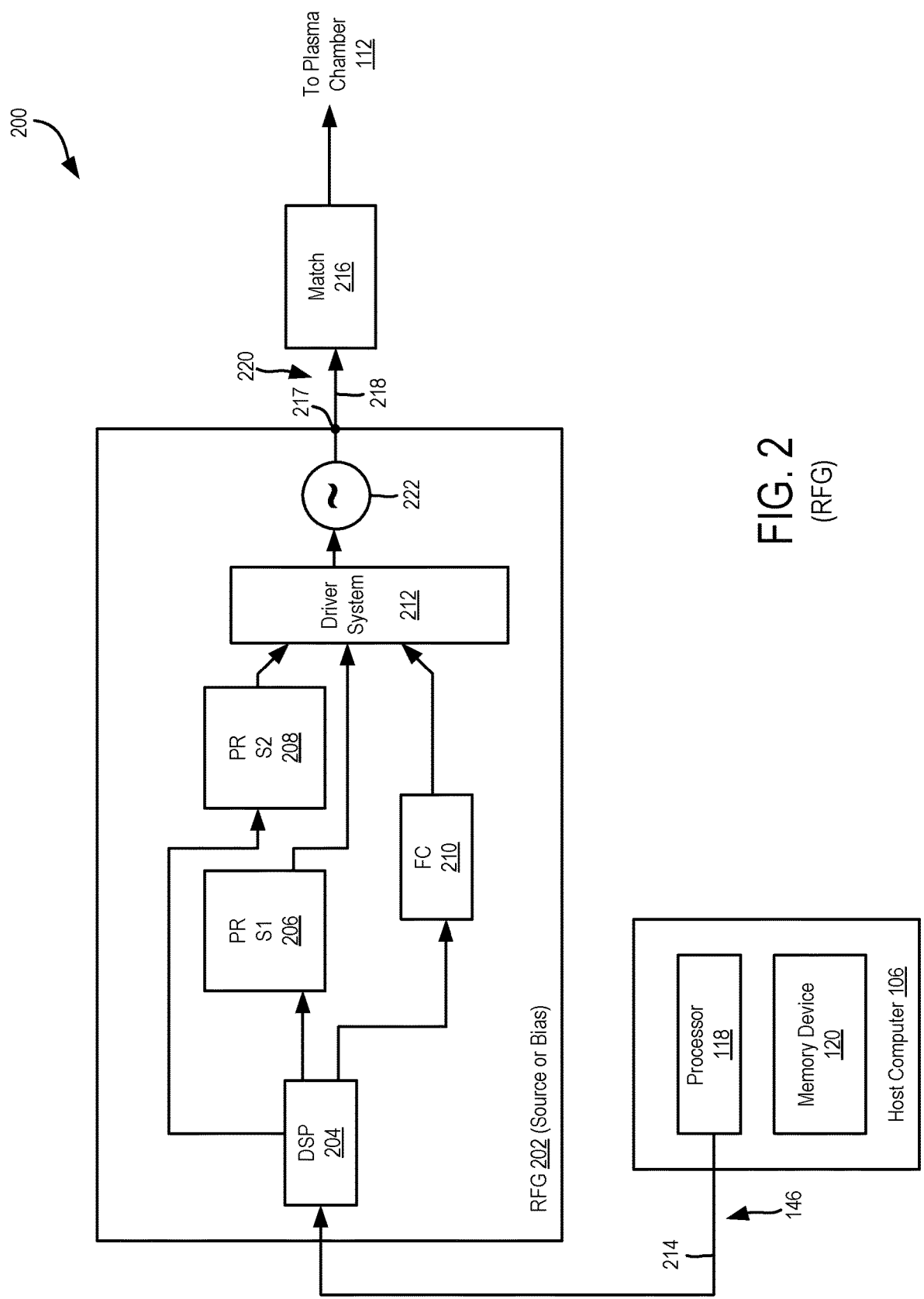
FIG. 2 is a diagram of an embodiment of a system to illustrate details of an RF generator.

FIG. 2 is a diagram of an embodiment of a system 200 to illustrate details of an RF generator 202. The system 200 includes the RF generator 202 and the host computer 106. The system 200 further includes a match 216 and an RF cable 218. The RF generator 202 is an example of the source RF generator 102 or of the bias RF generator 104 (FIG. 1). The match 216 is an example of the source match 108 or the bias match 110 (FIG. 1). The RF cable 218 is an example of the RF cable 138 or the RF cable 142 (FIG. 1), and is coupled to an output 217 of the RF power supply 222. The RF generator 202 includes a digital signal processor (DSP) 204, a power controller (PRS1) 206, a power controller (PRS2) 208, a frequency controller (FC) 210, a driver system 212, and an RF power supply 222.

Examples of a digital signal processor, as used herein, include a controller, a microprocessor, and a microcontroller, and these terms are sometimes used herein interchangeably. Examples of a parameter controller, as used herein, include a combination of a processor and a memory device. The processor of the parameter controller is coupled to the memory device of the parameter controller. Similarly, examples of a frequency controller, as used herein, include a combination of a processor and a memory device. The processor of the frequency controller is coupled to the memory device of the frequency controller. An example of a driver system, as used herein, includes a circuit having one or more drivers, such as one or more transistors that are coupled to each other. Examples of an RF power supply, as used herein, include an electronic oscillator that produces a periodic oscillating RF signal, such as a sine wave.

The processor 118 is coupled via a transfer cable system 214 to the DSP 204. The transfer cable system 214 is an example of the transfer cable system 130 or the transfer cable system 134 (FIG. 1). The digital signal processor 202 is coupled to the parameter controllers 206 and 208, and to the frequency controller 210. The parameter controllers 206 and 208 are coupled to the driver system 212, which is coupled to the RF power supply 222. Also, the frequency controller 210 is coupled to the driver system 212. The RF power supply 222 is coupled via the RF cable 218 to the match 216.

The processor 118 provides variables, such as the source variables or bias variables, and the synchronization signal 146 via the transfer cable system 214 to the DSP 204. Upon receiving the variables, the DSP 204 provides the parameter, such as a power level or a voltage level, for a state S1 of an RF signal 220 to the parameter controller 206 for storage of the parameter for the state S1 in a memory device of the parameter controller 206. As an example, a parameter level, such as a power level or a voltage level, is an envelope of an RF signal. As an illustration, the parameter level is a distinct horizontal level and is higher or lower than a distinct horizontal level of another parameter level. As another illustration, the parameter level is one or more zero-to-peak amplitudes or one or more zero-to-peak magnitudes or one or more peak-to-peak amplitudes or one or more peak-to-peak magnitudes of the RF signal. Amplitudes of the parameter level are within a pre-determined range, such as 0 to 5%, from each other and are exclusive of amplitudes of another or different parameter level. As another example, a parameter level has a maximum value and a minimum value. The maximum value is a maximum of all values of the parameter level and the minimum value is a minimum of all the values of the parameter level. A first parameter level is lower than a second parameter level when a maximum value of the first parameter level is less than a minimum value of the second parameter level and the first parameter level is higher than the second parameter level when a minimum value of the first parameter level is greater than a maximum value of the second parameter level.

Also, in response to receiving the variables, the DSP 204 provides the parameter, such as a power level or a voltage level, for a state S2 of the RF signal 220 to the parameter controller 208 for storage of the parameter for the state S1 in a memory device of the parameter controller 208. Similarly, upon receiving the variables, the DSP 204 provides a frequency level to the frequency controller 210 for storage in a memory device of the frequency controller 210.

In one embodiment, a level, such as a level of one of the variables, includes one or more values. For example, a power level includes one or more power values that are within a predetermined range from each other or a voltage level includes one or more voltage values that are within a preset range from each other. As another example, a variable level of an RF signal is one or more zero-to-peak amplitudes or one or more zero-to-peak magnitudes or one or more peak-to-peak amplitudes or one or more peak-to-peak magnitudes of the RF signal. Amplitudes of the variable level are within a pre-determined range, such as 0 to 5%, from each other and are exclusive of amplitudes of another or different variable level. As yet another example, a variable level is a distinct horizontal level and is higher or lower than a distinct horizontal level of another variable level.

In an embodiment, values of a first variable level are different from values of a second variable level. For example, values of the first variable level are exclusive of values of the second variable level. As another example, none of values of the first variable level are the same as any of the values of the second variable level.

Upon receiving the synchronization signal 146, the DSP 204 identifies cycles of the synchronization signal 146. For example, the DSP 204 determines that a cycle 1 of the synchronization signal 146 starts at a first time and ends or stops at a second time, and that a cycle 2 of the synchronization signal 146 starts at the second time and ends or stops at a third time. To illustrate, the DSP 204 determines that a logic level of the synchronization signal 146 transitions from 0 to 1 at a start time and transitions again from 0 to 1 at a stop time, and that there are no other transitions from 0 to 1 between the transitions at the start and stop times to identify a cycle of the synchronization signal 146. The DSP 204 counts each cycle to determine a number of cycles of the synchronization signal 146.

Also, upon identifying the cycles, during each cycle of the synchronization signal 146, the DSP 204 sends an instruction signal for the state S1 to the parameter controller 206. For example, the DSP 204 sends the instruction signal for the state S1 to the parameter controller 206 at a time of transition from the state S2 or the state S0 to the state S1. The instruction signal for the state S1 sent to the parameter controller 206 includes a time period for the state S1 during each cycle for which the parameter controller 206 is to provide the parameter level for the state S1 to the driver system 212. Upon receiving the instruction signal for the state S1, the parameter controller 206 accesses the parameter level for the state S1 from the memory device of the parameter controller 206 and sends the parameter level to the driver system 212 for the time period for the state S1. For example, the parameter controller 206 sends the parameter level for the state S1 to the driver system 212 at the time of transition from the state S2 or the state S0 to the state S1. After the time period for the state S1, during a cycle of the synchronization signal 146, the parameter controller 206 does not send the parameter level for the state S1 to the driver system 212.

Similarly, upon receiving the synchronization signal 146, during each cycle of the synchronization signal 146, the DSP 204 sends an instruction signal for the state S2 to the parameter controller 208. For example, the DSP 204 sends the instruction signal for the state S2 to the parameter controller 208 at a time of transition from the state S1 or the state S0 to the state S2. The instruction signal for the state S2 sent to the parameter controller 208 includes a time period for the state S2 during each cycle for which the parameter controller 208 is to provide the parameter level for the state S2 to the driver system 212. Upon receiving the instruction signal for the state S2, the parameter controller 208 accesses the parameter level for the state S2 from the memory device of the parameter controller 208 and sends the parameter level to the driver system 212 for the time period for the state S2. For example, the parameter controller 206 sends the parameter level for the state S2 to the driver system 212 at the time of transition from the state S1 or the state S0 to the state S2. After the time period for the state S2, during a cycle of the synchronization signal 146, the parameter controller 208 does not send the parameter level for the state S2 to the driver system 212.

Also, upon receiving the synchronization signal 146, during each cycle of the synchronization signal 146, the DSP 204 sends an instruction signal to the frequency controller 210. Upon receiving the instruction signal, the frequency controller 210 accesses the frequency level from the memory device of the frequency controller 210 and sends the frequency level to the driver system 212.

In response to receiving the parameter level for the state S1 and the frequency level, the driver system 212 generates a drive signal for the state S1 for the time period for the state S1 and sends the drive signal to the RF power supply 222. For example, upon receiving the parameter level for the state S1 and the frequency level at the time of transition from the state S2 or the state S0 to the state S1, the driver system 212 generates the drive signal for the state S1 for the time period for the state S1 and sends the drive signal to the RF power supply 222. The RF power supply 222 generates the state S1 of the RF signal 220 upon receiving the drive signal for the state S1 from the driver system 212. For example, upon receiving the drive signal for the state S1 from the driver system 212, the RF power supply 222 transitions the RF signal 220 from the state S0 or the state S2 to the state S1. The state S1 of the RF signal 220 has the parameter level for the state S1 and the frequency level during the time period for the state S1.

Similarly, in response to receiving the frequency level and the parameter level for the state S2, the driver system 212 generates a drive signal for the state S2 for the time period for the state S2 and sends the drive signal to the RF power supply 222. For example, upon receiving the parameter level for the state S2 and the frequency level at the time of transition from the state S1 or the state S0 to the state S2, the driver system 212 generates the drive signal for the state S2 for the time period for the state S2 and sends the drive signal to the RF power supply 222. The RF power supply 222 generates the state S2 of the RF signal 220 upon receiving the drive signal for the state S2 from the driver system 212. For example, upon receiving the drive signal for the state S2 from the driver system 212, the RF power supply 222 transitions the RF signal 220 from the state S0 or the state S1 to the state S2. The state S2 of the RF signal 220 has the parameter level for the state S2 and the frequency level during the time period for the state S2.

Also, in one embodiment, during each cycle of the synchronization signal 146, there is a time period for which the RF signal 220 has a parameter level of zero. The RF signal 220 has the parameter level of zero during a no-state (NS), such as a state S0. As an example, a parameter level of an RF signal, described herein, is zero when the parameter level is close to zero or substantially zero. To illustrate, the parameter level is zero when the parameter level is less than a pre-determined value. An example of the pre-determined value of the parameter level is 1 watt. Another example of the pre-determined value of the parameter level is 0.25 watts. Yet another example of the pre-determined value of the parameter level is 0.5 watts. Upon receiving the synchronization signal 146, during each cycle of the synchronization signal 146, the DSP 204 does not send the instruction signals for the states S1 and S2 to the parameter controllers 206 and 208 during a time period for the no-state.

During the time period for the no-state for which the instruction signals for the states S1 and S2 are not received, the parameter controllers 206 and 208 do not send or stop sending the parameter levels for the states S1 and S2 to the driver system 212. For example, after the time period for the state S1, the parameter controller 206 does not send the parameter level for the state S1 to the driver system 212. As another example, after the time period for the state S2, the parameter controller 208 does not send the parameter level for the state S2 to the driver system 212.

When the parameter levels for the states S1 and S2 are not received, the driver system 212 does not send a drive signal to the RF power supply 222. When the drive signal is not received during the time period for the no-state, the RF power supply 222 generates the RF signal 220 having the parameter level of zero during the no-state. For example, when the drive signal is not received, the power supply 222 transitions the RF signal 220 from the state S1 or the state S2 to the no-state S0.

In one embodiment, instead of the parameter controller 206, the parameter controller 208, and the frequency controller 210, one or more controllers, such as one or more processors, are used to perform the functions described herein as being performed by the parameter controllers 206 and 208, and the frequency controller 210. Each of the one or more controllers includes a processor and a memory device, and the processor is coupled to the memory device.

In an embodiment, instead of the DSP 204, the parameter controller 206, the parameter controller 208, and the frequency controller 210, one or more controllers, such as one or more processors, are used to perform the functions described herein as being performed by the DSP 204, the parameter controllers 206 and 208, and the frequency controller 210. Each of the one or more controllers includes a processor and a memory device, and the processor is coupled to the memory device.

FIG. 3A is an embodiment of a graph 300 to illustrate a synchronization signal 302. The graph 300 plots a logic level of the synchronization signal 302 versus time t. The synchronization signal 302 is an example of the synchronization signal 146 (FIG. 1). The logic level of the synchronization signal 302 is plotted on a y-axis and the time t is plotted on an x-axis. A logic level, as used herein, ranges from 0 to 1, with the logic level 0 corresponding to 0 volts (V) direct current (DC) and the logic level 1 corresponding 5 volts DC. A synchronization signal, as used herein, is a digital pulsed signal, such as a square wave, having the logic levels 1 and 0.

The synchronization signal 302 has a duty cycle of 50%. For example, the synchronization signal 302 has the logic level of 1 from a time t0 to a time t5. The synchronization signal 302 has the logic level of 0 from the time t5 to a time t10, and has the logic level of 1 from the time t10 to a time t15, and has the logic level of 0 from the time t15 to a time t20.

A time interval between the times t0 and t20 is divided into equal time intervals. For example, the time interval between the times t0 and t20 is divided into a first time interval between the time t0 and a time t1, a second time interval between the time t1 and a time t2, a third time interval between the time t2 and a time t3, a fourth time interval between the time t3 and a time t4, a fifth time interval between the time t4 and the time t5, a six time interval between the time t5 and a time t6, a seventh time interval between the time t6 and a time t7, an eighth time interval between the time t7 and a time t8, a ninth time interval between the time t8 and a time t9, a tenth time interval between the time t9 and the time t10, an eleventh time interval between the time t10 and a time t11, a twelfth time interval between the time t11 and a time t12, a thirteenth time interval between the time t12 and a time t13, a fourteenth time interval between the time t13 and a time t14, a fifteenth time interval between the time t14 and the time t15, a sixteenth time interval between the time t15 and a time t16, a seventeenth time interval between the time t16 and a time t17, an eighteenth time interval between the time t17 and a time t18, a nineteenth time interval between the time t18 and a time t19, and a twentieth time interval between the time t19 and the time t20. Each of the first through twentieth time interval is equal or the same.

The synchronization signal 302 has multiple cycles, such as the cycle 1 and the cycle 2, and repeat the logic level 1 and 0 during each cycle. For example, the synchronization signal 302 transitions from the logic level 1 to the logic level 0 at the time t5 during the cycle 1 and transitions from the logic level 1 to the logic level 0 at the time t15 during the cycle 2. As another example, at the time t0 of the cycle 1, the synchronization signal 302 transitions from the logic level 0 of a cycle 0 to the logic level 1 of the cycle 1. The cycle 0 is of the synchronization signal 302 and precedes the cycle 1 of the synchronization signal 302. Similarly, at the time t10 of the cycle 1, the synchronization signal 302 transitions from the logic level 0 of the cycle 1 to the logic level 1 of the cycle 2. The times t0 through t10 occur during the cycle 1 of a synchronization signal, described herein, and the times t10 through t20 occur during the cycle 2 of the synchronization signal. The cycle 1 starts at the time t0 and ends at the time t10, and the cycle 2 starts at the time t10 and ends at the time t20.

Each cycle of a synchronization signal, described herein, repeats periodically. For example, the cycle 2 of the synchronization signal follows and is consecutive to the cycle 1 of the synchronization signal and the cycle 2 of the synchronization signal follows and is consecutive to the cycle 0 of the synchronization signal.

FIG. 3B is an embodiment of a graph 304 to illustrate a parameter 306 of the RF signal 152, which is a source RF signal, versus the time t. The parameter 306 is plotted on a y-axis and the time t is plotted on an x-axis.

The parameter 306 periodically transitions between parameter levels PR1 and PR2 in synchronization with the synchronization signal 302. For example, the parameter 306 transitions between the parameter levels PR1 and PR2 during the cycle 1 of the synchronization signal 302 and again transitions between the parameter levels PR1 and PR2 during the cycle 2 of the synchronization signal 302. To illustrate, the parameter 306 has the parameter level PR1 during an instance of the state S1 from the time t0 to the time t5, the parameter level PR2 during an instance of the state S2 from the time t5 to the time t10, the parameter level PR1 during another instance of the state S1 from the time t10 to the time t15, and the parameter level PR2 during another instance of the state S2 from the time t15 to the time t20. During the cycle 1 of the synchronization signal 302, the parameter 306 transitions from the parameter level PR2 to the parameter level PR1 at the time t0 and transitions from the parameter level PR1 to the parameter level PR2 at the time t5. During the cycle 2 of the synchronization signal 302, the parameter 306 again transitions from the parameter level PR2 to the parameter level PR1 at the time t10 and transitions from the parameter level PR1 to the parameter level PR2 at the time t15. The parameter level PR1 is an example of the parameter level for the state S1 of the RF signal 152 and the parameter level PR2 is an example of the parameter level for the state S2 of the RF signal 152.

The parameter level PR1 is less than the parameter level PR2. For example, power values of the parameter level PR1 are lower than power values of the parameter level PR2. As another example, none of the power value of the parameter level PR1 are greater than the power values of the parameter level PR2. The parameter level PR1 is greater than zero.

In one embodiment, a transition time, which is a time of transition between two parameter levels, is a time period between two times. For example, instead of transitioning at the time t5 from the power level PR1 to the power level PR2, the parameter 306 starts its transition at a first time from the parameter level PR1 and ends its transition to the parameter level PR2 at a second time. The first time is before the time t5 and between the times t2 and t5 and the second time is after the time t5 and between the times t5 and t8. The time period of transition is the transition time between the first time and the second time.

In an embodiment, instead of transitioning between PR1 and PR2 parameter levels, the parameter 306 transitions between 0 and PR2 parameter levels or between 0 and PR1 parameter levels.

In one embodiment, in addition to the synchronization signal 302, a digital pulsed signal is received by the DSP 204 from the processor 118 via the transfer cable system 214. For example, the synchronization signal 302 is received via a first transfer cable of the transfer cable system 214 and the digital pulsed signal is received via a second transfer cable of the transfer cable system 214. The digital pulsed signal periodically transitions between two logic levels in the same manner in which the parameter 306 transitions between the parameter levels PR1 and PR2. For example, during the cycle 1 of the synchronization signal 302, the digital pulsed signal transitions at the time t0 from the logic level 1 to the logic level 0 and transitions at the time t5 from the logic level 0 to the logic level 1. During the cycle 2 of the synchronization signal 302, the digital pulsed signal transitions at the time t10 from the logic level 1 to the logic level 0 and transitions at the time t15 from the logic level 0 to the logic level 1. Upon receiving the digital pulsed signal, the DSP 204 identifies, from the digital pulsed signal, the time periods for the states S1 and S2 of the parameter 306, and generates the instruction signals having the time periods. For example, the time period for the state S1 of the parameter 306 is the same as a time period for the logic level 1 of the digital pulsed signal and the time period for the state S2 of the parameter 306 is the same as a time period for the logic level 2 of the digital pulsed signal.

FIG. 3C is an embodiment of a graph 308 to illustrate a parameter 310 of the RF signal 168 (FIG. 1), which is a bias RF signal, versus the time t. The parameter 310 is plotted on a y-axis and the time t is plotted on an x-axis. The parameter 310 periodically transitions among parameter levels 0, PR1, and PR2 in synchronization with the synchronization signal 302. For example, the parameter 310 transitions among the parameter levels 0, PR2, and PR1 during the cycle 1 of the synchronization signal 302 and again transitions among the parameter levels 0, PR2, and PR1 during the cycle 2 of the synchronization signal 302. To illustrate, the parameter 306 has the parameter level 0 during an instance of the state S0 from the time t0 to the time t2, the parameter level PR2 during an instance of the state S1 from the time t2 to the time t8, the parameter level PR1 during an instance of the state S2 from the time t8 to the time t10. The parameter levels of 0, PR2, and PR1 repeat during the cycle 2 of the synchronization signal 302. During the cycle 1 of the synchronization signal 402, the parameter 310 transitions from the parameter level PR1 to the parameter level 0 at the time t0, transitions from the parameter level 0 to the parameter level PR2 at the time t2, transitions from the parameter level PR2 to the parameter level PR1 at the time t8, and transitions from the parameter level PR1 to the parameter level 0 at the time t10. During the cycle 2 of the synchronization signal 302, the parameter 310 again transitions from the parameter level PR1 to the parameter level 0 at the time t10, transitions from the parameter level 0 to the parameter level PR2 at the time t12, transitions from the parameter level PR2 to the parameter level PR1 at the time t18, and transitions from the parameter level PR1 to the parameter level 0 at the time t20.

The parameter level 0 is an example of the parameter level for the state S0 of the RF signal 168, the parameter level PR1 is an example of the parameter level for the state S1 of the RF signal 168, and the parameter level PR2 is an example of the parameter level of the state S2 of the RF signal 168.

When a combination of parameter levels of the parameters 306 and 310 during a first time period is different from a combination of parameter levels of the parameters 306 and 310 during a second time period, a plasma impedance state for the first time period is different from a plasma impedance state for the second time period. For example, the parameter level of the parameter 306 of the source RF signal is PR1 during a time period between the times t0 and t2 and the parameter level of the parameter 310 of the bias RF signal is 0 during a time period between the times t0 and t2 to define a state PS1 of impedance of plasma within the plasma chamber 112 (FIG. 1). The state of impedance of plasma within the plasma chamber 112 is sometimes referred to herein as a plasma impedance state (PS). The parameter level of the parameter 306 of the source RF signal is PR1 during a time period between the times t2 and t5 and the parameter level of the parameter 310 of the bias RF signal is PR2 during a time period between the times t2 and t5 to define another plasma impedance state PS2.

As another example, the parameter level of the parameter 306 of the source RF signal is PR2 during a time period between the times t5 and t8 and the parameter level of the parameter 310 of the bias RF signal is PR2 during a time period between the times t5 and t8 to define another plasma impedance state PS3, which is different from each of the plasma impedance states PS1 and PS2.

As yet another example, the parameter level of the parameter 306 of the source RF signal is PR2 during a time period between the times t8 and t10 and the parameter level of the parameter 310 of the bias RF signal is PR1 during a time period between the times t8 and t10 to define another plasma impedance state PS4, which is different from each of the plasma impedance states PS1, PS2 and PS3. As such, during each cycle of the synchronization signal 302, due to a change in parameter levels of the bias and source RF signals, multiple plasma impedance states, such as the four plasma impedance states PS1 through PS4 are created. An impedance of the plasma within the plasma chamber 112 (FIG. 1) having the multiple plasma impedance states PS1 through PS4 is an example of multi-state plasma impedance.

In one embodiment, the parameter 306 is of the RF signal 168 and the parameter 310 is of the RF signal 152.

In one embodiment, in addition to the synchronization signal 302, a digital pulsed signal is received by the DSP 204 from the processor 118 via the transfer cable system 214. For example, the synchronization signal 302 is received via the first transfer cable of the transfer cable system 214 and the digital pulsed signal is received via the second transfer cable of the transfer cable system 214. The digital pulsed signal periodically transitions among three logic levels in the same manner in which the parameter 310 transitions among the parameter levels 0, PR2, and PR1. For example, during the cycle 1 of the synchronization signal 302, the digital pulsed signal transitions at the time t0 from the logic level 1 to the logic level 0, transitions at the time t2 from the logic level 0 to a logic level 2, and transitions at the time t8 from the logic level 2 to the logic level 1. The logic level 2 is greater than the logic level 1. To illustrate, the logic level 1 has a higher DC voltage than the logic level 1. During the cycle 2 of the synchronization signal 302, the digital pulsed signal transitions at the time t10 from the logic level 1 to the logic level 0, transitions at the time t12 from the logic level 0 to the logic level 2, and transitions at the time t18 from the logic level 2 to the logic level 1. Upon receiving the digital pulsed signal, the DSP 204 identifies, from the digital pulsed signal, the time periods for the states S0, S2, and S1 of the parameter 310, and generates the instruction signals having the time periods. For example, the time period for the state S0 of the parameter 310 is the same as a time period for the logic level 0 of the digital pulsed signal, the time period for the state S1 of the parameter 310 is the same as a time period for the logic level 1 of the digital pulsed signal, and the time period for the state S2 of the parameter 310 is the same as a time period for the logic level 2 of the digital pulsed signal.

FIG. 4A is the embodiment of the graph 300.

FIG. 4B is the embodiment of the graph 304.

FIG. 4C is an embodiment of a graph 400 to illustrate a parameter 402 of the RF signal 168 (FIG. 1), which is the bias RF signal, versus the time t. The parameter 402 is plotted on a y-axis and the time t is plotted on an x-axis. The parameter 402 periodically transitions among the parameter levels 0, PR2, and PR1 in synchronization with the synchronization signal 302. For example, the parameter 402 transitions among the parameter levels 0, PR2, and PR1 during the cycle 1 of the synchronization signal 302 and again transitions among the parameter levels 0, PR2, and PR1 during the cycle 2 of the synchronization signal 302. To illustrate, the parameter 402 has the parameter level 0 during an instance of the state S0 from the time t0 to the time t2, the parameter level PR2 during an instance of the state S1 from the time t2 to the time t8, the parameter level PR1 during an instance of the state S2 from the time t8 to the time t9, and the parameter level 0 during another instance of the state S0 from the time t9 to the time t10. The parameter levels of 0, PR2, and PR1 repeat during the cycle 2 of the synchronization signal 302. During the cycle 1 of the synchronization signal 310, the parameter 402 transitions from the parameter level 0 to the parameter level PR2 at the time t2, transitions from the parameter level PR2 to the parameter level PR1 at the time t8, and transitions from the parameter level PR1 to the parameter level 0 at the time t9. During the cycle 2 of the synchronization signal 310, the parameter 402 again transitions from the parameter level 0 to the parameter level PR2 at the time t12, transitions from the parameter level PR2 to the parameter level PR1 at the time t18, and transitions from the parameter level PR1 to the parameter level 0 at the time t19.

When a combination of parameter levels of the parameters 306 and 402 during a first time period is different from a combination of parameter levels of the parameters 306 and 402 during a second time period, a plasma impedance state for the first time period is different from a plasma impedance state for the second time period. For example, the parameter level of the parameter 306 of the source RF signal is PR1 during a time period between the times t0 and t2 and the parameter level of the parameter 402 of the bias RF signal is 0 during a time period between the times t0 and t2 to define a plasma impedance state PS1. The parameter level of the parameter 306 of the source RF signal is PR1 during a time period between the times t2 and t5 and the parameter level of the parameter 402 of the bias RF signal is PR2 during a time period between the times t2 and t5 to define another plasma impedance state PS2.

As another example, the parameter level of the parameter 306 of the source RF signal is PR2 during a time period between the times t5 and t8 and the parameter level of the parameter 402 of the bias RF signal is PR2 during a time period between the times t5 and t8 to define another plasma impedance state PS3, which is different from each of the plasma impedance states PS1 and PS2.

As yet another example, the parameter level of the parameter 306 of the source RF signal is PR2 during a time period between the times t8 and t9 and the parameter level of the parameter 402 of the bias RF signal is PR1 during a time period between the times t8 and t9 to define another plasma impedance state PS4, which is different from each of the plasma impedance states PS1, PS2 and PS3.

As another example, the parameter level of the parameter 306 of the source RF signal is PR2 during a time period between the times t9 and t10 and the parameter level of the parameter 402 of the bias RF signal is 0 during a time period between the times t9 and t10 to define another plasma impedance state PS5, which is different from each of the plasma impedance states PS1, PS2, PS3, and PS4.

As such, during each cycle of the synchronization signal 302, due to a change in parameter levels of the bias and source RF signals, multiple plasma impedance states, such as the five plasma impedance states PS1 through PS5 are created. An impedance of the plasma within the plasma chamber 112 (FIG. 1) having the multiple plasma impedance states PS1 through PS5 is an example of multi-state plasma impedance.

In one embodiment, the parameter 306 is of the RF signal 168 and the parameter 402 is of the RF signal 152.

In one embodiment, in addition to the synchronization signal 310, a digital pulsed signal is received by the DSP 204 from the processor 118 via the transfer cable system 214. For example, the synchronization signal 302 is received via the first transfer cable of the transfer cable system 214 and the digital pulsed signal is received via the second transfer cable of the transfer cable system 214. The digital pulsed signal periodically transitions among three logic levels in the same manner in which the parameter 402 transitions among the parameter levels 0, PR2, and PR1. For example, during the cycle 1 of the synchronization signal 302, the digital pulsed signal transitions at the time t2 from the logic level 0 to the logic level 2, transitions at the time t8 from the logic level 2 to the logic level 1, and transitions at the time t9 from the logic level 1 to the logic level 0. During the cycle 2 of the synchronization signal 302, the digital pulsed signal transitions at the time t12 from the logic level 0 to the logic level 2, transitions at the time t18 from the logic level 2 to the logic level 1, and transitions at the time t19 from the logic level 1 to the logic level 0. Upon receiving the digital pulsed signal, the DSP 204 identifies, from the digital pulsed signal, the time periods for the states S0, S2, and S1 of the parameter 402, and generates the instruction signals having the time periods. For example, the time period for the state S0 of the parameter 402 is the same as a time period for the logic level 0 of the digital pulsed signal, the time period for the state S1 of the parameter 402 is the same as a time period for the logic level 1 of the digital pulsed signal, and the time period for the state S2 of the parameter 402 is the same as a time period for the logic level 2 of the digital pulsed signal.

FIG. 5A is an embodiment of a graph 500 to illustrate a synchronization signal 502. The graph 500 plots a logic level of the synchronization signal 502 versus the time t. The synchronization signal 502 is an example of the synchronization signal 146 (FIG. 1). The logic level of the synchronization signal 502 is plotted on a y-axis and the time t is plotted on an x-axis.

The synchronization signal 502 has a duty cycle of 70%. For example, the synchronization signal 502 has the logic level of 1 from the time t0 to the time t7. The synchronization signal 302 has the logic level of 0 from the time t7 to the time t10, has the logic level of 1 from the time t10 to a time t17, and has the logic level of 0 from the time t17 the time t20.

The synchronization signal 502 has multiple cycles and repeat the logic level 1 and 0 during each cycle. For example, the synchronization signal 502 transitions from the logic level 1 to the logic level 0 at the time t7 during a cycle 1 and transitions from the logic level 1 to the logic level 0 at the time t17 during a cycle 2. As another example, at the time t0 of the cycle 1, the synchronization signal 502 transitions from the logic level 0 of a cycle 0 of the synchronization signal 502 to the logic level 1 of the cycle 1. Similarly, at the time t10 of the cycle 1, the synchronization signal 502 transitions from the logic level 0 of the cycle 1 to the logic level 1 of the cycle 2. The cycle 0 of the synchronization signal 502 precedes the cycle 1 of the synchronization signal 502, and the cycle 1 of the synchronization signal 502 precedes the cycle 2 of the synchronization signal 502.

In one embodiment, the synchronization signal 502 has another duty cycle, such as a 50% duty cycle or a 60% duty cycle, instead of the 70% duty cycle.

FIG. 5B is an embodiment of a graph 504 to illustrate a parameter 506 of the RF signal 152, which is the source RF signal, versus the time t. The parameter 506 is plotted on a y-axis and the time t is plotted on an x-axis.

The parameter 506 periodically transitions between parameter levels 0, PR1 and PR2 in synchronization with the synchronization signal 502. For example, the parameter 506 transitions among the parameter levels 0, PR2 and PR1 during the cycle 1 of the synchronization signal 502 and again transitions among the parameter levels 0, PR2 and PR1 during the cycle 2 of the synchronization signal 502. To illustrate, the parameter 506 has the parameter level 0 during an instance of the state S0 from the time t0 to the time t3, the parameter level PR2 during the state S1 from the time t3 to the time t8, the parameter level PR1 during the state S2 from the time t8 to the time t9, and the parameter level 0 during another instance of the state S0 from the time t9 to the time t10. The parameter 506 repeats a sequence of occurrence of the states S0, S2, S1, and S0 during the cycle 2 of the synchronization signal 502. During the cycle 1 of the synchronization signal 502, the parameter 506 transitions from the parameter level 0 to the parameter level PR2 at the time t3, transitions from the parameter level PR2 to the parameter level PR1 at the time t8, and transitions from the parameter level PR1 to the parameter level 0 at the time t9. The parameter 506 repeats the transitions among the parameter levels 0, PR2, and PR1 during the cycle 2 of the synchronization signal 502.

In one embodiment, in addition to the synchronization signal 502, a digital pulsed signal is received by the DSP 204 from the processor 118 via the transfer cable system 214. For example, the synchronization signal 502 is received via the first transfer cable of the transfer cable system 214 and the digital pulsed signal is received via the second transfer cable of the transfer cable system 214. The digital pulsed signal periodically transitions among three logic levels in the same manner in which the parameter 506 transitions among the parameter levels 0, PR2, and PR1. For example, during the cycle 1 of the synchronization signal 502, the digital pulsed signal transitions at the time t3 from the logic level 0 to the logic level 2, transitions at the time t8 from the logic level 2 to the logic level 1, transitions at the time t9 from the logic level 1 to the logic level 0. During the cycle 2 of the synchronization signal 502, the digital pulsed signal transitions at the time t13 from the logic level 0 to the logic level 2, transitions at the time t18 from the logic level 2 to the logic level 1, and transitions at the time t19 from the logic level 1 to the logic level 0. Upon receiving the digital pulsed signal, the DSP 204 identifies, from the digital pulsed signal, the time periods for the states S0, S2, and S1 of the parameter 502, and generates the instruction signals having the time periods. For example, the time period for the state S0 of the parameter 506 is the same as a time period for the logic level 0 of the digital pulsed signal, the time period for the state S2 of the parameter 506 is the same as a time period for the logic level 2 of the digital pulsed signal, and the time period for the state S1 of the parameter 506 is the same as a time period for the logic level 1 of the digital pulsed signal.

FIG. 5C is an embodiment of a graph 508 to illustrate a parameter 510 of the RF signal 168 (FIG. 1), which is the bias RF signal, versus the time t. The parameter 510 is plotted on a y-axis and the time t is plotted on an x-axis. The parameter 510 periodically transitions among the parameter levels PR1, PR2, and 0 in synchronization with the synchronization signal 502. For example, the parameter 510 transitions among the parameter levels PR1, PR2, and 0 during the cycle 1 of the synchronization signal 502 and again transitions among the parameter levels PR1, PR2, and 0 during the cycle 2 of the synchronization signal 502. To illustrate, the parameter 510 has the parameter level PR1 during an instance of the state S1 from the time t0 to the time t2, the parameter level PR2 during the state S2 from the time t2 to the time t5, the parameter level PR1 during another instance of the state S1 from the time t5 to the time t9, and the parameter level 0 during the state S0 from the time t9 to the time t10. The parameter levels of PR1, PR2, and 0 repeat during the cycle 2 of the synchronization signal 502. During the cycle 1 of the synchronization signal 502, the parameter 510 transitions from the parameter level 0 to the parameter level PR1 at the time t0, transitions from the parameter level PR1 to the parameter level PR2 at the time t2, transitions from the parameter level PR2 to the parameter level PR1 at the time t5, and transitions from the parameter level PR1 to the parameter level 0 at the time t9. During the cycle 2 of the synchronization signal 502, the parameter 510 again transitions from the parameter level 0 to the parameter level PR1 at the time t10, transitions from the parameter level PR1 to the parameter level PR2 at the time t12, transitions from the parameter level PR2 to the parameter level PR1 at the time t15, and transitions from the parameter level PR1 to the parameter level 0 at the time t19.

When a combination of parameter levels of the parameters 506 and 510 during a first time period is different from a combination of parameter levels of the parameters 506 and 510 during a second time period, a plasma impedance state for the first time period is different from a plasma impedance state for the second time period. For example, the parameter level of the parameter 506 of the source RF signal is 0 during a time period between the times t0 and t2 and the parameter level of the parameter 510 of the bias RF signal is PR1 during a time period between the times t0 and t2 to define a plasma impedance state PS1. The parameter level of the parameter 506 of the source RF signal is 0 during a time period between the times t2 and t3 and the parameter level of the parameter 510 of the bias RF signal is PR2 during a time period between the times t2 and t3 to define another plasma impedance state PS2.

As another example, the parameter level of the parameter 506 of the source RF signal is PR2 during a time period between the times t3 and t5 and the parameter level of the parameter 510 of the bias RF signal is PR2 during a time period between the times t3 and t5 to define another plasma impedance state PS1, which is different from each of the plasma impedance states PS1 and PS2. As yet another example, the parameter level of the parameter 506 of the source RF signal is PR2 during a time period between the times t5 and t8 and the parameter level of the parameter 510 of the bias RF signal is PR1 during a time period between the times t5 and t8 to define another plasma impedance state PS4, which is different from each of the plasma impedance states PS1, PS2 and PS3.

As another example, the parameter level of the parameter 506 of the source RF signal is PR1 during a time period between the times t8 and t9 and the parameter level of the parameter 510 of the bias RF signal is PR1 during a time period between the times t8 and t9 to define another plasma impedance state PS5, which is different from each of the plasma impedance states PS1, PS2, PS3, and PS4. As yet another example, the parameter level of the parameter 506 of the source RF signal is 0 during a time period between the times t9 and t10 and the parameter level of the parameter 510 of the bias RF signal is 0 during a time period between the times t9 and t10 to define another plasma impedance state PS6, which is different from each of the plasma impedance states PS1, PS2, PS3, PS4, and PS5. As such, during each cycle of the synchronization signal 502, due to a change in parameter levels of the bias and source RF signals, multiple plasma impedance states, such as the six plasma impedance states PS1 through PS6 are created. An impedance of the plasma within the plasma chamber 112 (FIG. 1) having the multiple plasma impedance states PS1 through PS6 is an example of multi-state plasma impedance.

In one embodiment, the parameter 506 is of the RF signal 168 and the parameter 510 is of the RF signal 152.

In one embodiment, in addition to the synchronization signal 502, a digital pulsed signal is received by the DSP 204 from the processor 118 via the transfer cable system 214. For example, the synchronization signal 502 is received via the first transfer cable of the transfer cable system 214 and the digital pulsed signal is received via the second transfer cable of the transfer cable system 214. The digital pulsed signal periodically transitions among three logic levels in the same manner in which the parameter 510 transitions among the parameter levels 0, PR1, and PR2. For example, during the cycle 1 of the synchronization signal 502, the digital pulsed signal transitions at the time t0 from the logic level 0 to the logic level 1, transitions at the time t2 from the logic level 1 to the logic level 2, transitions at the time t5 from the logic level 2 to the logic level 1, and transitions at the time t9 from the logic level 1 to the logic level 0. During the cycle 2 of the synchronization signal 502, the digital pulsed signal transitions at the time t10 from the logic level 0 to the logic level 1, transitions at the time t12 from the logic level 1 to the logic level 2, transitions at the time t15 from the logic level 2 to the logic level 1, and transitions at the time t19 from the logic level 1 to the logic level 0. Upon receiving the digital pulsed signal, the DSP 204 identifies, from the digital pulsed signal, the time periods for the states S0, S1, and S2 of the parameter 510, and generates the instruction signals having the time periods. For example, the time period for the state S0 of the parameter 510 is the same as a time period for the logic level 0 of the digital pulsed signal, the time period for the state S2 of the parameter 510 is the same as a time period for the logic level 2 of the digital pulsed signal, and the time period for the state S1 of the parameter 510 is the same as a time period for the logic level 1 of the digital pulsed signal.

FIG. 6A is an embodiment of a graph 600 to illustrate a synchronization signal 602. The graph 600 plots a logic level of the synchronization signal 602 versus the time t. The synchronization signal 602 is an example of the synchronization signal 146 (FIG. 1). The logic level of the synchronization signal 602 is plotted on a y-axis and the time t is plotted on an x-axis.

The synchronization signal 602 has a duty cycle of 30%. For example, the synchronization signal 602 has the logic level of 1 from the time t0 to the time t3. The synchronization signal 602 has the logic level of 0 from the time t3 to the time t10, has the logic level of 1 from the time t10 to a time t13, and has the logic level of 0 from the time t13 the time t20.

The synchronization signal 602 has multiple cycles and repeat the logic levels 1 and 0 during each cycle. For example, the synchronization signal 602 transitions from the logic level 1 to the logic level 0 at the time t3 during the cycle 1 and transitions from the logic level 1 to the logic level 0 at the time t13 during the cycle 2. As another example, at the time t0 of the cycle 1, the synchronization signal 602 transitions from the logic level 0 of a cycle 0 of the synchronization signal 602 to the logic level 1 of the cycle 1. Similarly, at the time t10 of the cycle 1, the synchronization signal 602 transitions from the logic level 0 of the cycle 1 to the logic level 1 of the cycle 2. The cycle 0 of the synchronization signal 602 precedes the cycle 1 of the synchronization signal 602 and the cycle 1 of the synchronization signal 602 precedes the cycle 2 of the synchronization signal 602.

In one embodiment, the synchronization signal 602 has another duty cycle, such as a 50% duty cycle or a 60% duty cycle, instead of the 30% duty cycle.

FIG. 6B is an embodiment of a graph 604 to illustrate a parameter 606 of the RF signal 152, which is the source RF signal, versus the time t. The parameter 606 is plotted on a y-axis and the time t is plotted on an x-axis.

The parameter 606 periodically transitions among the parameter levels PR2, PR1, and 0 in synchronization with the synchronization signal 602. For example, the parameter 606 transitions among the parameter levels PR2, PR1, and 0 during the cycle 1 of the synchronization signal 602 and again transitions among the parameter levels PR2, PR1, and 0 during the cycle 2 of the synchronization signal 602. To illustrate, the parameter 606 has the parameter level PR2 during the state S2 from the time t0 to the time t3, the parameter level PR1 during the state S1 from the time t3 to the time t7, and the parameter level 0 during the state S0 from the time t7 to the time t10. The parameter 606 repeats a sequence of occurrence of the states S2, S1, and S0 during the cycle 2 of the synchronization signal 602. Also, during the cycle 1 of the synchronization signal 602, the parameter 606 transitions from the parameter level 0 to the parameter level PR2 at the time t0, transitions from the parameter level PR2 to the parameter level PR1 at the time t3, and transitions from the parameter level PR1 to the parameter level 0 at the time t7. The parameter 506 repeats the transitions among the parameter levels PR2, PR1, and P0 during the cycle 2 of the synchronization signal 602. For example, during the cycle 2 of the synchronization signal 602, the parameter 606 transitions from the parameter level 0 to the parameter level PR2 at the time t10, transitions from the parameter level PR2 to the parameter level PR1 at the time t13, and transitions from the parameter level PR1 to the parameter level 0 at the time t17.

In one embodiment, in addition to the synchronization signal 602, a digital pulsed signal is received by the DSP 204 from the processor 118 via the transfer cable system 214. For example, the synchronization signal 602 is received via the first transfer cable of the transfer cable system 214 and the digital pulsed signal is received via the second transfer cable of the transfer cable system 214. The digital pulsed signal periodically transitions among three logic levels in the same manner in which the parameter 606 transitions among the parameter levels 0, PR2, and PR1. For example, during the cycle 1 of the synchronization signal 602, the digital pulsed signal transitions at the time t0 from the logic level 0 to the logic level 2, transitions at the time t3 from the logic level 2 to the logic level 1, transitions at the time t7 from the logic level 1 to the logic level 0. During the cycle 2 of the synchronization signal 602, the digital pulsed signal transitions at the time t10 from the logic level 0 to the logic level 2, transitions at the time t13 from the logic level 2 to the logic level 1, and transitions at the time t17 from the logic level 1 to the logic level 0. Upon receiving the digital pulsed signal, the DSP 204 identifies, from the digital pulsed signal, the time periods for the states S2, S1, and S0 of the parameter 602, and generates the instruction signals having the time periods. For example, the time period for the state S0 of the parameter 606 is the same as a time period for the logic level 0 of the digital pulsed signal, the time period for the state S2 of the parameter 606 is the same as a time period for the logic level 2 of the digital pulsed signal, and the time period for the state S1 of the parameter 606 is the same as a time period for the logic level 1 of the digital pulsed signal.

FIG. 6C is an embodiment of a graph 608 to illustrate a parameter 610 of the RF signal 168 (FIG. 1), which is the bias RF signal, versus the time t. The parameter 610 is plotted on a y-axis and the time t is plotted on an x-axis. The parameter 610 periodically transitions among the parameter levels 0, PR1, and PR2 in synchronization with the synchronization signal 602. For example, the parameter 610 transitions among the parameter levels 0, PR1, and PR2 during the cycle 1 of the synchronization signal 602 and again transitions among the parameter levels 0, PR1, and PR2 during the cycle 2 of the synchronization signal 602. To illustrate, the parameter 610 has the parameter level 0 during an instance of the state S0 from the time t0 to the time t1, the parameter level PR1 during the state S1 from the time t1 to the time t5, the parameter level PR2 during the state S2 from the time t5 to the time t8, and the parameter level 0 during another instance of the state S0 from the time t8 to the time t10. The parameter levels of 0, PR1 and PR2 repeat during the cycle 2 of the synchronization signal 602. During the cycle 1 of the synchronization signal 602, the parameter 610 transitions from the parameter level 0 to the parameter level PR1 at the time t1, transitions from the parameter level PR1 to the parameter level PR2 at the time t5, and transitions from the parameter level PR2 to the parameter level 0 at the time t8. During the cycle 2 of the synchronization signal 602, the parameter 610 again transitions from the parameter level 0 to the parameter level PR1 at the time t11, transitions from the parameter level PR1 to the parameter level PR2 at the time t15, and transitions from the parameter level PR2 to the parameter level 0 at the time t18.

When a combination of parameter levels of the parameters 606 and 610 during a first time period is different from a combination of parameter levels of the parameters 606 and 610 during a second time period, a plasma impedance state for the first time period is different from a plasma impedance state for the second time period. For example, the parameter level of the parameter 606 of the source RF signal is PR2 during a time period between the times t0 and t1 and the parameter level of the parameter 610 of the bias RF signal is 0 during a time period between the times t0 and t1 to define a plasma impedance state PS1. The parameter level of the parameter 606 of the source RF signal is PR2 during a time period between the times t1 and t3 and the parameter level of the parameter 610 of the bias RF signal is PR1 during a time period between the times t1 and t3 to define another plasma impedance state PS2.

As another example, the parameter level of the parameter 606 of the source RF signal is PR1 during a time period between the times t3 and t5 and the parameter level of the parameter 610 of the bias RF signal is PR1 during a time period between the times t3 and t5 to define another plasma impedance state PS3, which is different from each of the plasma impedance states PS1 and PS2. As yet another example, the parameter level of the parameter 606 of the source RF signal is PR1 during a time period between the times t5 and t7 and the parameter level of the parameter 610 of the bias RF signal is PR2 during a time period between the times t5 and t7 to define another plasma impedance state PS4, which is different from each of the plasma impedance states PS1, PS2 and PS3.

As another example, the parameter level of the parameter 606 of the source RF signal is 0 during a time period between the times t7 and t8 and the parameter level of the parameter 610 of the bias RF signal is PR2 during a time period between the times t7 and t8 to define another plasma impedance state PS5, which is different from each of the plasma impedance states PS1, PS2, PS3, and PS4. As yet another example, the parameter level of the parameter 606 of the source RF signal is 0 during a time period between the times t8 and t10 and the parameter level of the parameter 610 of the bias RF signal is 0 during a time period between the times t8 and t10 to define another plasma impedance state PS6, which is different from each of the plasma impedance states PS1, PS2, PS3, PS4, and PS5. As such, during each cycle of the synchronization signal 602, due to a change in parameter levels of the bias and source RF signals, multiple plasma impedance states, such as the six plasma impedance states PS1 through PS6 are created. An impedance of the plasma within the plasma chamber 112 (FIG. 1) having the multiple plasma impedance states PS1 through PS6 is an example of multi-state plasma impedance.

In one embodiment, the parameter 606 is of the RF signal 168 and the parameter 610 is of the RF signal 152.

In one embodiment, in addition to the synchronization signal 602, a digital pulsed signal is received by the DSP 204 from the processor 118 via the transfer cable system 214. For example, the synchronization signal 602 is received via the first transfer cable of the transfer cable system 214 and the digital pulsed signal is received via the second transfer cable of the transfer cable system 214. The digital pulsed signal periodically transitions among three logic levels in the same manner in which the parameter 610 transitions among the parameter levels 0, PR1, and PR2. For example, during the cycle 1 of the synchronization signal 502, the digital pulsed signal transitions at the time t1 from the logic level 0 to the logic level 1, transitions at the time t5 from the logic level 1 to the logic level 2, transitions at the time t8 from the logic level 2 to the logic level 1. During the cycle 2 of the synchronization signal 602, the digital pulsed signal transitions at the time t11 from the logic level 0 to the logic level 1, transitions at the time t15 from the logic level 1 to the logic level 2, and transitions at the time t18 from the logic level 2 to the logic level 1. Upon receiving the digital pulsed signal, the DSP 204 identifies, from the digital pulsed signal, the time periods for the states S0, S2, and S1 of the parameter 610, and generates the instruction signals having the time periods. For example, the time period for the state S0 of the parameter 610 is the same as a time period for the logic level 0 of the digital pulsed signal, the time period for the state S2 of the parameter 610 is the same as a time period for the logic level 2 of the digital pulsed signal, and the time period for the state S1 of the parameter 610 is the same as a time period for the logic level 1 of the digital pulsed signal.

In one embodiment, instead of the parameter level PR1 for any of the parameters 310 (FIG. 3C), 402 (FIG. 4C), 510 (FIG. 5C), and 610 (FIG. 6C), a parameter level PR3 is used. The parameter level PR3 is greater or lower than the parameter level PR1. Similarly, instead of the parameter level PR2 for any of the parameters 310, 402, 510, and 610, a parameter level PR4 is used. The parameter level PR4 is greater or lower than the parameter level PR3.

Figure 6D:
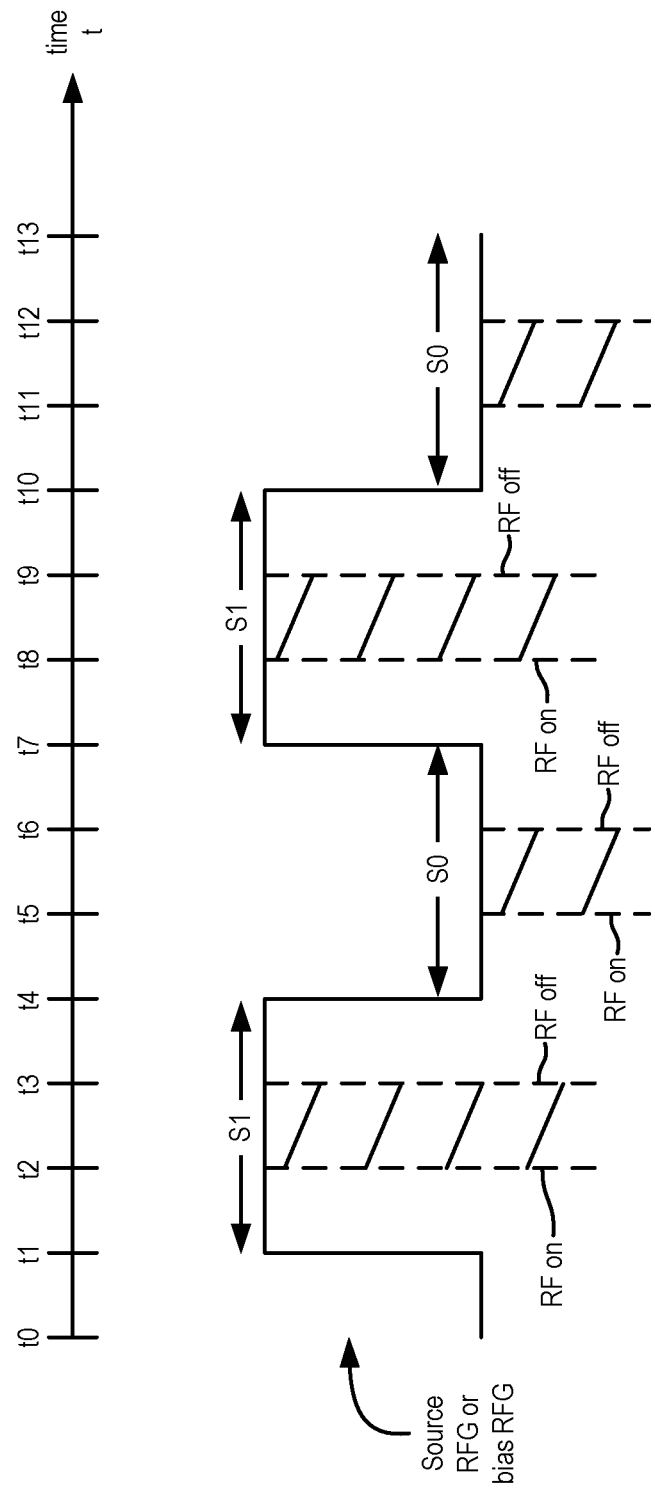
FIG. 6D is a diagram to illustrate an embodiment of an on-off time modification method with selective synchronization between a source RF generator and a bias RF generator.

FIG. 6D is a diagram to illustrate an embodiment of an on-off time modification method with selective synchronization between a source RF generator and a bias RF generator. As illustrated with respect to FIG. 6D, there is a time delay from the time t1 to the time t2 in turning an RF signal generated by a first RF generator, such as the source RF generator or the bias RF generator, compared to a second RF generator, such as the bias RF generator or the source RF generator. Also, a time at which RF power that is supplied by the first RF generator is turned off is moved forward from the time t4 to the time t3. As such, instead of the two plasma impedance states S1 and S0, more than two plasma impedance states, such as six or eight or ten or twenty plasma impedance states, are generated.

Multi-State Pulsing Components

Figure 7:
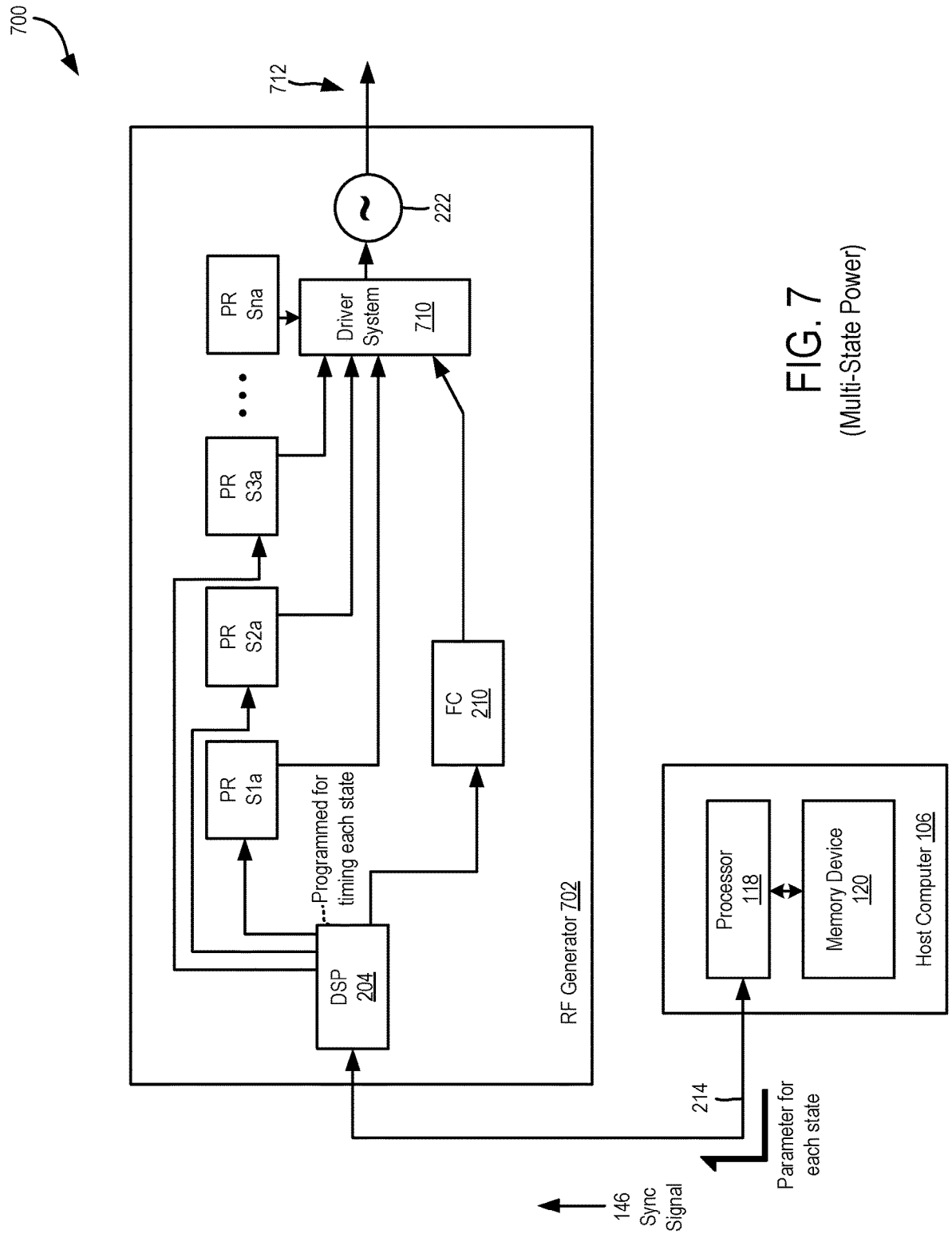
FIG. 7 is a diagram of an embodiment of a plasma system to illustrate multilevel parameter pulsing.

FIG. 7 is a diagram of an embodiment of a plasma system 700 to illustrate multilevel parameter pulsing. The plasma system 700 includes an RF generator 702 and the host computer 106. The RF generator 702 is an example of the source RF generator 102 (FIG. 1) or the bias RF generator 104 (FIG. 1). The RF generator 702 includes the DSP 204, multiple parameter controllers PRS1a, PRS2a, PRS3a and so on until PRSna, where n is an integer greater than three. For example, n is four or more. As an example, the RF generator 702 includes four parameter controllers, one for a state S1a, another for a state S2a, yet another one for a state S3a, and another one for a state S4a. As another example, the RF generator 702 includes five parameter controllers, one for the state S1a, another for the state S2a, yet another one for the state S3a, another one for the state S4a, and one for a state S5a. The RF generator 702 further includes the frequency controller FC 210, a driver system 710, and the RF power supply 222.

The DSP 204 is coupled to each of the parameter controllers PRS1a through PRSna of the RF generator 702. The parameter controllers PRS1a through PRSna are coupled to the driver system 710, which is coupled to the RF power supply 222. Also, the frequency controller 210 is coupled to the driver system 710.

The processor 118 provides the parameters, such as parameter levels, for the states S1a through Sna, and the synchronization signal 146 via the transfer cable system 214 to the DSP 204. Upon receiving the parameter levels for the states S1a through Sna, the DSP 204 provides the parameter, such as a power level or a voltage level, for the state S1a of an RF signal 712 to the parameter controller PRS1a for storage of the parameter for the state S1a in a memory device of the parameter controller PRS1a. The RF signal 712 is an example of the RF signal 152 or the RF signal 168 (FIG. 1).

Also, in response to receiving the parameter levels for the states S1a through Sna, the DSP 204 provides the parameter level, such as a power level or a voltage level, for the state S2a of the RF signal 712 to the parameter controller S2a for storage of the parameter level for the state S2a in a memory device of the parameter controller S2a. Moreover, in response to receiving the parameter levels for the states S1a through Sna, the DSP 204 provides the parameter level, such as a power level or a voltage level, for the state S3a of the RF signal 712 to the parameter controller PRS3a for storage of the parameter for the state S3a in a memory device of the parameter controller PRS3a. In response to receiving the parameters for the states S1a through Sna, the DSP 204 provides the parameter level, such as a power level or a voltage level, for the state Sna of the RF signal 712 to the parameter controller PRSna for storage of the parameter for the state Sna in a memory device of the parameter controller PRSna. Similarly, upon receiving the parameters for the states S1a through Sna, the DSP 204 provides a frequency level, such as a single frequency level, for all the states S1a through Sna to the frequency controller 210 for storage in the memory device of the frequency controller 210.

In an embodiment, values of an $(n-1)^{th}$ parameter level are different from values of an $n^{th}$ parameter level. For example, values of the $(n-1)^{th}$ parameter level are exclusive of values of the $n^{th}$ parameter level. As another example, none of values of the $(n-1)^{th}$ parameter level are the same as any of the values of the $n^{th}$ parameter level.

Upon receiving the synchronization signal 146, during each cycle of the synchronization signal 146, the DSP 204 sends an instruction signal for the state S1a to the parameter controller PRS1a. For example, the DSP 204 sends the instruction signal for the state S1a to the parameter controller PRS1a at a time of transition from a state different from or other than the state S1a, such as the state Sna or the state S0, to the state S1a. The instruction signal for the state S1a sent to the parameter controller PRS1a includes a time period for the state S1a during each cycle for which the parameter controller PRS1a is to provide the parameter level for the state S1a to the driver system 710. Upon receiving the instruction signal for the state S1a, the parameter controller PRS1a accesses the parameter level for the state S1a from the memory device of the parameter controller PRS1a and sends the parameter level to the driver system 710 for the time period for the state S1a. For example, the parameter controller PRS1a sends the parameter level for the state S1a to the driver system 710 at the time of transition from the state different from the state S1a to the state S1a. After the time period for the state S1a, during a cycle of the synchronization signal 146, the parameter controller PRS1a does not send the parameter level for the state S1a to the driver system 710.

Similarly, upon receiving the synchronization signal 146, during each cycle of the synchronization signal 146, the DSP 204 sends an instruction signal for the state S2a to the parameter controller PRS2a. For example, the DSP 204 sends the instruction signal for the state S2a to the parameter controller PRS2a at a time of transition from a state different from or other than the state S2a, such as the state S1a or the state S3a or the state S0, to the state S2a. The instruction signal for the state S2a sent to the parameter controller PRS2a includes a time period for the state S2a during each cycle for which the parameter controller PRS2a is to provide the parameter level for the state S2a to the driver system 710. Upon receiving the instruction signal for the state S2a, the parameter controller PRS2a accesses the parameter level for the state S2a from the memory device of the parameter controller PRS2a and sends the parameter level to the driver system 710 for the time period for the state S2a. For example, the parameter controller PRS2a sends the parameter level for the state S2a to the driver system 710 at the time of transition from the state different from the state S2a to the state S2a. After the time period for the state S2a, during a cycle of the synchronization signal 146, the parameter controller PRS2a does not send the parameter level for the state S2a to the driver system 710.

Also, upon receiving the synchronization signal 146, during each cycle of the synchronization signal 146, the DSP 204 sends an instruction signal for the state S3a to the parameter controller PRS3a. For example, the DSP 204 sends the instruction signal for the state S3a to the parameter controller PRS3a at a time of transition from a state different from or other than the state S3a, such the state S2a or the state S1a or the state S0, to the state S3a. The instruction signal for the state S3a sent to the parameter controller PRS3a includes a time period for the state S3a during each cycle for which the parameter controller PRS3a is to provide the parameter level for the state S3a to the driver system 710. Upon receiving the instruction signal for the state S3a, the parameter controller PRS3a accesses the parameter level for the state S3a from the memory device of the parameter controller PRS3a and sends the parameter level to the driver system 710 for the time period for the state S3a. For example, the parameter controller PRS3a sends the parameter level for the state S3a to the driver system 710 at the time of transition from the state different from the state S3a to the state S3a. After the time period for the state S3a, during a cycle of the synchronization signal 146, the parameter controller PRS3a does not send the parameter level for the state S3a to the driver system 710.

Moreover, upon receiving the synchronization signal 146, during each cycle of the synchronization signal 146, the DSP 204 sends an instruction signal for the state Sna to the parameter controller PRSna. For example, the DSP 204 sends the instruction signal for the state Sna to the parameter controller PRSna at a time of transition from a state different from or other than the state Sna, such as the S(n−1)a or the state S0, to the state Sna. The instruction signal for the state Sna sent to the parameter controller PRSna includes a time period for the state Sna during each cycle for which the parameter controller PRSna is to provide the parameter level for the state Sna to the driver system 710. Upon receiving the instruction signal for the state Sna, the parameter controller PRSna accesses the parameter level for the state Sna from the memory device of the parameter controller PRSna and sends the parameter level to the driver system 710 for the time period for the state Sna. For example, the parameter controller PRSna sends the parameter level for the state Sna to the driver system 710 at the time of transition from the state different from the state Sna to the state Sna. After the time period for the state Sna, during a cycle of the synchronization signal 146, the parameter controller PRSna does not send the parameter level for the state Sna to the driver system 710.

Also, upon receiving the synchronization signal 146, during each cycle of the synchronization signal 146, the DSP 204 sends an instruction signal to the frequency controller 210. Upon receiving the instruction signal, the frequency controller 210 accesses the frequency level from the memory device of the frequency controller 210 and sends the frequency level to the driver system 710.

In response to receiving the parameter level for the state S1a and the frequency level, the driver system 710 generates a drive signal for the state S1a for the time period for the state S1a and sends the drive signal to the RF power supply 222. For example, upon receiving the parameter level for the state S1a and the frequency level at the time of transition from the state different from or other than the state S1a, such as the state Sna or the state S2a or the state S3a or the state S0, to the state S1a, the driver system 710 generates the drive signal for the state S1a for the time period for the state S1a and sends the drive signal to the RF power supply 222. The RF power supply 222 generates the state S1a of the RF signal 712 upon receiving the drive signal for the state S1a from the driver system 710. For example, upon receiving the drive signal for the state S1a from the driver system 710, the RF power supply 222 transitions the RF signal 712 from the state different from the state S1a to the state S1a. The state S1a of the RF signal 712 has the parameter level for the state S1a and the frequency level during the time period for the state S1a.

Similarly, in response to receiving the parameter level for the state S2a and the frequency level, the driver system 710 generates a drive signal for the state S2a for the time period for the state S2a and sends the drive signal to the RF power supply 222. For example, upon receiving the parameter level for the state S2a and the frequency level at the time of transition from a state different from or other than the state S2a, such as the state S1a or the state S3a or the state Sna or the state S0, to the state S2a, the driver system 710 generates the drive signal for the state S2a for the time period for the state S2a and sends the drive signal to the RF power supply 222. The RF power supply 222 generates the state S2a of the RF signal 712 upon receiving the drive signal for the state S2a from the driver system 710. For example, upon receiving the drive signal for the state S2a from the driver system 710, the RF power supply 222 transitions the RF signal 712 from the state different from the state S2a to the state S2a. The state S2a of the RF signal 712 has the parameter level for the state S2a and the frequency level during the time period for the state S2a.

Also, in response to receiving the parameter level for the state S3a and the frequency level, the driver system 710 generates a drive signal for the state S3a for the time period for the state S3a and sends the drive signal to the RF power supply 222. For example, upon receiving the parameter level for the state S3a and the frequency level at the time of transition from a state different from or other than the state S3a, such as the state S2a or the state S4a or the state Sna or the state S0, to the state S3a, the driver system 710 generates the drive signal for the state S3a for the time period for the state S3a and sends the drive signal to the RF power supply 222. The RF power supply 222 generates the state S3a of the RF signal 712 upon receiving the drive signal for the state S3a from the driver system 710. For example, upon receiving the drive signal for the state S3a from the driver system 710, the RF power supply 222 transitions the RF signal 712 from the state different from the state S3a to the state S3a. The state S3a of the RF signal 712 has the parameter level for the state S3a and the frequency level during the time period for the state S3a.

Moreover, in response to receiving the parameter level for the state Sna and the frequency level, the driver system 710 generates a drive signal for the state Sna for the time period for the state Sna and sends the drive signal to the RF power supply 222. For example, upon receiving the parameter level for the state Sna and the frequency level at the time of transition from a state different from or other than the state Sna, such as the S(n−1)a or the state S0 or the state S3 or the state S2, to the state Sna, the driver system 710 generates the drive signal for the state Sna for the time period for the state Sna and sends the drive signal to the RF power supply 222. The RF power supply 222 generates the state Sna of the RF signal 712 upon receiving the drive signal for the state Sna from the driver system 710. For example, upon receiving the drive signal for the state Sna from the driver system 710, the RF power supply 222 transitions the RF signal 712 from the state different from the state Sna to the state Sna. The state Sna of the RF signal 712 has the parameter level for the state Sna and the frequency level during the time period for the state Sna.

Also, in one embodiment, during each cycle of the synchronization signal 146, there is a time period for which the RF signal 712 has a parameter level of zero. The RF signal 712 has the parameter level of zero during the no-state, such as the state S0. Upon receiving the synchronization signal 146, during each cycle of the synchronization signal 146, the DSP 204 does not send the instruction signals for the states S1a through Sna to the parameter controllers PRS1a through PRSna during the time period for the no-state.

During the time period for the no-state for which the instruction signals for the states S1a through Sna are not received, the parameter controllers PRS1a through PRSna do not send or stop sending the parameter levels for the states S1a through Sna to the driver system 710. For example, after the time period for the state S1a, the parameter controller PRS1a does not send the parameter level for the state S1a to the driver system 710. As another example, after the time period for the state S2a, the parameter controller PRS2a does not send the parameter level for the state S2a to the driver system 710.

When the parameter levels for the states S1a through Sna are not received, the driver system 710 does not send a drive signal to the RF power supply 222. When the drive signal is not received during the time period for the no-state, the RF power supply 710 generates the RF signal 712 having the parameter level of zero during the no-state. For example, when the drive signal is not received, the power supply 222 transitions the RF signal 712 from a state different from or other than the no-state S0, such as the state S1a or the state S2a or the state Sna, to the no-state S0.

The states S1a through Sna and the no-state are states of the parameter of the RF signal 712. For example, each state S1a through Sna and the no-state, described with reference to FIG. 7, represent a parameter level of the RF signal 712. To illustrate, the state S1a of the RF signal 712 identifies a first parameter level of the RF signal 712 and the state S2a of the RF signal 712 identifies a second parameter level of the RF signal 712.

In one embodiment, instead of the parameter controllers PRS1a through PRSna and the frequency controller 210, one or more controllers, such as one or more processors, are used to perform the functions described herein as being performed by the parameter controllers PRS1a through PRSna and the frequency controller 210.

In an embodiment, instead of the DSP 204, the parameter controllers PRS1a through PRSna, and the frequency controller 210, one or more controllers, such as one or more processors, are used to perform the functions described herein as being performed by the DSP 204, the parameter controllers PRS1a through PRSna, and the frequency controller 210.

Figure 8:
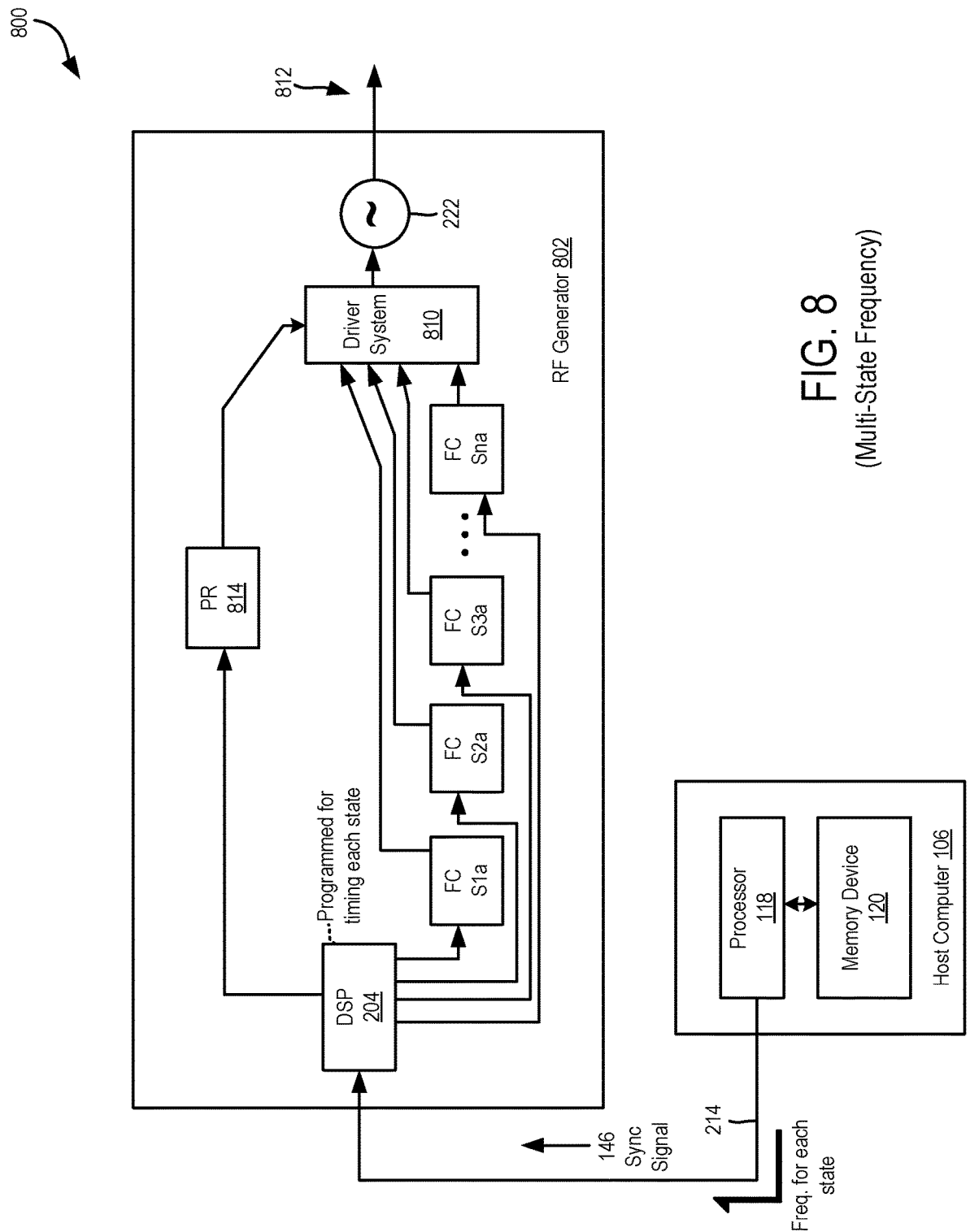
FIG. 8 is a diagram of an embodiment of a plasma system to illustrate multilevel frequency pulsing.

FIG. 8 is a diagram of an embodiment of a plasma system 800 to illustrate multilevel frequency pulsing. The plasma system 800 includes an RF generator 802 and the host computer 106. The RF generator 802 is an example of the source RF generator 102 (FIG. 1) or the bias RF generator 104 (FIG. 1). The RF generator 802 includes the DSP 204, multiple frequency controllers FCS1a, FCS2a, FCS3a and so on until FCSna, where n is an integer greater than three. For example, n is four or more. As an example, the RF generator 802 includes four frequency controllers, one for a state S1a, another for a state S2a, yet another one for a state S3a, and another one for a state S4a. As another example, the RF generator 802 includes five frequency controllers, one for the state S1a, another for the state S2a, yet another one for the state S3a, another one for the state S4a, and one for a state S5a. The RF generator 802 further includes a parameter controller 814, a driver system 810, and the RF power supply 222.

The DSP 204 is coupled to each of the frequency controllers FCS1a through FCSna of the RF generator 802. The frequency controllers FCS1a through FCSna are coupled to the driver system 810, which is coupled to the RF power supply 222. Also, the parameter controller 814 is coupled to the driver system 810.

The processor 118 provides frequencies, such as frequency levels, for the states S1a through Sna, and the synchronization signal 146 via the transfer cable system 214 to the DSP 204. Upon receiving the frequency levels for the states S1a through Sna, the DSP 204 provides the frequency, such as a frequency level, for the state S1a of an RF signal 812 to the frequency controller FCS1a for storage of the frequency for the state S1a in a memory device of the frequency controller FCS1a. The RF signal 812 is an example of the RF signal 152 or the RF signal 168 (FIG. 1).

Also, in response to receiving the frequency levels for the states S1a through Sna, the DSP 204 provides the frequency level for the state S2a of the RF signal 812 to the frequency controller FCS2a for storage of the frequency level for the state S2a in a memory device of the frequency controller FCS2a. Moreover, in response to receiving the frequency levels for the states S1a through Sna, the DSP 204 provides the frequency level for the state S3a of the RF signal 812 to the frequency controller FCS3a for storage of the frequency level for the state S3a in a memory device of the frequency controller FCS3a. In response to receiving the frequency levels for the states S1a through Sna, the DSP 204 provides the frequency level for the state Sna of the RF signal 812 to the frequency controller FCSna for storage of the frequency level for the state Sna in a memory device of the frequency controller FCSna. Similarly, upon receiving a parameter level, such as a single parameter level, for all the states S1a through Sna, the DSP 204 provides the parameter level to the parameter controller 814 for storage in the memory device of the parameter controller 814.

In an embodiment, values of an $(n-1)^{th}$ frequency level are different from values of an $n^{th}$ frequency level. For example, values of the $(n-1)^{th}$ frequency level are exclusive of values of the $n^{th}$ frequency level. As another example, none of values of the $(n-1)^{th}$ frequency level are the same as any of the values of the $n^{th}$ frequency level.

Upon receiving the synchronization signal 146, during each cycle of the synchronization signal 146, the DSP 204 sends an instruction signal for the state S1a to the frequency controller FCS1a. For example, the DSP 204 sends the instruction signal for the state S1a to the frequency controller FCS1a at a time of transition from the state different from or other than the state S1a, such as the state S2a or the state S0 or the state S3a, to the state S1a. The instruction signal for the state S1a sent to the frequency controller FCS1a includes a time period for the state S1a during each cycle for which the frequency controller FCS1a is to provide the frequency level for the state S1a to the driver system 810. Upon receiving the instruction signal for the state S1a, the frequency controller FCS1a accesses the frequency level for the state S1a from the memory device of the frequency controller FCS1a and sends the frequency level to the driver system 810 for the time period for the state S1a. For example, the frequency controller FCS1a sends the frequency level for the state S1a to the driver system 810 at the time of transition from the state different from the state S1a to the state S1a. After the time period for the state S1a, during a cycle of the synchronization signal 146, the frequency controller FCS1a does not send the frequency level for the state S1a to the driver system 810.

Similarly, upon receiving the synchronization signal 146, during each cycle of the synchronization signal 146, the DSP 204 sends an instruction signal for the state S2a to the frequency controller FCS2a. For example, the DSP 204 sends the instruction signal for the state S2a to the frequency controller FCS2a at a time of transition from the state different from or other than the state S2a, such as the state S1a or the state S0 or the state S3a, to the state S2a. The instruction signal for the state S2a sent to the frequency controller FCS2a includes a time period for the state S2a during each cycle for which the frequency controller FCS2a is to provide the frequency level for the state S2a to the driver system 810. Upon receiving the instruction signal for the state S2a, the frequency controller FCS2a accesses the frequency level for the state S2a from the memory device of the frequency controller FCS2a and sends the frequency level to the driver system 810 for the time period for the state S2a. For example, the frequency controller FCS2a sends the frequency level for the state S2a to the driver system 810 at the time of transition from the state different from the state S2a to the state S2a. After the time period for the state S2a, during a cycle of the synchronization signal 146, the frequency controller FCS2a does not send the frequency level for the state S2a to the driver system 810.

Also, upon receiving the synchronization signal 146, during each cycle of the synchronization signal 146, the DSP 204 sends an instruction signal for the state S3a to the frequency controller FCS3a. For example, the DSP 204 sends the instruction signal for the state S3a to the frequency controller FCS3a at a time of transition from the state different from or other than the state S3a, such as the state S2a or the state S1a or the state S0, to the state S3a. The instruction signal for the state S3a sent to the frequency controller FCS3a includes a time period for the state S3a during each cycle for which the frequency controller FCS3a is to provide the frequency level for the state S3a to the driver system 810. Upon receiving the instruction signal for the state S3a, the frequency controller FCS3a accesses the frequency level for the state S3a from the memory device of the frequency controller FCS3a and sends the frequency level to the driver system 810 for the time period for the state S3a. For example, the frequency controller FCS3a sends the frequency level for the state S3a to the driver system 810 at the time of transition from the state different from the state S3a to the state S3a. After the time period for the state S3a, during a cycle of the synchronization signal 146, the frequency controller FCS3a does not send the frequency level for the state S3a to the driver system 810.

Moreover, upon receiving the synchronization signal 146, during each cycle of the synchronization signal 146, the DSP 204 sends an instruction signal for the state Sna to the frequency controller FCSna. For example, the DSP 204 sends the instruction signal for the state Sna to the frequency controller FCSna at a time of transition from the state different from or other than the state Sna, such as a state S(n−1)a or the state S0, to the state Sna. The instruction signal for the state Sna sent to the frequency controller FCSna includes a time period for the state Sna during each cycle for which the frequency controller FCSna is to provide the frequency level for the state Sna to the driver system 810. Upon receiving the instruction signal for the state Sna, the frequency controller FCSna accesses the frequency level for the state Sna from the memory device of the frequency controller FCSna and sends the frequency level to the driver system 810 for the time period for the state Sna. For example, the frequency controller FCSna sends the frequency level for the state Sna to the driver system 810 at the time of transition from the state different from or other than the state Sn to the state Sna. After the time period for the state Sna, during a cycle of the synchronization signal 146, the frequency controller FCSna does not send the frequency level for the state Sna to the driver system 810.

Also, upon receiving the synchronization signal 146, during each cycle of the synchronization signal 146, the DSP 204 sends an instruction signal to the parameter controller 814. Upon receiving the instruction signal, the parameter controller 814 accesses the parameter level from the memory device of the parameter controller 814 and sends the parameter level to the driver system 810.

In response to receiving the frequency level for the state S1a and the parameter level, the driver system 810 generates a drive signal for the state S1a for the time period for the state S1a and sends the drive signal to the RF power supply 222. For example, upon receiving the frequency level for the state S2a and the parameter level at the time of transition different from or other than the state S1a, such as the state S2a or the state S3a or the state Sna or the state S0, to the state S1a, the driver system 810 generates the drive signal for the state S1a for the time period for the state S1a and sends the drive signal to the RF power supply 222. The RF power supply 222 generates the state S1a of the RF signal 812 upon receiving the drive signal for the state S1a from the driver system 810. For example, upon receiving the drive signal for the state S1a from the driver system 810, the RF power supply 222 transitions the RF signal 812 from the state different from the state S1a to the state S1a. The state S1a of the RF signal 812 has the frequency level for the state S1a and the parameter level during the time period for the state S1a.

Similarly, in response to receiving the frequency level for the state S2a and the parameter level, the driver system 810 generates a drive signal for the state S2a for the time period for the state S2a and sends the drive signal to the RF power supply 222. For example, upon receiving the frequency level for the state S2a and the parameter level at the time of transition from the state different from or other than the state S2a, such as the state S1a or the state S0 or the state S3a, to the state S2a, the driver system 810 generates the drive signal for the state S2a for the time period for the state S2a and sends the drive signal to the RF power supply 222. The RF power supply 222 generates the state S2a of the RF signal 812 upon receiving the drive signal for the state S2a from the driver system 810. For example, upon receiving the drive signal for the state S2a from the driver system 810, the RF power supply 222 transitions the RF signal 812 from the state different from the state S2a to the state S2a. The state S2a of the RF signal 712 has the frequency level for the state S2a and the parameter level during the time period for the state S2a.

Also, in response to receiving the frequency level for the state S3a and the parameter level, the driver system 810 generates a drive signal for the state S3a for the time period for the state S3a and sends the drive signal to the RF power supply 222. For example, upon receiving the frequency level for the state S3a and the parameter level at the time of transition from the state different from or other than the state S3a, such as the state S2a or the state S0 or the state S1a or the state S4a, to the state S3a, the driver system 810 generates the drive signal for the state S3a for the time period for the state S3a and sends the drive signal to the RF power supply 222. The RF power supply 222 generates the state S3a of the RF signal 812 upon receiving the drive signal for the state S3a from the driver system 810. For example, upon receiving the drive signal for the state S3a from the driver system 810, the RF power supply 222 transitions the RF signal 812 different from the state S3a to the state S3a. The state S3a of the RF signal 812 has the frequency level for the state S3a and the parameter level during the time period for the state S3a.

Moreover, in response to receiving the frequency level for the state Sna and the parameter level, the driver system 810 generates a drive signal for the state Sna for the time period for the state Sna and sends the drive signal to the RF power supply 222. For example, upon receiving the frequency level for the state Sna and the parameter level at the time of transition from the state different from or other than the state Sna, such as the state S(n−1)a or the state S0, to the state Sna, the driver system 810 generates the drive signal for the state Sna for the time period for the state Sna and sends the drive signal to the RF power supply 222. The RF power supply 222 generates the state Sna of the RF signal 812 upon receiving the drive signal for the state Sna from the driver system 810. For example, upon receiving the drive signal for the state Sna from the driver system 810, the RF power supply 222 transitions the RF signal 812 from the state different from the state Sna to the state Sna. The state Sna of the RF signal 812 has the frequency level for the state Sna and the parameter level during the time period for the state Sna.

Also, in one embodiment, during each cycle of the synchronization signal 146, there is a time period for which the RF signal 812 has a frequency level of zero. The RF signal 812 has the frequency level of zero during the no-state, such as a state S0. Upon receiving the synchronization signal 146, during each cycle of the synchronization signal 146, the DSP 204 does not send the instruction signals for the states S1a through Sna to the frequency controllers FCS1a through FCSna and to the parameter controller 814 during the time period for the no-state.

During the time period for the no-state for which the instruction signals for the states S1a through Sna are not received, the frequency controllers FCS1a through FCSna do not send or stop sending the frequency levels for the states S1a through Sna to the driver system 810 and the parameter controller 814 stops sends the parameter level to the driver system 810. For example, after the time period for the state S1a, the frequency controller FCS1a does not send the frequency level for the state S1a to the driver system 810. As another example, after the time period for the state S2a, the frequency controller FCS2a does not send the frequency level for the state S2a to the driver system 810.

When the frequency levels for the states S1a through Sna and the parameter level are not received, the driver system 810 does not send a drive signal to the RF power supply 222. When the drive signal is not received during the time period for the no-state, the RF power supply 810 generates the RF signal 812 having the parameter level of zero during the no-state. For example, when the drive signal is not received, the power supply 222 transitions the RF signal 812 from the state different from or other than the no-state S0, such as the state S1a or the state S2a or the state Sna, to the no-state S0.

The states S1a through Sna and the no-state are states of the frequency of the RF signal 812. For example, each state S1a through Sna and the no-state, described with reference to FIG. 8, represent a frequency level of the RF signal 812. To illustrate, the state S1 of the RF signal 812 identifies a first frequency level of the RF signal 812 and the state S2 of the RF signal 812 identifies a second frequency level of the RF signal 812.

In one embodiment, instead of the frequency controllers FCS1a through FCSna and the parameter controller 814, one or more controllers, such as one or more processors, are used to perform the functions described herein as being performed by the frequency controllers FCS1a through FCSna and the parameter controller 814.

In an embodiment, instead of the DSP 204, the frequency controllers FCS1a through FCSna, and the parameter controller 814, one or more controllers, such as one or more processors, are used to perform the functions described herein as being performed by the DSP 204, the frequency controllers FCS1a through FCSna, and the parameter controller 814.

Figure 9:
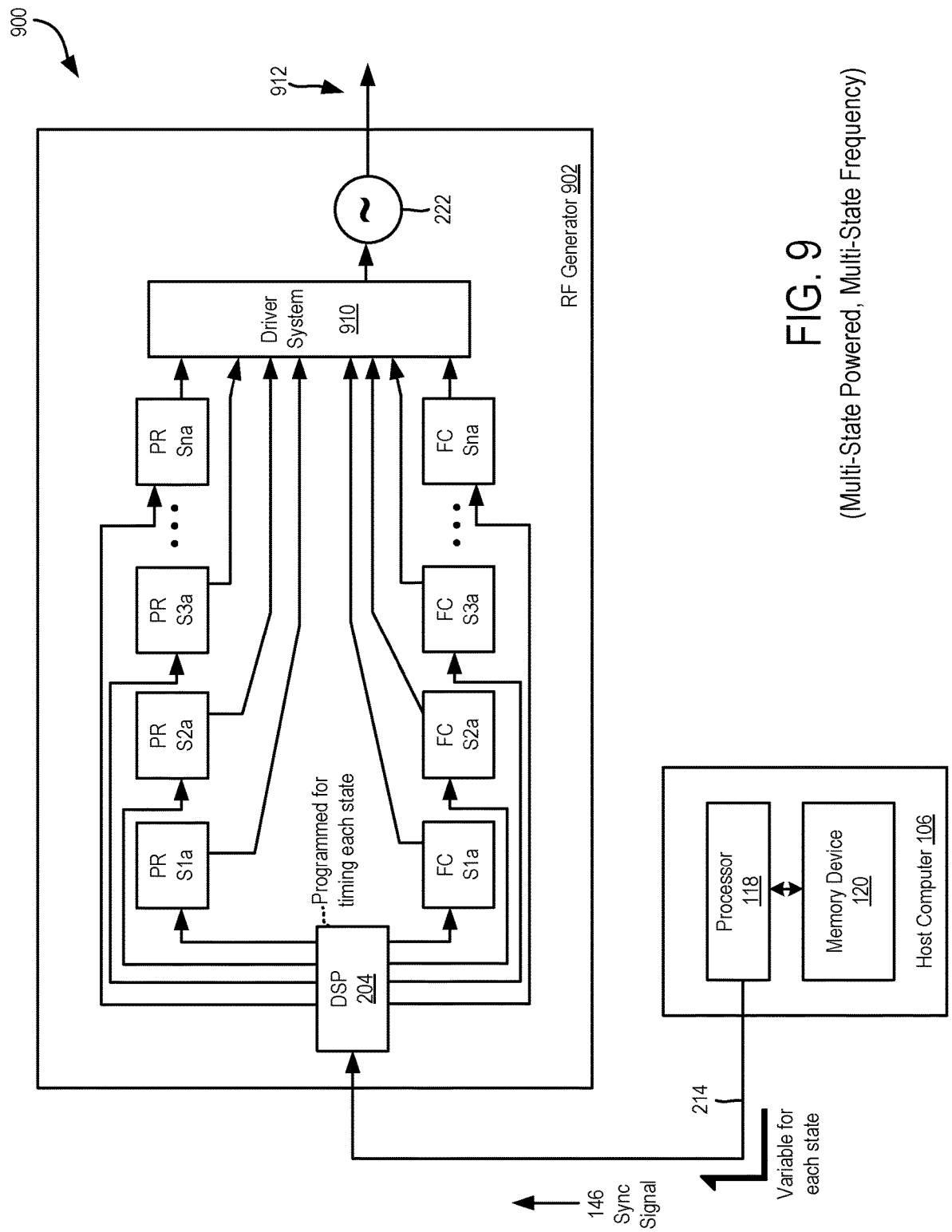
FIG. 9 is a diagram of an embodiment of a plasma system to illustrate simultaneous multilevel parameter pulsing and multilevel frequency pulsing.

FIG. 9 is a diagram of an embodiment of a plasma system 900 to illustrate simultaneous multilevel parameter pulsing and multilevel frequency pulsing. The plasma system 900 includes an RF generator 902 and the host computer 106. The RF generator 902 is an example of the source RF generator 102 (FIG. 1) or the bias RF generator 104 (FIG. 1). The RF generator 902 includes the DSP 204, the frequency controllers FCS1a through FCSna, and the parameter controllers PRS1a through PRSna. The RF generator 902 further includes a driver system 910 and the RF power supply 222.

The DSP 204 is coupled to each of the frequency controllers FCS1a through FCSna and each of the parameter controllers PRS1a through PRSna of the RF generator 902. The frequency controllers FCS1a through FCSna and the power controllers PRS1 through PRSna are coupled to the driver system 910, which is coupled to the RF power supply 222.

The processor 118 provides the frequency levels for the states S1a through Sna and the parameter levels for the states S1a through Sna, and the synchronization signal 146 via the transfer cable system 214 to the DSP 204. Upon receiving the frequency levels for the states S1a through Sna, the DSP 204 provides the frequency levels for the states S1a through Sna of an RF signal 912 to the frequency controllers FCS1a through FCSna, in the manner described above with reference to FIG. 8, for storage of the frequency levels for the states S1a through Sna in the memory devices of the frequency controllers FCS1a through FCSna. The RF signal 912 is an example of the RF signal 152 or the RF signal 168 (FIG. 1). Similarly, upon receiving the parameter levels for the states S1a through Sna, the DSP 204 provides the parameter levels for the states S1a through Sna of the RF signal 912 to the parameter controllers PRS1a through PRSna, in the manner described above with reference to FIG. 7, for storage of the parameter levels for the states S1a through Sna in the memory devices of the parameter controllers PRS1a through PRSna.

Upon receiving the synchronization signal 146, during each cycle of the synchronization signal 146, the DSP 204 sends the instruction signals for the states S1a through Sna to the frequency controllers FCS1a through FCSna in the same manner as that described above with reference to FIG. 8. Moreover, upon receiving the synchronization signal 146, during each cycle of the synchronization signal 146, the DSP 204 sends the instruction signals for the states S1a through Sna to the parameter controllers PRS1a through PRSna in the same manner as that described above with reference to FIG. 7.

As described in the manner above with reference to FIG. 8, upon receiving the instruction signals for the states S1a through Sna, the frequency controllers FCS1a through FCSna access the frequency levels for the states S1a through Sna from the memory devices of the frequency controllers FCS1a through FCSna and send the frequency levels to the driver system 910 for the time periods for the states S1a through Sna. Similarly, as described in the manner above with reference to FIG. 7, upon receiving the instruction signals for the states S1a through Sna, the parameter controllers PRS1a through PRSna access the parameter levels for the states S1a through Sna from the memory devices of the parameter controllers PRS1a through PRSna and send the parameter levels to the driver system 910 for the time periods for the states S1a through Sna.

In the manner described above with reference to FIGS. 7 and 8, in response to receiving the frequency levels for the states S1a through Sna and the parameter levels for the states S1a through Sna, the driver system 810 generates drive signals for the states S1a through Sna of the frequency levels and the states S1a through Sna of the parameter levels and sends the drive signals to the RF power supply 222. For example, upon receiving the frequency level for the state Sna and the parameter level for the state Sna at the time of transition from the state different from or other than the state Sna, such as the state S(n−1)a or the state S0, to the state Sna, the driver system 910 generates the drive signals for the state Sna of the frequency level and the state Sna of the parameter level for the time period for the state Sna and sends the drive signal to the RF power supply 222. The RF power supply 222 generates the state Sna of the frequency level and the state Sna of the parameter level of the RF signal 912 upon receiving the drive signals for the states Sna of the frequency level and the parameter level from the driver system 910. For example, upon receiving the drive signal for the state Sna of the frequency level from the driver system 910, the RF power supply 222 transitions the frequency level of the RF signal 912 from the state different from or other than the state Sna to the state Sna. The state Sna of the RF signal 912 has the frequency level of the state Sna. Upon receiving the drive signal for the state Sna of the parameter level from the driver system 910, the RF power supply 222 transitions the parameter level of the RF signal 912 from the state different from the state Sna to the state Sna. The state Sna of the RF signal 912 has the parameter level of the state Sna.

Also, in one embodiment, during each cycle of the synchronization signal 146, there is a time period for which the RF signal 912 has a frequency level of zero and a parameter level of zero. The RF signal 912 has the frequency level of zero and the parameter level of zero during the no-state, such as a state S0. Upon receiving the synchronization signal 146, during each cycle of the synchronization signal 146, the DSP 204 does not send the instruction signals for the states S1a through Sna to the frequency controllers FCS1a through FCSna and does not send the instruction signals for the states S1a through Sna to the parameter controllers PRS1a through PRSna during the time period for the no-state.

In the manner described above with reference to FIG. 8, during the time period for the no-state for which the instruction signals for the states S1a through Sna of the frequency levels are not received, the frequency controllers FCS1a through FCSna do not send or stop sending the frequency levels for the states S1a through Sna to the driver system 910. Similarly, in the manner described above with reference to FIG. 7, during the time period for the no-state for which the instruction signals for the states S1a through Sna of the parameter levels are not received, the parameter controllers PRS1a through PRSna do not send or stop sending the parameter levels for the states S1a through Sna to the driver system 910.

When the frequency levels for the states S1a through Sna and the parameter levels for the states S1a through Sna are not received, the driver system 910 does not send a drive signal to the RF power supply 222. When the drive signal is not received during the time period for the no-state, the RF power supply 222 generates the RF signal 912 having the parameter level of zero and the frequency level of zero during the no-state. For example, when the drive signal is not received, the power supply 222 transitions the RF signal 912 from the state different from or other than the no-state S0, such as the state S1a of the frequency level or the state S2a of the frequency level or the state Sna of the frequency level, to the no-state S0 of the frequency level. Similarly, when the drive signal is not received, the power supply 222 transitions the RF signal 912 from the state different from or other than the no-state of the parameter level, such as the state S1a of the parameter level or the state S2a of the parameter level or the state Sna of the parameter level, to the no-state S0 of the parameter level.

In one embodiment, instead of the frequency controllers FCS1a through FCSna and the parameter controllers PRS1a through PRSna, one or more controllers, such as one or more processors, are used to perform the functions described herein as being performed by the frequency controllers FCS1a through FCSna and the parameter controllers PRS1a through PRSna.

In an embodiment, instead of the DSP 204, the frequency controllers FCS1a through FCSna, and the parameter controllers PRS1a through PRSna, one or more controllers, such as one or more processors, are used to perform the functions described herein as being performed by the DSP 204, the frequency controllers FCS1a through FCSna, and the parameter controllers PRS1a through PRSna.

In one embodiment, when the RF signal 152 (FIG. 1) generated by the source RF generator has multiple variable levels, such as four variable levels, the bias RF generator 104 generates the RF signal 168 that is a continuous wave signal having a single variable level or a different number of variable levels than that of the RF signal 152, such as two or three or eight or ten variable levels. As another example, when the RF signal 168 (FIG. 1) generated by the bias RF generator has multiple variable levels, such as four variable levels, the source RF generator 102 generates the RF signal 152 that is a continuous wave signal having a single variable level or a different number of variable levels than that of the RF signal 168, such as two or three variable levels or eight or ten variable levels.

In one embodiment, the RF signals 152 and 168 have the same number of variable levels, such as six variable levels or eight variable levels.

FIG. 10A is an embodiment of the graph 300 to illustrate the synchronization signal 302.

Figure 10B:
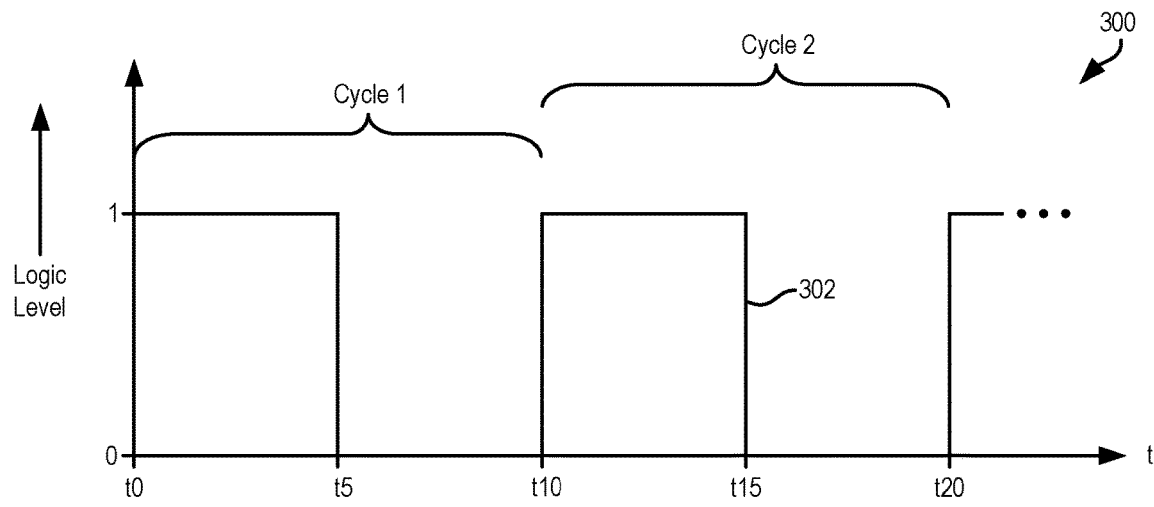
FIG. 10B is an embodiment of a graph to illustrate a variable of an RF signal of FIG. 9 versus the time.
Figure 10B:
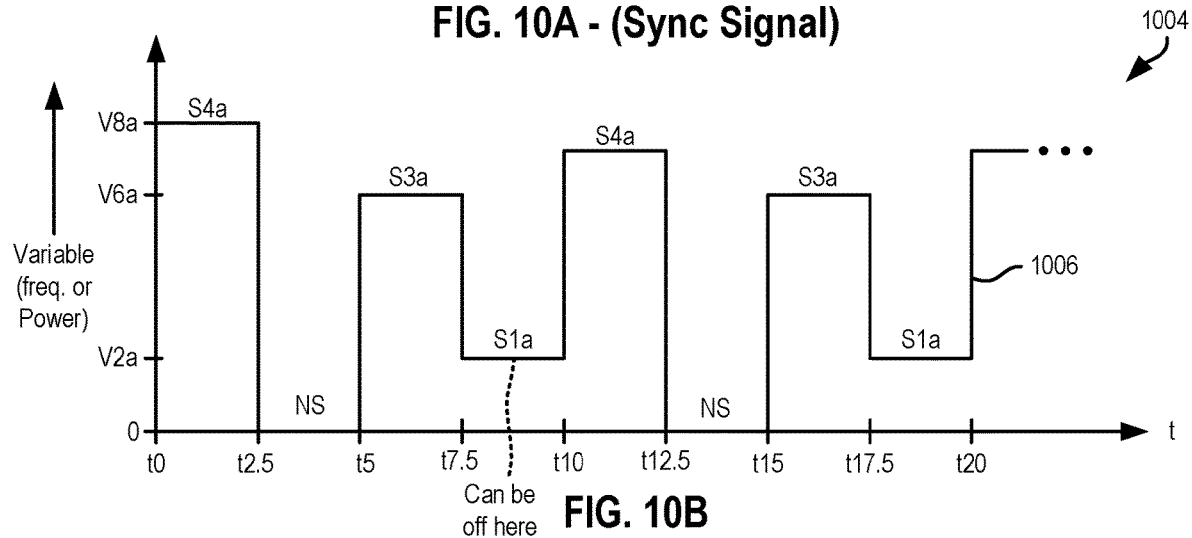

FIG. 10B is an embodiment of a graph 1004 to illustrate a variable 1006 of the RF signal 912 (FIG. 9) versus the time t. The variable 1006 is plotted on a y-axis and the time t is plotted on an x-axis.

The variable 1006 periodically transitions among variable levels V8a, 0, V6a, and V2a in synchronization with the synchronization signal 302. For example, the variable 1006 transitions among the variable levels V8a, 0, V6a, and V2a during the cycle 1 of the synchronization signal 302 and again transitions among the variable levels V8a, 0, V6a, and V2a during the cycle 2 of the synchronization signal 302. To illustrate, the variable 1006 has the variable level V8a during the state S4a from the time t0 to a time t2.5, the variable level zero during the no-state from the time t2.5 to the time t5, the variable level V6a during the state S3a from the time t5 to a time t7.5, and the variable level V2a during the state S1a from the time t7.5 to the time t10. The time t2.5 occurs between the times t2 and t3. Similarly, the time t7.5 occurs between the times t7 and t8. During the cycle 1 of the synchronization signal 302, the variable 1006 transitions from the variable level V2a to the variable level V8a at the time t0, transitions from the variable level V8a to the variable level zero at the time t2.5, transitions from the variable level zero to the variable level V6a at the time t5, and transitions from the variable level V6a to the variable level V2a at the time t7.5. During the cycle 2 of the synchronization signal 302, the variable 1006 transitions again from the variable level V2a to the variable level V8a at the time t10, transitions from the variable level V8a to the variable level zero at a time t12.5, transitions from the variable level zero to the variable level V6a at the time t15, and transitions from the variable level V6a to the variable level V2a at a time t17.5. The time t12.5 occurs between the times t12 and t13. Similarly, the time t17.5 occurs between the times t17 and t18. The variable level V8a is an example of the variable level for the state S4a of the RF signal 912, the variable level zero is an example of the variable level for the state 0 of the RF signal 912, the variable level V6a is an example of the variable level for the state S3a of the RF signal 912, and the variable level V2a is an example of the variable level for the state S1a of the RF signal 912.

The variable level V2a is greater than the variable level 0. Also, the variable level V6a is greater than the variable level V2a and the variable level V8a is greater than the variable level V6a. For example, power values of the variable level V6a are lower than power values of the variable level V8a. As another example, none of the power value of the variable level V6a are greater than the power values of the variable level V8a. As another example, a variable level has a maximum value and a minimum value. The maximum value is a maximum of all values of the variable level and the minimum value is a minimum of all the values of the variable level. A first variable level is lower than a second variable level when a maximum value of the first variable level is less than a minimum value of the second variable level and the first variable level is higher than the second variable level when a minimum value of the first variable level is greater than a maximum value of the second variable level.

In one embodiment, instead of achieving the variable level V2a, the variable 1006 has a variable level of zero. For example, the variable 1006 has the variable level of zero from the time t7.5 to the time t10 and from the time t17.5 to the time t20.

In one embodiment, a transition time, which is a time of transition between two variable levels, is a time period between a start time of the transition and an end time of the transition. For example, instead of transitioning at the time t2.5 from the variable level V8a to the variable level zero, the variable 1006 starts its transition at a first time from the variable level V8a and ends its transition to the variable level zero at a second time. The first time is before the time t2.5 and between the times t1 and t2.5 and the second time is after the time t2.5 and between the times t2.5 and t4. The time period of transition is the transition time between the first time and the second time.

In one embodiment, in addition to the synchronization signal 302, a digital pulsed signal is received by the DSP 204 from the processor 118 via the transfer cable system 214. For example, the synchronization signal 302 is received via the first transfer cable of the transfer cable system 214 and the digital pulsed signal is received via the second transfer cable of the transfer cable system 214. The digital pulsed signal periodically transitions among four variable levels in the same manner in which the variable 1006 transitions among the variable levels V8a, zero, V6a, and V2a. For example, during the cycle 1 of the synchronization signal 302, the digital pulsed signal transitions at the time t0 from the logic level 1 to a logic level 3, transitions at the time t2.5 from the logic level 3 to a logic level 0, transitions at the time t5 from the logic level 0 to a logic level 2, and transitions at the time t7.5 from the logic level 2 to the logic level 1. The logic level 3 is greater than the logic level 2. For example, the logic level 3 has a higher DC voltage than the DC voltage of the logic level 2. Upon receiving the digital pulsed signal, the DSP 204 identifies, from the digital pulsed signal, the time periods for the states S4a, no-state, S3a, and S1a of the variable 1006, and generates the instruction signals having the time periods. For example, the time period for the state S4a of the variable 1006 is the same as a time period for the logic level 3 of the digital pulsed signal, the time period for the state S0 of the variable 1006 is the same as a time period for the logic level 0 of the digital pulsed signal, the time period for the state S3a of the variable 1006 is the same as a time period for the logic level 2 of the digital pulsed signal, and the time period for the state S1a of the variable 1006 is the same as a time period for the logic level 1 of the digital pulsed signal.

Figure 10C:
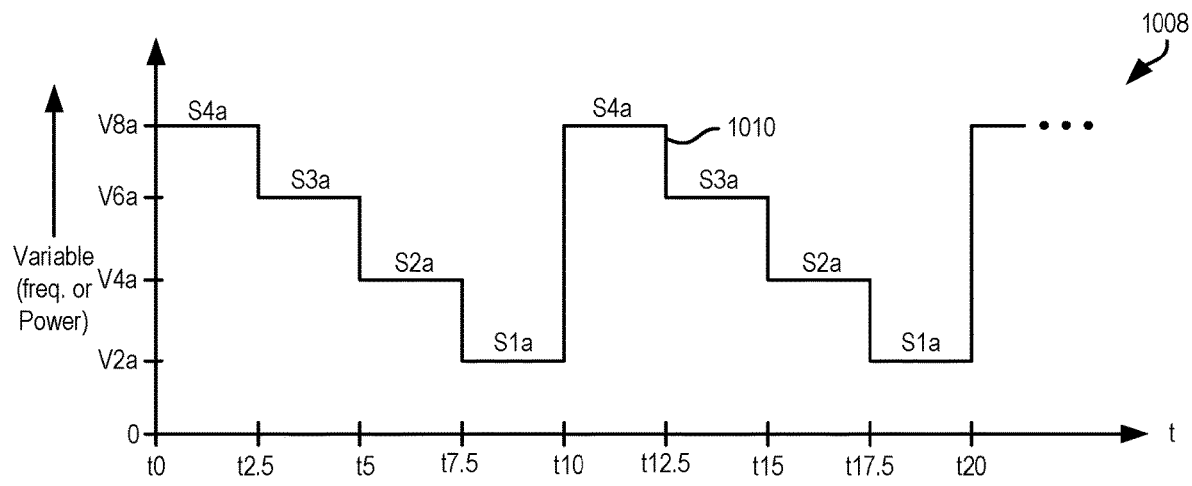
FIG. 10C is an embodiment of a graph to illustrate a variable of the RF signal of FIG. 9 versus the time.

FIG. 10C is an embodiment of a graph 1008 to illustrate a variable 1010 of the RF signal 912 (FIG. 9) versus the time t. The variable 1010 is plotted on a y-axis and the time t is plotted on an x-axis.

The variable 1010 periodically transitions among variable levels V8a, V6a, V4a, and V2a in synchronization with the synchronization signal 302. For example, the variable 1010 transitions among the variable levels V8a, V6a, V4a, and V2a during the cycle 1 of the synchronization signal 302 and again transitions among the variable levels V8a, V6a, V4a, and V2a during the cycle 2 of the synchronization signal 302. To illustrate, the variable 1010 has the variable level V8a during the state S4a from the time t0 to the time t2.5, the variable level V6a during the state S3a from the time t2.5 to the time t5, the variable level V4a during the state S2a from the time t5 to the time t7.5, and the variable level V2a during the state S1a from the time t7.5 to the time t10. During the cycle 1 of the synchronization signal 302, the variable 1010 transitions from the variable level V2a to the variable level V8a at the time t0, transitions from the variable level V8a to the variable level V6a at the time t2.5, transitions from the variable level V6a to the variable level V4a at the time t5, and transitions from the variable level V4a to the variable level V2a at the time t7.5. During the cycle 2 of the synchronization signal 302, the variable 1010 transitions again from the variable level V2a to the variable level V8a at the time t10, transitions from the variable level V8a to the variable level V6a at the time t12.5, transitions from the variable level V6a to the variable level V4a at the time t15, and transitions from the variable level V4a to the variable level V2a at the time t17.5. The variable level V4a is an example of the variable level for the state S2a of the RF signal 912.

The variable level V4a is greater than the variable level V2a and less than the variable level V6a. For example, power values of the variable level V4a are lower than power values of the variable level V6a and greater than power values of the variable level V2a. As another example, none of the power values of the variable level V4a are greater than the power values of the variable level V6a and none of the power values of the variable level V2a are greater than the power values of the variable level V4a.

In one embodiment, instead of achieving the variable level V2a, the variable 1010 has a variable level of zero. For example, the variable 1010 has the variable level of zero from the time t7.5 to the time t10 and from the time t17.5 to the time t20.

Figure 10D:
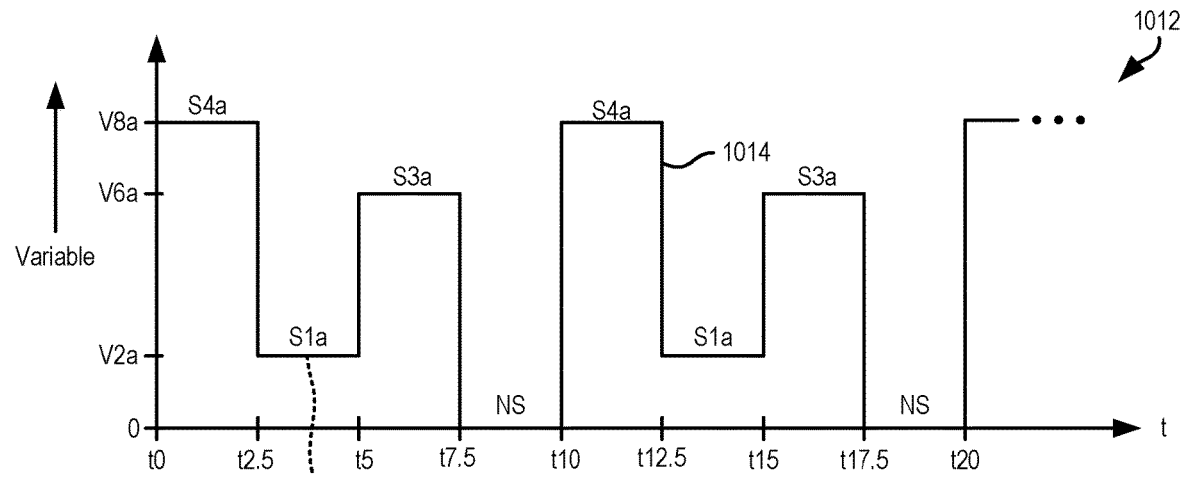
FIG. 10D is an embodiment of a graph to illustrate a variable of the RF signal of FIG. 9 versus the time t.

FIG. 10D is an embodiment of a graph 1012 to illustrate a variable 1014 of the RF signal 912 (FIG. 9) versus the time t. The variable 1014 is plotted on a y-axis and the time t is plotted on an x-axis.

The variable 1014 periodically transitions among the variable levels V8a, V2a, V6a, and zero in synchronization with the synchronization signal 302. For example, the variable 1014 transitions among the variable levels V8a, V2a, V6a, and zero during the cycle 1 of the synchronization signal 302 and again transitions among the variable levels V8a, V2a, V6a, and zero during the cycle 2 of the synchronization signal 302. To illustrate, the variable 1014 has the variable level V8a during the state S4a from the time t0 to the time t2.5, the variable level V2a during the state S1a from the time t2.5 to the time t5, the variable level V6a during the state S3a from the time t5 to the time t7.5, and the variable level zero during the state S0 from the time t7.5 to the time t10. During the cycle 1 of the synchronization signal 302, the variable 1014 transitions from the variable level zero to the variable level V8a at the time t0, transitions from the variable level V8a to the variable level V2a at the time t2.5, transitions from the variable level V2a to the variable level V6a at the time t5, and transitions from the variable level V6a to the variable level zero at the time t7.5. During the cycle 2 of the synchronization signal 302, the variable 1014 transitions again from the variable level zero to the variable level V8a at the time t10, transitions from the variable level V8a to the variable level V2a at the time t12.5, transitions from the variable level V2a to the variable level V6a at the time t15, and transitions from the variable level V6a to the variable level zero at the time t17.5.

Figure 10E:
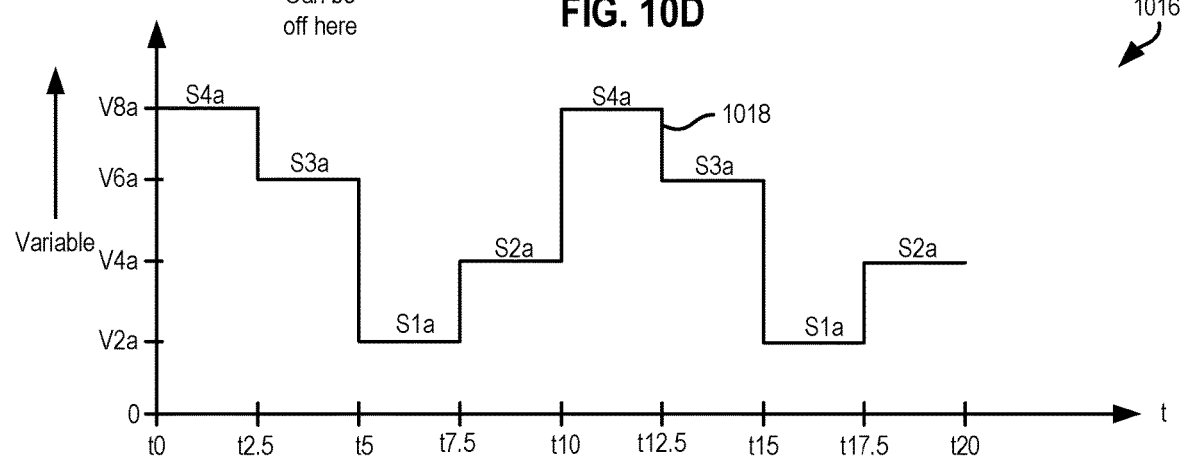
FIG. 10E is an embodiment of a graph to illustrate a variable of the RF signal of FIG. 9 versus the time.

FIG. 10E is an embodiment of a graph 1016 to illustrate a variable 1018 of the RF signal 912 (FIG. 9) versus the time t. The variable 1018 is plotted on a y-axis and the time t is plotted on an x-axis.

The variable 1018 periodically transitions among the variable levels V8a, V6a, V2a, and V4a in synchronization with the synchronization signal 302. For example, the variable 1018 transitions among the variable levels V8a, V6a, V2a, and V4a during the cycle 1 of the synchronization signal 302 and again transitions among the variable levels V8a, V6a, V2a, and V4a during the cycle 2 of the synchronization signal 302. To illustrate, the variable 1018 has the variable level V8a during the state S4a from the time t0 to the time t2.5, the variable level V6a during the state S3a from the time t2.5 to the time t5, the variable level V2a during the state S1a from the time t5 to the time t7.5, and the variable level V4a during the state S2a from the time t7.5 to the time t10. During the cycle 1 of the synchronization signal 302, the variable 1018 transitions from the variable level V4a to the variable level V8a at the time t0, transitions from the variable level V8a to the variable level V6a at the time t2.5, transitions from the variable level V6a to the variable level V2a at the time t5, and transitions from the variable level V2a to the variable level V4a at the time t7.5. During the cycle 2 of the synchronization signal 302, the variable 1018 transitions again from the variable level V4a to the variable level V8a at the time t10, transitions from the variable level V8a to the variable level V6a at the time t12.5, transitions from the variable level V6a to the variable level V2a at the time t15, and transitions from the variable level V2a to the variable level V4a at the time t17.5.

In one embodiment, instead of achieving the variable level V2a, the variable 1018 has a variable level of zero. For example, the variable 1018 has the variable level of zero from the time t5 to the time t7.5 and from the time t15 to the time t17.5.

Figure 10F:
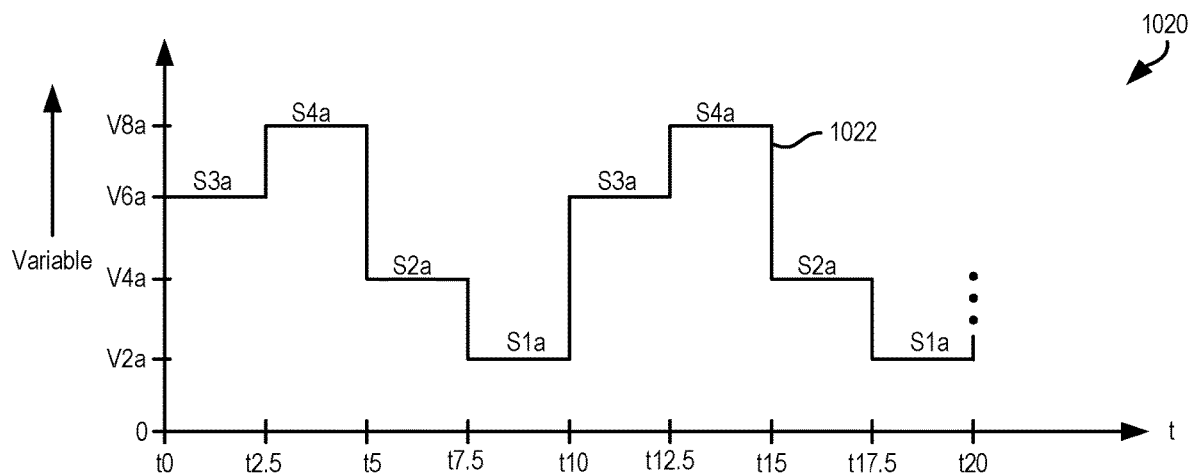
FIG. 10F is an embodiment of a graph to illustrate a variable of the RF signal of FIG. 9 versus the time.

FIG. 10F is an embodiment of a graph 1020 to illustrate a variable 1022 of the RF signal 912 (FIG. 9) versus the time t. The variable 1022 is plotted on a y-axis and the time t is plotted on an x-axis.

The variable 1022 periodically transitions among the variable levels V6a, V8a, V4a, and V2a in synchronization with the synchronization signal 302. For example, the variable 1022 transitions among the variable levels V6a, V8a, V4a, and V2a during the cycle 1 of the synchronization signal 302 and again transitions among the variable levels V6a, V8a, V4a, and V2a during the cycle 2 of the synchronization signal 302. To illustrate, the variable 1022 has the variable level V6a during the state S3a from the time t0 to the time t2.5, the variable level V8a during the state S4a from the time t2.5 to the time t5, the variable level V4a during the state S2a from the time t5 to the time t7.5, and the variable level V2a during the state S1a from the time t7.5 to the time t10. During the cycle 1 of the synchronization signal 302, the variable 1020 transitions from the variable level V2a to the variable level V6a at the time t0, transitions from the variable level V6a to the variable level V8a at the time t2.5, transitions from the variable level V8a to the variable level V4a at the time t5, and transitions from the variable level V4a to the variable level V2a at the time t7.5. During the cycle 2 of the synchronization signal 302, the variable 1018 transitions again from the variable level V2a to the variable level V6a at the time t10, transitions from the variable level V6a to the variable level V8a at the time t12.5, transitions from the variable level V8a to the variable level V4a at the time t15, and transitions from the variable level V4a to the variable level V2a at the time t17.5.

Figure 10G:
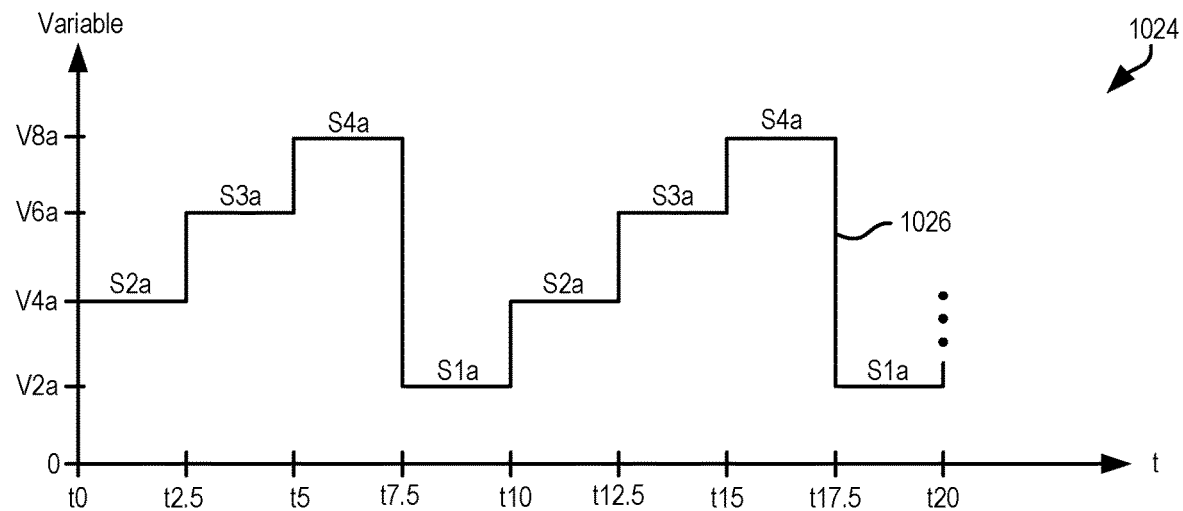
FIG. 10G is an embodiment of a graph to illustrate a variable of the RF signal of FIG. 9 versus the time t.

FIG. 10G is an embodiment of a graph 1024 to illustrate a variable 1026 of the RF signal 912 (FIG. 9) versus the time t. The variable 1026 is plotted on a y-axis and the time t is plotted on an x-axis.

The variable 1026 periodically transitions among the variable levels V4a, V6a, V8a, and V2a in synchronization with the synchronization signal 302. For example, the variable 1026 transitions among the variable levels V4a, V6a, V8a, and V2a during the cycle 1 of the synchronization signal 302 and again transitions among the variable levels V4a, V6a, V8a, and V2a during the cycle 2 of the synchronization signal 302. To illustrate, the variable 1024 has the variable level V4a during the state S2a from the time t0 to the time t2.5, the variable level V6a during the state S3a from the time t2.5 to the time t5, the variable level V8a during the state S4a from the time t5 to the time t7.5, and the variable level V2a during the state S1a from the time t7.5 to the time t10. During the cycle 1 of the synchronization signal 302, the variable 1026 transitions from the variable level V2a to the variable level V4a at the time t0, transitions from the variable level V4a to the variable level V6a at the time t2.5, transitions from the variable level V6a to the variable level V8a at the time t5, and transitions from the variable level V8a to the variable level V2a at the time t7.5.

During the cycle 2 of the synchronization signal 302, the variable 1026 transitions again from the variable level V2a to the variable level V4a at the time t10, transitions from the variable level V4a to the variable level V6a at the time t12.5, transitions from the variable level V6a to the variable level V8a at the time t15, and transitions from the variable level V8a to the variable level V2a at the time t17.5.

In one embodiment, instead of achieving the variable level V2a, the variable 1026 has a variable level of zero. For example, the variable 1026 has the variable level of zero from the time t7.5 to the time t10 and from the time t17.5 to the time t20.

Figure 10H:
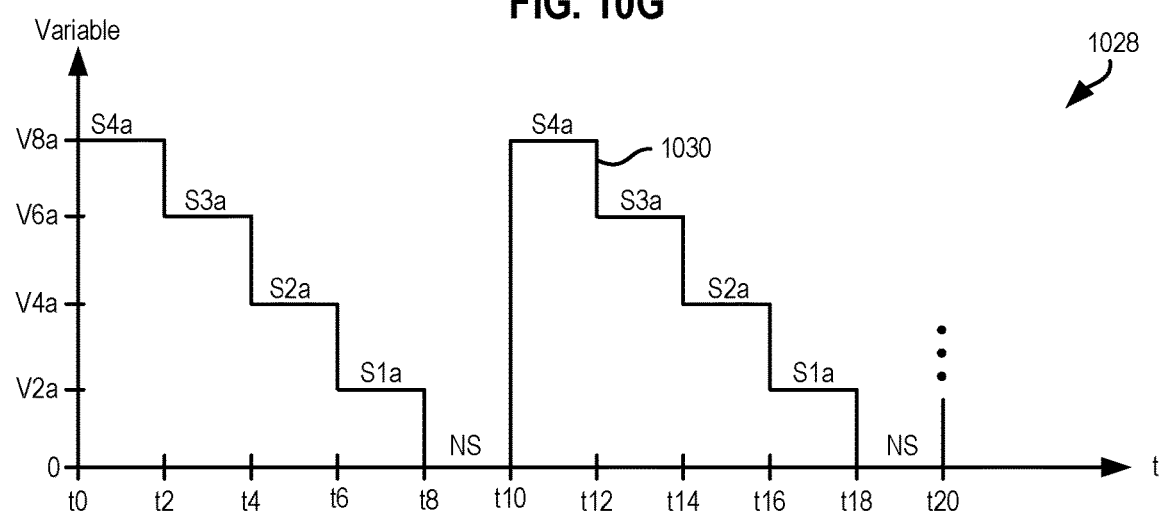
FIG. 10H is an embodiment of a graph to illustrate a variable of the RF signal of FIG. 9 versus the time.

FIG. 10H is an embodiment of a graph 1028 to illustrate a variable 1030 of the RF signal 912 (FIG. 9) versus the time t. The variable 1030 is plotted on a y-axis and the time t is plotted on an x-axis.

The variable 1030 periodically transitions among the variable levels V8a, V6a, V4a, V2a, and zero in synchronization with the synchronization signal 302. For example, the variable 1030 transitions among the variable levels V8a, V6a, V4a, V2a, and zero during the cycle 1 of the synchronization signal 302 and again transitions among the variable levels V8a, V6a, V4a, V2a, and zero during the cycle 2 of the synchronization signal 302. To illustrate, the variable 1030 has the variable level V8a during the state S4a from the time t0 to the time t2, the variable level V6a during the state S3a from the time t2 to the time t4, the variable level V4a during the state S2a from the time t4 to the time t6, the variable level V2a during the state S1a from the time t6 to the time t8, and the variable level 0 during the no-state from the time t8 to the time t10. During the cycle 1 of the synchronization signal 302, the variable 1030 transitions from the variable level zero to the variable level V8a at the time t0, transitions from the variable level V8a to the variable level V6a at the time t2, transitions from the variable level V6a to the variable level V4a at the time t4, transitions from the variable level V4a to the variable level V2a at the time t6, and transitions from the variable level V2a to the variable level zero at the time t8. During the cycle 2 of the synchronization signal 302, the variable 1030 transitions again from the variable level zero to the variable level V8a at the time t10, transitions from the variable level V8a to the variable level V6a at the time t12, transitions from the variable level V6a to the variable level V4a at the time t14, transitions from the variable level V4a to the variable level V2a at the time t16, and transitions from the variable level V2a to the variable level zero at the time t18.

It should be noted that although a step-down change in variable levels is illustrated in the graph 1028, in one embodiment, a step-up change in variable levels can occur. For example, during each cycle of the synchronization signal, the variable of the RF signal 912 can increase from zero to the variable level V2a, from the variable level V2a to the variable level V4a, from the variable level V4a to the variable level V6a, and from the variable level V6a to the variable level V8a.

Figure 10I:
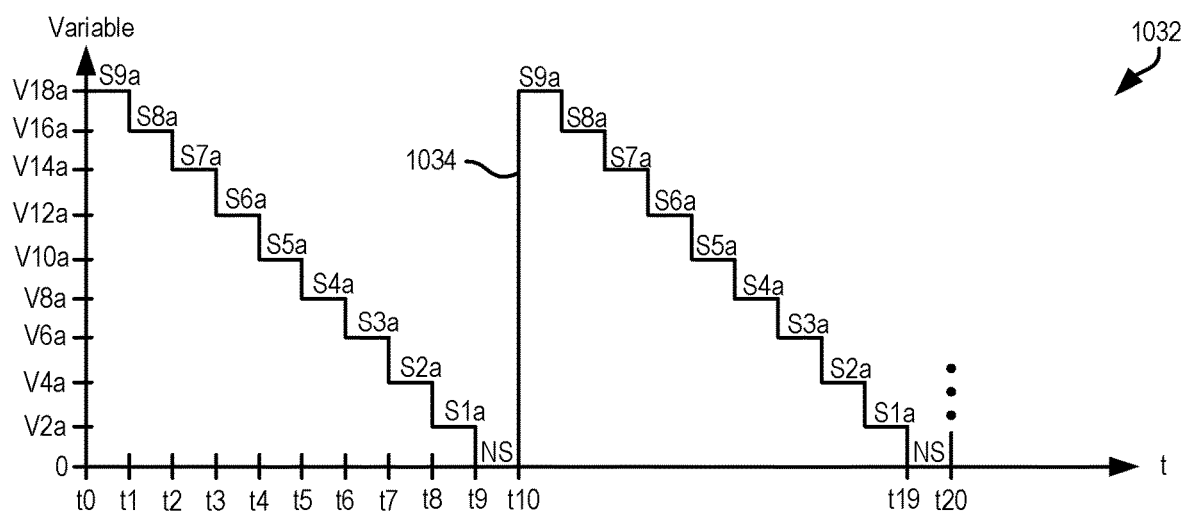
FIG. 10I is an embodiment of a graph to illustrate a variable of the RF signal of FIG. 9 versus the time.

FIG. 10I is an embodiment of a graph 1032 to illustrate a variable 1034 of the RF signal 912 (FIG. 9) versus the time t. The variable 1034 is plotted on a y-axis and the time t is plotted on an x-axis.

The variable 1034 periodically transitions among variable levels V18a, V16a, V14a, V12a, V10a, V8a, V6a, V4a, V2a, and zero in synchronization with the synchronization signal 302. For example, the variable 1034 transitions among the variable levels variable levels V18a, V16a, V14a, V12a, V10a, V8a, V6a, V4a, V2a, and zero during the cycle 1 of the synchronization signal 302 and again transitions among the variable levels variable levels V18a, V16a, V14a, V12a, V10a, V8a, V6a, V4a, V2a, and zero during the cycle 2 of the synchronization signal 302. To illustrate, the variable 1034 has the variable level V18a during a state S9a from the time t0 to the time t1, the variable level V16a during a state S8a from the time t1 to the time t2, the variable level V14a during a state S7a from the time t2 to the time t3, the variable level V12a during a state S6a from the time t3 to the time t4, the variable level V10a during a state S5a from the time t4 to the time t5, the variable level V8a during a state S4a from the time t5 to the time t6, the variable level V6a during a state S3a from the time t6 to the time t7, the variable level V4a during the state S2a from the time t7 to the time t8, the variable level V2a during the state S1a from the time t8 to the time t9, and the variable level zero during the state S0 from the time t9 to the time t10. During the cycle 1 of the synchronization signal 302, the variable 1034 transitions from the variable level zero to the variable level V18a at the time t0, transitions from the variable level V18a to the variable level V16a at the time t1, transitions from the variable level V16a to the variable level V14a at the time t2, transitions from the variable level V14a to the variable level V12a at the time t3, transitions from the variable level V12a to the variable level V10a at the time t4, transitions from the variable level V10a to the variable level V8a at the time t5, transitions from the variable level V8a to the variable level V6a at the time t6, transitions from the variable level V6a to the variable level V4a at the time t7, transitions from the variable level V4a to the variable level V2a at the time t8, and transitions from the variable level V2a to the variable level zero at the time t9. During the cycle 2 of the synchronization signal 302, the variable 1030 transitions again from the variable level zero to the variable level V18a at the time t10, transitions from the variable level V18a to the variable level V16a at the time t11, transitions from the variable level V16a to the variable level V14a at the time t12, transitions from the variable level V14a to the variable level V12a at the time t13, transitions from the variable level V12a to the variable level V10a at the time t14, transitions from the variable level V10a to the variable level V8a at the time t15, transitions from the variable level V8a to the variable level V6a at the time t16, transitions from the variable level V6a to the variable level V4a at the time t17, transitions from the variable level V4a to the variable level V2a at the time t18, and transitions from the variable level V2a to the variable level zero at the time t19.

The variable level V10a is greater than the variable level V8a. Also, the variable level V12a is greater than the variable level V10a and the variable level V14a is greater than the variable level V12a. The variable level V16a is greater than the variable level V14a and the variable level V18a is greater than the variable level V16a. For example, power values of the variable level V14a are lower than power values of the variable level V16a. As another example, none of the power values of the variable level V14a are greater than the power values of the variable level V16a.

It should be noted that although a step-down change in variable levels is illustrated in the graph 1032, in one embodiment, a step-up change in variable levels can occur. For example, during each cycle of the synchronization signal, the variable of the RF signal 912 can increase from zero to the variable level V2a, from the variable level V2a to the variable level V4a, from the variable level V4a to the variable level V6a, from the variable level V6a to the variable level V8a, from the variable level V8a to the variable level V10a, and so on until the variable level V18a.

Figure 10J:
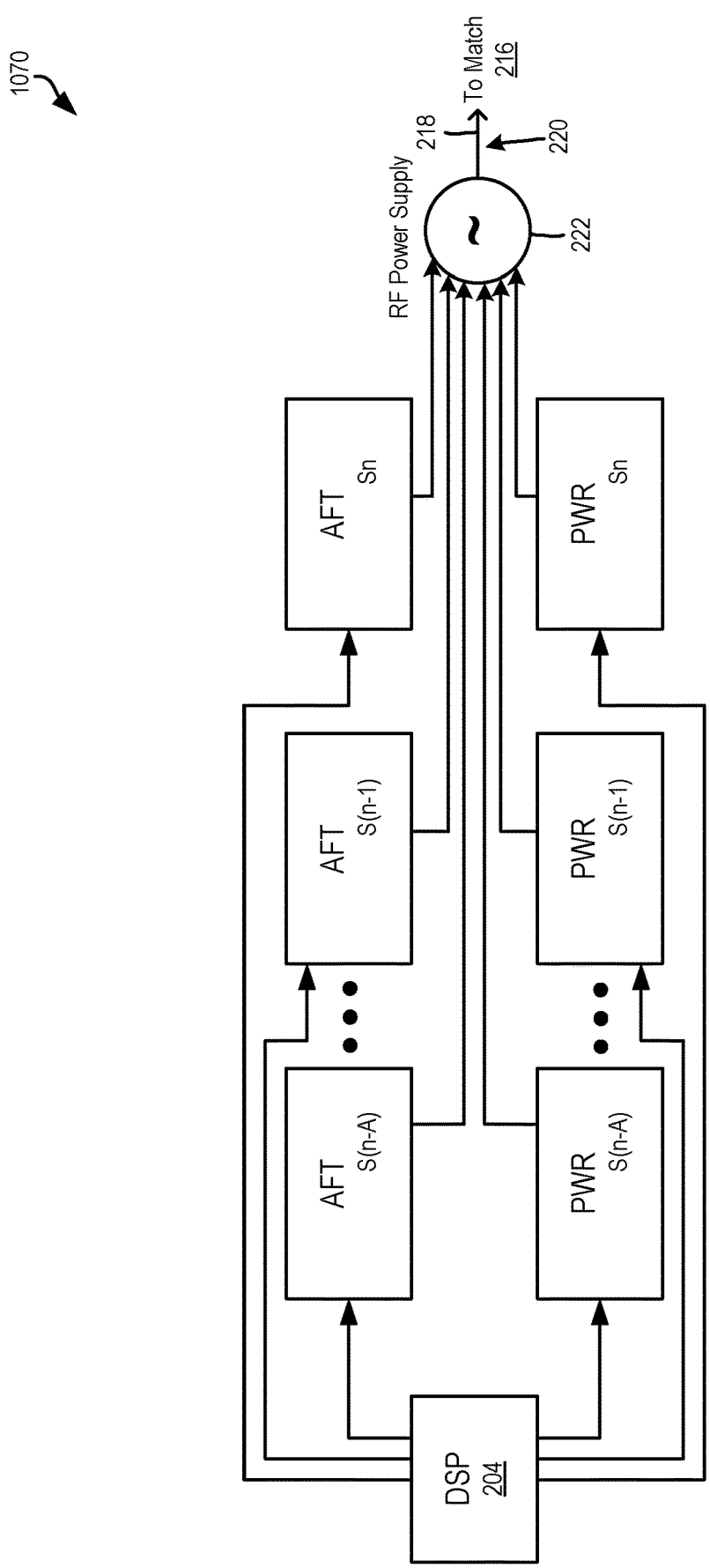
FIG. 10J is a diagram of an embodiment of a system having multiple power controllers and multiple auto frequency tuners (AFTs) is provided.

FIG. 10J is a diagram of an embodiment of an RF generator 1070 having multiple power controllers and multiple auto frequency tuners (AFTs) is provided. The RF generator 1070 is an example of the source RF generator 102 or the bias RF generator 104 (FIG. 1). The system 1070 also includes the DSP 204 and the RF power supply 222. The DSP 204 is an example of a receiver. The power controllers include a power controller $PWR_{S(n-A)}$, another power controller $PWR_{S(n-1)}$ and so on until a power controller $PWR_{Sn}$, is included. The AFTs include an auto frequency tuner $AFT_{S(n-A)}$, another auto frequency tuner $AFT_{S(n-1)}$ and so on until an auto frequency tuner $AFT_{Sn}$ is included. An auto frequency tuner as used herein is also a frequency controller.

During a state S(n-A), the auto frequency tuner $AFT_{S(n-A)}$ tunes a frequency of the RF signal 220 that is generated by the RF power supply 222 or the power controller $PWR_{S(n-A)}$ modifies a power of the RF signal 220 or both the frequency and power are modified, where (n-A) is an integer less than the integer n, and A is an integer. For example, when n is 4 or 5 or 10, (n-A) is 1. For example, during the state S(n-A), the DSP 204 provides a control signal to the auto frequency tuner $AFT_{S(n-A)}$ to indicate a logic level, such as a voltage level, of the state S(n-A). Upon receiving the control signal from the DSP 204, the auto frequency tuner $AFT_{S(n-A)}$ accesses a frequency level from a database within a memory device of the auto frequency tuner $AFT_{S(n-A)}$ for the state S(n-A). The auto frequency tuner $AFT_{S(n-A)}$ provides the frequency level for the state S(n-A) to the RF power supply 222. Upon receiving the frequency level for the state S(n-A), the RF power supply 222 generates the RF signal 220 having the frequency level during the state S(n-A). Similarly, during the state S(n-A), the DSP 204 provides a control signal to the power controller $PWR_{S(n-A)}$ to indicate the logic level of the state S(n-A). Upon receiving the control signal from the DSP 204, the power controller $PWR_{S(n-A)}$ accesses a power level $PL_{S(n-A)}$ from a database within a memory device of the power controller $PWR_{S(n-A)}$ for the state S(n-A). The power controller $PWR_{S(n-A)}$ provides the power level $PL_{S(n-A)}$ for the state S(n-A) to the RF power supply 222. Upon receiving the power level $PL_{S(n-A)}$ for the state S(n-A), the RF power supply 222 generates the RF signal 220 having the power level $PL_{S(n-A)}$ during the state S(n-A).

Similarly, during the state S(n-1), the auto frequency tuner $AFT_{S(n-1)}$ tunes a frequency of the RF signal 220 that is generated by the RF power supply 222 or the power controller $PWR_{S(n-1)}$ modifies a power of the RF signal 220 or both the frequency and power are modified. Also, during the state Sn, the auto frequency tuner $AFT_{Sn}$ tunes a frequency of the RF signal 220 that is generated by the RF power supply 222 or the power controller $PWR_{Sn}$ modifies a power of the RF signal 220 or both the frequency and power are modified.

The RF signal 220 is provided to via an output, such as an RF output port, of the RF generator 1070 to the impedance matching circuit 216 and the impedance matching circuit 216 generates a modified signal based on the RF signal 220 to provide the modified RF signal to an electrode, such as a TCP electrode or a bottom electrode, of the plasma chamber 112 (FIG. 1). The bottom electrode is situated within a chuck of the plasma chamber 112. The electrode or the plasma chamber 112 is an example of a load.

The RF signal 220 is generated when a digital pulse signal having the states S(n-A) through Sn is received by the DSP 204 from another processor of a host controller or the host computer 106 (FIG. 1) or a controller or from an analog-to-digital voltage control interface (ADVCI). The digital pulse signal is received at an input, such as an input port, of the DSP 204 shown in FIG. 10J. When the DSP 204 is situated within the RF generator 1070, the digital pulse signal is received by an input port of the RF generator 1070. The digital pulse signal is an example of an input signal and is generated by the other processor or by the ADVCI. The duty cycles, such as a time duration, of each of the four states S(n-4) through Sn is identified by the digital pulse signal. The four states occur during a clock cycle of a clock signal that is received at another input, such as another input port, of the processor shown in FIG. 10J. The clock signal is generated by the other processor or the ADVCI.

In an embodiment, a level, such as a power level or a frequency level, includes one or more values or amounts that are within a pre-determined range. For example, a first power level has one or more values of power that are within the pre-determined range and a second power level has one or more values of power that are within the pre-determined range. The second power level is exclusive of the first power level. For example, none of power values of the second power level is the same as a power value of the first power level.

Figure 10L:
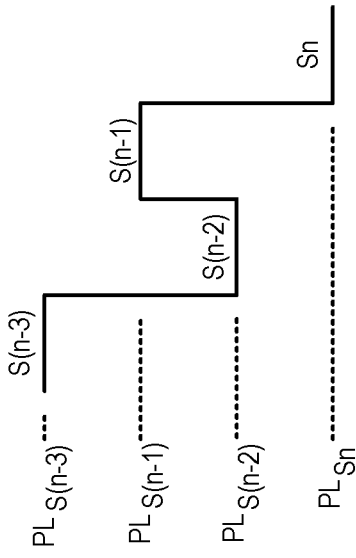
FIG. 10L is a diagram of an embodiment to illustrate another RF signal having four states S(n−3), S(n−2), S(n−1), and Sn to illustrate power levels of the RF signal.
Figure 10N:
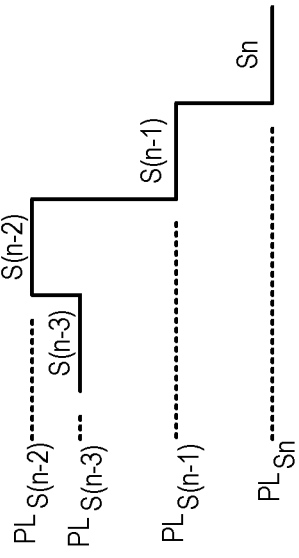
FIG. 10N is a diagram of an embodiment to illustrate another RF signal having four states S(n−3), S(n−2), S(n−1), and Sn to illustrate power levels of the RF signal.
Figure 10K:
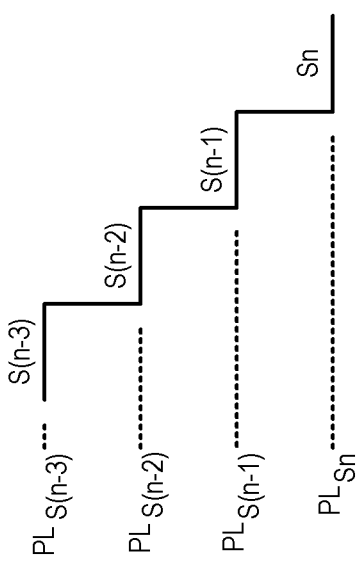
FIG. 10K is a diagram of an embodiment to illustrate an RF signal having four states S(n−3), S(n−2), S(n−1), and Sn to illustrate power levels of the RF signal.

FIG. 10K is a diagram of an embodiment to illustrate an RF signal having four states S(n-3), S(n-2), S(n-1), and Sn to illustrate power levels $PL_{S(n-3)}$, $PL_{S(n-2)}$, $PL_{S(n-1)}$, and $PL_{Sn}$ of the RF signal. A step down transition occurs from the state S(n-3) to the state Sn. For example, the power level $PL_{Sn}$ of the RF signal generated by an RF generator, such as the source RF generator 102 or the bias RF generator 104 (FIG. 1), during the state Sn is lower than the power level $PL_{S(n-1)}$ of the RF signal during the state S(n-1). Similarly, the power level $PL_{S(n-1)}$ of the RF signal during the state S(n-1) is lower than the power level $PL_{S(n-2)}$ of the RF signal during the state S(n-2), and the power level $PL_{S(n-2)}$ of the RF signal during the state S(n-2) is lower than the power level $PL_{S(n-3)}$ of the RF signal during the state S(n-3).

FIG. 10L is a diagram of an embodiment to illustrate another RF signal having the four states S(n-3), S(n-2), S(n-1), and Sn. The RF signal illustrated in FIG. 10L is also a step down signal except that during the state S(n-1), the RF signal has a higher power level $PL_{S(n-1)}$ than the power level $PL_{S(n-2)}$ during the state S(n-2).

Figure 10M:
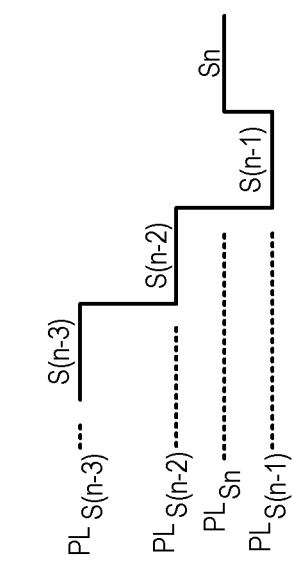
FIG. 10M is a diagram of an embodiment to illustrate yet another RF signal having four states S(n−3), S(n−2), S(n−1), and Sn to illustrate power levels of the RF signal.

FIG. 10M is a diagram of an embodiment to illustrate another RF signal having the four states S(n-3), S(n-2), S(n-1), and Sn. The RF signal illustrated in FIG. 10M is also a step down signal except that during the state Sn, the RF signal has a higher power level $PL_{Sn}$ than a power level $PL_{S(n-3)}$ during the state S(n-1).

FIG. 10N is a diagram of an embodiment to illustrate yet another RF signal having the four states S(n-3), S(n-2), S(n-1), and Sn. The RF signal illustrated in FIG. 14D is a step down signal except that during the state S(n-2), the RF signal has a higher power level $PL_{S(n-2)}$ than a power level $PL_{S(n-3)}$ during the state S(n-3).

FIG. 10O is a diagram of an embodiment to illustrate still another RF signal having the four states S(n-3), S(n-2), S(n-1), and Sn. The RF signal steps up its power levels $PL_{S(n-3)}$ through $PL_{S(n-1)}$ during the states S(n-3) through S(n-1) and steps down its power level $PL_{S(n-1)}$ from the state S(n-1) to a power level $PL_{Sn}$ during the state Sn.

The power levels $PL_{S(n-4)}$ through $PL_{Sn}$ repeat for each clock cycle of a clock signal that is received by the processor of the RF generator illustrated in FIG. 14A. The power levels $PL_{S(n-4)}$ through $PL_{Sn}$ repeat for multiple clock cycles. The clock signal is received from a clock source or from the processor of the host computer or the host controller or the ADVCI. The clock signal is generated by the clock source or by the processor of the host computer or the processor of the host controller or the ADVCI. Similarly, the power levels $PL_{S(n-A)}$ through $PL_{Sn}$ repeat for the states S(n−A) through Sn that occur during a clock cycle. The power levels $PL_{S(n-A)}$ through $PL_{Sn}$ repeat for multiple clock cycles. The power levels $PL_{S(n-A)}$ through $PL_{Sn}$ occur once during an instance of a clock cycle and repeat during each following instance of the clock cycle.

It should be noted that the RF signal illustrated in any of FIGS. 14B-14F is an envelope of a sinusoidal RF signal generated by the RF generator, such as the source RF generator 102 or the bias RF generator 104 (FIG. 1).

FIG. 10P is a diagram of an embodiment of a method to illustrate that a power level of zero is achieved during any of the states S(n−A) through Sn. As illustrated in FIG. 10P, instead of an RF signal having a power level of zero during the state Sn, the RF signal has the power level of zero in another state, such as S2 or S3.

In one embodiment, the embodiments described herein, in FIGS. 10K through 10P, with respect to power also apply equally as well to frequency. For example, instead of or in addition to multiple power levels, multiple frequency levels are achieved during the states S(n−A) through Sn.

It should be noted that in one embodiment, the power level of zero is achieved when the power level is zero. In an embodiment, the power level of zero is achieved when RF the power level is close to zero or substantially zero, such as within a pre-set range. An example of the pre-set range value is a range between 0.1 watts and 1 watt. Another example of the pre-set range is a range between 0.1 watts and 0.25 watts. Yet another example of the pre-set range is a range between 0.1 watts and 0.5 watts.

Transition Control

Figure 11A:
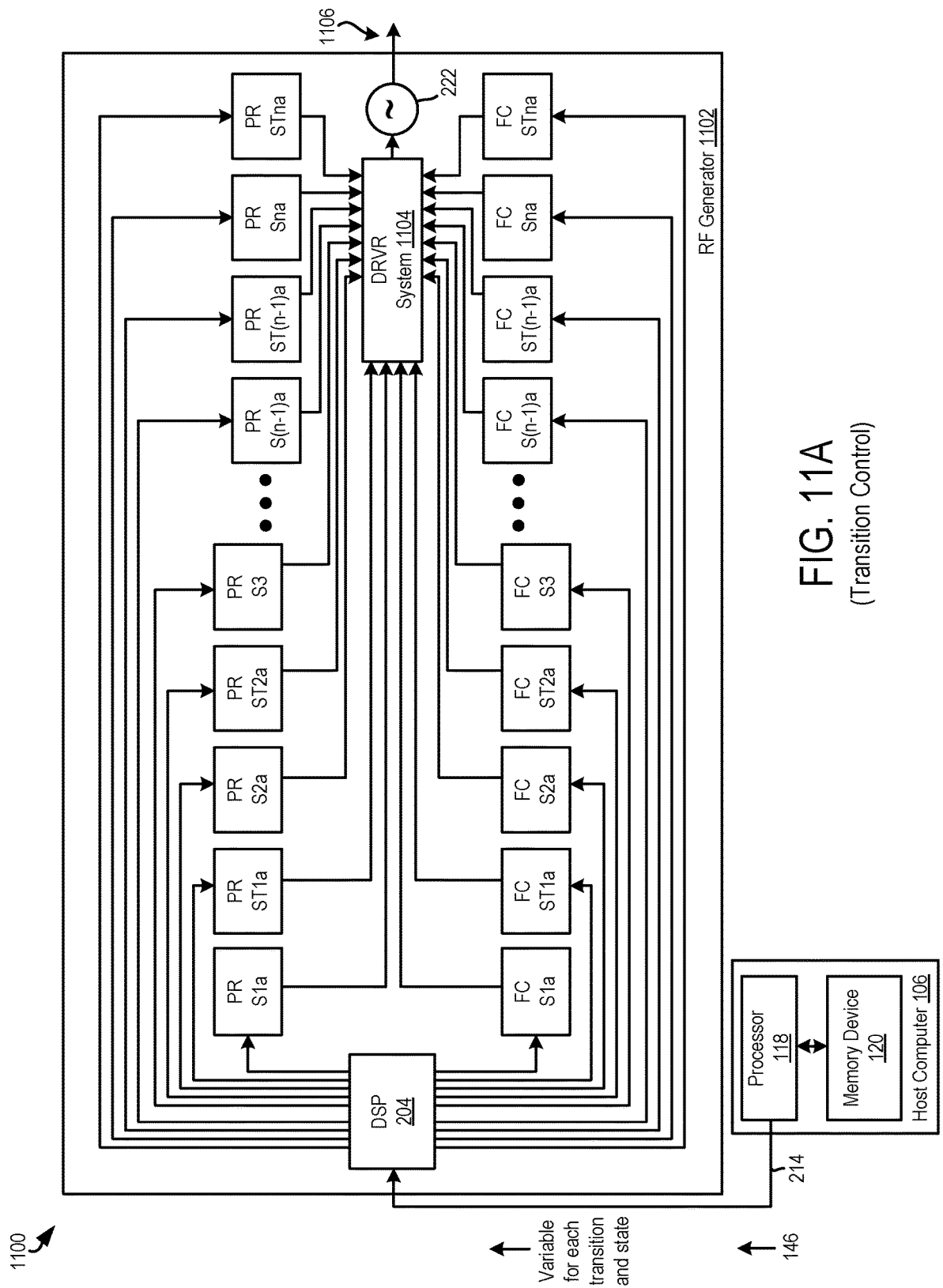
FIG. 11A is a diagram of an embodiment of a plasma system to illustrate a control of a slope of a state transition.

FIG. 11A is a diagram of an embodiment of a plasma system 1100 to illustrate a control of a slope of a state transition. The plasma system 1100 includes an RF generator 1102 and the host computer 106. The RF generator 1102 is an example of the source RF generator 102 (FIG. 1) or the bias RF generator 104 (FIG. 1). The RF generator 1102 includes the DSP 204, the parameter controllers PRS1a through PRSna, and multiple transition parameter controllers PRST1a, PRTS2a, PRST(n−1)a, and PRSTna, where n is an integer greater than three. For example, n is four or more. As an example, the RF generator 702 includes four transition parameter controllers, one for a state transition ST1a between the states S1a and S2a of the parameter during a current cycle of a synchronization signal, another for a state transition ST2a between the states S2a and S3a of the parameter during the current cycle of the synchronization signal, yet another one for a state transition ST(n−1)a between the states S(n−1)a and Sna of the parameter during the current cycle of the synchronization signal, and another one for a state transition STna between the state Sna of the parameter during the current cycle of the synchronization signal and the state S1a of the parameter during a following cycle of the synchronization signal. The current cycle precedes the following cycle. For example, there is no cycle of the synchronization signal between the current and following cycles. As another example, the RF generator 1102 includes five transition parameter controllers.

The RF generator 1102 further includes the frequency controllers FCS1a through FCSna, and multiple transition frequency controllers FCST1a, FCTS2a, FCST(n−1)a, and FCSTna, where n is an integer greater than three. For example, n is four or more. As an example, the RF generator 1102 includes four transition frequency controllers, one for the state transition ST1 between the states S1a and S2a of the frequency during the current cycle of the synchronization signal, another for the state transition ST2 between the states S2a and S3a of the frequency during the current cycle of the synchronization signal, yet another one for the state transition ST(n−1)a between the states S(n−1)a and Sna of the frequency during the current cycle of the synchronization signal, and another one for the state transition STna between the state Sna of the frequency during the current cycle of the synchronization signal and the state S1a of the frequency during the following cycle of the synchronization signal. As another example, the RF generator 1102 includes five transition frequency controllers. The RF generator 1102 further includes a driver system 1104 and the RF power supply 222.

The DSP 204 is coupled to each of the parameter controllers PRS1a through PRSna of the RF generator 1102 and to each of the transition parameter controllers PRST1a through PRSTna of the RF generator 1102. The parameter controllers PRS1a through PRSna and the transition parameter controllers PRST1a through PRSTna are coupled to the driver system 1104, which is coupled to the RF power supply 222.

Also, the DSP 204 is coupled to each of the frequency controllers FCS1a through FCSna of the RF generator 1102 and to each of the transition frequency controllers FCST1a through FCSTna of the RF generator 1102. The frequency controllers FCS1a through FCSna and the transition frequency controllers FCST1a through FCSTna are coupled to the driver system 1104. Functionality of the system 1110 is described below with reference to FIG. 11B.

Figure 11B:
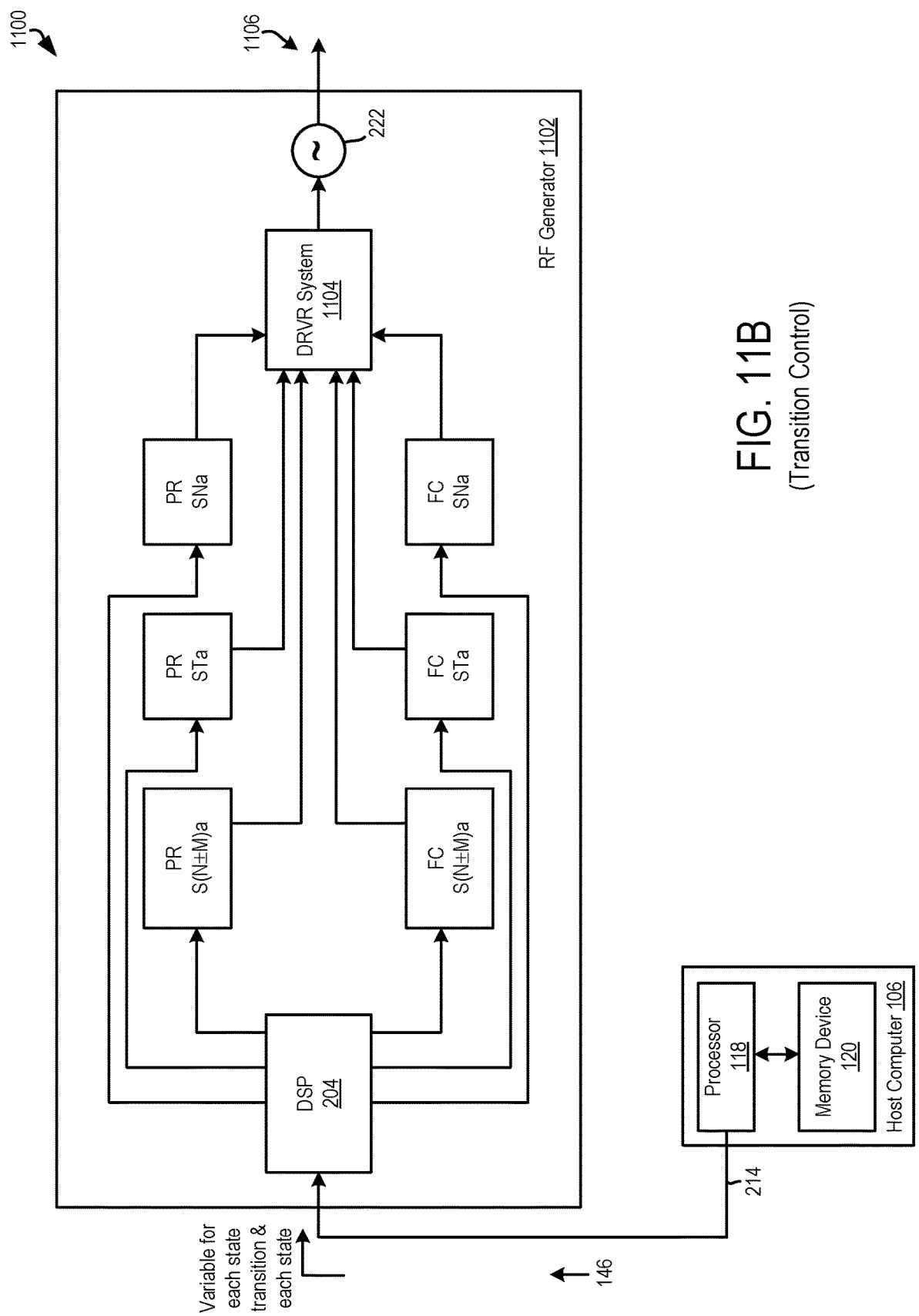
FIG. 11B is a diagram of an embodiment of the system of FIG. 11A to illustrate functionality of the system.

FIG. 11B is a diagram of an embodiment of the system 1100 to illustrate functionality of the system 1100. The system 1100 includes the RF generator 1102 and the host computer 106. The RF generator 1102 includes the DSP 204, a parameter controller PRS(N±M)a, a transition parameter controller PRSTa, and a parameter controller PRSNa, where N is an integer greater than zero and N±M is an integer different from N. For example, when N is 1, N±M is 2 or 3 or 4 and when N is 3, N±M is 4 or 2 or 1. The integer N±M defines M, which is a positive integer. Examples of the parameter controller PRSNa include the parameter controller PRS1a or PRS2a or PRS3a or PRSna (FIG. 11A). Examples of the parameter controller PRS(N±M)a include the parameter controller PRS1a or PRS2a or PRS3a or PRSna (FIG. 11A) and the parameter controller PRS(N±M)a is different from the parameter controller PRSNa. For example, when the parameter controller PRSNa is PRS4a, the parameter controller PRS(N±M)a is PRS2a or PRS1a.

Examples of the transition parameter controller PRSTa include the parameter controller PRST1a or PRST2a or PRST3a or PRST(n−1) or PRSTna (FIG. 11A). To illustrate, when the parameter controller PRSNa is the parameter controller PRS1a, and the parameter controller PRS(N±M)a is the parameter controller PRS2a, the transition parameter controller PRSTa is PRST1a, which controls a transition between the states S1a and S2a of the parameter. As another illustration, when the parameter controller PRSNa is the parameter controller PRS3a, and the parameter controller PRS(N±M)a is the parameter controller PRS5a, the transition parameter controller PRSTa is PRST3a, which controls a transition between the states S3a and S5a of the parameter.

It should be noted that the RF generator 1102 includes any number of transition parameter controllers, such as the transition parameter controller PRSTa. For example, when the parameter transitions from the state S4a of a preceding cycle of the synchronization signal 146 to the state S1a of the current cycle, from the state S1a of the current cycle to the state S2a of the current cycle, from the state S2a of the current cycle to the state S3a of the current cycle, and from the state S3a of the current cycle to the state S4a of the current cycle, the RF generator 1102 includes four transition parameter controllers. The four transition parameter controllers include one for controlling the transition from the state S4a of the preceding cycle of the synchronization signal 146 to the state S1a of the current cycle, another one for controlling a transition from the state S1a of the current cycle to the state S2a of the current cycle, yet another for controlling a transition from the state S2a of the current cycle to the state S3a of the current cycle, and another for controlling a transition from the state S3a of the current cycle to the state S4a of the current cycle. The preceding cycle of the synchronization signal 146 precedes the current cycle of the synchronization signal 146.

The RF generator 1102 further includes a frequency controller FCS(N±M)a, a transition frequency controller FCSTa, and the frequency controller FCSNa, where M and N are defined above. Examples of the frequency controller FCSNa include the frequency controller FCS1a or FCS2a or FCS3a or FCSna (FIG. 11A). Examples of the frequency controller FCS(N±M)a include the frequency controller FCS1a or FCS2a or FCS3a or FCSna (FIG. 11A) and the frequency controller FCS(N±M)a is different from the frequency controller FCSNa.

Examples of the transition frequency controller FCSTa include the frequency controller FCST1a or FCST2a or FCST3a or FCST(n−1) or FCSTna. To illustrate, if the frequency controller FCSNa is the frequency controller FCS1a, and the frequency controller FCS(N±M)a is the frequency controller FCS2a, the transition frequency controller FCSTa is FCST1a, which controls a transition between the states S1a and S2a of the frequency. As another illustration, if the frequency controller FCSNa is the frequency controller FCS3a, and the frequency controller FCS(N±M)a is the frequency controller FCS5a, the transition frequency controller FCSTa is FCST3a, which controls a transition between the states S3a and S5a of the frequency.

It should be noted that the RF generator 1102 includes any number of transition frequency controllers, such as the transition frequency controller FCSTa. For example, when the frequency transitions from the state S4a of the preceding cycle of the synchronization signal 146 to the state S1a of the current cycle, from the state S1a of the current cycle to the state S2a of the current cycle, from the state S2a of the current cycle to the state S3a of the current cycle, and from the state S3a of the current cycle to the state S4a of the current cycle, the RF generator 1102 includes four transition frequency controllers. The four transition frequency controllers include one for controlling the transition from the state S4a of the preceding cycle of the synchronization signal 146 to the state S1a of the current cycle, another one for controlling a transition from the state S1a of the current cycle to the state S2a of the current cycle, yet another for controlling a transition from the state S2a of the current cycle to the state S3a of the current cycle, and another for controlling a transition from the state S3a of the current cycle to the state S4a of the current cycle.

The DSP 204 is coupled to the parameter controllers PRS(N±M)a and PRSNa and to the transition parameter controller PRSTa. Also, the DSP 204 is coupled to the frequency controllers FCS(N±M)a and FCSNa and to the transition frequency controller FCSTa. The parameter controllers PRS(N±M)a and PRSNa, the transition parameter controller PRSTa, the frequency controllers FCS(N±M)a and FCSNa, and the transition frequency controller FCSTa are coupled to the driver system 1104, which is coupled to the RF power supply 222.

The processor 118 provides the parameter levels for the states S(N±M)a and SNa, and the synchronization signal 146 via the transfer cable system 214 to the DSP 204. In addition, the processor 118 provides one or more parameter values for the state transition STa of the parameter via the transfer cable system 214 to the DSP 204. For example, the processor 118 provides one or more parameter values to be achieved during the state transition ST1a of the parameter, one or more parameter values to be achieved during the state transition ST2a of the parameter, one or more parameter values to be achieved during the state transition ST(n−1)a of the parameter, and one or more parameter values to be achieved during the state transition STna of the parameter.

The state transition STa of the parameter is a transition between the states S(N±M)a and SNa of the parameter. For example, the state transition STa of the parameter is a transition from the state S(N±M)a of the parameter to the state SNa of the parameter or from the state SNa of the parameter to the state S(N±M)a of the parameter.

Also, the processor 118 provides the frequency levels for the states S(N±M)a and SNa via the transfer cable system 214 to the DSP 204. In addition, the processor 118 provides frequency values for state transition STa of the frequency via the transfer cable system 214 to the DSP 204. For example, the processor 118 provides one or more frequency values to be achieved during the state transition ST1a of the frequency, one or more frequency values to be achieved during the state transition ST2a of the frequency, one or more frequency values to be achieved during the state transition ST(n−1)a of the frequency, and one or more frequency values to be achieved during the state transition STna of the frequency.

The state transition STa of the frequency is a transition between the states S(N±M)a and SNa of the frequency. For example, the state transition STa of the frequency is a transition from the state S(N±M)a of the frequency to the state SNa of the frequency or from the state SNa of the frequency to the state S(N±M)a of the frequency.

Upon receiving the parameter levels for the states S(N±M)a and SNa, the DSP 204 provides the parameter level for the state S(N±M)a of an RF signal 1106 to the parameter controller PRS(N±M)a for storage of the parameter level for the state S(N±M)a in the memory device of the parameter controller PRS(N±M)a. The RF signal 1106 is an example of the RF signal 152 or the RF signal 168 (FIG. 1). Also, upon receiving the one or more parameter values for the state transition STa of the parameter, the DSP 204 provides the one or more parameter values for the state transition STa of the parameter of the RF signal 1106 to the transition parameter controller PRSTa for storage of the one or more parameter values for the state transition STa in a memory device of the transition parameter controller PRSTa. An example of a parameter value during the state transition STa is an envelope, such as a zero-to-peak amplitude or a peak-to-peak amplitude, of the parameter of the RF signal 1106 during the state transition STa. Also, in response to receiving the parameter levels for the states S(N±M)a and SNa, the DSP 204 provides the parameter level for the state SNa of the RF signal 1106 to the parameter controller PRSNa for storage of the parameter level for the state SNa in the memory device of the parameter controller PRSNa.

Upon receiving the synchronization signal 146, during each cycle of the synchronization signal 146, the DSP 204 sends an instruction signal for the state S(N±M)a of the parameter to the parameter controller PRS(N±M)a. For example, the DSP 204 sends the instruction signal for the state S(N±M)a to the parameter controller PRS(N±M)a at an end of time of transition from the state different from or other than the state S(N±M)a, such as the state S(N±M−1)a or the state S0, to the state S(N±M)a. The instruction signal for the state S(N±M)a sent to the parameter controller PRS(N±M)a includes a time period for the state S(N±M)a during each cycle for which the parameter controller PRS(N±M)a is to provide the parameter level for the state S(N±M)a to the driver system 1104. Upon receiving the instruction signal for the state S(N±M)a, the parameter controller PRS(N±M)a accesses the parameter level for the state S(N±M)a from the memory device of the parameter controller PRS(N±M)a and sends the parameter level to the driver system 1104 for the time period for the state S(N±M)a. For example, the parameter controller PRS(N±M)a sends the parameter level for the state S(N±M)a to the driver system 1104 at the end of the time of transition from the state different from the state S(N±M)a to the state S(N±M)a. After the time period for the state S(N±M)a, during a cycle of the synchronization signal 146, the parameter controller PRS(N±M)a does not send the parameter level for the state S(N±M)a to the driver system 1104.

Similarly, upon receiving the synchronization signal 146, during each cycle of the synchronization signal 146, the DSP 204 sends an instruction signal for the state transition STa of the parameter to the transition parameter controller PRSTa. For example, the DSP 204 sends the instruction signal for the state transition STa to the transition parameter controller PRSTa at a start of time of transition from the state S(N±M)a to the state SNa or from the state S0 to the state SNa. The instruction signal for the state transition STa sent to the transition parameter controller PRSTa includes a time period for the state transition STa during each cycle for which the transition parameter controller PRSTa is to provide the one or more parameter values for the state transition STa to the driver system 1104. Upon receiving the instruction signal for the state transition STa, the transition parameter controller PRSTa accesses the one or more parameter values for the state transition STa from the memory device of the transition parameter controller PRSTa and sends the one or more parameter values to the driver system 1104 for the time period for the state transition STa. For example, the transition parameter controller PRSTa sends the one or more parameter values for the state transition STa to the driver system 1104 at the end of the time of the state S(N±M)a. After the time period for the state transition STa, during a cycle of the synchronization signal 146, the transition parameter controller PRSTa does not send the one or more parameter values for the state transition STa to the driver system 1104.

Upon receiving the synchronization signal 146, during each cycle of the synchronization signal 146, the DSP 204 sends an instruction signal for the state SNa to the parameter controller PRSNa. For example, the DSP 204 sends the instruction signal for the state SNa to the parameter controller PRSNa at an end of time of transition from the state S(N±M)a to the state SNa. The instruction signal for the state SNa sent to the parameter controller PRSNa includes a time period for the state SNa during each cycle for which the parameter controller PRSNa is to provide the parameter level for the state SNa to the driver system 1104. Upon receiving the instruction signal for the state SNa, the parameter controller PRSNa accesses the parameter level for the state SNa from the memory device of the parameter controller PRSNa and sends the parameter level to the driver system 1104 for the time period for the state SNa. For example, the parameter controller PRSNa sends the parameter level for the state SNa to the driver system 1104 at the end of the time of transition from the state S(N±M)a to the state SNa. After the time period for the state SNa, during a cycle of the synchronization signal 146, the parameter controller PRSNa does not send the parameter level for the state SNa to the driver system 1104.

Similarly, upon receiving the frequency levels for the states S(N±M)a and SNa, the DSP 204 provides the frequency level for the state S(N±M)a of the frequency of the RF signal 1106 to the frequency controller FCS(N±M)a for storage of the frequency level for the state S(N±M)a in the memory device of the frequency controller FCS(N±M)a. Also, upon receiving the one or more frequency values for the state transition STa of the frequency, the DSP 204 provides the one or more frequency values for the state transition STa of the frequency of the RF signal 1106 to the transition frequency controller FCSTa for storage of the one or more frequency values for the state transition STa in a memory device of the transition frequency controller FCSTa. An example of a frequency value during the state transition STa is an envelope, such as a zero-to-peak amplitude or a peak-to-peak amplitude, of the frequency of the RF signal 1106 during the state transition STa. Also, in response to receiving the frequency levels for the states S(N±M)a and SNa, the DSP 204 provides the frequency level for the state SNa of the RF signal 1106 to the frequency controller FCSNa for storage of the frequency level for the state SNa in the memory device of the frequency controller FCSNa.

Upon receiving the synchronization signal 146, during each cycle of the synchronization signal 146, the DSP 204 sends an instruction signal for the state S(N±M)a of the frequency to the frequency controller FCS(N±M)a. For example, the DSP 204 sends the instruction signal for the state S(N±M)a to the frequency controller FCS(N±M)a at an end of time of transition from the state different from or other than the state S(N±M)a, such as the state S(N±M−1)a or the state S0, to the state S(N±M)a. The instruction signal for the state S(N±M)a sent to the frequency controller FCS(N±M)a includes a time period for the state S(N±M)a during each cycle for which the frequency controller FCS(N±M)a is to provide the frequency level for the state S(N±M)a to the driver system 1104. Upon receiving the instruction signal for the state S(N±M)a, the frequency controller FCS(N±M)a accesses the frequency level for the state S(N±M)a from the memory device of the frequency controller FCS(N±M)a and sends the frequency level to the driver system 1104 for the time period for the state S(N±M)a. For example, the frequency controller FCS(N±M)a sends the frequency level for the state S(N±M)a to the driver system 1104 at the end of the time of transition from the state different from the state S(N±M)a to the state S(N±M)a. After the time period for the state S(N±M)a, during a cycle of the synchronization signal 146, the frequency controller FCS(N±M)a does not send the frequency level for the state S(N±M)a to the driver system 1104.

Similarly, upon receiving the synchronization signal 146, during each cycle of the synchronization signal 146, the DSP 204 sends an instruction signal for the state transition STa of the frequency to the transition frequency controller FCSTa. For example, the DSP 204 sends the instruction signal for the state transition STa to the transition frequency controller FCSTa at a start of time of transition from the state S(N±M)a to the state SNa or from the state S0 to the state SNa. The instruction signal for the state transition STa sent to the transition frequency controller FCSTa includes a time period for the state transition STa during each cycle for which the transition parameter controller FCSTa is to provide the one or more frequency values for the state transition STa to the driver system 1104. Upon receiving the instruction signal for the state transition STa, the transition frequency controller FCSTa accesses the one or more frequency values for the state transition STa from the memory device of the transition parameter controller FCSTa and sends the one or more frequency values to the driver system 1104 for the time period for the state transition STa. For example, the transition frequency controller FCSTa sends the one or more frequency values for the state transition STa to the driver system 1104 at the end of the time of the state S(N±M)a. After the time period for the state transition STa, during a cycle of the synchronization signal 146, the transition frequency controller FCSTa does not send the one or more frequency values for the state transition STa to the driver system 1104.

Upon receiving the synchronization signal 146, during each cycle of the synchronization signal 146, the DSP 204 sends an instruction signal for the state SNa to the frequency controller FCSNa. For example, the DSP 204 sends the instruction signal for the state SNa to the frequency controller FCSNa at an end of time of transition from the state S(N±M)a to the state SNa. The instruction signal for the state SNa sent to the frequency controller FCSNa includes a time period for the state SNa during each cycle for which the frequency controller FCSNa is to provide the frequency level for the state SNa to the driver system 1104. Upon receiving the instruction signal for the state SNa, the frequency controller FCSNa accesses the frequency level for the state SNa from the memory device of the frequency controller FCSNa and sends the parameter level to the driver system 1104 for the time period for the state SNa. For example, the frequency controller FCSNa sends the frequency level for the state SNa to the driver system 1104 at the end of the time of transition from the state S(N±M)a to the state SNa. After the time period for the state SNa, during a cycle of the synchronization signal 146, the frequency controller FCSNa does not send the frequency level for the state SNa to the driver system 1104.

In response to receiving the parameter level for the state S(N±M)a and the frequency level for the state S(N±M)a, the driver system 1104 generates a drive signal for the time period for the state S(N±M)a of the parameter level and the state S(N±M)a of the frequency level, and sends the drive signal to the RF power supply 222. For example, upon receiving the parameter level for the state S(N±M)a at the end of the time of transition from the state S(N±M−1)a or the state S0 to the state S(N±M)a of the parameter and receiving the frequency level for the state S(N±M)a at the end of the time of transition from the state S(N±M−1)a or the state S0 to the state S(N±M)a of the frequency, the driver system 1104 generates the drive signal for the state S(N±M)a of the parameter level and the state S(N±M)a of the frequency level for the time period for the states S(N±M)a and sends the drive signal to the RF power supply 222. The RF power supply 222 generates the state S(N±M)a of the parameter and the state S(N±M)a of the frequency of the RF signal 1106 upon receiving the drive signal for the state S(N±M)a from the driver system 1104. For example, upon receiving the drive signal for the state S(N±M)a of the parameter and the state S(N±M)a of the frequency from the driver system 1104, the RF power supply 222 generates the state S(N±M)a of the parameter and the state S(N±M)a of the frequency of the RF signal 1106. The state S(N±M)a of the parameter of the RF signal 1106 has the parameter level for the state S(N±M)a during the time period for the state S(N±M)a of the parameter. Also, the state S(N±M)a of the frequency of the RF signal 1106 has the frequency level for the state S(N±M)a during the time period for the state S(N±M)a of the frequency.

Similarly, in response to receiving the one or more parameter values for the state transition STa and the one or more frequency values for the state transition STa, the driver system 1104 generates a drive signal for the time period for the state transition STa of the parameter of the RF signal 1106 and the state transition STa of the frequency of the RF signal 1106, and sends the drive signal to the RF power supply 222. For example, upon receiving the one or more parameter values for the state transition STa of the parameter at the end of the time of the state S(N±M)a or the state S0 of the parameter and receiving the one or more frequency values for the state transition STa of the frequency at the end of the time of the state S(N±M)a or the state S0 of the frequency, the driver system 1104 generates the drive signal for the state transition STa of the parameter and the state transition STa of the frequency for the time period for the state transitions STa of the frequency and parameter, and sends the drive signal to the RF power supply 222. The RF power supply 222 generates the state transition STa of the parameter and the state transition STa of the frequency of the RF signal 1106 upon receiving the drive signal for the state transitions STa of the frequency and parameter from the driver system 1104. For example, upon receiving the drive signal for the state transition STa of the parameter and the state transition STa of the frequency from the driver system 1104, the RF power supply 222 starts transitioning the RF signal 1106 from the state S(N±M)a of the parameter or the state S0 of the parameter to the state SNa of the parameter and from the state S(N±M)a of the frequency or the state S0 of the frequency to the state SNa of the frequency. The state transition STa of the parameter of the RF signal 1106 has the one or more parameter values for the state transition STa during the time period for the state transition STa of the parameter. Also, the state transition STa of the frequency of the RF signal 1106 has the frequency level for the state transition STa during the time period for the state transition STa of the frequency.

In response to receiving the parameter level for the state SNa and the frequency level for the state SNa, the driver system 1104 generates a drive signal for the time period for the state SNa of the parameter level and the state SNa of the frequency level, and sends the drive signal to the RF power supply 222. For example, upon receiving the parameter level for the state SNa at the end of the time of transition from the state S(N±M)a or the state S0 to the state SNa of the parameter and receiving the frequency level for the state SNa at the end of the time of transition from the state S(N±M)a or the state S0 to the state SNa of the frequency, the driver system 1104 generates the drive signal for the state SNa of the parameter level and the state SNa of the frequency level for the time period for the states SNa and sends the drive signal to the RF power supply 222. The RF power supply 222 generates the state SNa of the parameter and the state SNa of the frequency of the RF signal 1106 upon receiving the drive signal for the state SNa from the driver system 1104. For example, upon receiving the drive signal for the state SNa of the parameter and the state SNa of the frequency from the driver system 1104, the RF power supply 222 generates the state SNa of the parameter and the state SNa of the frequency of the RF signal 1106. The state SNa of the parameter of the RF signal 1106 has the parameter level for the state SNa during the time period for the state SNa of the parameter. Also, the state SNa of the frequency of the RF signal 1106 has the frequency level for the state SNa during the time period for the state SNa of the frequency.

In one embodiment, instead of the parameter controllers PRS(N±M)a and PRSNa, the transition parameter controller PRSTa, the frequency controllers FCS(N±M)a and FCSNa, and the transition frequency controller FCSTa, one or more controllers, such as one or more processors, are used to perform the functions described herein as being performed by the parameter controllers PRS(N±M)a and PRSNa, the transition parameter controller PRSTa, the frequency controllers FCS(N±M)a and FCSNa, and the transition frequency controller FCSTa.

In an embodiment, instead of the DSP 204, the parameter controllers PRS(N±M)a and PRSNa, the transition parameter controller PRSTa, the frequency controllers FCS (N±M)a and FCSNa, and the transition frequency controller FCSTa, one or more controllers, such as one or more processors, are used to perform the functions described herein as being performed by the DSP 204, the parameter controllers PRS(N±M)a and PRSNa, the transition parameter controller PRSTa, the frequency controllers FCS (N±M)a and FCSNa, and the transition frequency controller FCSTa.

Figure 12A:
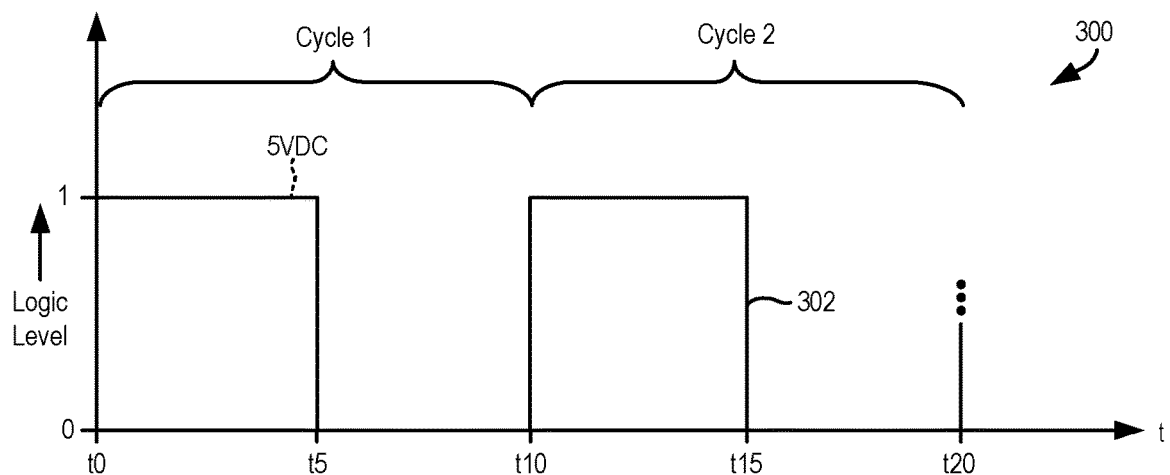
FIG. 12A is an embodiment of the graph to illustrate the synchronization signal of FIG. 3A.

FIG. 12A is an embodiment of the graph 300 to illustrate the synchronization signal 302.

Figure 12B:
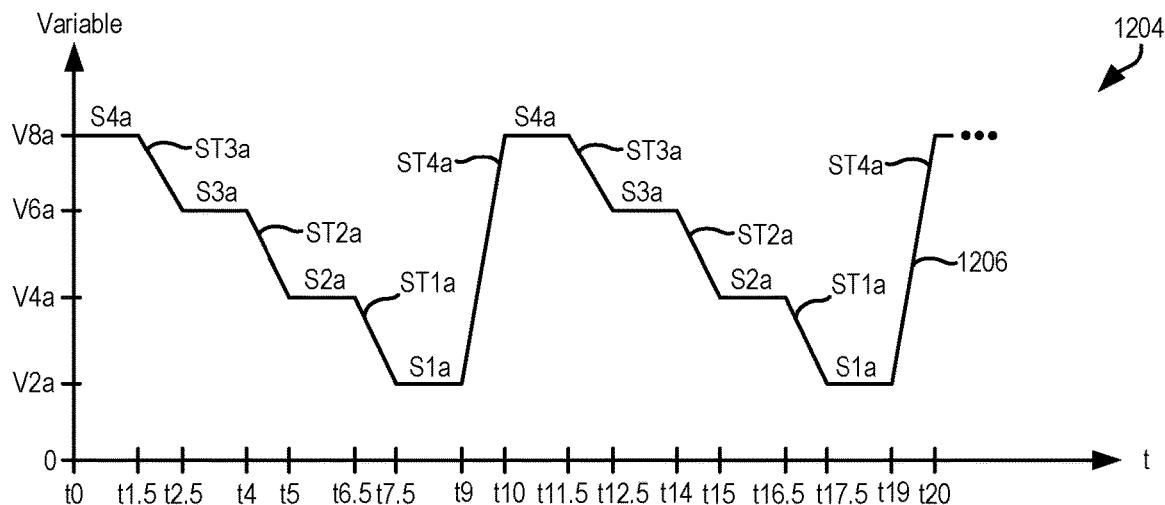
FIG. 12B is an embodiment of a graph to illustrate a variable of an RF signal of FIGS. 11A and 11B versus the time.

FIG. 12B is an embodiment of a graph 1204 to illustrate a variable 1206, such as the frequency or the parameter, of the RF signal 1106 (FIGS. 11A and 11B) versus the time t. The variable 1206 is plotted on a y-axis and the time t is plotted on an x-axis.

The variable 1206 periodically transitions among the variable levels V8a, V6a, V4a, and V2a in synchronization with the synchronization signal 302. For example, the variable 1206 transitions among the variable levels V8a, V6a, V4a, and V2a during the cycle 1 of the synchronization signal 302 and again transitions among the among the variable levels V8a, V6a, V4a, and V2a during the cycle 2 of the synchronization signal 302. To illustrate, the variable 1206 has the variable level V8a during the state S4a of the variable of the RF signal 1106 from the time t0 to a time t1.5, the one or more variable values during the state transition ST3a of the variable from the time t1.5 to a time t2.5, the variable level V6a during the state S3a from the time t2.5 to the time t4, the one or more variable values during the state transition ST2a of the variable from the time t4 to the time t5, the variable level V4a during the state S2a from the time t5 to a time t6.5, the one or more variable values during the state transition ST1a of the variable from the time t6.5 to a time t7.5, the variable level V2a during the state S1a from the time t7.5 to the time t9, and the one or more variable values during the state transition ST4a of the variable from the time t9 to the time t10. It should be noted that the time t1.5 is between the times t1 and t2, and the time t6.5 is between the times t6 and t7.

During the cycle 1 of the synchronization signal 302, the variable 1206 starts a transition from the variable level V8a to the variable level V6a at the time t1.5 and ends the transition at the time t2.5. Also, during the cycle 1 of the synchronization signal 302, the variable 1206 starts a transition from the variable level V6a to the variable level V4a at the time t4 and ends the transition at the time t5. During the cycle 1 of the synchronization signal 302, the variable 1206 starts a transition from the variable level V4a to the variable level V2a at the time t6.5 and ends the transition at the time t7.5. Also, during the cycle 1 of the synchronization signal 302, the variable 1206 starts a transition from the variable level V2a to the variable level V8a at the time t9 and ends the transition at the time t10.

During the cycle 2 of the synchronization signal 302, the variable 1206 starts a transition from the variable level V8a to the variable level V6a at a time t11.5 and ends the transition at the time t12.5. Also, during the cycle 2 of the synchronization signal 302, the variable 1206 starts a transition from the variable level V6a to the variable level V4a at the time t14 and ends the transition at the time t15. During the cycle 2 of the synchronization signal 302, the variable 1206 starts a transition from the variable level V4a to the variable level V2a at a time t16.5 and ends the transition at the time t17.5. Also, during the cycle 2 of the synchronization signal 302, the variable 1206 starts a transition from the variable level V2a to the variable level V8a at the time t19 and ends the transition at the time t20. It should be noted that the time t11.5 is between the times t11 and t12, and the time t16.5 is between the times t16 and t17.

The one or more variables values of the state transition ST3a between the variable levels V8a and V6a are less than the variable level V8a and greater than the variable level V6a. Similarly, the one or more variables values of the state transition ST2a between the variable levels V6a and V4a are less than the variable level V6a and greater than the variable level V4a. Also, the one or more variables values of the state transition ST1a between the variable levels V4a and V2a are less than the variable level V4a and greater than the variable level V2a. The one or more variables values of the state transition ST4a between the variable levels V2a and V8a are less than the variable level V8a and greater than the variable level V2a.

In an embodiment, instead of transitioning to the variable level V2a of the state S1a, the variable of the RF signal 1106 transitions to the variable level zero.

In one embodiment, in addition to the synchronization signal 302, a digital pulsed signal is received by the DSP 204 from the processor 118 via the transfer cable system 214 (FIG. 11B). For example, the synchronization signal 302 is received via the first transfer cable of the transfer cable system 214 and the digital pulsed signal is received via the second transfer cable of the transfer cable system 214. The digital pulsed signal periodically transitions among four logic levels 8, 6, 4, and 2 in the same manner in which the variable 1206 transitions among the variable levels V8a, V6a, V4a, and V2a. For example, during the cycle 1 of the synchronization signal 302, the digital pulsed signal starts a transition from the logic level 8 to the logic level 6 at the time t1.5 and ends the transition at the time t2.5. Also, during the cycle 1 of the synchronization signal 302, the digital pulsed signal starts a transition from the logic level 6 to the logic level 4 at the time t4 and ends the transition at the time t5. During the cycle 1 of the synchronization signal 302, the digital pulsed signal starts a transition from the logic level 4 to the logic level 2 at the time t6.5 and ends the transition at the time t7.5. Also, during the cycle 1 of the synchronization signal 302, the digital pulsed signal starts a transition from the logic level 2 to the logic level 8 at the time t9 and ends the transition at the time t10. The logic level 8 is greater than the logic level 6, which is greater than the logic level 4. The logic level 4 is greater than the logic level 2. For example, a DC voltage of the logic level 8 is greater than a DC voltage of the logic level 6, and the DC voltage of the logic level 6 is greater than a DC voltage of the logic level 4. The DC voltage of the logic level 4 is greater than the DC voltage of the logic level 2.

In the embodiment, during the cycle 2 of the synchronization signal 302, the digital pulsed signal starts a transition from the logic level 8 to the logic level 6 at the time t11.5 and ends the transition at the time t12.5. Also, during the cycle 2 of the synchronization signal 302, the digital pulsed signal starts a transition from the logic level 6 to the logic level 4 at the time t14 and ends the transition at the time t15. During the cycle 2 of the synchronization signal 302, the digital pulsed signal starts a transition from the logic level 4 to the logic level 2 at the time t16.5 and ends the transition at the time t17.5. Also, during the cycle 2 of the synchronization signal 302, the digital pulsed signal starts a transition from the logic level 2 to the logic level 8 at the time t19 and ends the transition at the time t20. Upon receiving the digital pulsed signal, the DSP 204 identifies, from the digital pulsed signal, the time periods for the states S1a through S4a and the state transitions ST1a through ST4a of the variable 1206, and generates the instruction signals having the time periods. For example, the time period for the state transition ST1 of the variable 1206 is the same as a time period for the transition of the digital pulsed signal from the logic level 4 to the logic level 2 of the digital pulsed signal and the time period for the state ST2 of the variable 1206 is the same as a time period for the transition of the digital pulsed signal from the logic level 6 to the logic level 4.

Figure 12C:
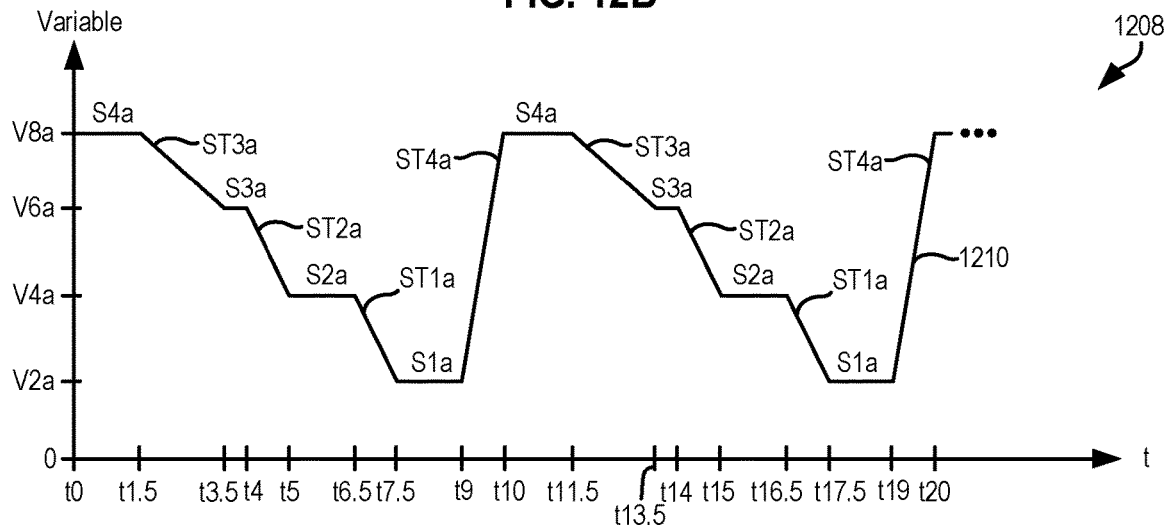
FIG. 12C is an embodiment of a graph to illustrate the variable of the RF signal of FIGS. 11A and 11B versus the time.

FIG. 12C is an embodiment of a graph 1208 to illustrate a variable 1210, such as the frequency or the parameter, of the RF signal 1106 (FIGS. 11A and 11B) versus the time t. The variable 1210 is plotted on a y-axis and the time t is plotted on an x-axis.

The variable 1210 periodically transitions among the variable levels V8a, V6a, V4a, and V2a in synchronization with the synchronization signal 302. For example, the variable 1210 transitions among the variable levels V8a, V6a, V4a, and V2a during the cycle 1 of the synchronization signal 302 and again transitions among the among the variable levels V8a, V6a, V4a, and V2a during the cycle 2 of the synchronization signal 302. To illustrate, the variable 1210 has the variable level V8a during the state S4a of the variable of the RF signal 1106 from the time t0 to the time t1.5, one or more variable values during the state transition ST3a of the variable from the time t1.5 to a time t3.5, the variable level V6a during the state S3a from the time t3.5 to the time t4, the one or more variable values during the state transition ST2a of the variable from the time t4 to the time t5, the variable level V4a during the state S2a from the time t5 to a time t6.5, the one or more variable values during the state transition ST1a of the variable from the time t6.5 to a time t7.5, the variable level V2a during the state S1a from the time t7.5 to the time t9, and the one or more variable values during the state transition ST4a of the variable from the time t9 to the time t10. It should be noted that the time t3.5 is between the times t3 and t4.

During the cycle 1 of the synchronization signal 302, the variable 1210 starts a transition from the variable level V8a to the variable level V6a at the time t1.5 and ends the transition at the time t3.5. Also, during the cycle 1 of the synchronization signal 302, the remaining transitions of the variable 1210 are the same as that of the variable 1206 (FIG. 12B).

During the cycle 2 of the synchronization signal 302, the variable 1210 starts a transition from the variable level V8a to the variable level V6a at a time t11.5 and ends the transition at a time t13.5. Also, during the cycle 2 of the synchronization signal 302, the remaining transitions of the variable 1210 are the same as that of the variable 1206. It should be noted that the time t13.5 is between the times t13 and t14. A slope of the state transition ST3a is greater than a slope of the state transition ST2a and a slope of the state transition ST1a.

In an embodiment, instead of transitioning to the variable level V2a of the state S1a, the variable 1210 transitions to the variable level zero.

In one embodiment, a slope of the state transition ST3a is less than a slope of the state transition ST2a and a slope of the state transition ST1a.

In an embodiment, one or more of the state transitions ST1a through STna of a variable, described herein, has a different slope from one or more of remaining of the state transitions ST1a through STna. For example, the state transition ST1a has a different slope, such as a greater slope or a lesser slope, than a slope of the state transition ST2a, a slope of the state transition ST3a, and a slope of the state transition ST4a. To illustrate, the state transition ST1a has a greater angle than an angle of the state transition ST2a and an angle of the state transition ST3a and a lesser angle than an angle of the state transition ST4a.

Figure 12D:
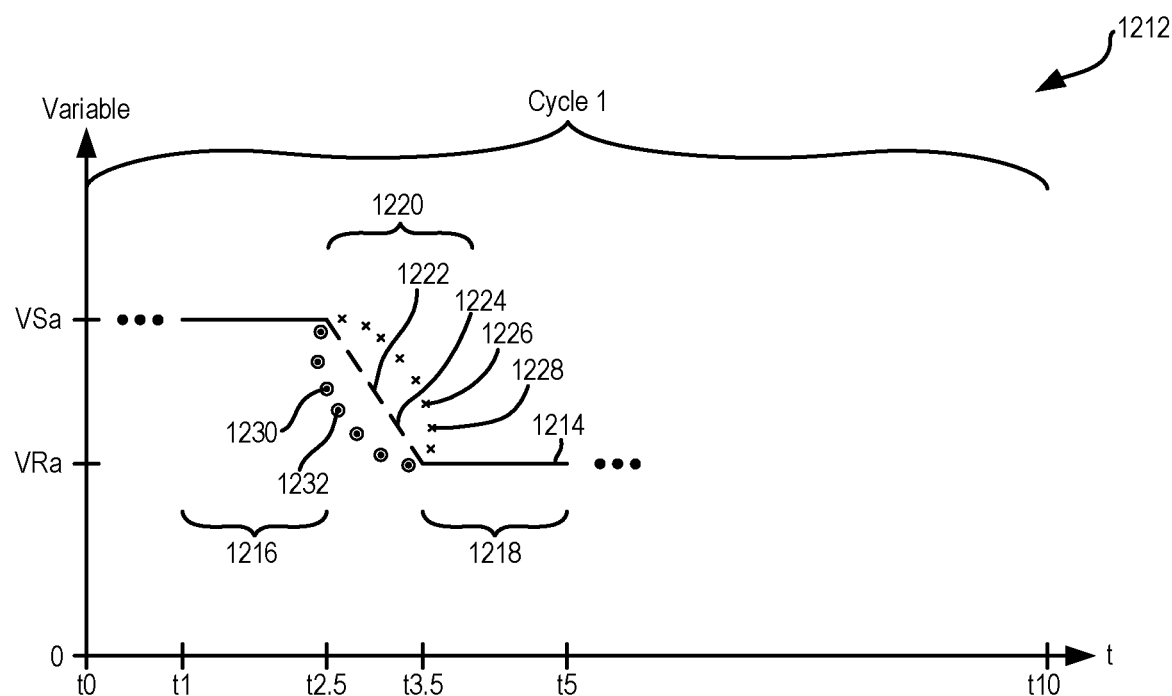
FIG. 12D is a diagram of an embodiment of a graph to illustrate different types of transitions of the variable of the RF signal of FIGS. 11A and 11B versus the time.

FIG. 12D is a diagram of an embodiment of a graph 1212 to illustrate different types of transitions of a variable 1214, such as the frequency or the parameter, of the RF signal 1106 (FIGS. 11A and 11B) versus the time t. The variable 1214 is plotted on a y-axis and the time t is plotted on an x-axis.

The variable 1214 periodically transitions between variable levels VRa and VSa in synchronization with the synchronization signal 302, where each of R and S is a real number and S is greater than R. For example, the variable 1214 transitions between the variable levels VRa and VSa during the cycle 1 of the synchronization signal 302 and again transitions between the variable levels VRa and VSa during remaining cycles, such as the cycle 2, of the synchronization signal 302 (FIG. 12A). To illustrate, the variable 1214 has the variable level VSa during a state 1216 of the variable of the RF signal 1106 from the time t1 to the time t2.5, one or more variable values during a state transition 1220 of the variable from the time t2.5 to the time t3.5, and the variable level VRa during a state 1218 from the time t3.5 to the time t5.

During the state transition 1220, the variable 1214 has multiple values 1222 and 1224 to define a negative linear slope of the state transition 1220 between the states 1216 and 1218. The values 1222 and 1224 are less than values of the variable level VSa and greater than values of the variable level VRa. It should be noted that the variable 1214 can have more or less than two values during the state transition 1220.

In one embodiment, during the state transition 1220, the variable 1214 has multiple values 1226 and 1228 to define a convex slope of the state transition 1220 between the states 1216 and 1218.

In an embodiment, during the state transition 1220, the variable 1214 has multiple values 1230 and 1232 to define a concave slope of the state transition 1220 between the states 1216 and 1218. Each of the convex slope and the convex slope of the variable 1214 is an example of a curved slope.

Figure 12E:
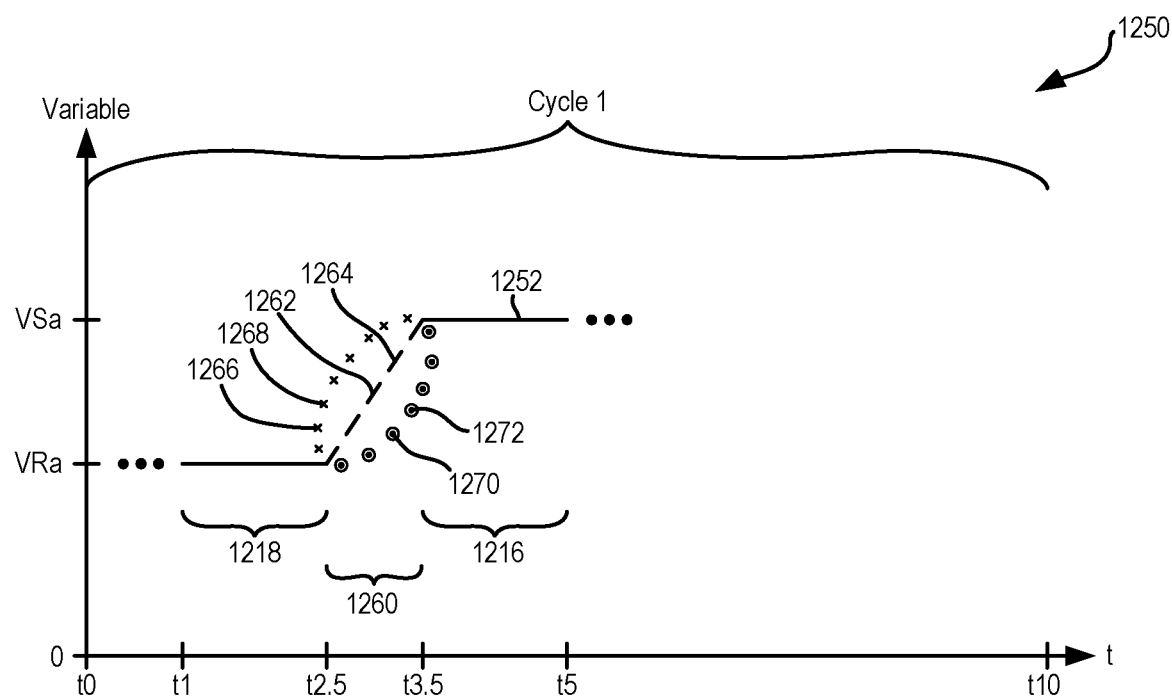
FIG. 12E is a diagram of an embodiment of a graph to illustrate different types of transitions of the variable of the RF signal of FIGS. 11A and 11B versus the time.

FIG. 12E is a diagram of an embodiment of a graph 1250 to illustrate different types of transitions of a variable 1252, such as the frequency or the parameter, of the RF signal 1106 (FIGS. 11A and 11B) versus the time t. The variable 1252 is plotted on a y-axis and the time t is plotted on an x-axis.

The variable 1252 periodically transitions between the variable levels VRa and VSa in synchronization with the synchronization signal 302. For example, the variable 1252 transitions between the variable levels VRa and VSa during the cycle 1 of the synchronization signal 302 and again transitions between the variable levels VRa and VSa during remaining cycles, such as the cycle 2, of the synchronization signal 302 (FIG. 12A). To illustrate, the variable 1252 has the variable level VSa during the state 1218 of the variable of the RF signal 1106 from the time t1 to the time t2.5, one or more variable values during a state transition 1260 of the variable from the time t2.5 to the time t3.5, and the variable level VSa during the state 1216 from the time t3.5 to the time t5.

During the state transition 1260, the variable 1252 has multiple values 1262 and 1264 to define a positive linear slope of the state transition 1260 between the states 1216 and 1218. The values 1262 and 1264 are less than values of the variable level VSa and greater than values of the variable level VRa. It should be noted that the variable 1252 can have more or less than two values during the state transition 1260.

In one embodiment, during the state transition 1260, the variable 1252 has multiple values 1266 and 1268 to define a convex slope of the state transition 1260 between the states 1216 and 1218.

In an embodiment, during the state transition 1260, the variable 1252 has multiple values 1270 and 1272 to define a concave slope of the state transition 1260 between the states 1216 and 1218. Each of the convex slope and the convex slope of the variable 1252 is an example of a curved slope.

FIG. 12F is a diagram of an embodiment of a pulse shaping method. As illustrated with reference to FIG. 12F, a transition of the RF signal 1106 (FIG. 11B) that is generated by the RF generator 1102 (FIG. 11B) is changed to have a negative slope to reduce a pulse width for one or more of the states S(n−A) through Sn. For example, instead of a vertical or a substantially vertical transition from the state S(n−1) to the state Sn, a sloped transition having a negative slope is provided between the states S(n−1) and Sn. Due to the negative slope, a pulse width of a power level $PL_{S(n-1)}$ of the RF signal 1106 during the state S(n−1) is reduced. Power levels to achieve the sloped transition are provided from the host computer or the host controller to the RF generator 1102 to achieve the sloped transition.

In one embodiment, a sloped transition between frequency levels occurs. For example, one frequency level transitions to another frequency level via a positive or a negative sloped transition. The frequency levels during the slope transition are provided from the host computer to the RF generator 1102 to generate the RF signal 1106 having the frequency levels.

FIG. 12G is a diagram of an embodiment of another pulse shaping method. As illustrated in FIG. 12G, a slope of a transition from the state S(n−A) to the state S(n−A+1) of the RF signal 1106 (FIG. 11B) generated by the RF generator 1102 (FIG. 11B) is steeper, such as greater, than a slope of a transition of the RF signal 1106 from the state S(n−1) to the state Sn.

In an embodiment, a slope of a transition from the state S(n−A) of the RF signal 1106 generated by the RF generator 1102 to the state S(n−A+1) of the RF generator 1106 is less steeper, such as lower, than a slope of a transition from the state S(n−1) to the state Sn of the RF signal 1106.

Figures 12H, 12I:
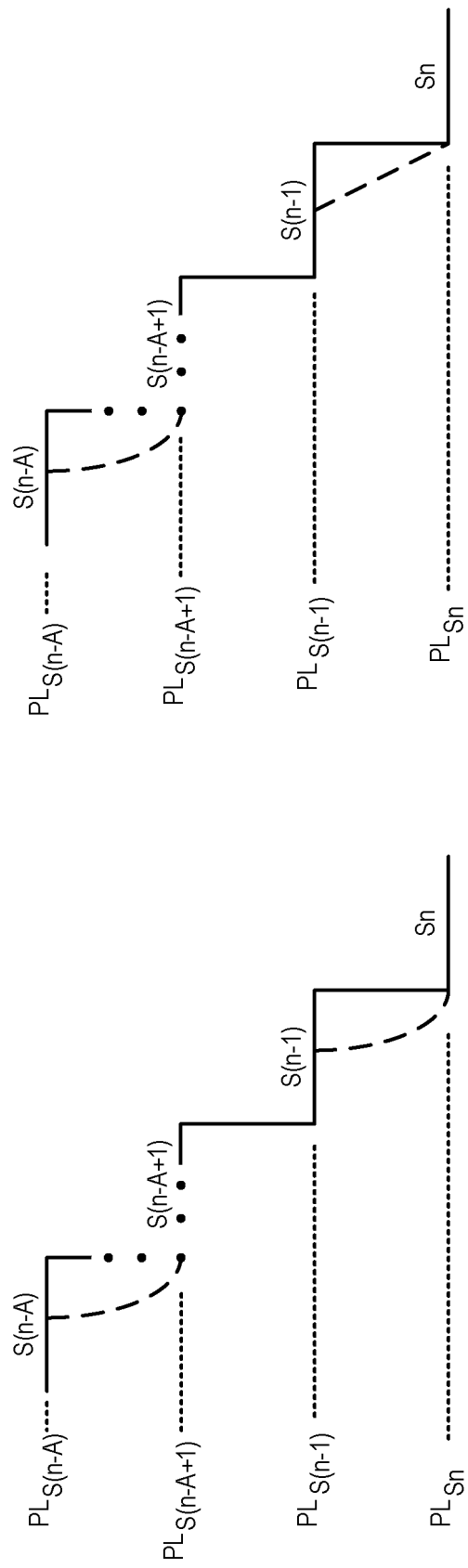
FIG. 12H is a diagram of an embodiment of yet another pulse shaping method.
FIG. 12I is a diagram of an embodiment of still another pulse shaping method.

FIG. 12H is a diagram of an embodiment of yet another pulse shaping method. In FIG. 12H, a slope of a transition from the state S(n−A) to the state S(n−A+1) of the RF signal 1106 (FIG. 11B) generated by the RF generator 1102 (FIG. 11B) is curved, such as half parabolic or exponential. Also, a slope of a transition from the state S(n−1) to the state Sn of the RF signal 1106 is curved.

FIG. 12I is a diagram of an embodiment of another pulse shaping method. As illustrated in FIG. 12I, a slope of a transition from the state S(n−A) to the state S(n−A+1) of the RF signal 1106 (FIG. 11B) generated by the RF generator 1102 (FIG. 11B) is curved and a slope of a transition from the state S(n−1) to the state Sn of the RF signal 1106 is linear.

Figure 12J:
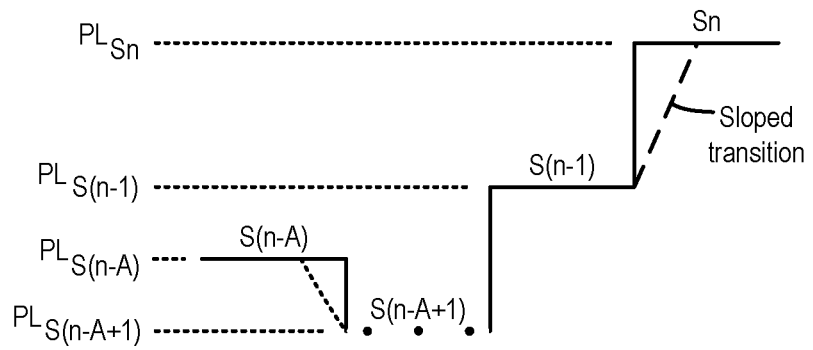
FIG. 12J is a diagram of an embodiment of another pulse shaping method.

FIG. 12J is a diagram of another embodiment of still another pulse shaping method. As illustrated with reference to FIG. 12J, a transition of the RF signal 1106 (FIG. 11B) that is generated by the RF generator 1102 (FIG. 11B) is changed to have a positive or a negative slope to reduce a pulse width of the RF signal 1106 for one or more of the states S(n−A) through Sn. For example, instead of a vertical or a substantially vertical transition from the state S(n−1) to the state Sn, a sloped transition having a negative slope is provided between the states S(n−A) and S(n−A+1). Due to the negative slope, a pulse width of a power level $PL_{S(n-A)}$ of the RF signal 1106 during the state S(n−A) is reduced. As another example, instead of a vertical or a substantially vertical transition from the state S(n−1) to the state Sn, a sloped transition having a positive slope is provided between the states S(n−1) and Sn. Due to the positive slope, a pulse width of a power level $PL_{Sn}$ of the RF signal 1106 during the state Sn is reduced.

Figure 12K:
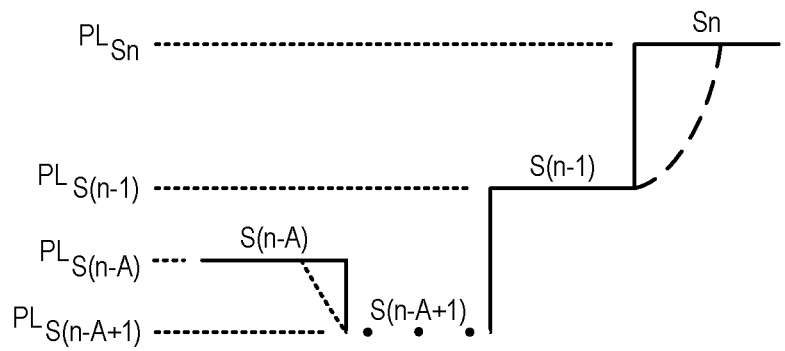
FIG. 12K is a diagram of an embodiment of yet another pulse shaping method.

FIG. 12K is a diagram of an embodiment to illustrate another pulse shaping method. In FIG. 12K, a transition from the state S(n−A) to the state S(n−A+1) of the RF signal 1106 (FIG. 11B) that is generated by the RF generator 1102 (FIG. 11B) has a linear slope, such as a negative straight slope, and a transition from the state S(n−1) to the state Sn of the RF signal 1106 has a curved slope, such as a concave slope. The curved slope has a positive slope.

Figure 12L:
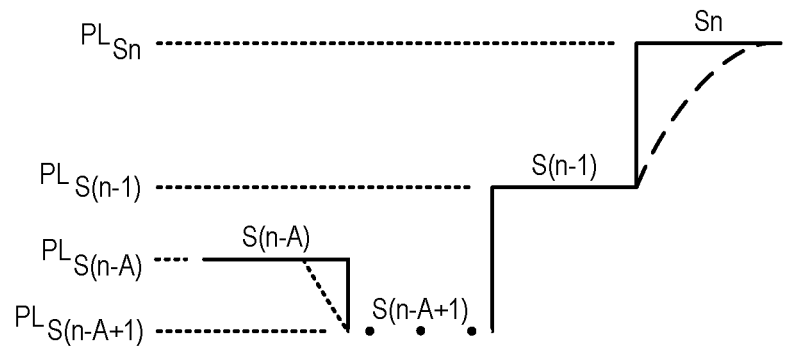
FIG. 12L is a diagram of an embodiment of another pulse shaping method.

FIG. 12L is a diagram of an embodiment to illustrate another pulse shaping method. In FIG. 12L, a transition from the state S(n−A) to the state S(n−A+1) of the RF signal 1106 (FIG. 11B) that is generated by the RF generator 1102 (FIG. 11B) has a linear slope, such as a negative straight slope, and a transition from the state S(n−1) to the state Sn of the RF signal 1106 has a curved slope, such as a convex slope. The curved slope has a positive slope.

EtherCAT Cable

Figure 13A:
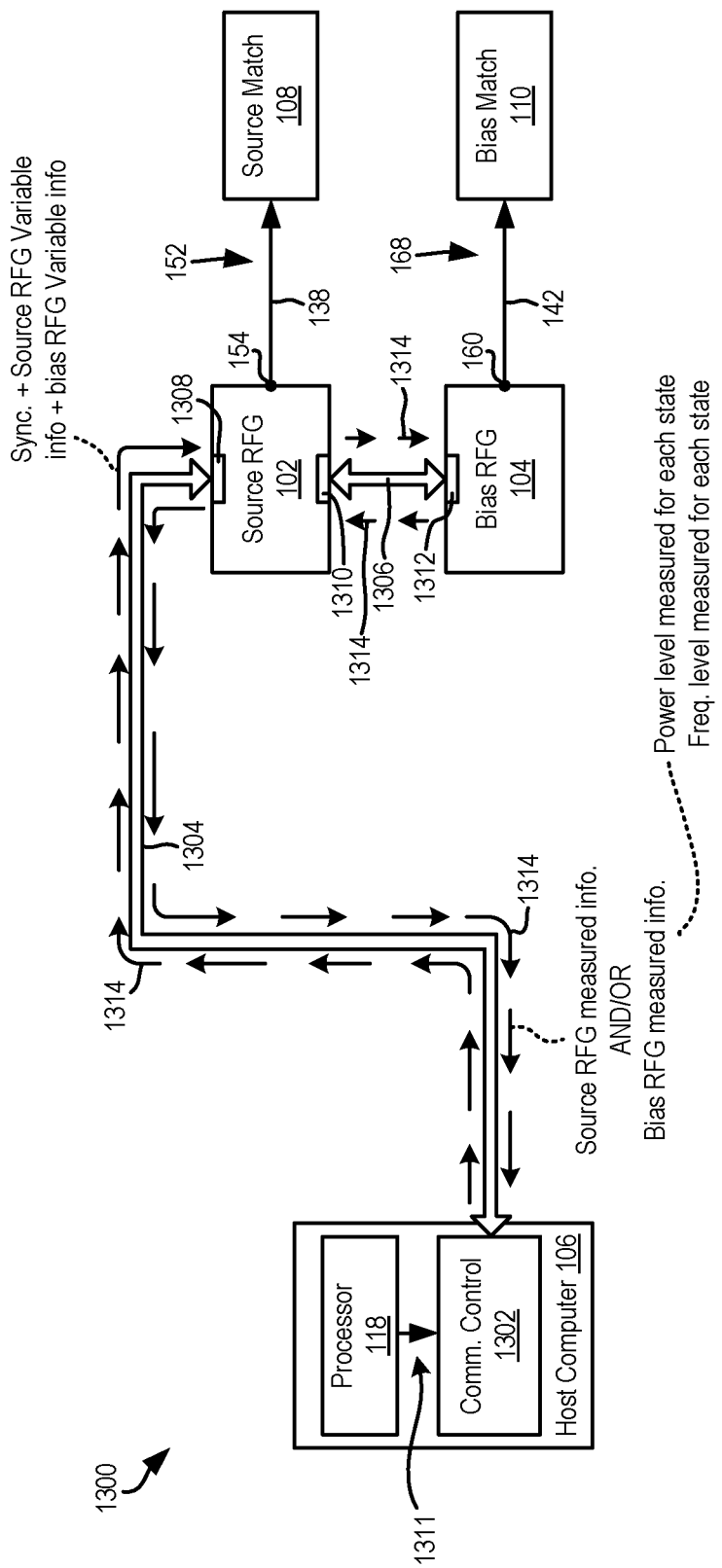
FIG. 13A is a diagram of an embodiment of a system to illustrate a transfer of information between various components of a plasma system via one or more EtherCAT cables.

FIG. 13A is a diagram of an embodiment of a system 1300 to illustrate a transfer of information between various components of a plasma system via one or more Ethernet for Control Automation (EtherCAT) cables. An example of an EtherCAT cable is an Ethernet cable. EtherCAT is an Ethernet-based protocol, is used for real-time distributed control of information, and is suitable for automation technology. An EtherCAT slave device reads data addressed to it while an EtherCAT frame or packet passes through the EtherCAT slave device, processing the data on the fly. Similarly, input data is inserted from the EtherCAT slave device into the EtherCAT frame while the EtherCAT frame passes through the EtherCAT slave device. The EtherCAT frame is not completely received by the EtherCAT slave device before being processed, and instead processing starts as soon as possible. Sending of the input data from the EtherCAT slave device is also conducted with a minimum delay of small bit times.

The system 1300 includes the host computer 106, the source RF generator 102, the bias RF generator 104, the source match 108, and the bias match 110, each of which is an example of a component of a plasma tool or a plasma system. A component of the plasma tool that sends one or more EtherCAT frames is referred to herein as a master EtherCAT device and a component of the plasma tool that receives the one or more EtherCAT frames is referred to herein as a slave EtherCAT device. For example, each of the bias RF generator 104, the source match 108, the bias match 110 is an example of a slave EtherCAT device and the source RF generator 102 is an example of a master EtherCAT device. Each of the source RF generator 102, the bias RF generator 104, the source match 108, and the bias match 110 is an example of a component of a plasma system. One or more EtherCAT frames are sometimes referred to herein as a pulse train.

The host computer 106 includes the processor 118 and a communication controller 1302. Examples of the communication controller, as used herein, include an ASIC, a PLD, a controller, and a processor.

The processor 118 is coupled to the communication controller 1302. The communication controller 1302 is coupled to a port 1308 of the source RF generator 102 via an EtherCAT cable 1304. Examples of an Ethernet cable, as used herein, include a twisted pair cable. To illustrate, the Ethernet cable is a 100BASE-TX™ or a 100BASE-T4™ cable that is capable of transferring data at a speed of 100 megabits per second (Mbps) or greater. Moreover, another port 1310 of the source RF generator 102 is coupled via an EtherCAT cable 1306 to a port 1312 of the bias RF generator 104.

The processor 118 sends processor data 1311, such as timing information of the synchronization signal 146 (FIG. 7), source RF generator variable information, and bias RF generator variable information, to the communication controller 1302. Examples of the timing information of the synchronization signal 146 includes a time at which the synchronization signal 146 changes its logic level, such as from 1 to 0 or from 0 to 1, during each cycle of the synchronization signal 146, and a number of cycles of the synchronization signal 146. The timing information also includes the logic levels 0 and 1 of the synchronization signal 146. Examples of the source RF generator variable information include a variable level, such as a parameter level or a frequency level, for each state of operation of the source RF generator 102. To illustrate, the source RF generator variable information includes power levels and frequency levels for the states S1a through Sna of the variable of the RF signal 152 generated by the source RF generator 102. Examples of the bias RF generator variable information include a variable level, such as a parameter level or a frequency level, for each state of operation of the bias RF generator 104. To illustrate, the bias RF generator variable information includes power levels and frequency levels for the states S1a through Sna of the variable of the RF signal 168 generated by the bias RF generator 104.

The communication controller 1302 receives the processor data 1311 and applies the EtherCAT protocol to embed the processor data 1311 to generate one or more EtherCAT frames 1314 having the processor data 1311, and sends the one or more EtherCAT frames 1314 via the EtherCAT cable 1304 to the port 1308 of the source RF generator 102. A communication controller of the source RF generator 102 receives the one or more EtherCAT frames 1314 via the port 1308 and identifies the source RF generator variable information and the timing information of the synchronization signal 146 from the one or more EtherCAT frames 1314, and sends the source RF generator variable information and the timing information to the DSP 204 of the source RF generator 102.

Moreover, the communication controller of the source RF generator 102 sends a request for information, such as source RF generator measured information, to the DSP 204 of the source RF generator 102. An example of the source RF generator measured information includes a factor determined or identified by the DSP 204 of the source RF generator 102. An example of the factor identified by the DSP 204 of the source RF generator 102 includes a criterion, such as a complex voltage and current or complex voltage or complex power or complex current or complex impedance. The criterion is measured by a sensor for each state of the RF signal 152. The sensor that measures the criterion is located within or outside the source RF generator 102 and is coupled to the output 154 of the source RF generator 102. A complex factor includes a magnitude and a phase. For example, the complex voltage includes a magnitude of the complex voltage and a phase of the complex voltage. The complex voltage and current includes a magnitude of a voltage, a magnitude of a current, and a phase between the voltage and the current. The sensor measures the criterion and provides the criterion to the DSP 204 of the source RF generator 102. The DSP 204 of the source RF generator 102 identifies the criterion and/or determines a frequency of the criterion from the measured criterion for each state of the RF signal 152. For example, the DSP 204 of the source RF generator 102 applies Fourier transformation to values of the criterion to determine the frequency of the criterion. The frequency of the criterion is an example of the factor.

Upon receiving the request for the information, the DSP 204 of the source RF generator 102 provides the source RF generator measured information to the communication controller of the source RF generator 102. When the source RF generator measured information is received, the communication controller of the source RF generator 102 embeds the source RF generator measured information within the one or more EtherCAT frames 1314 and sends the one or more EtherCAT frames 1314 via the port 1310 of the source RF generator 102 and the EtherCAT cable 1306 to the port 1312 of the bias RF generator 104.

A communication controller of the bias RF generator 104 receives the one or more EtherCAT frames 1314 via the port 1312 and identifies the bias RF generator variable information and the timing information of the synchronization signal 146 from the one or more EtherCAT frames 1314, and sends the bias RF generator variable information and the timing information to the DSP 204 of the bias RF generator 104.

Moreover, the communication controller of the bias RF generator 104 sends a request for information, such as bias RF generator measured information, to the DSP 204 of the bias RF generator 104. An example of the bias RF generator measured information includes a factor determined or identified by the DSP 204 of the bias RF generator 104. An example of the factor identified by the DSP 204 of the bias RF generator 104 includes a criterion, such as a complex voltage and current or complex voltage or complex power or complex current or complex impedance. The criterion is measured by a sensor for each state of the RF signal 168. The sensor that measures the criterion is located within or outside the bias RF generator 104 and is coupled to the output 160 of the bias RF generator 104. The sensor measures the criterion and provides the criterion to the DSP 204 of the bias RF generator 104. The DSP 204 the bias RF generator 104 identifies the criterion and determines a frequency of the criterion from the measured criterion for each state of the RF signal 168. For example, the DSP 204 of the bias RF generator 104 applies Fourier transformation to values of the criterion to determine the frequency of the criterion.

Upon receiving the request for the information, the DSP 204 of the bias RF generator 104 provides the bias RF generator measured information to the communication controller of the bias RF generator 104. When the bias RF generator measured information is received, the communication controller of the bias RF generator 104 embeds the bias RF generator measured information within the one or more EtherCAT frames 1314 and sends the one or more EtherCAT frames 1314 via the port 1312 of the bias RF generator 104 and the EtherCAT cable 1306 to the port 1310 of the source RF generator 102. The communication controller of the source RF generator 102 receives the one or more EtherCAT frames 1314 via the port 1310 and sends the one or more EtherCAT frames 1314 via the port 1308 and the EtherCAT cable 1304 to the communication controller 1302 of the host computer 106.

The communication controller 1302 of the host computer 106 applies the EtherCAT protocol to the one or more EtherCAT frames 1314 to obtain or extract the source RF generator measured information for each state of the variable of the source RF signal 152 and the bias RF generator measured information for each state of the variable of the bias RF signal 168 from the one or more EtherCAT frames 1314. The communication controller 1302 provides the source RF generator measured information and the bias RF generator measured information to the processor 118. The processor 118 determines whether to modify the variable of the source RF generator 102 during each state of the variable of the RF signal 152 or the variable of the bias RF generator 104 during each state of the variable of the RF signal 168 or a combination thereof based on the source RF generator measured information or the bias RF generator measured information or a combination thereof. The processor 118 controls each state of the variable of the RF signal 152 generated by the source RF generator 102 based on the modified variable of the source RF generator 102 for the state and/or controls each state of the variable of the RF signal 168 generated the bias RF generator 104 based on the modified variable of the bias RF generator 104 for the state.

It should be noted that in one embodiment, there is no storage of the one or more EtherCAT frames 1314 within the source RF generator 102 and no storage of the one or more EtherCAT frames 1314 in the bias RF generator 104. For example, the one or more EtherCAT frames 1314 are in a constant state of movement within a memory device of the communication controller of the source RF generator 102 and the one or more EtherCAT frames 1314 are in a constant state of movement within a memory device of the communication controller of the bias RF generator 104. To illustrate, the one or more EtherCAT frames 1314 move within the memory device, such as from one register to another of a string of registers of the communication controller of the source RF generator 102, while the source RF generator variable information and the source RF generator measured information is being transferred between the communication controller of the source RF generator 102 and the DSP 204 of the source RF generator 102. As another illustration, the one or more EtherCAT frames 1314 move within the memory device, such as from one register to another of a string of registers of the communication controller of the bias RF generator 104, while the bias RF generator variable information and the bias RF generator measured information is being transferred between the communication controller of the bias RF generator 104 and the DSP 204 of the bias RF generator 104.

Figure 13B:
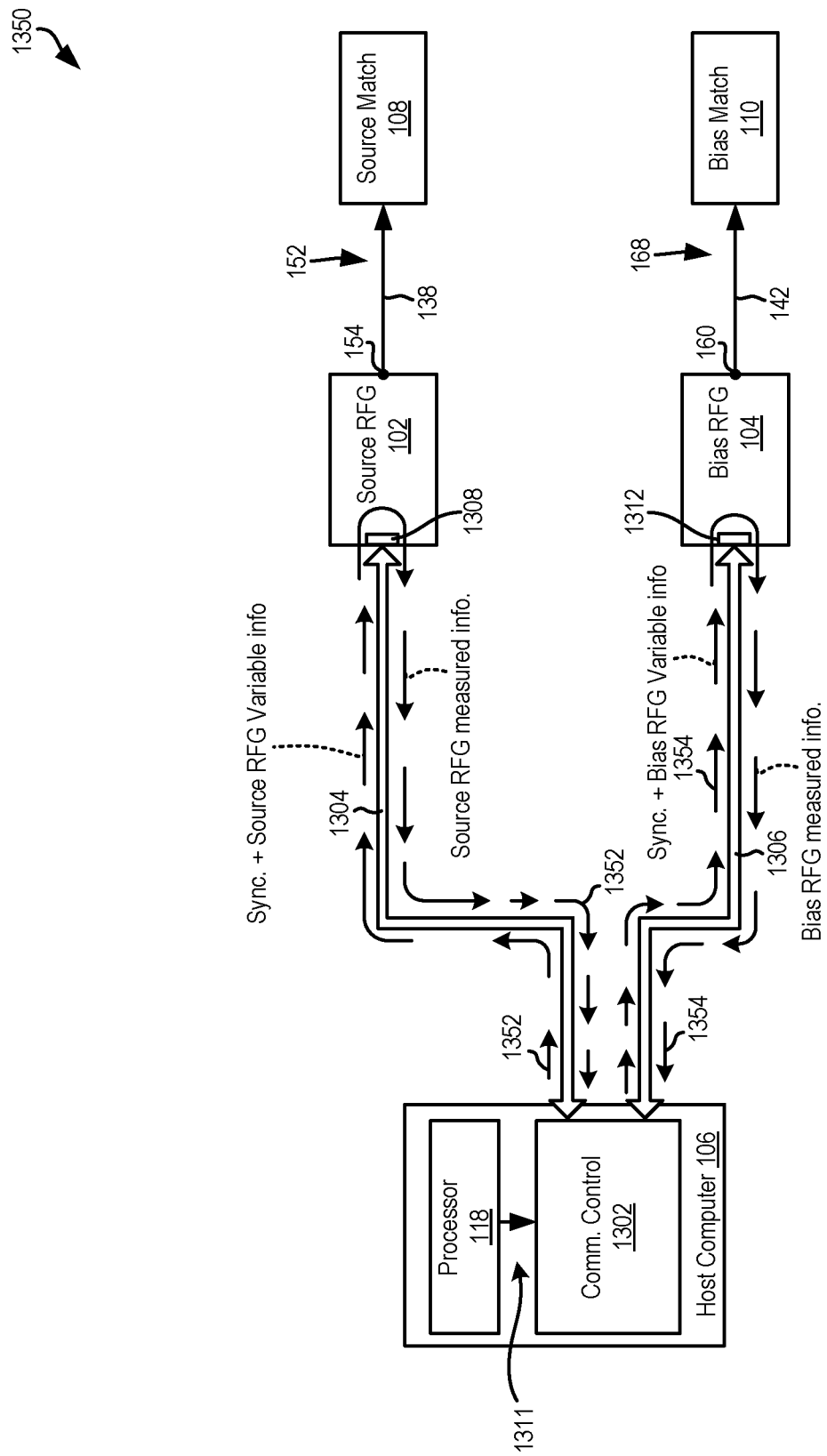
FIG. 13B is a diagram of an embodiment of a system to illustrate a transfer of information between various components of a plasma system via one or more EtherCAT cables.

FIG. 13B is a diagram of an embodiment of a system 1350 to illustrate a transfer of information between various components of a plasma system via one or more EtherCAT cables. The system 1350 includes the host computer 106, the source RF generator 102, the bias RF generator 104, the source match 108, and the bias match 110. The communication controller 1302 is coupled to the port 1312 of the bias RF generator 104 via the EtherCAT cable 1306.

The processor 118 sends the processor data 1311 to the communication controller 1302. The communication controller 1302 receives the processor data 1311 and applies the EtherCAT protocol to embed the timing information of the synchronization signal 146 and the source RF generator variable information of the processor data 1311 to generate one or more EtherCAT frames 1352 having the timing information of the synchronization signal 146 and the source RF generator variable information, and sends the one or more EtherCAT frames 1352 via the EtherCAT cable 1304 to the port 1308 of the source RF generator 102. The communication controller of the source RF generator 102 receives the one or more EtherCAT frames 1352 via the port 1308 and identifies the source RF generator variable information and performs the same functions as described above with reference to FIG. 13A until the source RF generator measured information is received from the DSP 204 of the source RF generator 102. When the source RF generator measured information is received, the communication controller of the source RF generator 102 embeds the source RF generator measured information within the one or more EtherCAT frames 1352 and sends the one or more EtherCAT frames 1352 via the port 1308 of the source RF generator 102 and the EtherCAT cable 1306 to the communication controller 1302 of the host computer 106.

In a similar manner, the communication controller 1302 receives the processor data 1311 and applies the EtherCAT protocol to embed the timing information of the synchronization signal 146 and the bias RF generator variable information of the processor data 1311 to generate one or more EtherCAT frames 1354 having the timing information of the synchronization signal 146 and the bias RF generator variable information, and sends the one or more EtherCAT frames 1354 via the EtherCAT cable 1306 to the port 1312 of the bias RF generator 104. The communication controller of the bias RF generator 104 receives the one or more EtherCAT frames 1354 via the port 1312 and identifies the bias RF generator variable information and performs the same functions as described above with reference to FIG. 13A until the bias RF generator measured information is received from the DSP 204 of the bias RF generator 104. When the bias RF generator measured information is received, the communication controller of the bias RF generator 104 embeds the bias RF generator measured information within the one or more EtherCAT frames 1354 and sends the one or more EtherCAT frames 1354 via the port 1312 of the bias RF generator 104 and the EtherCAT cable 1306 to the communication controller 1302 of the host computer 106.

The communication controller 1302 of the host computer 106 applies the EtherCAT protocol to the one or more EtherCAT frames 1352 to obtain or extract the source RF generator measured information from the one or more EtherCAT frames 1352. The communication controller 1302 provides the source RF generator measured information to the processor 118.

Similarly, the communication controller 1302 of the host computer 106 applies the EtherCAT protocol to the one or more EtherCAT frames 1354 to obtain or extract the bias RF generator measured information from the one or more EtherCAT frames 1354. The communication controller 1302 provides the bias RF generator measured information to the processor 118. The processor 118 performs the same functions as described above with reference to FIG. 13A.

It should be noted that in one embodiment, there is no storage of the one or more EtherCAT frames 1352 within the source RF generator 102 and no storage of the one or more EtherCAT frames 1354 in the bias RF generator 104. For example, the one or more EtherCAT frames 1352 are in a constant state of movement within the memory device of the communication controller of the source RF generator 102 and the one or more EtherCAT frames 1354 are in a constant state of movement within the memory device of the communication controller of the bias RF generator 104. To illustrate, the one or more EtherCAT frames 1352 move within the memory device, such as from one register to another of a string of registers of the communication controller of the source RF generator 102, while the source RF generator variable information and the source RF generator measured information is being transferred between the communication controller of the source RF generator 102 and the DSP 204 of the source RF generator 102. As another illustration, the one or more EtherCAT frames 1352 move within the memory device, such as from one register to another of a string of registers of the communication controller of the bias RF generator 104, while the bias RF generator variable information and the bias RF generator measured information is being transferred between the communication controller of the bias RF generator 104 and the DSP 204 of the bias RF generator 104.

Figure 14:
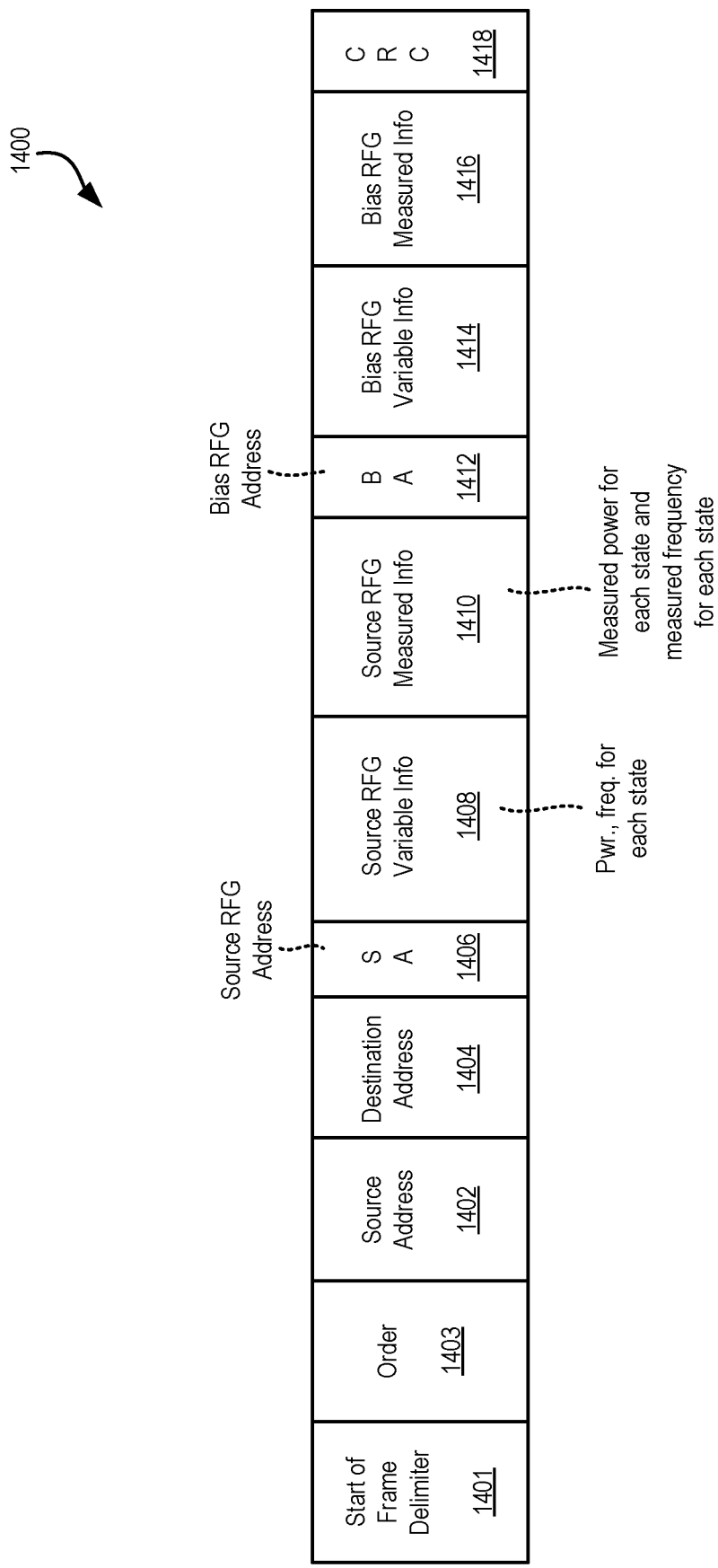
FIG. 14 is a diagram of an embodiment of an EtherCAT frame.

FIG. 14 is a diagram of an embodiment of an EtherCAT frame 1400. The EtherCAT frame 1400 is an example of any of the one or more EtherCAT frames 1314 (FIG. 13A). Also, the EtherCAT frame 1400 is an example of any of the one or more EtherCAT frames 1352 (FIG. 13B) and of any of the one or more EtherCAT frames 1354 (FIG. 13B).

In one embodiment, the terms frame and packet are used herein interchangeably. The EtherCAT frame 1400 includes fields 1401, 1403, 1402, 1404, 1406, 1408, 1410, 1412, 1414, 1416, and 1418.

The field 1401 includes a start of frame delimiter that identifies a start of the EtherCAT frame 1400. The field 1402 includes a source address of the EtherCAT frame 1400. An example of the source address is an address of the communication controller 1302 of the host computer 106 that generates the EtherCAT frame 1400. The field 1403 of the EtherCAT frame 1400 includes an order in which the EtherCAT frame 1400 is to be circulated to various components of a plasma system. An example of the order includes a sequence from the communication controller 1302 to the source RF generator 102 to the bias RF generator 104, from the bias RF generator 104 back to the source RF generator 102, and from the source RF generator 102 to the processor 102. Another example of the order includes a sequence from the communication controller 1302 to the source RF generator 102, and back from the source RF generator 102 to the communication controller 1302.

The field 1404 includes a destination address of the EtherCAT frame 1400. An example of the destination address is an address of the communication controller 1302 of the host computer 106 and the address of the communication controller 1302 is a final destination of the EtherCAT frame 1400.

The field 1406 includes an address, such as a media access control (MAC) address, that identifies the source RF generator 102 (FIG. 13A) to distinguish the source RF generator 102 from other RF generators of a plasma system. The field 1408 includes the source RF generator variable information and the field 1410 includes the source RF generator measured information. The address that identifies the source RF generator 102 is used by the communication controller of the source RF generator 102 to determine that data within the field 1408 is to be provided to the DSP 204 of the source RF generator 102 and to determine that data received from the DSP 204 of the source RF generator 102 is to be stored in the field 1410.

The field 1412 includes an address, such as a MAC address, that identifies the bias RF generator 104 (FIG. 13A) to distinguish the bias RF generator 104 from other RF generators of a plasma system. The field 1414 includes the bias RF generator variable information and the field 1416 includes the bias RF generator measured information. The address that identifies the bias RF generator 104 is used by the communication controller of the bias RF generator 104 to determine that data within the field 1414 is to be provided to the DSP 204 of the bias RF generator 104 and to determine that data received from the DSP 204 of the bias RF generator 104 is to be stored in the field 1416.

The field 1418 includes a cyclic redundancy check (CRC) for one or more of the fields 1408 and 1414. For example, the CRC is performed by the communication controller 1302 (FIG. 13A) after receiving the EtherCAT frame 1400 to determine whether the source RF generator variable information, within the field 1408, as sent by the communication controller 1302 matches the source RF generator variable information, within the field 1408, received by the communication controller 1302 to determine validity of the EtherCAT frame 1400.

In one embodiment, either the fields 1406, 1408 and 1410 or the fields 1412, 1414, and 1416 are not included in the EtherCAT frame 1400. For example, when the EtherCAT frame 1400 is an example of any of the one or more EtherCAT frames 1452 that are sent to the source RF generator 102 (FIG. 13B), the EtherCAT frame 1400 excludes the fields 1412, 1414, and 1416 for the bias RF generator 104.

In an embodiment, either the fields 1406, 1408 and 1410 or the fields 1412, 1414, and 1416 are included in the EtherCAT frame 1400 but are empty. For example, when the EtherCAT frame 1400 is an example of any of the one or more EtherCAT frames 1452 that are sent to the source RF generator 102 (FIG. 13B), the EtherCAT frame 1400 excludes any data or information in the fields 1412, 1414, and 1416 for the bias RF generator 104.

Figure 15A:
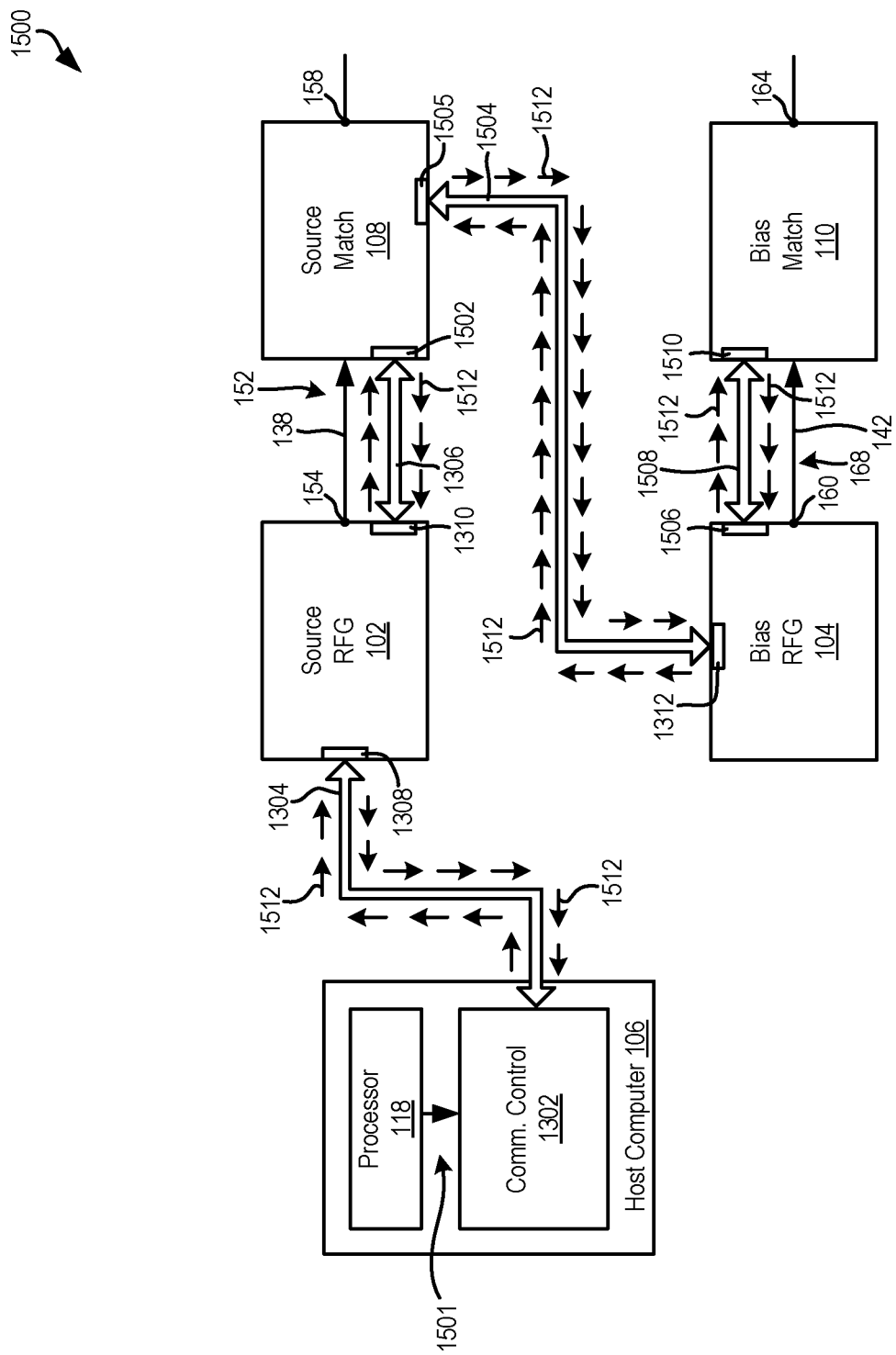
FIG. 15A is a diagram of an embodiment of a system to illustrate a transfer of information between various components of a plasma system via one or more EtherCAT cables.

FIG. 15A is a diagram of an embodiment of a system 1500 to illustrate a transfer of information between various components of a plasma system via one or more EtherCAT cables. The system 1500 includes the host computer 106, the source RF generator 102, the bias RF generator 104, the source match 108, and the bias match 110.

A port 1310 of the source RF generator 102 is coupled via the EtherCAT cable 1306 to a port 1502 of the source match 108. Also, another port 1505 of the source match 108 is coupled via an EtherCAT cable 1504 to the port 1312 of the bias RF generator 104. Another port 1506 of the bias RF generator 104 is coupled via an EtherCAT cable 1508 to a port 1510 of the bias match 110.

The processor 118 sends processor data 1501, which includes the processor data 1302 (FIG. 13A) for the source RF generator 102 and the bias RF generator 104 and includes match data, such as bias match data or source match data, or a combination thereof. The processor data 1501 is sent to the communication controller 1302. An example of the source match data includes one or more specifications of one or more components of the source match 108 and an example of the source match data includes one or more specifications of the one or more components of the bias match 110. Examples of the one or more specifications of one or more components of the source match 108 includes a capacitance value of a capacitor of source match 108 and an inductance value of an inductor of source match 108. Examples of the one or more specifications of one or more components of the bias match 110 includes a capacitance value of a capacitor of bias match 110 and an inductance value of an inductor of bias match 110.

The communication controller 1302 receives the processor data 1501 and applies the EtherCAT protocol to embed the processor data 1501 to generate one or more EtherCAT frames 1512 having the processor data 1501, and sends the one or more EtherCAT frames 1512 via the EtherCAT cable 1304 to the port 1308 of the source RF generator 102. The communication controller of the source RF generator 102 receives the one or more EtherCAT frames 1512 via the port 1308 and identifies the source RF generator variable information and the timing information of the synchronization signal 146 from the one or more EtherCAT frames 1512, and sends the source RF generator variable information and the timing information to the DSP 204 of the source RF generator 102.

Moreover, the communication controller of the source RF generator 102 sends a request for information, such as the source RF generator measured information and source state information of the RF signal 152, to the DSP 204 of the source RF generator 102. An example of the source state information of the RF signal 152 includes timing information of states and/or timing information of state transitions of the RF signal 152. As an illustration, the timing information of the states of the RF signal 152 includes a time at which the RF signal 152 changes its variable level and a time for which the RF signal 152 stays at the variable level. To further illustrate, with reference to FIG. 10B, the timing information of the state S4a of the RF signal 152 includes the time t0 at which the variable 1006 of the RF signal 152 transitions from the variable level V2a to the variable level V8a, a time period between the times t0 and t2.5 for which the variable 1006 of the RF signal 152 remains at the variable level V8a, the time t2.5 at which the variable 1006 of the RF signal 152 transitions from the variable level V8a to the variable level of zero, the time t5 at which the variable 1006 transitions from the variable level zero to the variable level V6a, a time period between the times t5 and t7.5 for which the variable 1006 of the RF signal 152 remains at the variable level V6a, the time t7.5 at which the variable 1006 transitions from the variable level V6a to the variable level V2a, and a time period between the times t7.5 and t10 for which the variable 1006 of the RF signal 152 remains at the variable level V2a.

As another illustration, with reference to FIG. 12B, the timing information of the state S4a of the RF signal 152 includes the time t0 at which the variable 1206 of the RF signal 152 transitions from the variable level V2a to the variable level V8a and a time period between the times t0 and t1.5 for which the variable 1206 of the RF signal 152 remains at the variable level V8a. The timing information of the state transition ST4a of the variable 1206 of the RF signal 152 includes the time t1.5 at which the variable of the RF signal 152 starts a transition from the variable level V8a to the variable level V6a and the time t2.5 at which the variable 1206 of the RF signal 152 stops the transition. Similarly, the timing information of the state transition ST3a of the variable 1206 of the RF signal 152 includes the time t4 at which the variable 1206 of the RF signal 152 starts a transition from the variable level V6a to the variable level V4a and the time t5 at which the variable 1206 of the RF signal 152 stops the transition, the timing information of the state transition ST2a of the variable 1206 of the RF signal 152 includes the time t6.5 at which the variable 1206 of the RF signal 152 starts a transition from the variable level V4a to the variable level V2a and the time t7.5 at which the variable 1206 of the RF signal 152 stops the transition, and the timing information of the state transition ST4a of the variable 1206 of the RF signal 152 includes the time t9 at which the variable 1206 of the RF signal 152 starts a transition from the variable level V2a to the variable level V8a and the time t10 at which the variable 1206 of the RF signal 152 stops the transition.

Upon receiving the request for the information, the DSP 204 of the source RF generator 102 provides the source RF generator measured information and the source state information to the communication controller of the source RF generator 102. When the source RF generator measured information and the source state information is received, the communication controller of the source RF generator 102 embeds the source RF generator measured information and the source state information within the one or more EtherCAT frames 1512 and sends the one or more EtherCAT frames 1512 via the port 1310 of the source RF generator 102 and the EtherCAT cable 1306 to the port 1502 of the source match 108.

A communication controller of the source match 108 receives the one or more EtherCAT frames 1512 via the port 1502 of the source match 108, extracts the source match data and the source state information from the one or more EtherCAT frames 1512, and sends the source match data and the source state information to a processor of the source match 108. The processor of the source match 108 controls one or more components of the source match 108 according to the source match data and the source state information. For example, the processor of the source match 108 does not control the components of the source match 108 during one or more of the states S1a through Sna but controls the components during remaining of the states S1a through Sna. The processor of the source match 108 controls the components of the source match 108 to achieve the capacitance and inductance values within the source match data.

Also, the communication controller of the source match 108 sends a request for information, such as source match measured information, to the processor of the source match 108. An example of the source match measured information includes the criterion measured by a sensor that is coupled to a component of the source match 108 or to the output 158 of the source match 108. The sensor is located within or outside the source match 108. Upon receiving the request for information, the processor of the source match 108 provides the source match measured information to the communication controller of the source match 108. The communication controller of the source match 108 embeds the source match measured information within the one or more EtherCAT frames 1512 and sends the one or more EtherCAT frames 1512 via the port 1505 and the EtherCAT cable 1504 to the port 1312 of the bias RF generator 104.

The communication controller of the bias RF generator 104 receives the one or more EtherCAT frames 1512 via the port 1312 and identifies the bias RF generator variable information and the timing information of the synchronization signal 146 from the one or more EtherCAT frames 1512, and sends the bias RF generator variable information and the timing information to the DSP 204 of the bias RF generator 104.

Moreover, the communication controller of the bias RF generator 104 sends a request for information, such as the bias RF generator measured information and bias state information of the RF signal 168, to the DSP 204 of the bias RF generator 104. An example of the bias state information of the RF signal 168 includes timing information of states and/or timing information of state transitions of the RF signal 168. As an illustration, the timing information of the states of the RF signal 168 includes a time at which the RF signal 168 changes its variable level and a time for which the RF signal 168 stays at the variable level. To further illustrate, with reference to FIG. 10B, the timing information of the state S4a of the RF signal 168 includes the time t0 at which the variable 1006 of the RF signal 168 transitions from the variable level V2a to the variable level V8a, a time period between the times t0 and t2.5 for which the variable 1006 of the RF signal 168 remains at the variable level V8a, the time t2.5 at which the variable 1006 of the RF signal 168 transitions from the variable level V8a to the variable level of zero, the time t5 at which the variable 1006 transitions from the variable level zero to the variable level V6a, a time period between the times t5 and t7.5 for which the variable 1006 of the RF signal 168 remains at the variable level V6a, the time t7.5 at which the variable 1006 transitions from the variable level V6a to the variable level V2a, and a time period between the times t7.5 and t10 for which the variable 1006 of the RF signal 168 remains at the variable level V2a.

As another illustration, with reference to FIG. 12B, the timing information of the state S4a of the RF signal 168 includes the time t0 at which the variable 1206 of the RF signal 168 transitions from the variable level V2a to the variable level V8a and a time period between the times t0 and t1.5 for which the variable 1206 of the RF signal 168 remains at the variable level V8a. The timing information of the state transition ST4a of the variable 1206 of the RF signal 168 includes the time t1.5 at which the variable of the RF signal 168 starts a transition from the variable level V8a to the variable level V6a and the time t2.5 at which the variable 1206 of the RF signal 168 stops the transition. Similarly, the timing information of the state transition ST3a of the variable 1206 of the RF signal 168 includes the time t4 at which the variable 1206 of the RF signal 168 starts a transition from the variable level V6a to the variable level V4a and the time t5 at which the variable 1206 of the RF signal 168 stops the transition, the timing information of the state transition ST2a of the variable 1206 of the RF signal 168 includes the time t6.5 at which the variable 1206 of the RF signal 168 starts a transition from the variable level V4a to the variable level V2a and the time t7.5 at which the variable 1206 of the RF signal 168 stops the transition, and the timing information of the state transition ST4a of the variable 1206 of the RF signal 168 includes the time t9 at which the variable 1206 of the RF signal 168 starts a transition from the variable level V2a to the variable level V8a and the time t10 at which the variable 1206 of the RF signal 168 stops the transition.

Upon receiving the request for the information, the DSP 204 of the bias RF generator 104 provides the bias RF generator measured information and the bias state information to the communication controller of the bias RF generator 104. When the bias RF generator measured information and the bias state information is received, the communication controller of the bias RF generator 104 embeds the bias RF generator measured information and the bias state information within the one or more EtherCAT frames 1512 and sends the one or more EtherCAT frames 1512 via the port 1506 of the bias RF generator 104 and the EtherCAT cable 1508 to the port 1510 of the bias match 110.

A communication controller of the bias match 110 receives the one or more EtherCAT frames 1512 via the port 1510 of the bias match 110, extracts the bias match data and the bias state information from the one or more EtherCAT frames 1512, and sends the bias match data and the bias state information to a processor of the bias match 110. The processor of the bias match 110 controls one or more components of the bias match 110 according to the bias match data and the bias state information. For example, the processor of the bias match 110 does not control the components of the bias match 110 during one or more of the states S1a through Sna but controls the components during remaining of the states S1a through Sna. The processor of the bias match 110 controls the components of the bias match 110 to achieve the capacitance and inductance values within the bias match data.

Also, the communication controller of the bias match 110 sends a request for information, such as bias match measured information, to the processor of the bias match 110. An example of the bias match measured information includes the criterion measured by a sensor that is coupled to a component of the bias match 110 or to the output 164 of the bias match 110. The sensor is located within or outside the bias match 110. Upon receiving the request for information, the processor of the bias match 110 provides the bias match measured information to the communication controller of the bias match 110. The communication controller of the bias match 110 embeds the bias match measured information within the one or more EtherCAT frames 1512 and sends the one or more EtherCAT frames 1512 via the port 1510 and the EtherCAT cable 1508 to the port 1506 of the bias RF generator 104.

The communication controller of the bias RF generator 104 receives the one or more EtherCAT frames 1512 via the port 1506 from the bias match 110 and sends the one or more EtherCAT frames 1512 via the port 1312 and the EtherCAT cable 1504 to the port 1505 of the source match 108. The communication controller of the source match 108 receives the one or more EtherCAT frames 1512 via the port 1505 from the bias RFG 104 and sends the one or more EtherCAT frames 1512 via the port 1502 and the EtherCAT cable 1306 and the port 1310 to the source RF generator 102. The communication controller of the source RF generator 102 receives the one or more EtherCAT frames 1512 via the port 1310 and sends the one or more EtherCAT frames 1512 via the port 1308 and the EtherCAT cable 1304 to the communication controller 1302 of the host computer 106.

The communication controller 1302 of the host computer 106 applies the EtherCAT protocol to the one or more EtherCAT frames 1512 to obtain or extract the source RF generator measured information and the bias RF generator measured information from the one or more EtherCAT frames 1314. The communication controller 1302 provides the source RF generator measured information and the bias RF generator measured information to the processor 118.

Figure 15B:
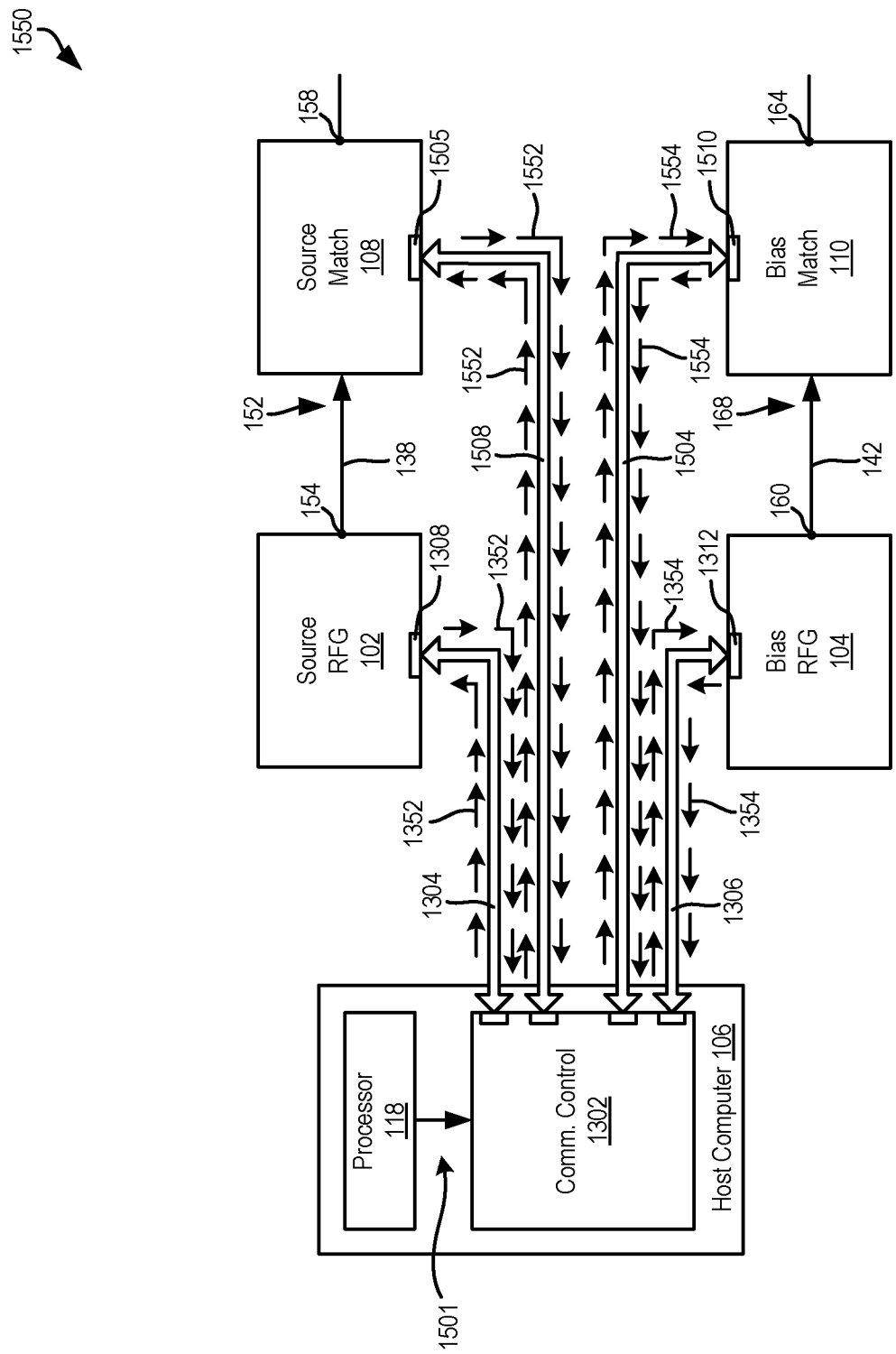
FIG. 15B is a diagram of an embodiment of a system to illustrate a transfer of information between various components of a plasma system via one or more EtherCAT cables.

FIG. 15B is a diagram of an embodiment of a system 1550 to illustrate a transfer of information between various components of a plasma system via one or more EtherCAT cables. The system 1550 includes the host computer 106, the source RF generator 102, the bias RF generator 104, the source match 108, and the bias match 110. The communication controller 1302 is coupled to the port 1505 of the source match 108 via the EtherCAT cable 1508 and the communication controller 1302 is coupled to the port 1510 of the bias match 110 via the EtherCAT cable 1504.

The processor 118 sends the processor data 1501 to the communication controller 1302. The communication controller 1302 receives the processor data 1501 and applies the EtherCAT protocol to embed the timing information of the synchronization signal 146 and the source match data of the processor data 1311 to generate the one or more EtherCAT frames 1552 having the timing information of the synchronization signal 146 and the source match data, and sends the one or more EtherCAT frames 1552 via the EtherCAT cable 1508 to the port 1505 of the source match 108. The communication controller of the source match 108 receives the one or more EtherCAT frames 1552 via the port 1505 and identifies the source match data and performs the same functions as described above with reference to FIG. 15A until the source match measured information is received from the processor of the source match 108. When the source match measured information is received, the communication controller of the source match 108 embeds the source match measured information within the one or more EtherCAT frames 1552 and sends the one or more EtherCAT frames 1552 via the port 1505 of the source match 108 and the EtherCAT cable 1508 to the communication controller 1302 of the host computer 106.

In a similar manner, the communication controller 1302 receives the processor data 1501 and applies the EtherCAT protocol to embed the timing information of the synchronization signal 146 and the bias match data of the processor data 1311 to generate the one or more EtherCAT frames 1554 having the timing information of the synchronization signal 146 and the bias match data, and sends the one or more EtherCAT frames 1554 via the EtherCAT cable 1504 to the port 1510 of the bias match 110. The communication controller of the bias match 110 receives the one or more EtherCAT frames 1554 via the port 1510 and identifies the bias match data and performs the same functions as described above with reference to FIG. 15A until the bias match measured information is received from the processor of the bias match 110. When the bias match measured information is received, the communication controller of the bias match 110 embeds the bias match measured information within the one or more EtherCAT frames 1554 and sends the one or more EtherCAT frames 1554 via the port 1510 of the bias match 110 and the EtherCAT cable 1504 to the communication controller 1302 of the host computer 106.

The communication controller 1302 of the host computer 106 applies the EtherCAT protocol to the one or more EtherCAT frames 1552 to obtain or extract the source match measured information from the one or more EtherCAT frames 1552. The communication controller 1302 provides the source match measured information to the processor 118. Upon receiving the source match measured information, the processor 1108 controls one or more of the source RF generator 102, the source match 108, the bias RF generator 104, and the bias match 110 based on the source match measured information.

Similarly, the communication controller 1302 of the host computer 106 applies the EtherCAT protocol to the one or more EtherCAT frames 1554 to obtain or extract the bias match measured information from the one or more EtherCAT frames 1554. The communication controller 1302 provides the bias match measured information to the processor 118. Upon receiving the bias match measured information, the processor 1108 controls one or more of the source RF generator 102, the source match 108, the bias RF generator 104, and the bias match 110 based on the bias match measured information.

It should be noted that in one embodiment, there is no storage of the one or more EtherCAT frames 1552 within the source match 108 and no storage of the one or more EtherCAT frames 1554 in the bias match 110. For example, the one or more EtherCAT frames 1552 are in a constant state of movement within the source RF match 108 and the one or more EtherCAT frames 1554 are in a constant state of movement within the bias match 110. To illustrate, the one or more EtherCAT frames 1552 move within a memory device, such as from one register to another of a string of registers, of the communication controller of the source match 108, while the source match data and the source match measured information is being transferred between the communication controller of the source match 108 and the processor of the source match 108. As another illustration, the one or more EtherCAT frames 1554 move within a memory device, such as from one register to another of a string of registers, of the communication controller of the bias match 110, while the bias match data and the bias match measured information is being transferred between the communication controller of the bias match 110 and the processor of the bias match 110.

Figure 16:
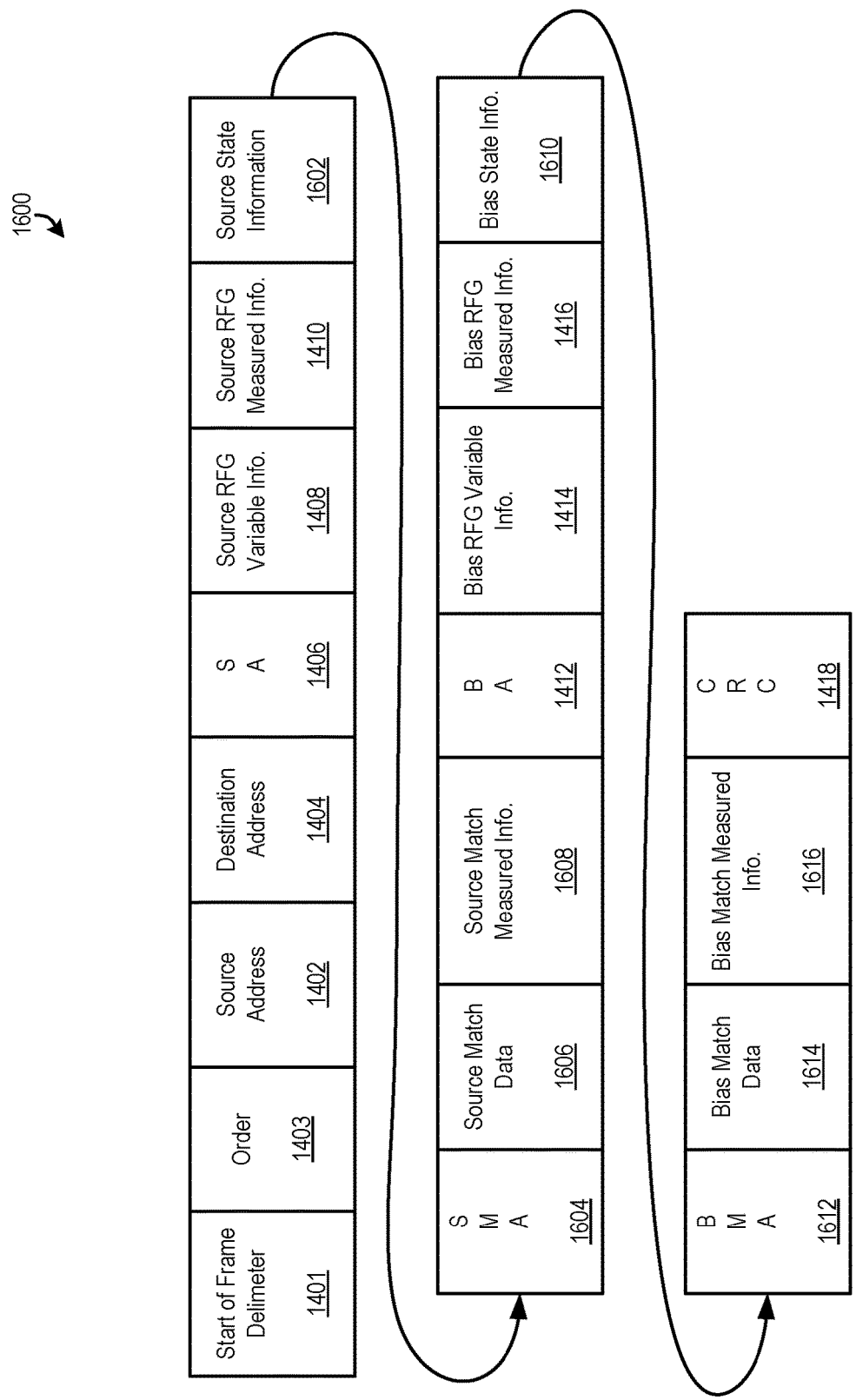
FIG. 16 is a diagram of an embodiment of an EtherCAT frame.

FIG. 16 is a diagram of an embodiment of an EtherCAT frame 1600. The EtherCAT frame 1600 is an example of any of the one or more EtherCAT frames 1512 (FIG. 15A). The EtherCAT frame 1600 is an example of any of the one or more EtherCAT frames 1552 (FIG. 15B). Also, the EtherCAT frame 1600 is an example of any of the one or more EtherCAT frames 1554 (FIG. 15B).

The EtherCAT frame 1600 includes multiple fields 1401, 1403, 1402, 1404, 1406, 1408, 1410, 1602, 1604, 1606, 1608, 1412, 1414, 1416, 1610, 1612, 1614, 1616, and 1418. The field 1401 includes a start of frame delimiter that identifies a start of the EtherCAT frame 1600. The field 1402 includes a source address of the EtherCAT frame 1600. An example of the source address is an address of the host computer 106 that generates the EtherCAT frame 1600.

The field 1403 of the EtherCAT frame 1600 includes an order in which the EtherCAT frame 1600 is to be circulated to various components of a plasma system. An example of the order in which the EtherCAT frame 1600 is to be circulated includes a sequence from the communication controller 1302 to the source RF generator 102 to the source match 108, from the source match 108 to the bias RF generator 104, from the bias RF generator 104 to the bias match 110, from the bias match 110 back to the bias RF generator 104, from the bias RF generator 104 to the source match 108, from the source match 108 to the source RF generator 102, and from the source RF generator 102 to the communication controller 1302. Another example of the order in which the EtherCAT frame 1600 is to be circulated includes a sequence from the communication controller 1302 to the source RF generator 102, and back from the source RF generator 102 to the communication controller 1302.

The field 1404 includes a destination address of the EtherCAT frame 1600. An example of the destination address is an address of the communication controller 1302 of the host computer 106 and the address of the communication controller 1302 is a final destination of the EtherCAT frame 1600.

The field 1602 includes the source state information. The address that identifies the source RF generator 102 is used by the communication controller of the source RF generator 102 to determine that data received from the DSP 204 of the source RF generator 102 is to be stored in the field 1602.

The field 1604 includes an address, such as a MAC address, of the source match 108, that identifies the source match 108 (FIG. 13A) to distinguish the source match 108 from other RF generators of a plasma system. The field 1606 includes the source match data, and the field 1608 includes the source match measured information. The address that identifies the source match 108 is used by the communication controller of the source match 108 to determine that data within the field 1606 is to be provided to the processor of the source match 108 and data received from the processor of the source match 108 is to be stored in the field 1608.

The field 1610 includes the bias state information. The address that identifies the bias RF generator 104 is used by the communication controller of the bias RF generator 104 to determine that data received from the DSP 204 of the bias RF generator 104 is to be stored in the field 1610.

The field 1612 includes an address, such as a MAC address, of the bias match 110, that identifies the bias match 110 (FIG. 13A) to distinguish the bias match 110 from other RF generators of a plasma system. The field 1614 includes the bias match data, and the field 1616 includes the bias match measured information. The address that identifies the bias match 110 is used by the communication controller of the bias match 110 to determine that data within the field 1614 is to be provided to the processor of the bias match 110 and data received from the processor of the bias match 110 is to be stored in the field 1616.

The field 1418 includes a CRC for one or more of the fields 1408, 1410, 1602, 1606, 1608, 1414, 1416, 1610, 1614, and 1616. For example, the CRC is performed by the communication controller 1302 (FIG. 13A) after receiving the EtherCAT frame 1600 to determine whether the source RF generator variable information, within the field 1408, as sent by the communication controller 1302 matches the source RF generator variable information, within the field 1408, received by the communication controller 1302 to determine validity of the EtherCAT frame 1400.

In one embodiment, the fields 1408, 1410, and 1602 or the fields 1606 and 1608 or the fields 1414, 1416, and 1610 or the fields 1614 and 1616 or a combination thereof are not included in the EtherCAT frame 1600. For example, when the EtherCAT frame 1600 is an example of any of the one or more EtherCAT frames 1552 (FIG. 15B) that are sent to the source match 108 (FIG. 15B), the EtherCAT frame 1600 excludes the fields 1408, 1410, 1602, 1414, 1416, 1610, 1614, and 1616 for the source RF generator 102, the bias RF generator 104, and the bias match 110.

In an embodiment, the fields 1408, 1410, and 1602 or the fields 1606 and 1608 or the fields 1414, 1416, and 1610 or the fields 1614 and 1616 or a combination thereof are included in the EtherCAT frame 1600 but are empty. For example, when the EtherCAT frame 1600 is an example of any of the one or more EtherCAT frames 1552 that are sent to the source match 108, the EtherCAT frame 1600 excludes any data or information in the fields 1408, 1410, 1602, 1414, 1416, 1610, 1614, and 1616 for the source RF generator 102, the bias RF generator 104, and the bias match 110.

In one embodiment, it should be noted that the addresses of a component of a plasma system, described herein, is an address of a communication controller of the component. For example, the MAC address of the source RF generator 102 is an address of the communication controller of the source RF generator 102, the MAC address of the bias RF generator 104 is an address of the communication controller of the bias RF generator 104, the MAC address of the source match 108 is an address of the communication controller of the source match 108, and the MAC address of the bias match 110 is an address of the communication controller of the bias match 110.

Figure 17:
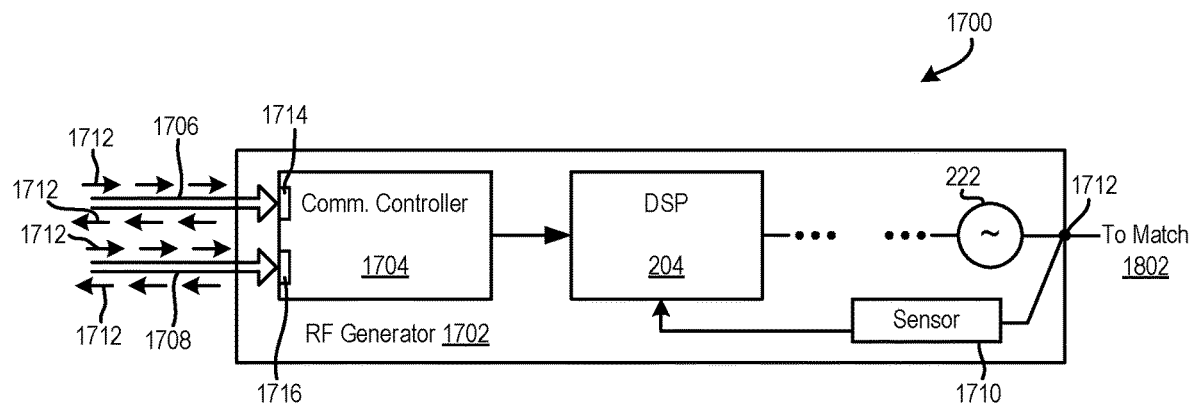
FIG. 17 is a diagram of an embodiment of a system to illustrate an RF generator that is coupled to EtherCAT cables.

FIG. 17 is a diagram of an embodiment of a system 1700 to illustrate an RF generator 1702 that is coupled to EtherCAT cables 1706 and 1708. The RF generator 1702 is an example of the source RF generator 102 or the bias RF generator 104 (FIG. 15A). The EtherCAT cable 1706 is an example of any of the EtherCAT cables 1304 (FIG. 13A), 1306 (FIG. 13B), and 1504 (FIG. 15A). The EtherCAT cable 1708 is an example of any of the EtherCAT cables 1306 and 1508 (FIGS. 13A & 15A).

The RF generator 1702 includes a communication controller 1704, the DSP 204, the RF power supply 222, and a sensor 1710. Examples of the sensor 1710 include a complex voltage and current sensor, a complex impedance sensor, a complex power sensor, and a complex voltage sensor. The RF generator 202 (FIG. 2) is an example of the RF generator 1702 except that in the RF generator 1702, the DSP 204 is coupled via the communication controller 1704 to the processor 118 of the host computer 106. Also, any of the RF generators 702 (FIG. 7), 802 (FIG. 8), and 902 (FIG. 9), 1102 (FIG. 11A) is an example of the RF generator 1702 except that in the RF generator 1702, the DSP 204 is coupled via the communication controller 1704 to the processor 118 of the host computer 106.

The communication controller 1704 is coupled to the EtherCAT cable 1706 via a port 1714 of the communication controller 1704 and is coupled to the EtherCAT cable 1708 via another port 1716 of the communication controller 1704. The communication controller 1704 is also coupled to the DSP 204. The sensor 1710 is coupled to the DSP 204 and to an output 1712 of the RF generator 1702. Any of the outputs 158 and 164 (FIG. 1) is an example of the output 1712.

The communication controller 1704 receives one or more EtherCAT frames 1712 via the port 1714 from a component of a plasma system. For example, the communication controller 1704 receives the one or more EtherCAT frames 1314 (FIG. 13A), or 1352 (FIG. 13B), or 1354 (FIG. 13C), or 1512 (FIG. 15A) via the port 1714 from a component of a plasma system. The communication controller 1704 processes the one or more EtherCAT frames 1712 to identify an address of the RF generator 1702. For example, the communication controller 1704 compares the address of the RF generator 1702 with a pre-stored address of the RF generator 1702 within a memory device of the communication controller 1704 and determines whether the two addresses match. Upon determining that the two addresses match, the communication controller 1704 identifies the address of the RF generator 1702 from the one or more EtherCAT frames 1712.

Once the address is identified, the communication controller 1704 identifies data to be extracted from the one or more EtherCAT frames 1712 and to be provided to the DSP 204. As an example, the data to be provided to the DSP 204 of the RF generator 1702 is identified as being between the address of the RF generator 1702 in the one or more EtherCAT frames 1712 and a following address within the one or more EtherCAT frames 1712. To illustrate with respect to FIG. 14, the source RF generator variable information within the field 1408 is between the source RF generator address within the field 1406 and the bias RF generator address within the field 1412. An example of data to be provided to the DSP 204 include the source RF generator variable information of the field 1408 or the bias RF generator variable information of the field 1414. Once the data is identified, the communication controller 1704 extracts, such as obtains or reads or copies, the data to be provided to the DSP 204 from the one or more EtherCAT frames 1712, and sends the data to the DSP 204.

The sensor 1710 measures the criterion, for one or more of the states described above, and provides the criterion to the DSP 204. The DSP 204 provides the criterion to the communication controller 1714 or calculates the factor from the criterion and provides the factor to the communication controller 1714 or a combination thereof. Also, the communication controller 1704 receives data from the DSP 204 and includes the data within fields, for the RF generator 1702, within the one or more EtherCAT frames 1712. For example, the communication controller 1704 receives the factor from the DSP 204 and embeds the factor within the one or more EtherCAT frames 1712, and sends the factor via the port 1714 and the EtherCAT cable 1706 to a source component, such as the processor 118 or the source RF generator 102 or the source match 108, of a plasma system or sends the one or more EtherCAT frames 1712 via the port 1716 to a destination component, such as the source match 108 or the bias RF generator 104, of the plasma system. To illustrate, to send the one or more EtherCAT frames 1712 to a component, such as the source component or the destination component or any other component of the plasma system, the communication controller 1704 reads the order field 1403 of the one or more EtherCAT frames 1712 to identify the address of the component from the one or more EtherCAT frames 1712. To further illustrate, to identify the address of the component, the communication controller 1704 compares the address of the destination component as stored in the one or more EtherCAT frames 1712 with a pre-stored address of the component within a memory device of the communication controller 1704 and determines whether the two addresses match. Upon determining that the two addresses match, the communication controller 1704 identifies the address of the component from the one or more EtherCAT frames 1712, and sends the one or more EtherCAT frames 1712 to the component. The source component is one from which the one or more EtherCAT frames 1712 are received by the RF generator 1702 and the destination component is one to which the one or more EtherCAT frames 1712 are to be sent by the RF generator 1702. When the one or more EtherCAT frames 1712 are sent via the port 1716 to the destination component of the plasma system, the one or more EtherCAT frames 1712 are later received via the port 1716 from the destination component and sent by the communication controller 1704 via the port 1714 to the source component.

In one embodiment, multiple sensors are associated with the RF generator 1702. For example, another sensor is coupled to a point on the RF cable 138 or 142 (FIG. 1) and is also coupled to the DSP 204 to measure and provide the criterion to the DSP 204.

In an embodiment, the system 1700 excludes the EtherCAT cable 1708 and the communication controller 1702 excludes the port 1716.

Figure 18:
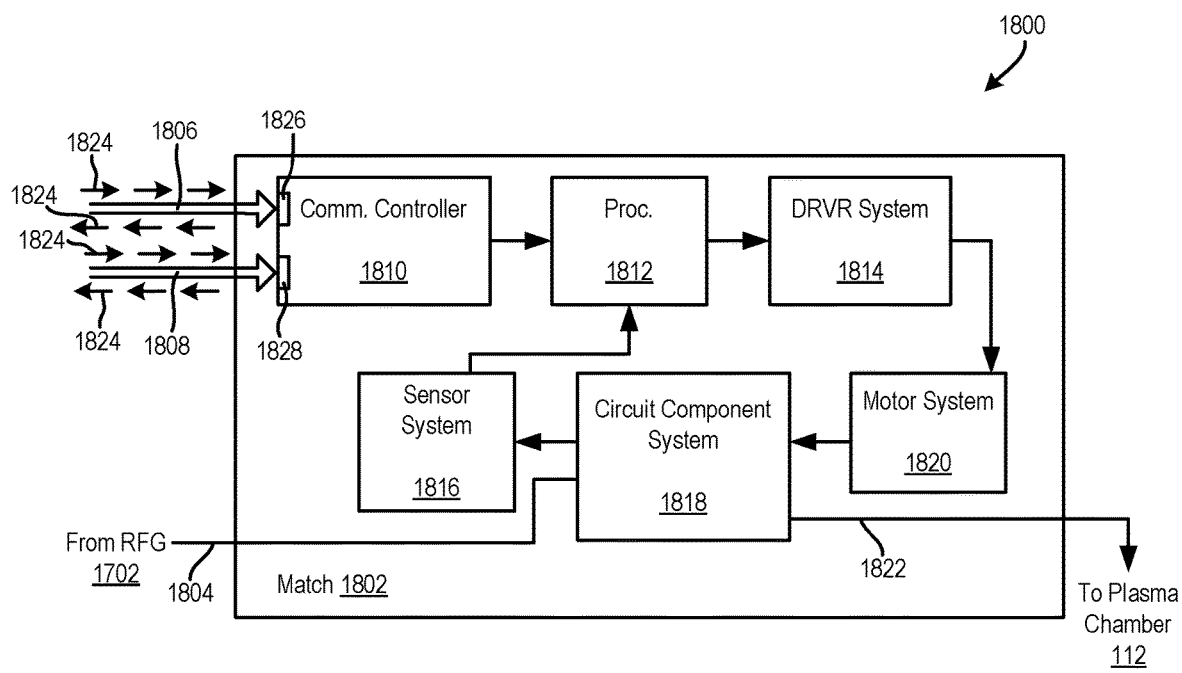
FIG. 18 is a diagram of an embodiment of a system to illustrate a match that is coupled to the RF generator of FIG. 17 via an RF cable and is coupled to EtherCAT cables.

FIG. 18 is a diagram of an embodiment of a system 1800 to illustrate a match 1802 that is coupled to the RF generator 1702 (FIG. 17) via an RF cable 1804 and is coupled to EtherCAT cables 1806 and 1808. The RF cable 1804 is an example of any of the RF cables 138 and 142 (FIG. 1) and 218 (FIG. 2). The match 1802 is an example of the source match 108 (FIG. 15A) or the bias match 110 (FIG. 15B). The EtherCAT cable 1806 is an example of any of the EtherCAT cables 1306 (FIG. 15A), 1508 (FIG. 15B), and 1504 (FIGS. 15A and 15B). The EtherCAT cable 1808 is an example of the EtherCAT cable 1504 (FIG. 15A).

The match 1802 includes a communication controller 1810, a processor 1812, a driver system 1814, a sensor system 1816, a circuit component system 1818, and a motor system 1820. An example of the sensor system 1816 includes one or more sensors, such as the sensor 1710 (FIG. 17). An example of the driver system 1814 includes one or more drivers, such as one or more transistors, that are coupled with each other. An example of the circuit component system 1818 includes one or more circuit components, such as inductors and capacitors, that are coupled with each other. An example of the motor system 1820 includes one or more electric motors. Each electric motor is coupled to a respective circuit component, such as an inductor or a capacitor, of the circuit component system 1818.

The source match 108 or the bias match 110 is an example of the match 1802 except that the match 1802 includes the communication controller 1810 and the processor 1812. The communication controller 1810 is coupled to the EtherCAT cable 1806 via a port 1826 of the communication controller 1810 and to the EtherCAT cable 1808 via a port 1828 of the communication controller 1810. The communication controller 1810 is also coupled to the processor 1812. The processor 1812 is coupled to the sensor system 1816 and to the driver system 1814, which is coupled to the motor system 1820. The motor system 1820 is coupled to the circuit component system 1818, which is coupled to the RF cable 1804 and to the plasma chamber 112 via an RF transmission line 1822. The circuit component system 1818 is coupled to the sensor system 1816. For example, a first sensor of the sensor system 1816 is coupled to a first circuit component of the circuit component system 1818 and a second sensor of the sensor system 1816 is coupled to a second circuit component of the circuit component system 1818. Any of the RF transmission line 140 and 144 (FIG. 1) is an example of the RF transmission line 1822.

The communication controller 1810 receives one or more EtherCAT frames 1824 via the port 1826 from a component of a plasma system. For example, the communication controller 1810 receives the one or more EtherCAT frames 1512 (FIG. 15A), or 1552 (FIG. 15B), or 1554 (FIG. 15C), via the port 1826 from a component of a plasma system. The communication controller 1810 processes the one or more EtherCAT frames 1824 to identify an address of the match 1802. For example, the communication controller 1810 compares the address of the match 1802 with a pre-stored address of the match 1802 within a memory device of the communication controller 1810 and determines whether the two addresses match. Upon determining that the two addresses match, the communication controller 1810 identifies the address of the match 1802 from the one or more EtherCAT frames 1824.

Once the address is identified, the communication controller 1810 identifies data to be extracted from the one or more EtherCAT frames 1824 for providing to the processor 1812. As an example, the data to be provided to the processor 1812 of the match 1802 is identified as being between the address of the match 1802 in the one or more EtherCAT frames 1824 and a following address within the one or more EtherCAT frames 1824. To illustrate with respect to FIG. 16, the source match data within the field 1606 is between the source match address within the field 1604 and the bias RF generator address within the field 1412. An example of data to be provided to the processor 1812 include the source match data within the field 1606 or the bias match data within the field 1614. The communication controller 1810 extracts, such as reads or obtains or copies, the data to be provided to the processor 1812 from the one or more EtherCAT frames 1512 and sends the data to the processor 1812.

The sensor system 1816 measures the criterion at one or more outputs of one or more circuit components of the circuit component system 1818 and provides the criterion to the processor 1812. The processor 1812 provides the criterion to the communication controller 1810. Also, the communication controller 1810 receives data from the processor 1812 and includes the data within fields for the match 1802 within the one or more EtherCAT frames 1824. For example, the communication controller 1810 receives the criterion from the processor 1812 and embeds the criterion within the one or more EtherCAT frames 1824, and sends the criterion via the port 1826 and the EtherCAT cable 1806 to a source component, such as the source RF generator 108 or the bias RF generator 104 or the host computer 106, of a plasma system or sends the one or more EtherCAT frames 1824 via the port 1828 to a destination component, such as the bias RF generator 104, of the plasma system. For example, to send the one or more EtherCAT frames 1824 to a component, such as the source component or the destination component or any other component of the plasma system, the communication controller 1810 reads the order field 1403 of the one or more EtherCAT frames 1824 to identify the address of the destination from the one or more EtherCAT frames 1824. To illustrate, to identify the address of the destination component, the communication controller 1810 compares the address of the destination component as stored in the one or more EtherCAT frames 1824 with a pre-stored address of the destination component within a memory device of the communication controller 1810 and determines whether the two addresses match. Upon determining that the two addresses match, the communication controller 1810 identifies the address of the destination component from the one or more EtherCAT frames 1824, and sends the one or more EtherCAT frames 1824 to the destination component.

The source component is one from which the one or more EtherCAT frames 1824 are received by the match 1802 and the destination component is one to which the one or more EtherCAT frames 1824 are to be sent by the match 1802. When the one or more EtherCAT frames 1824 are sent via the port 1828 to the destination component of the plasma system, the one or more EtherCAT frames 1824 are later received via the port 1828 from the destination component and sent by the communication controller 1810 via the port 1826 to the source component.

In one embodiment, multiple sensors are associated with the match 1802. For example, another sensor is coupled to a point on the RF transmission line 1804 and is also coupled to the processor 1812 to measure and provide the criterion to the processor 1812.

In an embodiment, the system 1800 excludes the EtherCAT cable 1808 and the communication controller 1810 excludes the port 1828.

Figure 19A:
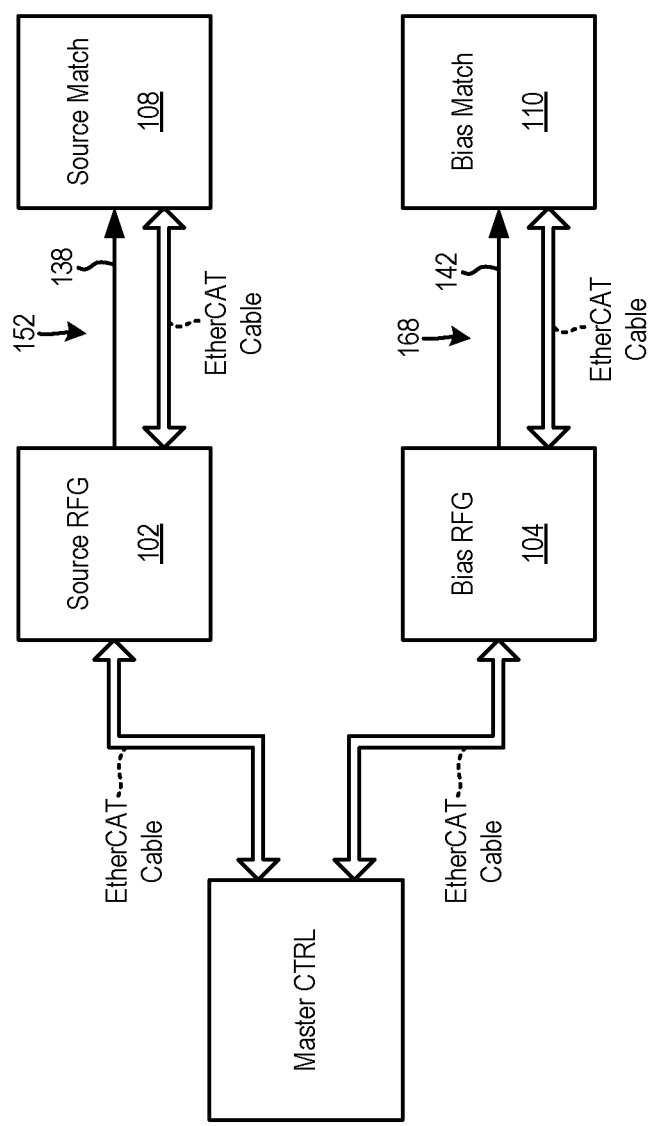
FIG. 19A illustrates an embodiment of an EtherCAT synchronization system in which an EtherCAT cable is coupled between two components of a plasma system.

FIG. 19A illustrates another embodiment of an EtherCAT synchronization system 1920, such as a plasma system, in which multiple EtherCAT cables are coupled between any two components of the EtherCAT synchronization system 1920. For example, an EtherCAT cable is coupled from an output port of a master controller to the input port of the source RF generator 102, another EtherCAT cable is coupled from another output port of the master controller to an input port of the bias RF generator 104, an EtherCAT cable is coupled from an output port of the source RF generator 102 to an input port of the source match 108, and an EtherCAT cable is coupled from an output port of the bias RF generator 104 to an input port of the bias match 110. Examples of the master controller include the host controller or the host computer 106 (FIG. 1) or the ADVCI or another controller.

State information for the source RF generator 102 and the source match 108 is provided in a pulse train that is sent from the master controller to the source RF generator 102 and sent from the source RF generator 102 to the source match 108. For example, duty cycles, power levels, and frequency levels of the states S(n–A) through Sn of the variable of the RF signal 152 to be generated by the source RF generator 102 and the source match data are provided in the pulse train sent from the master controller to the source RF generator 102 and duty cycles of the states S(n–A) through Sn of the variable are provided in the pulse train sent from the source RF generator 102 to the source match 108. Similarly, duty cycles, power levels, and frequency levels of the states S(n–A) through Sn of the variable of the RF signal 168 and the bias match data are provided in another pulse train sent from the master controller to the bias RF generator 104 and duty cycles of the states S(n–A) through Sn are provided in the other pulse train sent from the bias RF generator 104 to the bias match 110.

Figure 19B:
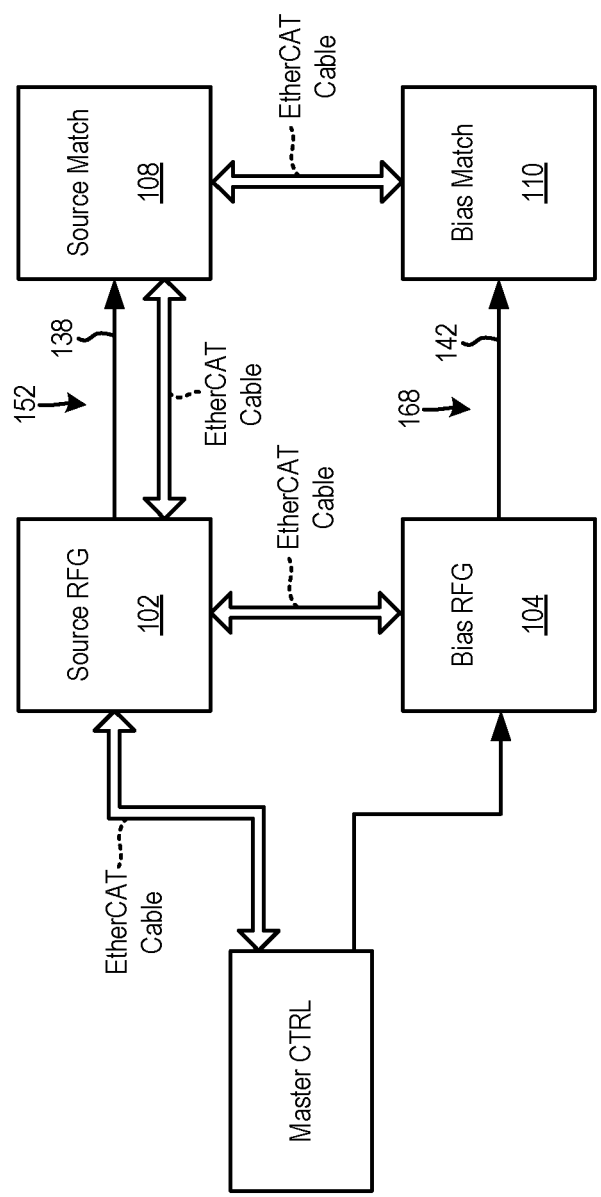
FIG. 19B is a diagram of an embodiment of an EtherCAT synchronization system in which an EtherCAT cable is coupled between a source radio frequency (RF) generator and a bias RF generator, and another EtherCAT cable is coupled between the source RF generator and a source match.

FIG. 19B is a diagram of an embodiment of an EtherCAT synchronization system 1930, such as a plasma system, in which an EtherCAT cable is coupled between an output port of the master controller and an input port of the source RF generator 102, an EtherCAT cable is coupled between an output port of the source RF generator 102 and an input port of the bias RF generator 104, an EtherCAT cable is coupled from an output port of the source RF generator 102 to an input port of the source match 108, and an EtherCAT cable is coupled between an output port of the source match 108 and an input port of the bias match 110.

State information for the source RF generator 102, the source match 108, the bias RF generator 104, and the bias match 110 is provided in a pulse train that is sent from the master controller to the source RF generator 102. For example, duty cycles, power levels, and frequency levels of the states S(n–A) through Sn of the variables of the RF signals 152 and 168, the source match data, and the bias match data are provided in the pulse train sent from the master controller to the source RF generator 102. The pulse train is forwarded from the source RF generator 102 to the bias RF generator 104. Also, the pulse train sent from the source RF generator 102 to the source match 108 and is sent from the source match 108 to the bias match 110.

In one embodiment, the EtherCAT cable is coupled from an output port of the bias RF generator 104 to an input of the source RF generator 102 and the EtherCAT cable is coupled from an output port of the bias match 110 to an input port of the source match 108. In this embodiment, instead of the EtherCAT cable that couples the master controller to the source RF generator 102, an EtherCAT cable that couples an output port of the master controller to an input port of the bias RF generator 104 is used. Also, an EtherCAT cable is coupled from an output port of the bias RF generator 104 to an input port of the bias match 110. The state information for the source RF generator 102, the source match 108, the bias RF generator 104, and the bias match 110 is provided in a pulse train that is sent from the master controller to the bias RF generator 104. For example, the pulse train is sent from the master controller to the bias RF generator 104, forwarded from the bias RF generator 104 to the source RF generator 102, forwarded from the bias RF generator 104 to the bias match 110, and forwarded from the bias match 110 to the source match 108.

Figure 19C:
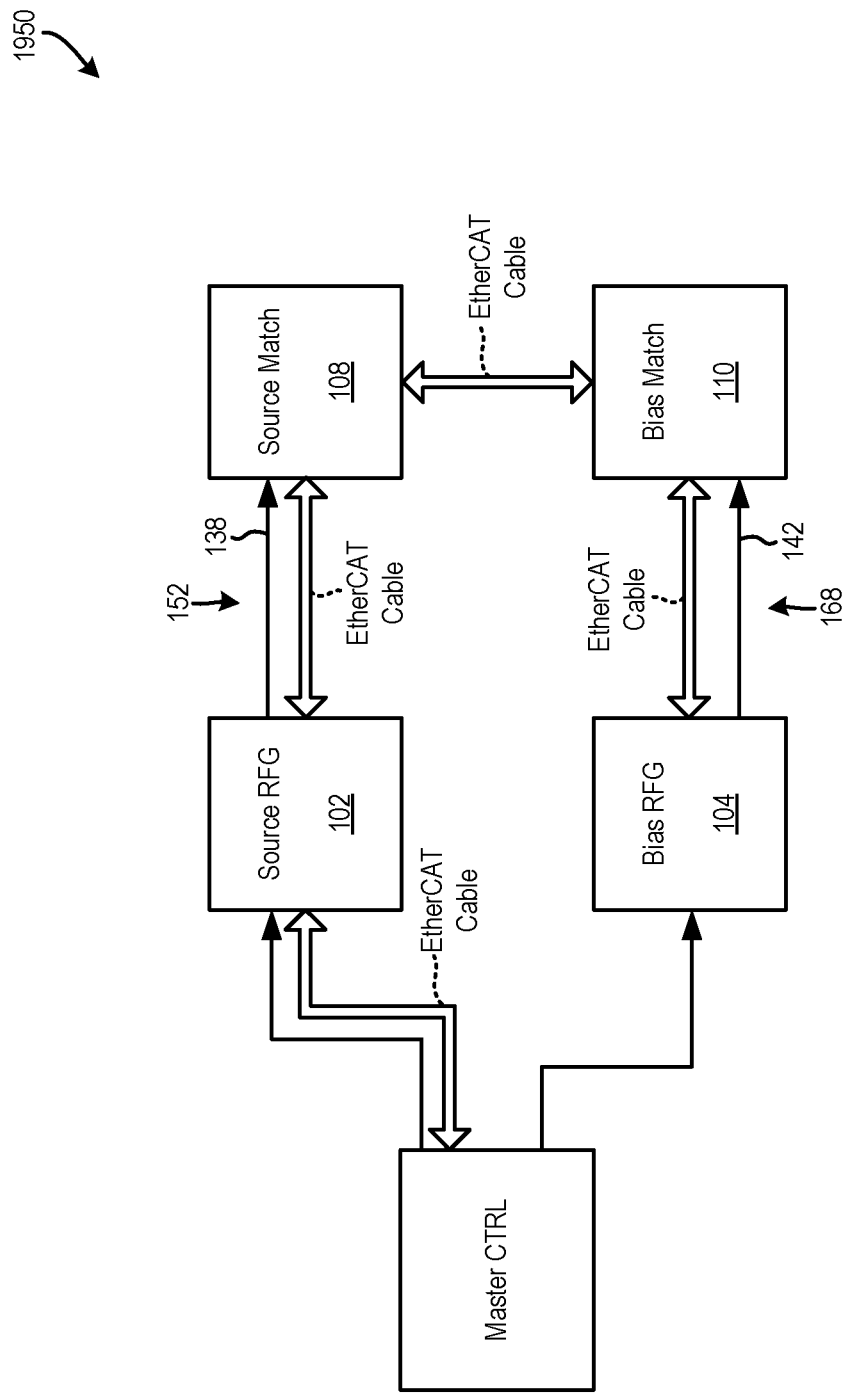
FIG. 19C illustrates an embodiment of an EtherCAT synchronization system in which components of a plasma system are coupled in a Daisy chain fashion.

FIG. 19C illustrates an embodiment of an EtherCAT synchronization system 1950, such as a plasma system, in which components are coupled in a Daisy chain fashion. For example, an EtherCAT cable is coupled from an output port of the master controller to an input port of the source RF generator 102, an EtherCAT cable is coupled form an output port of the source RF generator 102 to an input port of the source match 108, an EtherCAT cable is coupled from an output port of the source match 108 to an input port of the bias match 110, and an EtherCAT cable is coupled from an output port of the bias match 110 to an input port of the bias RF generator 104.

The state information for the source RF generator 102, the source match 108, the bias RF generator 104, and the bias match 110 is provided in a pulse train that is sent from the master controller to the source RF generator 102. The pulse train is then sent from the source RF generator 102 to the source match 108, then from the source match 108 to the bias match 110, and from the bias match 110 to the bias RF generator 104.

Figure 19D:
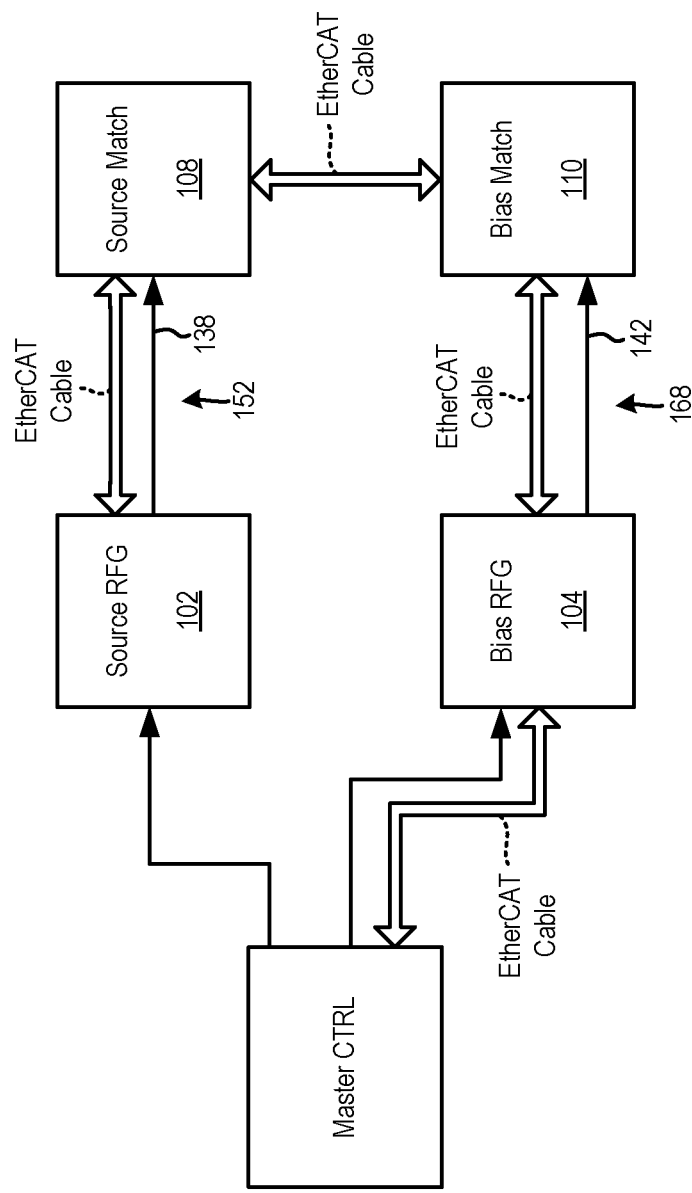
FIG. 19D illustrates an embodiment of an EtherCAT synchronization system in which components of a plasma system are coupled in a Daisy chain fashion.

FIG. 19D illustrates an embodiment of an EtherCAT synchronization system 1960, such as a plasma system, in which components are coupled in a Daisy chain fashion. For example, an EtherCAT cable is coupled from an output port of the master controller to an input port of the bias RF generator 104, an EtherCAT cable is coupled form an output port of the bias RF generator 104 to an input port of the bias match 110, an EtherCAT cable is coupled from an output port of the bias match 110 to an input port of the source match 108, and an EtherCAT cable is coupled from an output port of the source match 108 to an input port of the source RF generator 102.

The state information for the source RF generator 102, the source match 108, the bias RF generator 104, and the bias match 110 is provided in a pulse train that is sent from the master controller to the bias RF generator 104. The pulse train is then sent from the bias RF generator 104 to the bias match 110, from the bias match 110 to the source match 108, and from the source match 108 to the source RF generator 102.

Calibration

Figure 20:
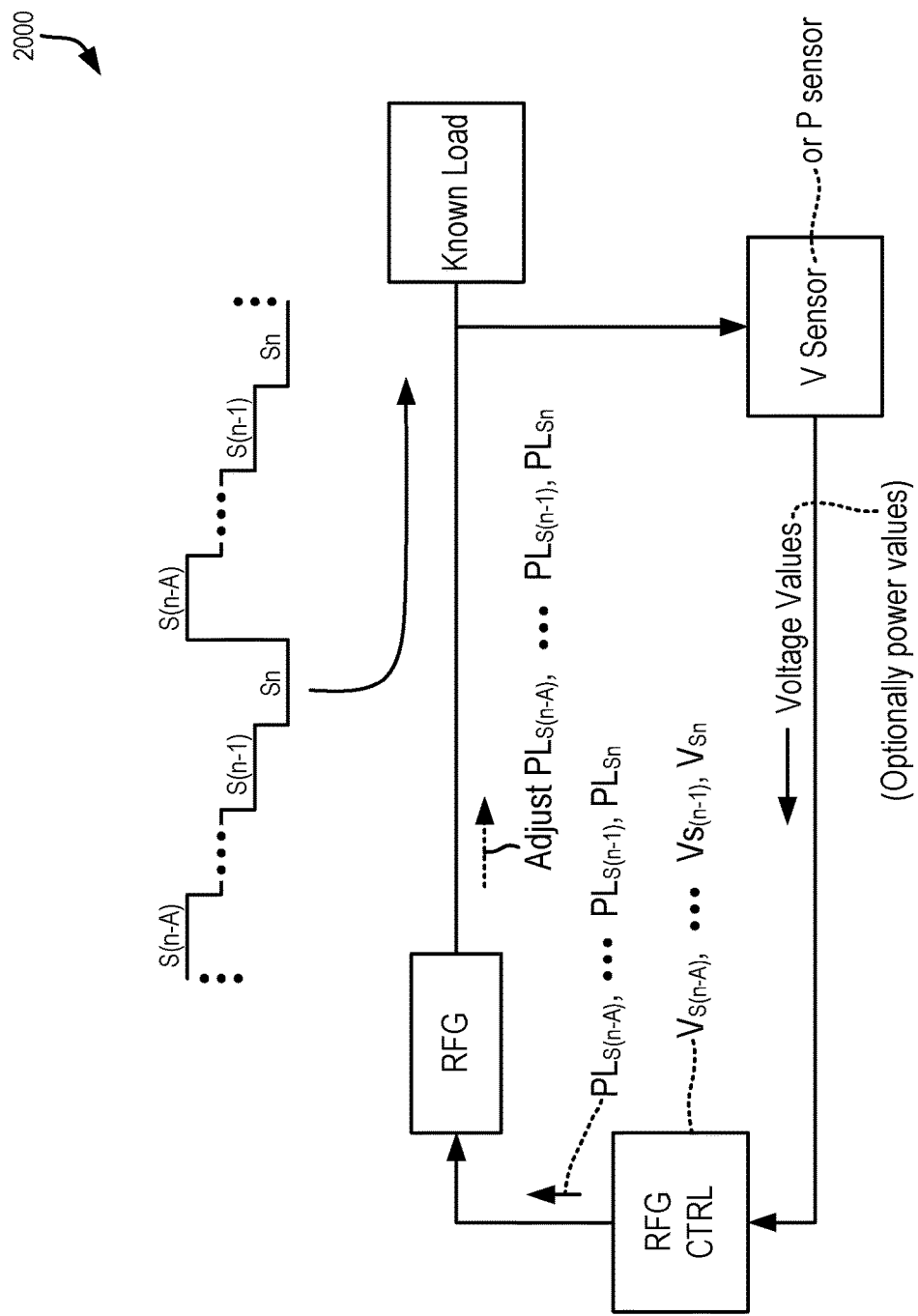
FIG. 20 is a diagram of an embodiment of a system to illustrate a pulse train calibration method.

FIG. 20 is a diagram of an embodiment of a system 2000 to illustrate a pulse train calibration method. As illustrated with respect to FIG. 20, a radio frequency generator (RFG) controller, such as the host computer 106 (FIG. 1) or a digital signal processor or the ADVCI, provides power levels, such as $PL_{S(n-A)}$, $PL_{S(n-A+1)}$ ... $PL_{S(n-1)}$, and $PL_{Sn}$ to a radiofrequency generator RFG for multiple states S(n–A), S(n–A+1) ... S(n–1), and Sn, where A is a positive integer. As an example, a number of states S(n–A) through Sn range from 4 through 36. To illustrate, the number of states is four states, or five states, or six states, or seven states, or eight states, or nine states, or ten states, or eleven states, or twelve states, or thirteen states, or fourteen states, or fifteen states, or sixteen states. Each state occurs for one or more microseconds. For example, a duty cycle of each of the states S(n–A) through Sn is the same. To illustrate, the state S(n–A) occurs for a number of microseconds, the state S(n–A+1) occurs for the same number of microseconds and so on until the state Sn occurs for the number of microseconds. As another example, a duty cycle of one or more states is different than a duty cycle of one or more of remaining states. To illustrate, the state S(n–A) occurs for a first number of microseconds and the state Sn occurs for a second number of microseconds. As another illustration, the state S(n–A) occurs for a first number of microseconds, the state S(n–A+1) occurs for a second number of microseconds, and the state Sn occurs for a third number of microseconds. An example of the radiofrequency generator RFG is the RF generator 702 (FIG. 7). Another example of the radiofrequency generator RFG is the RF generator 902 (FIG. 9).

The radiofrequency generator RFG generates an RF signal having the power levels $PL_{S(n-A)}$, $PL_{S(n-A+1)}$ ... $PL_{S(n-1)}$, and $PL_{Sn}$ and supplies the RF signal to a known load, such as a 50 ohm load. A voltage sensor that is coupled to the known load measures voltage values and provides the voltage values to the RFG controller. For example, the voltage sensor is coupled to an input of the known load. As another example, the voltage sensor is coupled to an RF cable that is coupled between the radiofrequency generator RFG and the known load. The RFG controller determines voltage values, such as $V_{S(n-A)}$, $V_{S(n-A+1)}$ ... $V_{S(n-1)}$, $V_{Sn}$, for the states S(n–A), S(n–A+1) ... S(n–1), and Sn from the voltage values received from the voltage sensor. For each state, the RFG controller determines whether a power level for the state is to be changed based on the voltage value for the state, and adjusts one or more of the power levels $PL_{S(n-A)}$, $PL_{S(n-A+1)}$ ... $PL_{S(n-1)}$, and $PL_{Sn}$ based on the determination. As an example, the RFG controller determines whether the voltage value for the state is outside a pre-set range, and adjusts a power level for the state until the voltage value is within the preset range.

Figure 21:
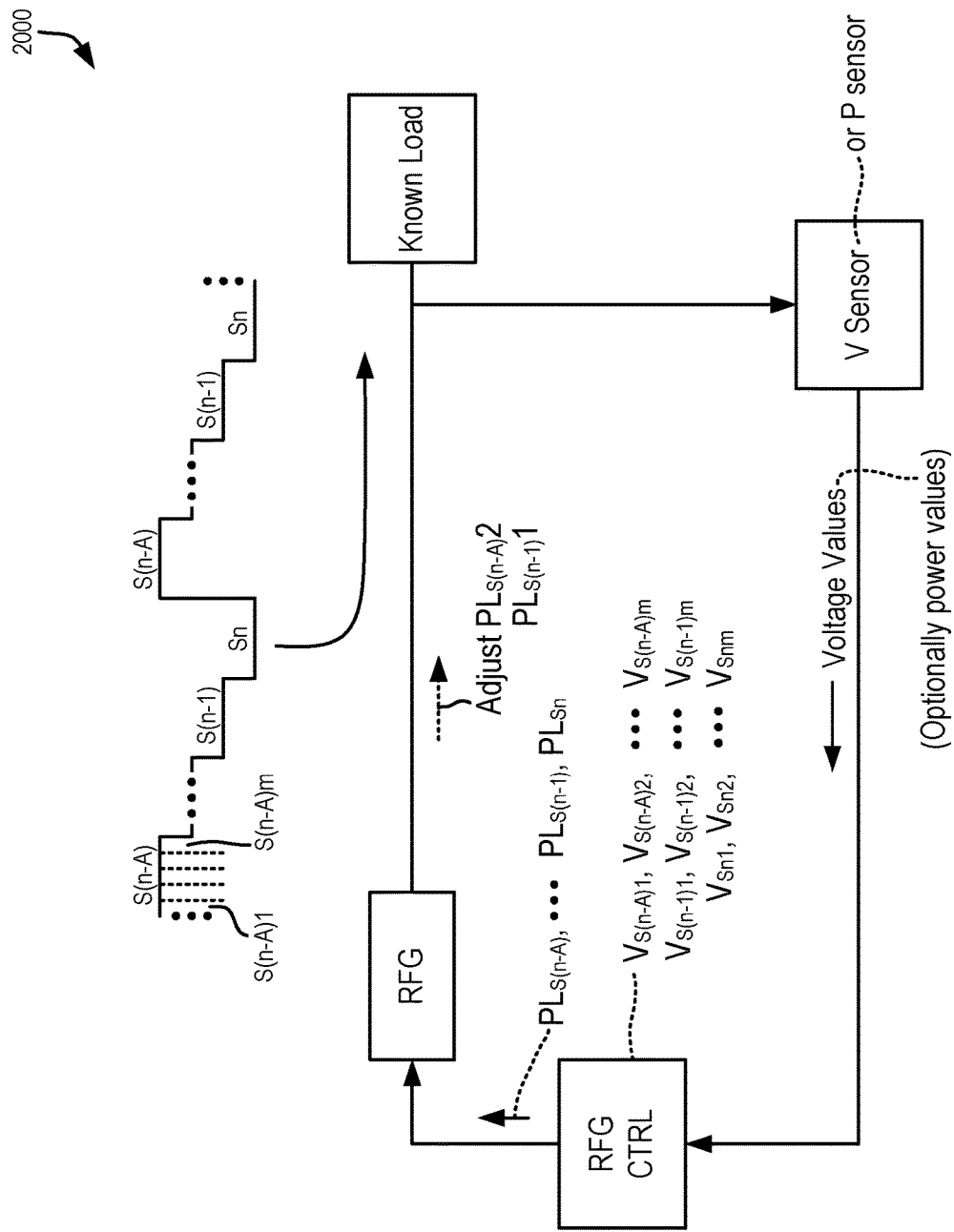
FIG. 21 is a diagram of an embodiment of a system to illustrate a voltage pulse leveling method.

FIG. 21 is a diagram of an embodiment of the system 2000 to illustrate a voltage pulse leveling method. As described above with respect to the system 2000 of FIG. 20, the RF signal having the power levels $PL_{S(n-A)}$, $PL_{S(n-A+1)}$ ... $PL_{S(n-1)}$, and $PL_{Sn}$ is supplied to the known load and the voltage sensor measures the voltage values. The voltage values are provided to the RFG controller. Referring back to the system 2000 of FIG. 21, the RFG controller divides each state into multiple sub-states or sub-pulses. For example, the state S(n–A) is divided into sub-states S(n–A)1, S(n–A)2 and so on until a sub-state S(n–A)m is determined, where m is an integer greater than two. As another example, the state S(n–1) is divided into sub-states S(n–1)1, S(n–1)2 and so on until a sub-state S(n–1)m, and the state Sn is divided into sub-states Sn1, Sn2, and so on until a sub-state Snm is determined. For each sub-state, the RFG controller determines voltage values from the measured voltage values received from the voltage sensor. As an example, the RFG controller calculates voltage values $V_{S(n-A)1}$, $V_{S(n-A)2}$, and so on until a voltage value $V_{S(n-A)m}$ for the sub-states S(n–A)1 through the state S(n–A)m is calculated. To illustrate, the voltage value $V_{S(n-A)1}$ is a statistical measure, such as an average or a median, of voltage values that are measured during the sub-state S(n–A)1 and the voltage value $V_{S(n-A)2}$ is a statistical measure of voltage values that are measured during the sub-state S(n–A)2. Similarly, the RFG controller calculates voltage values $V_{S(n-1)1}$, $V_{S(n-1)2}$, and so on until a voltage value $V_{S(n-1)m}$ for the sub-states S(n–1)1 through S(n–1)m is calculated and calculates voltage values $V_{Sn1}$, $V_{Sn2}$, and so on until a voltage value $V_{Snm}$ for the sub-states Sn1 through the state Snm is calculated. Based on the calculated voltage value for each sub-state, the RFG controller adjusts a power level for the sub-state, such as a power level $PL_{S(n-A)2}$ for the sub-state S(n–A)2 of the state S(n–A) and a power level $PL_{S(n-1)1}$ for the sub-state S(n–1)1 of the state S(n–1), until the voltage value is within a predetermined range. In this manner, the RFG controller adjusts one or more of power levels $PL_{S(n-A)}$, $PL_{S(n-A+1)}$ ... $PL_{S(n-1)}$, and $PL_{Sn}$.

Figure 22:
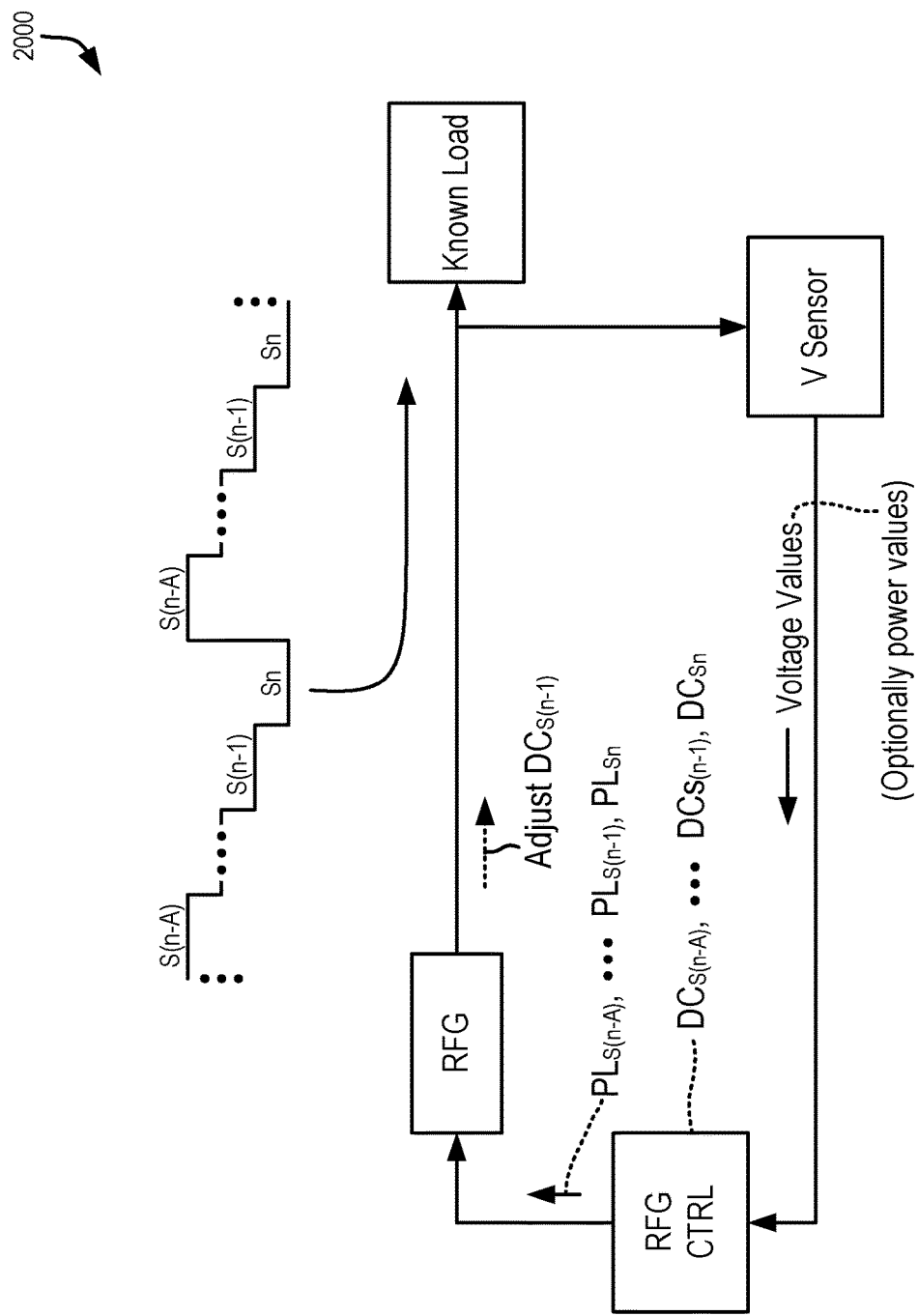
FIG. 22 is a diagram of an embodiment of a system to illustrate a duty cycle calibration method.

FIG. 22 is a diagram of an embodiment of the system 2000 to illustrate a duty cycle calibration method. As described above with reference to FIG. 20, the voltage sensor measures the voltage values and provides the voltage values to the RFG controller. Referring to the system 100, the RFG controller determines duty cycles of the power levels $PL_{S(n-A)}$, $PL_{S(n-A+1)}$ ... $PL_{S(n-1)}$, and $PL_{Sn}$ for the states S(n–A) through Sn based on the voltage values for the states. For example, multiple voltage values for the state Sn are measured for a time duration and multiple voltage values for the state S(n–A) are measured for the same or a different time duration. The voltage values for the state S(n–A) are different than the voltage values for the state Sn.

The duty cycles determined include a duty cycle $DC_{S(n-A)}$ for the state S(n–A) of the power level $PL_{S(n-A)}$ and so on until a duty cycle $DC_{S(n-1)}$ for the state S(n–1) of the power level $PL_{S(n-1)}$ and a duty cycle $DC_{Sn}$ for the state Sn of the power level $PL_{Sn}$ are determined. The RFG controller determines whether each of the duty cycles for a corresponding state is within a pre-set duty cycle range. The RFG controller adjusts one or more of the duty cycles for one or more of the corresponding states until the one or more duty cycles are within corresponding one or more pre-set duty cycle ranges. For example, the RFG controller increases or decreases the duty cycle $DC_{Sn}$ for the state Sn for the power level $PL_{Sn}$ in response to determining that the duty cycle $DC_{Sn}$ is not within a pre-set duty cycle range for the state Sn.

It should be noted that in an embodiment, instead of using the voltage sensor in the systems of FIG. 20, 21 or 22, a power sensor that measures power or a complex voltage and current sensor that measures a complex voltage and current can be used.

Tuning for Four or More States (Tune TCCT Match to Average Impedance)

Figure 23:
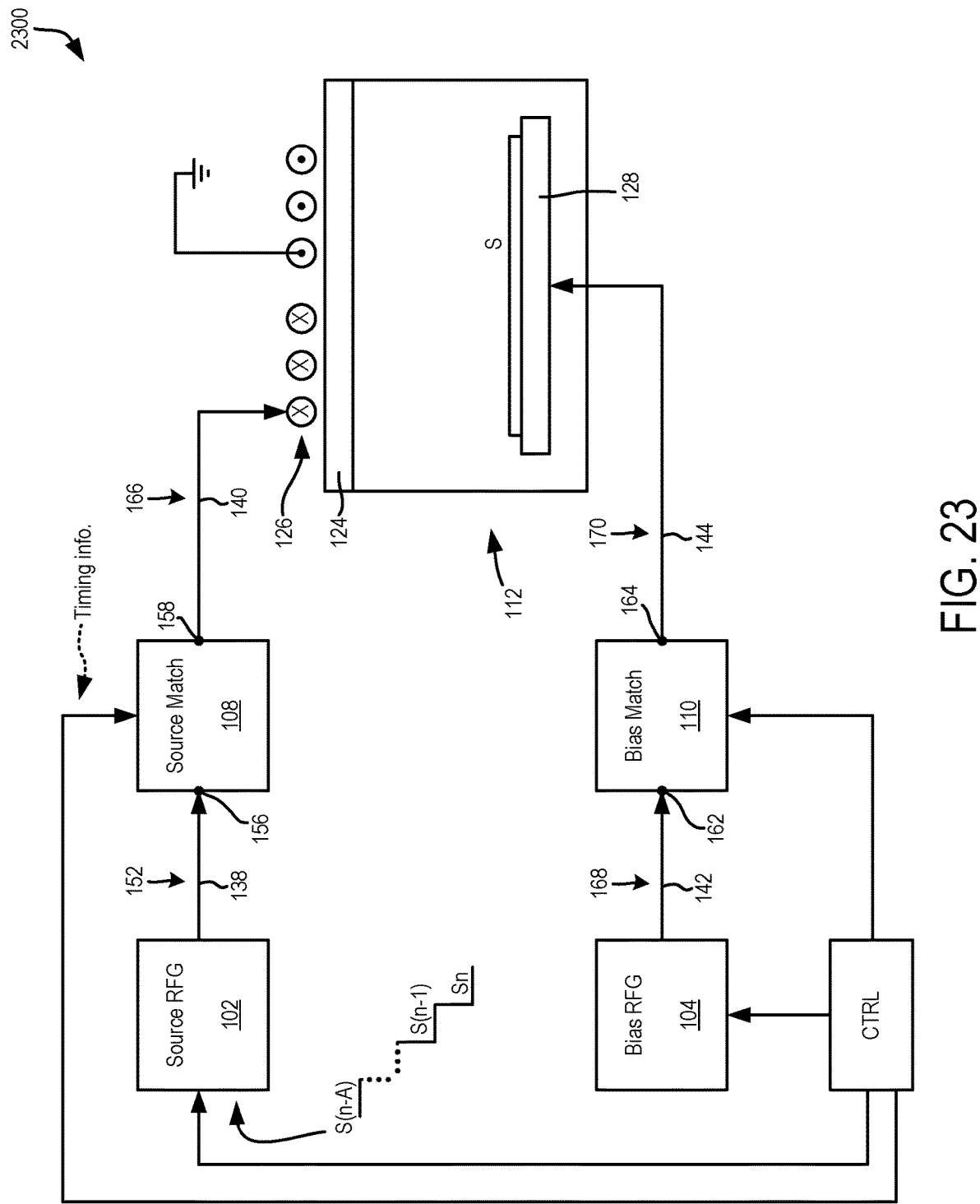
FIG. 23 illustrates a system to illustrate use of a transformer coupled capacitive tuning (TCCT) match.

FIG. 23 illustrates a system 2300 including a controller (CTRL) and the source match 108, such as a source transformer coupled capacitive tuning (TCCT) match. An example of the controller includes the RFG controller (FIG. 20). Additional examples of the controller CTRL includes the host computer 106 (FIG. 1) and the host controller. An example of a TCCT match is provided in U.S. Pat. No. 10,056,231, which is incorporated by reference herein in its entirety.

The controller CTRL is coupled to the source RF generator 102, the bias RF generator 104, the source match 108, and the bias match 110. The source match 108 is coupled to the TCP coil 126 of the plasma chamber 112. The substrate support 128 or a lower electrode of the substrate support 128 is sometimes referred to herein as a bias electrode.

The controller CTRL provides timing information regarding the states S(n–A) through Sn to the source match 108. For example, the controller CTRL provides a duty cycle, which includes a time of start and a time of end, of each of the states S(n–A) through Sn to the source match 108. The timing information is provided to the source match 108 to allow the source match 108 to tune during one or more of the states S(n–A) through Sn to match an impedance of a load coupled to an output of the source match 108 with an impedance of a source coupled to an input of the source match 108 to reduce power reflected towards the source RF generator 102. An example of the load includes the plasma chamber 112 and the RF transmission line 140 that couples the source match 108 to the TCP coil 126 and an example of the source includes the source RF generator 102 and the RF cable 138 that couples the source RF generator 102 to the source match 108.

The controller CTRL controls the source match 108 via one or more motor drivers and corresponding one or more motors to adjust a capacitance, or an inductance, or a combination thereof for one or more of the states S(n–A) through Sn to further reduce power that is reflected towards the source RF generator 102 for the one or more of the states S(n–A) through Sn. For example, the source match 108 changes its capacitance or inductance or a combination thereof for a state over multiple clock cycles of a clock signal so that there is match in an impedance of the load coupled to the output 158 of the source match 108 with an impedance of the source coupled to the input 156 of the source match 108. The states S(n–A) through Sn occur over each clock cycle of the clock signal and repeat with each clock cycle. The clock signal is received from the controller CTRL or from a clock source, such as a clock oscillator. While the source RF generator 102 generates the RF signal 152 having the states S(n–A) through Sn, the bias RF generator 104 can generate the RF signal 168 that is continuous or has two states or has more than two states.

In an embodiment, in addition to the bias RF generator 104, one or more additional bias RF generators are coupled via the bias match 110 to the plasma chamber 112.

In one embodiment, the bias match 110 operates in synchronization with states S(n–A) through Sn. The bias match 110 is also provided with timing information regarding the states S(n–A) through Sn by the controller CTRL. The timing information is provided to the bias match 110 to allow the bias match 110 to tune during one or more of the states S(n–A) through Sn to match an impedance of a load coupled to the output 164 of the bias match 110 with an impedance of a source coupled to the input 162 of the bias match 110. An example of the load includes the plasma chamber 112 and the RF transmission line 144 that couples the bias match 110 to the substrate support 128 of the plasma chamber 112 and an example of the source includes the bias RF generator 104 and the RF cable 142 that couples the bias RF generator 104 to the bias match 110.

In one embodiment, one or more circuit components, such as capacitors, inductors, and resistors, of the source TCCT match are adjusted to achieve a ratio between a current passing through the TCP coil 126 and another current passing through another TCP coil (not shown). The other TCP coil is located in the same horizontal plane in which the TCP coil 126 is located or in a different horizontal plane above or below the horizontal plane of the TCP coil 126. Both the TCP coils form together a TCP electrode.

In one embodiment, in addition to the source RF generator 102, one or more additional source RF generators are coupled via the source TCCT match to the other TCP coil.

Selective Tuning of Match (Tune TCCT Match During One State and Tune RFG During the Other States)

Figure 24A:
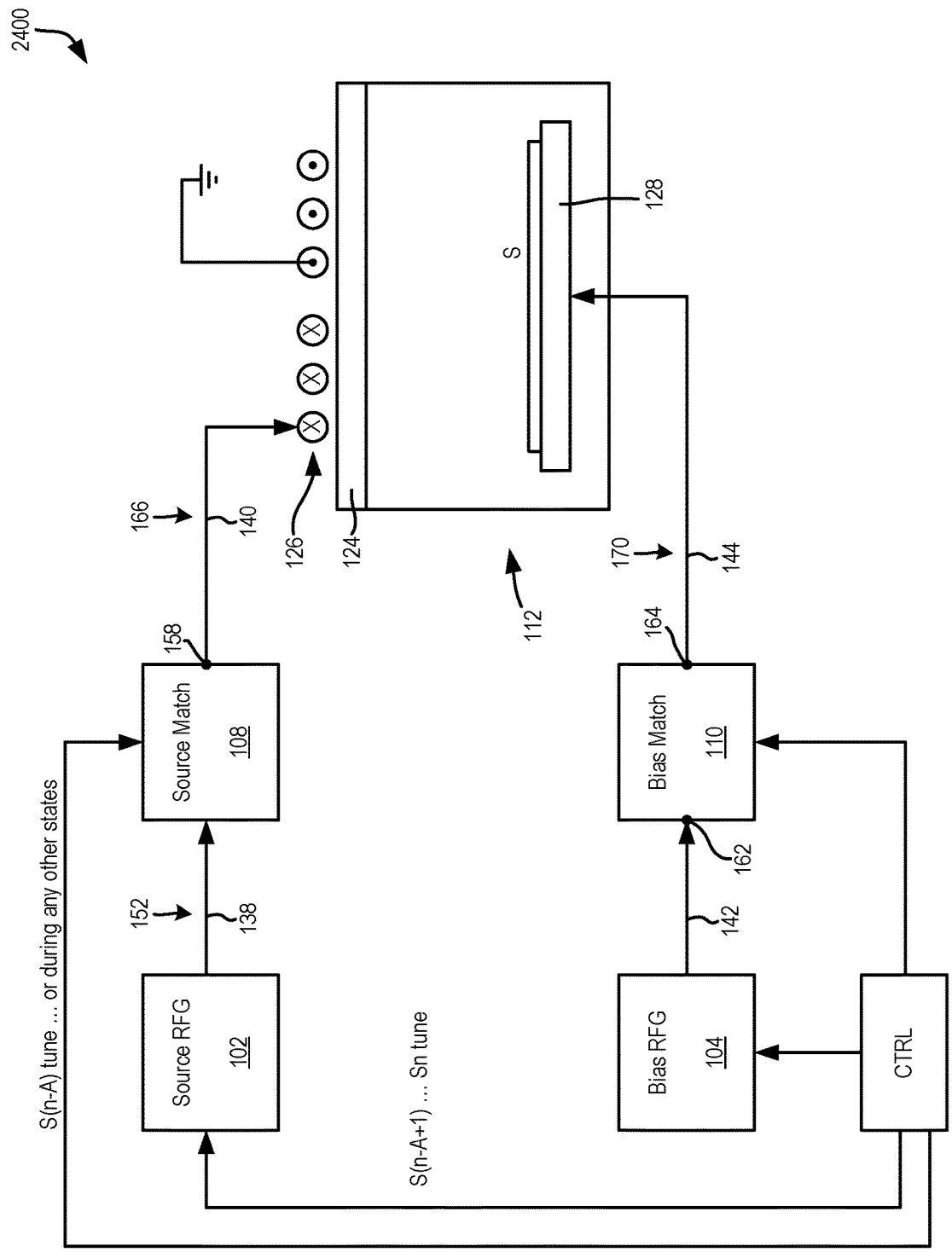
FIG. 24A is a diagram of an embodiment of a system to illustrate a state match tuning method.

FIG. 24A is a diagram of an embodiment of the system 2400 to illustrate a state match tuning method. The source match 108 is tuned during one of the states S(n–A) through Sn and the source RF generator 102 is tuned during one or more of remaining of the states S(n–A) through Sn. For example, a capacitance or an inductance or a combination thereof of the source match 108 is modified by the controller CTRL via one or more motor drivers and corresponding one or more motors to tune the source match 108 during the state S(n–A) to reduce power that is reflected towards the source RF generator 102. Also, a frequency or a power level or a combination thereof of the source RF generator 102 is modified during one or more of the remaining states S(n–A+1) through Sn to tune the source RF generator 102 to reduce power that is reflected towards the source RF generator 102 during the one or more of the remaining states.

The power reflected can be measured by a sensor, such as a voltage sensor or a complex voltage and current sensor, that is coupled to an output of the source RF generator 102 to determine whether the reflected power is reduced. The measured power is provided from the sensor to the controller CTRL to determine power amounts to be supplied by the source RF generator 102 to further reduce the measured power.

In an embodiment, instead of the measured power, a voltage reflection coefficient is used to determine whether to change power supplied by the source RF generator 102.

Figure 24B:
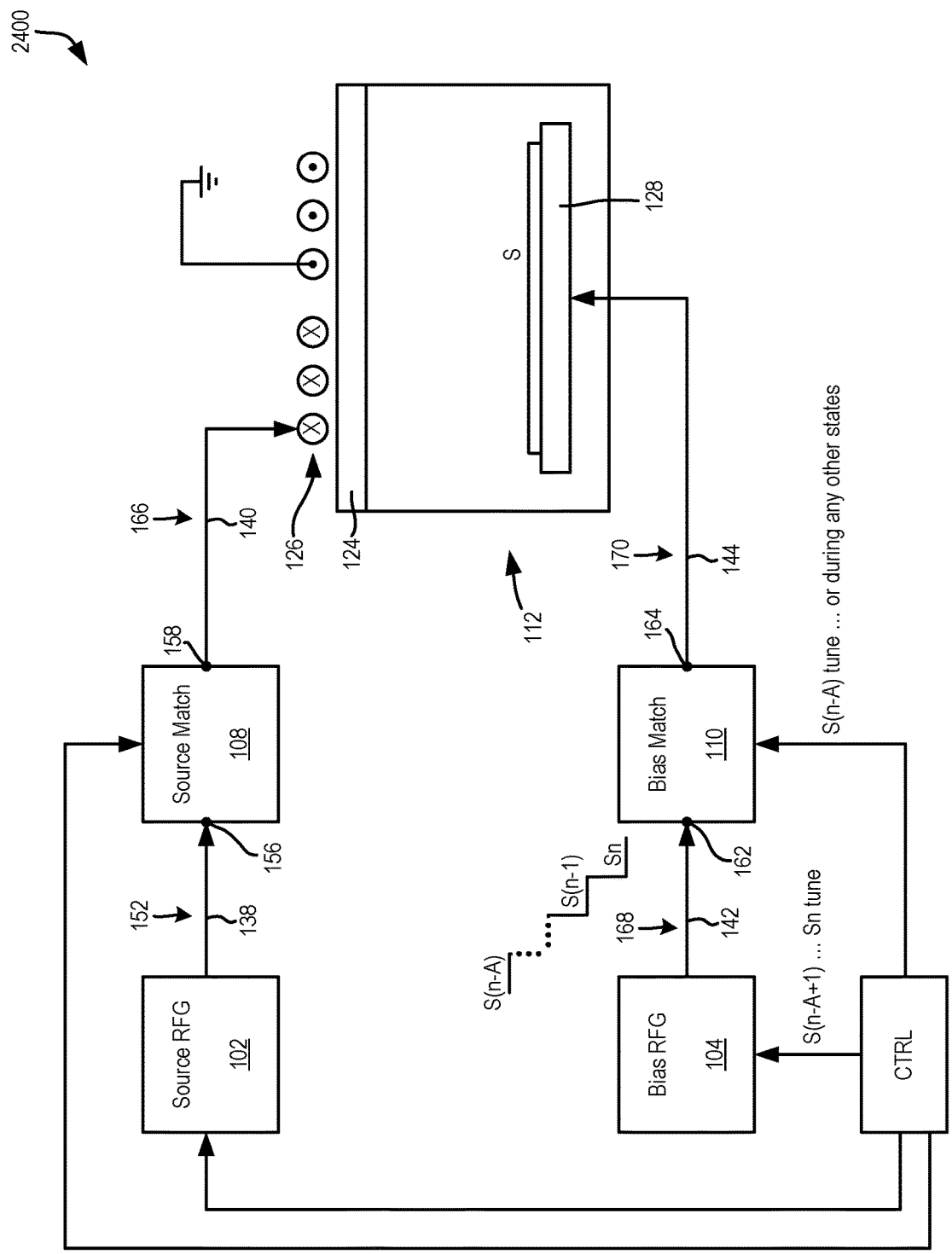
FIG. 24B is a diagram of an embodiment of a system to illustrate another state match tuning method.

FIG. 24B is a diagram of an embodiment of the system 2400 to illustrate a state match tuning method. The bias match 110 is tuned during one of the states S(n–A) through Sn and the bias RF generator 104 is tuned during one or more of remaining of the states S(n–A) through Sn. For example, a capacitance or an inductance or a combination thereof of the bias match 110 is modified by the controller CTRL via one or more motor drivers and corresponding one or more motors to tune the bias match 110 during the state S(n–A) to reduce power that is reflected towards the bias RF generator 104. Also, a frequency or a power level or a combination thereof of the bias RF generator 104 is modified during one or more of the remaining states S(n–A+1) through Sn to tune the bias RF generator 104 to reduce power that is reflected towards the bias RF generator 104 during the one or more of the remaining states.

The power reflected may be measured by a sensor, such as a voltage sensor or a complex voltage and current sensor, that is coupled to an output of the bias RF generator 104 to determine whether the reflected power is reduced. The measured power is provided from the sensor to the controller CTRL to determine power amounts to be supplied by the bias RF generator 104 to further reduce the measured power.

In an embodiment, instead of the measured power, a voltage reflection coefficient is used to determine whether to change power supplied by the bias RF generator 104.

Solid State Match

Figure 25A:
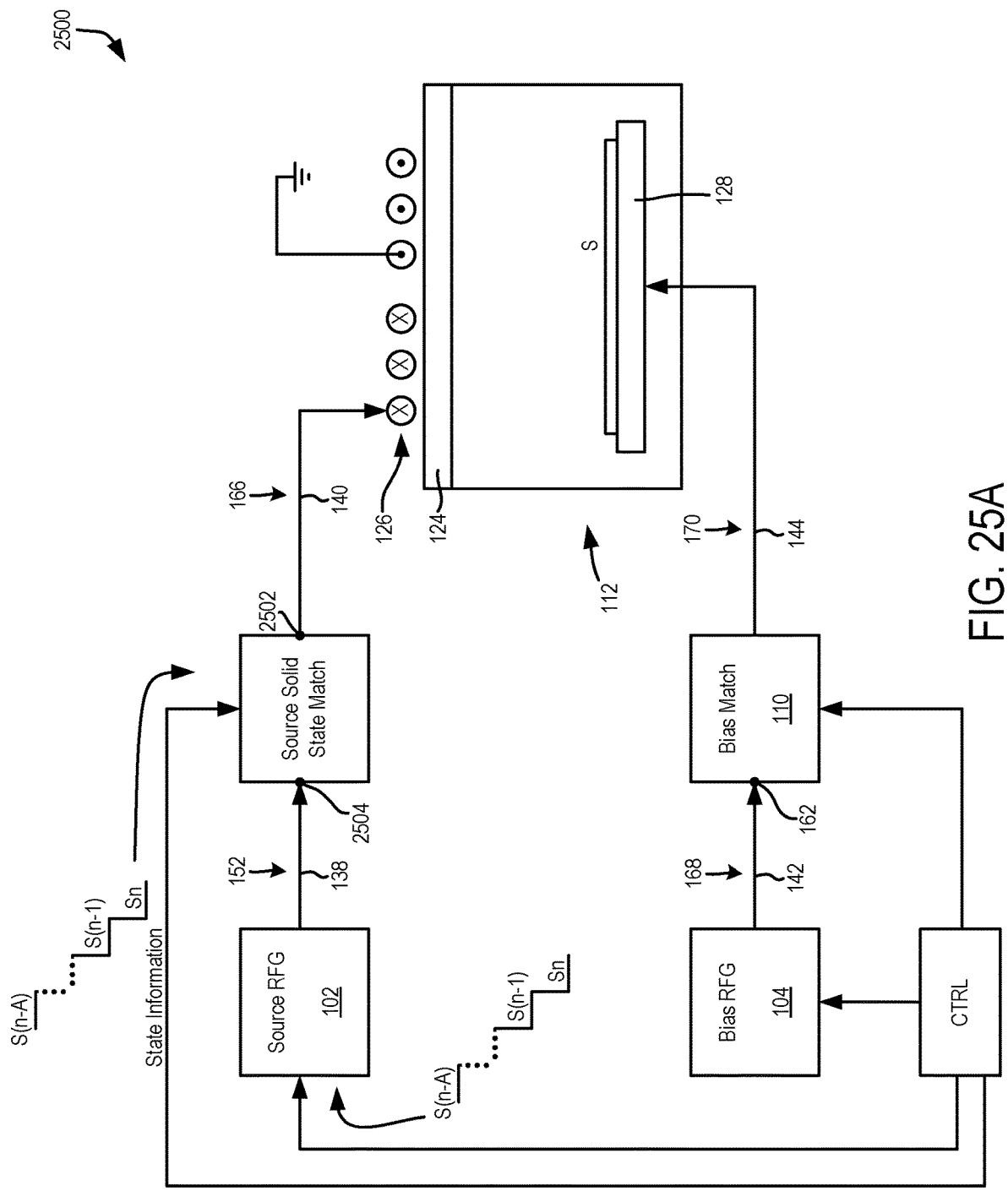
FIG. 25A is a diagram of an embodiment of a system to illustrate a source solid state match.

FIG. 25A is a diagram of an embodiment of a system 2500 to illustrate a solid state match, which is sometimes referred to herein as an electronic match. Instead of the source match 108, a solid state match is used, as illustrated with respect to FIG. 25A. The system 2500 of FIG. 25A has the same components as the system 2400 of FIG. 24A except that in FIG. 25A, the source match 108 is replaced with a source solid state match. The source solid state match facilitates achieving a current ratio between currents flowing through the TCP coil 126 of a TCP electrode of the plasma chamber 112 and the other TCP coil of the TCP electrode. State information, such as timing information for the states S(n–A) through Sn, is provided by the controller CTRL to the source solid state match. During each of the states S(n–A) through Sn, the source solid state match matches an impedance of a load coupled to an output 2502 of the solid state match with that of a source coupled to an input 2504 of the solid state match to reduce power that is reflected towards the source RF generator 102. An example of the load coupled to the output 2502 of the solid state match includes the RF transmission line 140 and the plasma chamber 112 and an example of the source coupled to the input 2504 includes the RF cable 138 and the source RF generator 102. The RF cable 138 is coupled to the input 2504 and the RF transmission line 140 is coupled to the output 2502. The bias RF generator 104 operates in a continuous wave (CW) mode or a dual-state mode or a multi-state mode. An example of the multi-state mode is a mode that applies multi-level pulsing.

Figure 25B:
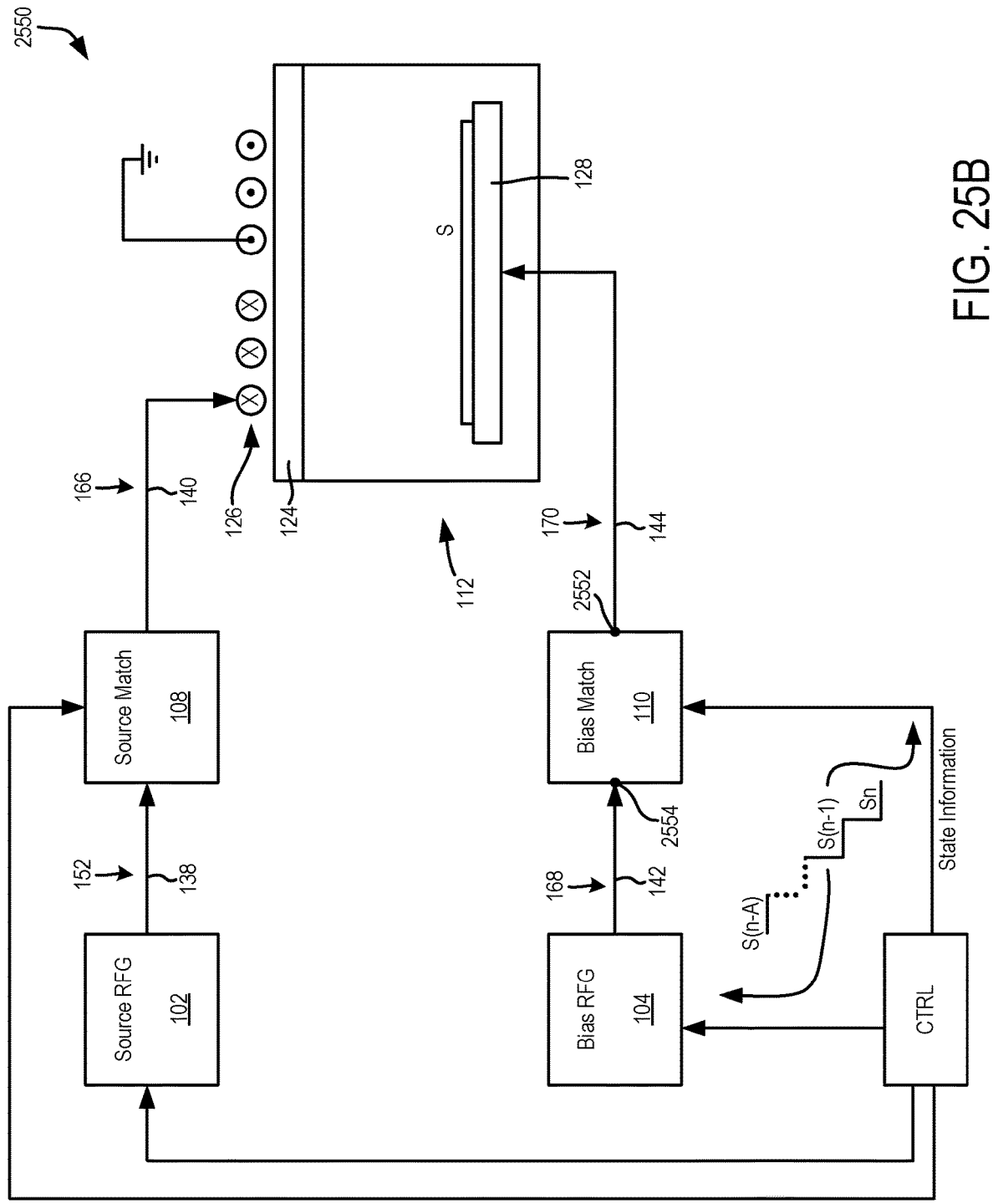
FIG. 25B is a diagram of an embodiment of a system to illustrate that, instead of a bias match, a bias solid state match is used.

FIG. 25B is a diagram of an embodiment of a system 2550 to illustrate that, instead of the bias match 110, a bias solid state match is used. The system 2550 is the same as the system 2500 except that instead of the bias match 110, the bias solid state match is used and instead of the source solid state match, the source match 108 is used. State information, such as timing information for the states S(n–A) through Sn is provided by the controller CTRL to the bias solid state match. During each of the states S(n–A) through Sn, the bias solid state match matches an impedance of a load coupled to an output 2552 of the bias solid state match with that of a source coupled to an input 2554 of the bias solid state match to reduce power that is reflected towards the bias RF generator 104. An example of the load coupled to the output 2552 of the bias solid state match includes the plasma chamber 112 and the RF transmission line 144 that couples the bias solid state match to the plasma chamber 112. An example of the source coupled to the input 2554 of the bias solid state match includes the RF cable 142 and the bias RF generator 104. The output 2552 is coupled to the RF transmission line 144 and the input 2554 is coupled to the RF cable 142. When the bias RF generator 104 is operated in a multi-state mode, the source RF generator 102 operates in a continuous wave (CW) mode or a dual-state mode or a multi-state mode.

Selective Tuning of RF Generator (Tune RF Generator During One State but not During Other States)

Figure 26A:
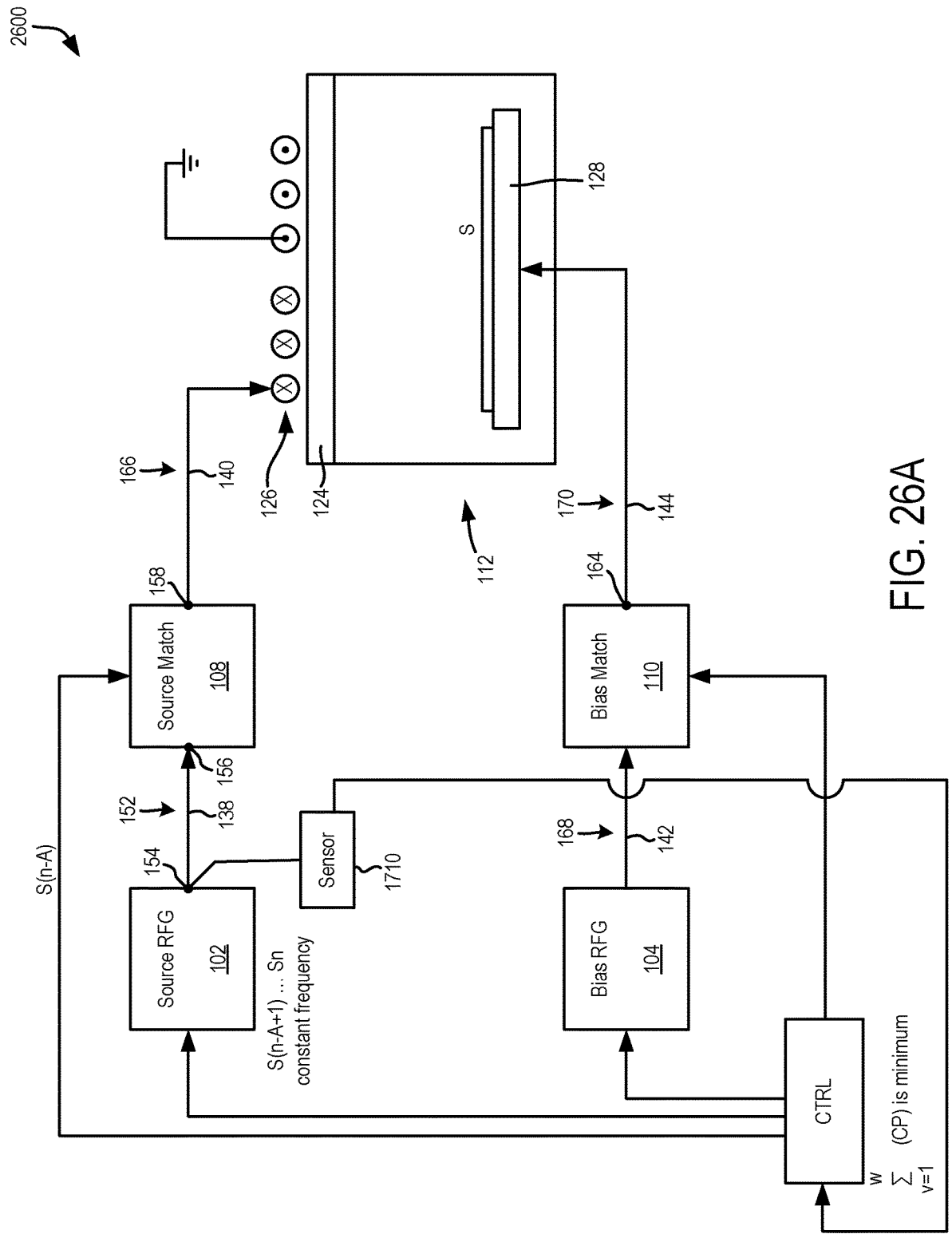
FIG. 26A is a diagram of an embodiment of a system to illustrate a match tuning method with fixed frequency.

FIG. 26A is a diagram of an embodiment of a system 2600 to illustrate a match tuning method with fixed frequency. The system 700 illustrated with respect of FIG. 26A has the same components as that illustrated with reference to FIG. 23 except that in the system 2600, the sensor 1710 is coupled to an output of the source RF generator 102. The sensor 1710 measures power reflected towards the source RF generator 102. The controller CTRL tunes the source match 108 during the state S(n–A). Moreover, the controller CTRL maintains a constant frequency of the source RF generator 102 during the remaining states S(n–A+1) through Sn. The constant frequency is determined by the controller CTRL so that a sum $\Sigma_{v=1}^{w}$ CvPv of power reflected towards the source RF generator 102 is minimum, where Cv is a weight for a state, Pv is power that is reflected towards the source RF generator 102 for the state, and v is a state number of the state. For example, a state number of the state S(n–A) is one, a state number of the state S(n–A+1) is two, and so on until a state number of the state Sn is w, where w is a positive integer. While the source RF generator 102 is operated in the multi-state mode, the bias RF generator 104 operates in a continuous wave (CW) state or in two states or in the multi-state mode.

Figure 26B:
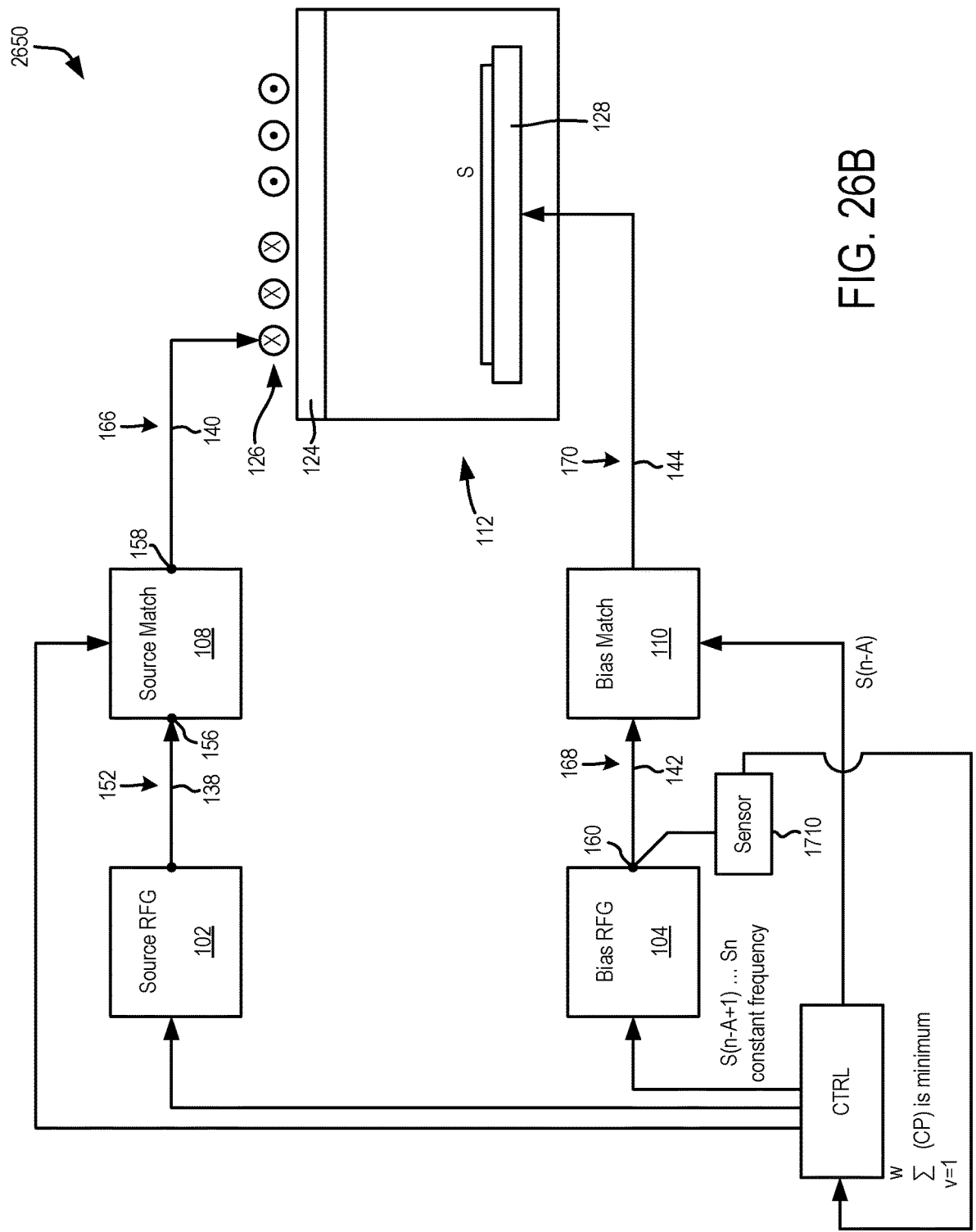
FIG. 26B is a diagram of an embodiment of a system to illustrate a match tuning method with fixed frequency.

FIG. 26B is a diagram of an embodiment of a system 2650 to illustrate a match tuning method with fixed frequency. The controller CTRL tunes the bias match 110 during the state S(n–A). Moreover, the controller CTRL maintains a constant frequency of the bias RF generator 104 during the remaining states S(n–A+1) through Sn. The constant frequency is determined by the controller CTRL so that a sum $\Sigma_{v=1}^{w}$ CvPv of power reflected towards the bias RF generator 104 is minimum, where Cv is a weight for a state, Pv is power that is reflected towards the bias RF generator 104 for the state, and v is a state number of the state. For example, a state number of the state S(n–A) is one, a state number of the state S(n–A+1) is two, and so on until a state number of the state Sn is w. The sensor 1710 is coupled to the output 160 of the bias RF generator 104 to measure power reflected towards the bias RF generator 104. While the bias RF generator 104 operates in the multi-state mode, the source RF generator 102 operates in a continuous wave (CW) state or in two states or in the multi-state mode.

In an embodiment, both the source and bias RF generators 102 and 104 operate in multiple states S(n-A) through Sn.

In an embodiment, the source RF generator 102 operates in a different number of states than the bias RF generator 104.

Master Sync Controller (ADVCI or Pulse Master Controller)

Figure 27:
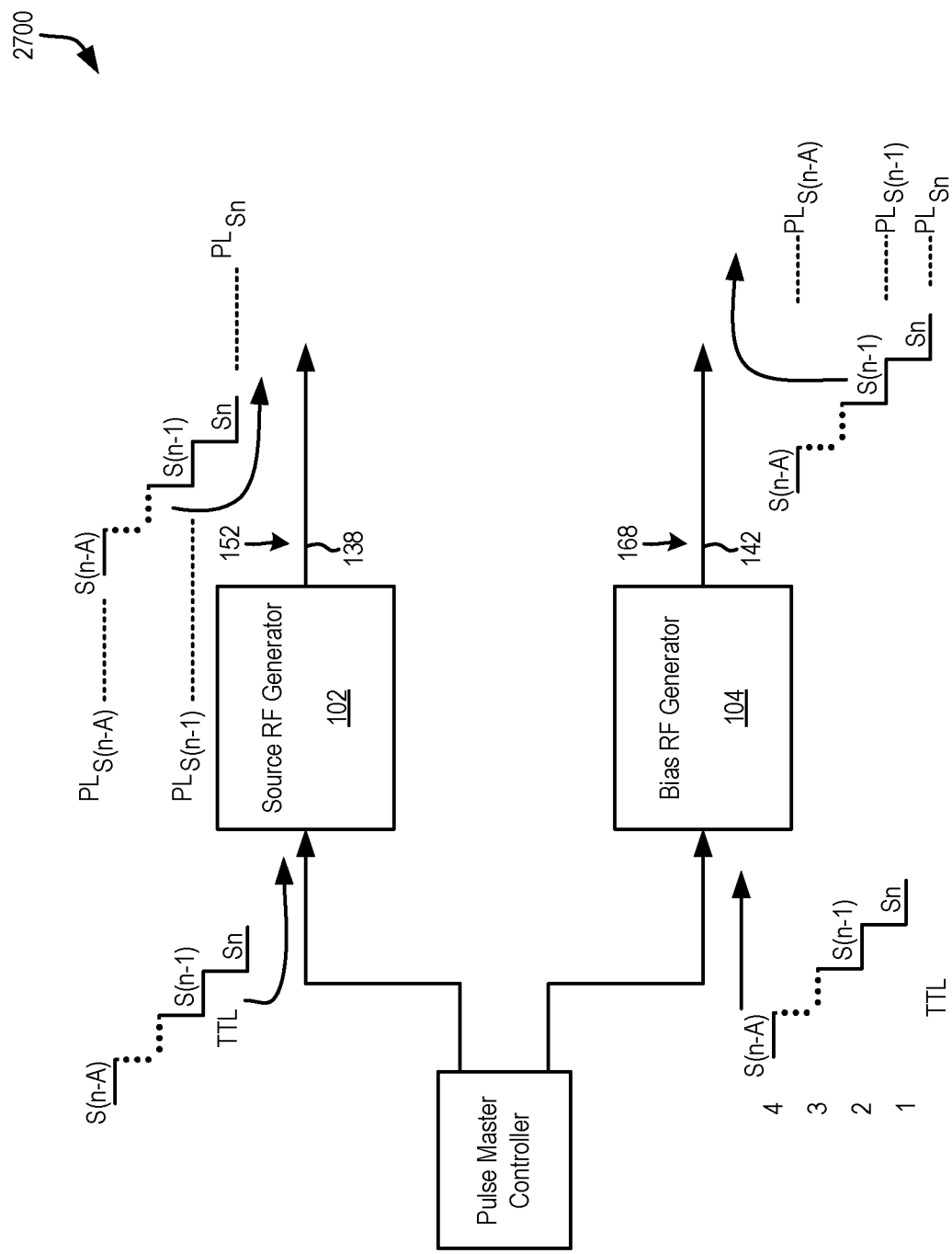
FIG. 27 is a diagram of an embodiment of a system to illustrate a clock synchronization method between transformer coupled plasma (TCP) and bias electrodes.

FIG. 27 is a diagram of an embodiment of a system 2700 to illustrate a clock synchronization method between TCP and bias electrodes. As illustrated in FIG. 27, a pulse master controller, such as a digital pulse source or a digital signal processor or the host computer 106 or the host controller or the ADVCI, generates a transistor-transistor logic (TTL) signal having the states S(n-A) through Sn and provides the TTL signal to the bias RF generator 104. The pulse master controller is sometimes referred to herein as an external pulse master controller. Upon receiving the TTL signal, the bias RF generator 104 generates an RF signal having the power levels $PL_{S(n-A)}$ through $PL_{Sn}$ for the states S(n-A) through Sn. Moreover, the pulse master controller provides the TTL signal to the source RF generator 102. Upon receiving the TTL signal, the source RF generator 102 generates an RF signal having multiple power levels $PL_{S(n-A)}$ through $PL_{Sn}$ for the states S(n-A) through Sn. There is one power level generated by the source RF generator 102 for each of the states S(n-A) through Sn. For example, a first power level is generated for the state S(n-A), a second power level is generated for the state S(n-A+1), a third power level is generated for the state S(n-1), and a fourth power level is generated for the state Sn.

In one embodiment, a power level generated by the source RF generator 102 during a state is different from a power level generated by the bias RF generator 104 during the state. For example, the power level $PL_{Sn}$ generated by the source RF generator 102 during the state Sn is different from, such as greater than or lower than, a power level generated by the bias RF generator 104 during the state Sn.

In an embodiment, the source RF generator 102 is provided a TTL signal that has a different number of states than a TTL signal provided to the bias RF generator 104. For example, the source RF generator 102 is provided a TTL signal that has four states and the bias RF generator 104 is provided a TTL signal that has five states. As another example, the source RF generator 102 is provided a TTL signal that has five states and the bias RF generator 104 is provided a TTL signal that has four states.

Figure 28A:
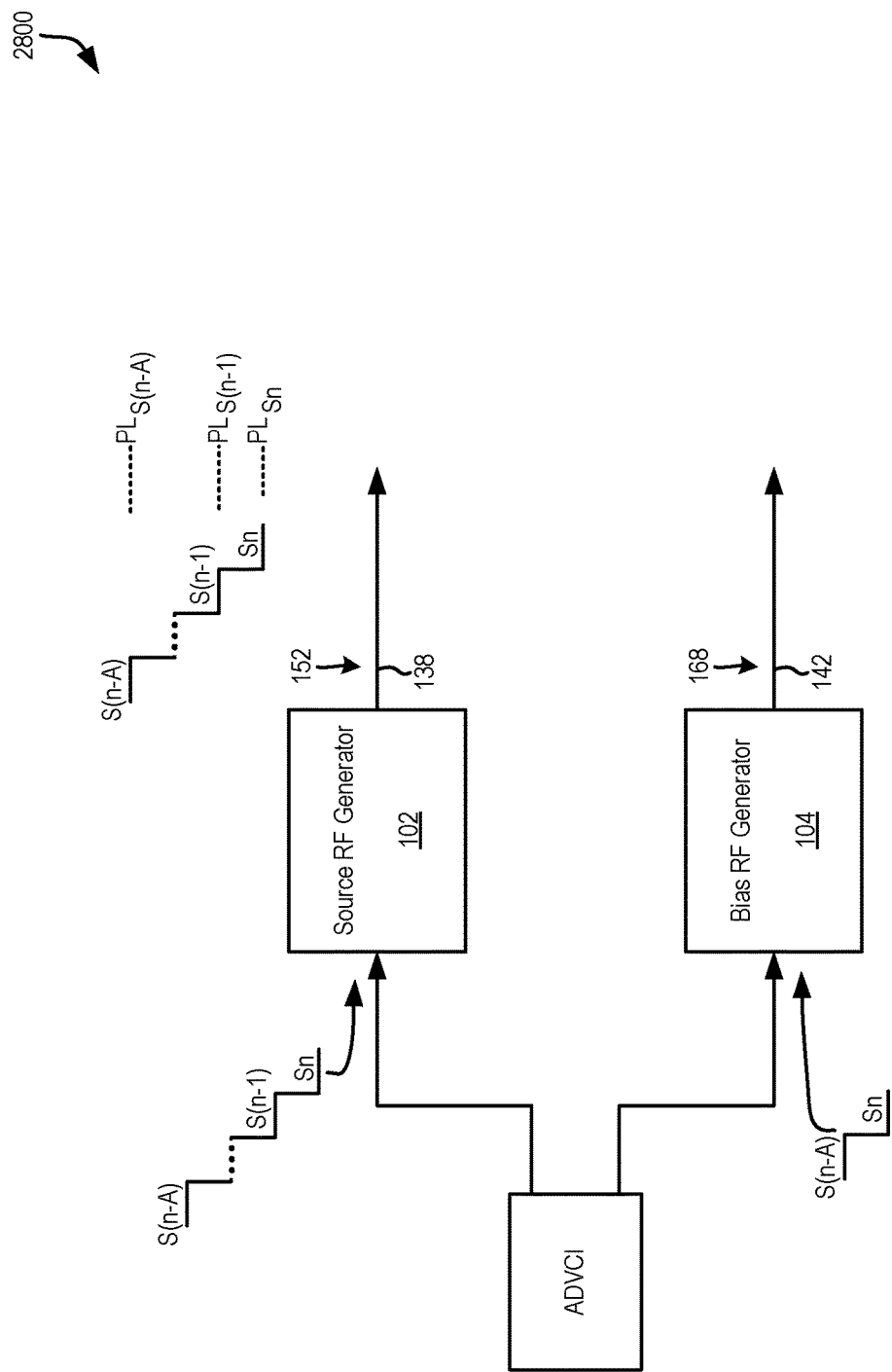
FIG. 28A is an embodiment of a system to illustrate a synchronization master.

FIG. 28A is an embodiment of a system 2800 to illustrate a synchronization master. The system 2800 illustrated in FIG. 28A includes the synchronization master, such as the ADVCI, and further includes the source RF generator 102 and the bias RF generator 104. The ADVCI converts an analog signal, such as an analog voltage signal, to a digital signal, such as a digital voltage signal. Also, the ADVCI performs one or more other functions, such as voltage peak detection and generation of a state signal having the multiple state S(n-A) through Sn. For example, the ADVCI generates the state signal having multiple logic levels, such as DC voltage levels. The synchronization master is coupled to the source RF generator 102 and the bias RF generator 104.

The synchronization master generates a clock signal, such as a TTL signal, having two states S1 and S0, and provides the clock signal to the bias RF generator 104. Upon receiving the clock signal, the bias RF generator 104 generates an RF signal having two power levels of the two states S(n-1) and Sn. For example the RF signal generated by the bias RF generator 104 has a high power level and a low power level. The low power level has one or more power values that are lower than that of power values high power level. The high power level has one or more power values. Also, the synchronization master generates a digital pulse signal having the states S(n-A) through Sn, and sends the digital pulse signal to the source RF generator 102. An example of the digital pulse signal is a multi-state waveform. Upon receiving the digital pulse signal, the source RF generator 102 generates an RF signal having power levels for the states S(n-A) through Sn, such as four or more states. For example, the RF signal generated by the source RF generator 102 has the same number of power levels as a number of the states S(n-A) through Sn.

It should be noted that in one embodiment, instead of the clock signal, a digital pulse signal that has a different number of states that a number of the states S(n-1) and Sn is provided from the synchronization master to the bias RF generator 104.

Figure 28B:
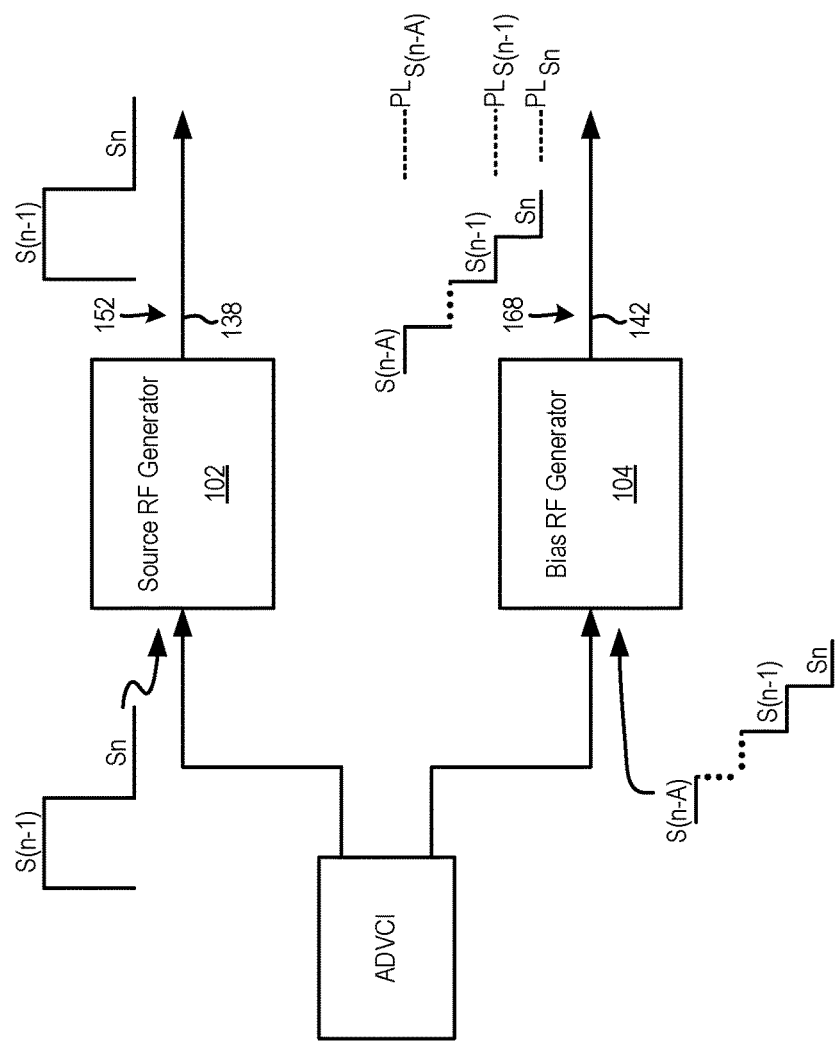
FIG. 28B is an embodiment of a system to illustrate a synchronization master.

FIG. 28B is an embodiment of the system 2800 to illustrate the synchronization master. The synchronization master generates a clock signal, such as a TTL signal, having the two states S(n-1) and Sn, and provides the clock signal to the source RF generator 102. Upon receiving the clock signal, the source RF generator 102 generates an RF signal having two power levels of the two states S(n-1) and Sn. For example the RF signal generated by the source RF generator 102 has a high power level and a low power level. The low power level has one or more power values that are lower than power values high power level. The high power level may have one or more power values. Also, the synchronization master generates a digital pulse signal having the states S(n-A) through Sn, such as four or more states, and sends the digital pulse signal to the bias RF generator 104. Upon receiving the digital pulse signal, the bias RF generator 104 generates an RF signal having power levels for the states S(n-A) through Sn. For example, the RF signal generated by the bias RF generator 104 has the same number of power levels as a number of the states S(n-A) through Sn.

It should be noted that in one embodiment, instead of the clock signal, a digital pulse signal that has a different number of states that a number of the states S(n-A) through Sn may be provided from the synchronization master to the source RF generator 102.

Master Sync Controller with Endpoint Detection

Figure 29:
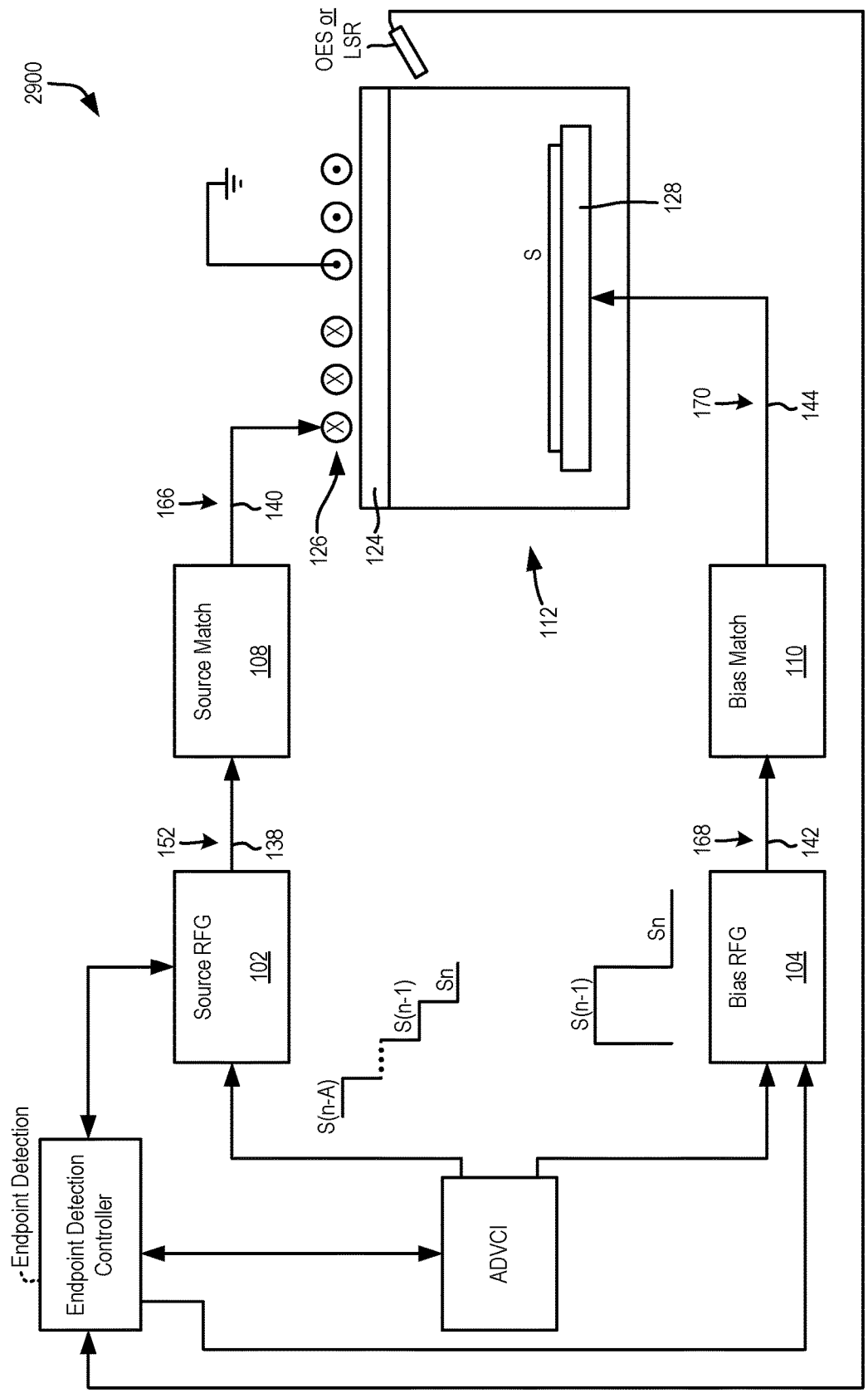
FIG. 29 is a diagram of an embodiment of a system to illustrate use of multi-state control with endpoint detection.

FIG. 29 is a diagram of an embodiment of a system 2900 to illustrate use of multi-state control with endpoint detection. The system 2900 includes an endpoint detection controller, the ADVCI, the source RF generator 102, the bias RF generator 104, the source match 108, the bias match 110, and the plasma chamber 112. When the source RF generator 102 generates the RF signal 152 having one or more the states S(n-A) through Sn, the bias RF generator 104 generates the RF signal 168 having one or more of the states S(n-A) through Sn to process the substrate S. As an example, the RF signal 152 generated by the source RF generator 102 has the same number of states as the RF signal 168 generated by the bias RF generator 104. As another example, the RF signal 152 generated by the source RF generator 102 has a different number of states that a number of states of the RF signal 168 generated by the bias RF generator 104.

An optical emission spectroscope or a Lam spectral reflectometer (LSR) is situated outside the plasma chamber 112 to determine an intensity of light that is reflected from the plasma chamber 122 while the substrate S is being processed in the plasma chamber 112. The endpoint detection controller receives an electrical signal indicating the intensity from the optical emission spectroscope or LSR to determine whether an end point or a process point within a process is reached. Examples of the process performed on the substrate S include a deposition process, an etching process, a cleaning processor, and a sputtering processor. Upon determining that the end point or the process point or a combination thereof is not yet achieved, the endpoint detection controller sends an adjust signal to the ADVCI. Upon receiving the adjust signal, the ADVCI controls power levels of the source RF generator 102 during the states S(n–A) through Sn, or controls power levels of the bias RF generator 104 during the states S(n–A) through Sn, or a combination thereof. When it is determined that the end point or the process point is achieved, the endpoint detection controller sends a stop signal to the ADVCI. Upon receiving the stop signal, the ADVCI controls power levels of the source RF generator 102 during the states S(n–A) through Sn to be zero, and controls power levels of the bias RF generator 104 during the states S(n–A) through Sn to be zero.

Reflected Power Reduction for Multi-State Pulsing

Figure 30:
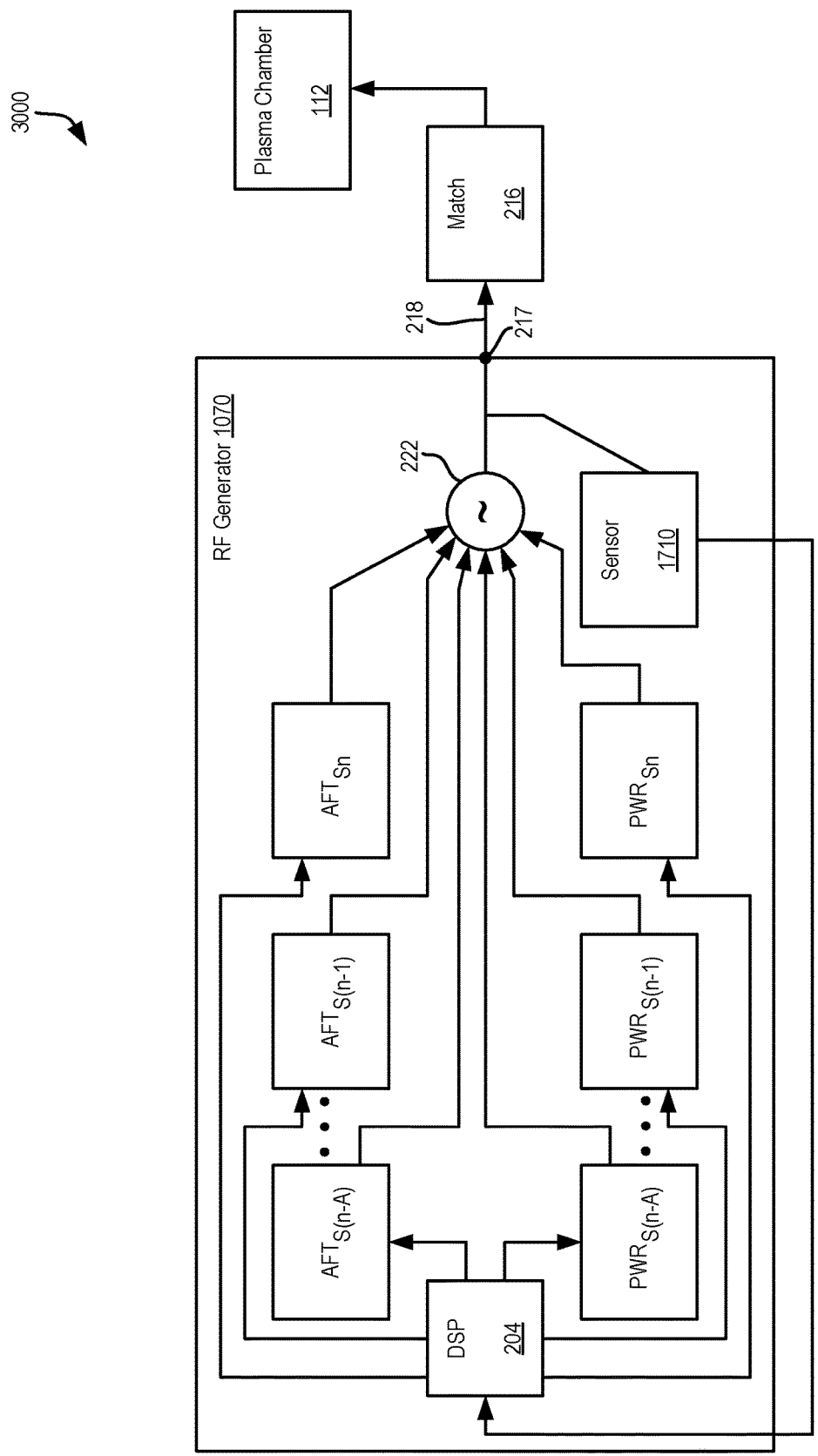
FIG. 30 illustrates a system that includes the power controllers, the auto frequency tuners, a processor, and a power supply to illustrate a method for frequency tuning or power tuning of trajectories at a microsecond level.

FIG. 30 illustrates a system 3000 that includes the RF generator 1070, which includes the power controllers $PWR_{S(n-A)}$ through $PWR_{Sn}$, the auto frequency tuners $AFT_{S(n-A)}$ through $AFT_{Sn}$, the DSP 204, and the RF power supply 222, to illustrate a method for frequency tuning trajectories at a microsecond level. The system 3000 further includes the match 216, such as the source match 108 or the bias match 110, and includes the plasma chamber 112. The sensor 1710 is coupled to the output 217 of the RF power supply 222. The RF power supply 222 is that of the source RF generator 102 or the bias RF generator 104.

The sensor 1710 measures the criterion at the output 217 and provides the criterion to the DSP 204. The DSP 204 determines to change a frequency for one or more of the states S(n–A) through Sn and/or a power for the one or more of the states S(n–A) through Sn to reduce the reflected power during the one or more of the states. To change the frequency for one or more of the states S(n–A) through Sn, the DSP 204 controls a corresponding one or more of the auto frequency tuners $AFT_{S(n-A)}$ through $AFT_{Sn}$, and to change the power for one or more of the states S(n–A) through Sn, the DSP 204 controls a corresponding one or more of the power controllers $PWR_{S(n-A)}$ through $PWR_{Sn}$ as described above with reference to FIG. 10J.

In one embodiment, a method for tuning an RF generator is described. The method includes generating a digital pulse signal having four or more states, providing the digital pulse signal to the RF generator, and generating an RF signal having four or more power levels that are synchronized with the four or more states of the digital pulse signal.

In an embodiment, a first one of the four or more states provides a time duration of an occurrence of a first one of the four or more power levels, a second one of the four or more states provides a time duration of an occurrence of a second one of the four or more power levels, a third one of the four or more states provides a time duration of an occurrence of a third one of the four or more power levels, and a fourth one of the four or more states provides a time duration of an occurrence of a fourth one of the four or more power levels.

In one embodiment, a generator for use in generating plasma for semiconductor fabrication is described. The generator includes a receiver for processing an input signal that defines a multi-state waveform. The multi-state waveform is associated with a respective power level to be applied by the generator during each one of a plurality of multi-states of the multi-state waveform. The generator further includes an output for delivering an RF power signal to a load of the RF generator. The RF power signal uses the power levels associated with the multi-state waveform. The power levels are repeated during each clock cycle for a plurality of clock cycles.

In an embodiment, the power levels include four levels, or five levels, or six levels, or seven levels, or eight levels In one embodiment, one of the power levels transitions to another one of the power levels to reduce a pulse width of the other one of the power levels.

In an embodiment, one of the power levels transitions to another one of the power levels to reduce a pulse width of the one of the power levels.

In one embodiment, the load is a TCP electrode and multi-state waveform is applied to another generator that is coupled to a bias electrode.

In an embodiment, a generator for use in supplying power to a plasma processing chamber having an electrode is described. The generator includes an input for receiving a multi-state signal that includes at least four states and an output for providing an RF signal that supplies multiple levels of power based on the multi-state signal. The RF signal is delivered to a match that connected to the electrode of the plasma processing chamber.

In one embodiment, a method for supplying multi-state power to an electrode of a plasma processing chamber is described. The method includes generating a digital pulse signal having at least four states and processing the digital pulse signal to generate a multi-state RF signal. The multi-state RF signal has multiple power levels corresponding to each of the at least four states. The method includes outputting the multi-state RF signal to a load for transfer of power to the electrode.

In an embodiment, the at least four states repeat during each clock cycle for a plurality of clock cycles.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSP)s, chips defined as application specific integrated circuits (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a transformer coupled plasma (TCP) reactor, in some embodiments, the above-described operations apply to other types of plasma chambers, e.g., a parallel plate plasma chamber, e.g., a capacitively coupled plasma chamber, etc., dielectric tools, a plasma chamber including an electron cyclotron resonance (ECR) reactor, etc. An example of the TCP reactor includes an inductively coupled plasma (ICP) reactor. Another example of the TCP reactor includes a conductor tool. Sometimes, the terms reactor and plasma chamber are used herein interchangeably.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for generating a multi-state plasma impedance, comprising:
receiving, from a processor by a first radio frequency (RF) generator and a second RF generator, a synchronization signal having a plurality of cycles that repeat periodically;
generating a first RF signal by the first RF generator, wherein the first RF signal includes at least two parameter levels within one of the plurality of cycles;
generating a second RF signal by the second RF generator, wherein the second RF signal includes at least three parameter levels within the one of the plurality of cycles; and
modifying a time of transition between the at least two parameter levels or a time of transition among the at least three parameter levels based on a number of plasma impedance states to be achieved.

2. The method of claim 1, further comprising:
supplying the first RF signal to a first impedance matching network coupled to a first electrode of a plasma chamber; and
supplying the second RF signal to a second impedance matching network coupled to a second electrode of the plasma chamber.

3. The method of claim 1, wherein the synchronization signal is a digital pulsed signal having a duty cycle, wherein the duty cycle repeats during the plurality of cycles.

4. The method of claim 1, wherein the synchronization signal repeatedly transitions between a first logic level and a second logic level during the plurality of cycles, wherein the first logic level is greater than the second logic level.

5. The method of claim 1, wherein the at least two parameter levels of the first RF signal include a first positive parameter level and a second positive parameter level, wherein the second positive parameter level of the first RF signal is greater than the first positive parameter level of the first RF signal, wherein the at least three parameter levels of the second RF signal include a zero parameter level, a first positive parameter level, and a second positive parameter level, wherein the second positive parameter level of the second RF signal is less than the first positive parameter level of the second RF signal.

6. The method of claim 1, wherein a combination of one of the at least two parameter levels of the first RF signal and one of the at least three parameter levels of the second RF signal defines a plasma impedance state.

7. The method of claim 1, wherein the at least two parameter levels of the first RF signal includes a first parameter level and a second parameter level, and the at least three parameter levels of the second RF signal includes a first parameter level, a second parameter level, and a third parameter level, wherein the first RF signal transitions between the first and second parameter levels at two transition times during the one of the plurality of cycles, wherein the second RF signal transitions among the first, second, and third parameter levels at three transition times during the one of the plurality of cycles, wherein at least one of the three transitions times of the second RF signal is different from at least one of the two transition times of the first RF signal to generate the multi-state plasma impedance.

8. The method of claim 1, wherein the at least two parameter levels of the first RF signal includes a first parameter level and a second parameter level, and the at least three parameter levels of the second RF signal includes a zero parameter level, a second parameter level, and a first parameter level, the method further comprising:
transitioning the first RF signal from the second parameter level to the first parameter level at a first transition time during the one of the plurality of cycles;
transitioning the first RF signal from the first parameter level to the second parameter level at a second transition time during the one of the plurality of cycles;
transitioning the second RF signal from the first parameter level to the zero parameter level at a third transition time during the one of the plurality of cycles;
transitioning the second RF signal from the zero parameter level to the second parameter level at a fourth transition time during the one of the plurality of cycles; and
transitioning the second RF signal from the second parameter level to the first parameter level at a fifth transition time during the one of the plurality of cycles,
wherein at least one of the first and second transition times is different from at least one of the third, fourth, and fifth transition times during the one of the plurality of cycles to generate the multi-state plasma impedance.

9. A controller system for generating a multi-state plasma impedance, comprising:
a first processor of a first radio frequency (RF) generator, wherein the first processor is configured to receive a synchronization signal having a plurality of cycles that repeat periodically,
wherein the first processor is configured to control a first RF power supply of the first RF generator to generate a first RF signal, wherein the first RF signal includes at least two parameter levels within one of the plurality of cycles; and
a second processor of a second RF generator, wherein the second processor is configured to receive the synchronization signal,
wherein the second processor is configured to control a second RF power supply of the second RF generator to generate a second RF signal, wherein the second RF signal includes at least three parameter levels within the one of the plurality of cycles,
wherein the first processor is configured to control the first RF power supply to modify a time of transition between the at least two parameter levels or the second processor is configured to control the second RF power supply to modify a time of transition among the at least three parameter levels based on a number of plasma impedance states to be achieved.

10. The controller system of claim 9, wherein the first RF power supply is configured to supply the first RF signal to a first impedance matching network coupled to a first electrode of a plasma chamber, wherein the second RF power supply is configured to supply the second RF signal to a second impedance matching network coupled to a second electrode of the plasma chamber.

11. The controller system of claim 9, wherein the synchronization signal is a digital pulsed signal having a duty cycle, wherein the duty cycle repeats during the plurality of cycles.

12. The controller system of claim 9, wherein the synchronization signal repeatedly transitions between a first logic level and a second logic level during the plurality of cycles, wherein the first logic level is greater than the second logic level.

13. The controller system of claim 9, wherein the at least two parameter levels of the first RF signal include a first positive parameter level and a second positive parameter level, wherein the second positive parameter level of the first RF signal is greater than the first positive parameter level of the first RF signal, wherein the at least three parameter levels of the second RF signal include a zero parameter level, a first positive parameter level, and a second positive parameter level, wherein the second positive parameter level of the second RF signal is less than the first positive parameter level of the second RF signal.

14. The controller system of claim 9, wherein a combination of one of the at least two parameter levels of the first RF signal and one of the at least three parameter levels of the second RF signal defines a plasma impedance state.

15. The controller system of claim 9, wherein the at least two parameter levels of the first RF signal includes a first parameter level and a second parameter level, and the at least three parameter levels of the second RF signal includes a first parameter level, a second parameter level, and a third parameter level, wherein the first RF signal transitions between the first and second parameter levels at two transition times during the one of the plurality of cycles, wherein the second RF signal transitions among the first, second, and third parameter levels at three transition times during the one of the plurality of cycles, wherein at least one of the three transitions times of the second RF signal is different from at least one of the two transition times of the first RF signal to generate the multi-state plasma impedance.

16. The controller system of claim 9, wherein the at least two parameter levels of the first RF signal includes a first parameter level and a second parameter level, and the at least three parameter levels of the second RF signal includes a zero parameter level, a second parameter level, and a first parameter level, wherein the first processor is further configured to:
control the first RF power supply to transition the first RF signal from the second parameter level to the first parameter level at a first transition time during the one of the plurality of cycles; and
control the first RF power supply to transition the first RF signal from the first parameter level to the second parameter level at a second transition time during the one of the plurality of cycles;
wherein the second processor is configured to:
control the second RF power supply to transition the second RF signal from the first parameter level to the zero parameter level at a third transition time during the one of the plurality of cycles;
control the second RF power supply to transition the second RF signal from the zero parameter level to the second parameter level at a fourth transition time during the one of the plurality of cycles; and
control the second RF power supply to transition the second RF signal from the second parameter level to the first parameter level at a fifth transition time during the one of the plurality of cycles,
wherein at least one of the first and second transition times is different from at least one of the third, fourth, and fifth transition times during the one of the plurality of cycles to generate the multi-state plasma impedance.

17. A plasma system for generating a multi-state plasma impedance, comprising:
a first radio frequency (RF) generator configured to generate a first RF signal; and
a second RF generator configured to generate a second RF signal,
wherein each of the first and second RF generators are configured to receive a synchronization signal having a plurality of cycles that repeat periodically,
wherein the first RF signal includes at least two parameter levels within one of the plurality of cycles,
wherein the second RF signal includes at least three parameter levels within the one of the plurality of cycles,
wherein the first RF generator is configured to modify a time of transition between the at least two parameter levels or the second RF generator is configured to modify a time of transition among the at least three parameter levels based on a number of plasma impedance states to be achieved.

18. The plasma system of claim 17, wherein the first RF generator is coupled via a first impedance matching network to an RF coil of a plasma chamber, wherein the first RF generator is configured to supply the first RF signal to the first impedance matching network, wherein the second RF power generator is coupled via a second impedance matching network to a substrate support of the plasma chamber, wherein the second RF generator is configured to supply the second RF signal to the second impedance matching network.

19. The plasma system of claim 17, wherein the at least two parameter levels of the first RF signal includes a first parameter level and a second parameter level, and the at least three parameter levels of the second RF signal includes a first parameter level, a second parameter level, and a third parameter level, wherein the first RF signal transitions between the first and second parameter levels at two transition times during the one of the plurality of cycles, wherein the second RF signal transitions among the first, second, and third parameter levels at three transition times during the one of the plurality of cycles, wherein at least one of the three transitions times of the second RF signal is different from at least one of the two transition times of the first RF signal to generate the multi-state plasma impedance.

20. The plasma system of claim 17, wherein the at least two parameter levels of the first RF signal includes a first parameter level and a second parameter level, and the at least three parameter levels of the second RF signal includes a zero parameter level, a second parameter level, and a first parameter level, wherein the first RF generator is configured to:
transition the first RF signal from the second parameter level to the first parameter level at a first transition time during the one of the plurality of cycles; and
transition the first RF signal from the first parameter level to the second parameter level at a second transition time during the one of the plurality of cycles,
wherein the second RF generator is configured to:
transition the second RF signal from the first parameter level to the zero parameter level at a third transition time during the one of the plurality of cycles;
transition the second RF signal from the zero parameter level to the second parameter level at a fourth transition time during the one of the plurality of cycles; and
transition the second RF signal from the second parameter level to the first parameter level at a fifth transition time during the one of the plurality of cycles,
wherein at least one of the first and second transition times is different from at least one of the third, fourth, and fifth transition times during the one of the plurality of cycles to generate the multi-state plasma impedance.

* * * * *